US012335491B2

United States Patent
Iguchi et al.

(10) Patent No.: US 12,335,491 B2
(45) Date of Patent: Jun. 17, 2025

(54) THREE-DIMENSIONAL DATA ENCODING METHOD, THREE-DIMENSIONAL DATA DECODING METHOD, THREE-DIMENSIONAL DATA ENCODING DEVICE, AND THREE-DIMENSIONAL DATA DECODING DEVICE

(71) Applicant: Panasonic Intellectual Property Corporation of America, Torrance, CA (US)

(72) Inventors: Noritaka Iguchi, Osaka (JP); Toshiyasu Sugio, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 500 days.

(21) Appl. No.: 17/314,362

(22) Filed: May 7, 2021

(65) Prior Publication Data
US 2021/0264641 A1 Aug. 26, 2021

Related U.S. Application Data

(63) Continuation of application No. PCT/JP2019/044913, filed on Nov. 15, 2019.
(Continued)

(51) Int. Cl.
*H04N 19/17* (2014.01)
*H03M 7/30* (2006.01)
*H04N 19/20* (2014.01)

(52) U.S. Cl.
CPC .......... *H04N 19/17* (2014.11); *H03M 7/3064* (2013.01); *H03M 7/6005* (2013.01); *H03M 7/6011* (2013.01); *H04N 19/20* (2014.11)

(58) Field of Classification Search
CPC ........ G06T 9/001; G06T 9/40; H03M 7/3064; H03M 7/3084; H03M 7/4006;
(Continued)

(56) References Cited

U.S. PATENT DOCUMENTS 10,902,062 B1 * 1/2021 Guha .................. G06F 16/9027
2005/0276323 A1 12/2005 Martemyanov et al.
(Continued)

FOREIGN PATENT DOCUMENTS

WO 2014/020663 2/2014

OTHER PUBLICATIONS

PCC Test Model C13v2, 122. MPEG Meeting; Apr. 16, 2018-Apr. 20, 2018; San Diego; (Motion Picture Expert Groupor ISO/IEC JTC1/SC29/WG1 1), No. n17519 (2018).*
(Continued)

*Primary Examiner* — Mohammed S Rahaman
(74) *Attorney, Agent, or Firm* — Wenderoth, Lind & Ponack, L.L.P.

(57) ABSTRACT

A three-dimensional data encoding method includes: dividing a current frame including three-dimensional points into processing units; and encoding the processing units to generate a bitstream. Control information for each frame included in the bitstream includes first information indicating whether (i) one of the processing units included in the current frame includes duplicated points that are three-dimensional points having same geometry information or (ii) none of the processing units includes the duplicated points.

12 Claims, 86 Drawing Sheets

Related U.S. Application Data

(60) Provisional application No. 62/768,488, filed on Nov. 16, 2018.

(58) Field of Classification Search
CPC ............ H03M 7/6005; H03M 7/6011; H03M 7/6023; H04N 19/124; H04N 19/17; H04N 19/174; H04N 19/176; H04N 19/182; H04N 19/20; H04N 19/436; H04N 19/70
See application file for complete search history.

(56) References Cited

U.S. PATENT DOCUMENTS

| | | | | |
|---|---|---|---|---|
| 2011/0142321 | A1* | 6/2011 | Huffman | H04N 21/8146 382/131 |
| 2014/0324914 | A1* | 10/2014 | Luo | H04N 19/96 707/797 |
| 2014/0375638 | A1 | 12/2014 | Tomaru et al. | |
| 2016/0007005 | A1* | 1/2016 | Konieczny | H04N 13/161 348/43 |
| 2019/0197739 | A1* | 6/2019 | Sinharoy | G06T 7/55 |
| 2020/0021844 | A1* | 1/2020 | Yea | H04N 19/61 |

OTHER PUBLICATIONS

International Search Report issued Dec. 17, 2019 in International (PCT) Application No. PCT/JP2019/044913.
George P. Gerdan et al., "Transforming Cartesian coordinates X,Y,Z to Geographical coordinates φ, λ, h", The Australian Surveyor, vol. 44, No. 1, Jun. 1999.
Extended European Search Report issued on Jan. 12, 2022, in European Patent Application No. 19885583.5.
Schwarz et al., "Fast Parallel Surface and Solid Voxelization on GPUs", ACM SIGGRAPH Asia 2010 Papers On, SIGGRAPH Asia '10, ACM Press, New York, New York, USA, (2010), pp. 1-10, XP058313233.
Iguchi (Panasonic) et al., "[G-PCC] Clarification and Modification of CD syntax and semantics", 128, MPEG Meeting; Oct. 7, 2019-Oct. 11, 2019; Geneva; (Motion Picture Expert Group or ISO/IEC JTCI/SC29/WG11), No. m51064, (2019), XP030221575.
"PCC Test Model C13v2", 122.MPEG Meeting; Apr. 16, 2018-Apr. 20, 2018; San Diego; (Motion Picture Expert Groupor ISO/IEC JTC1/SC29/WG11), No. n17519 (2018), XP030264089.
Office Action issued Jan. 5, 2023 in Indian Patent Application No. 202147021593, with English-language translation.
Communication pursuant to Article 94(3) EPC issued Mar. 20, 2025 in corresponding European Patent Application No. 19 885 583.5.
Han Chung Dean et al., "[PCC] TMC13 new proposal on Combine Frame Coding", 124. MPEG Meeting; Oct. 8-12, 2018; Macao; (Motion Picture Expert Group or ISO/IEC JTC1/SC29/WG11 ), No. m44813 Oct. 4, 2018 (Oct. 4, 2018), XP030192444, Retrieved from the Internet: URL:http://phenix.int-evry.fr/mpeg/doc_end_user/documents/124_Macao/wg11/m44813-v1-m44813.zip m44813.docx [retrieved on Oct. 4, 2018].
Han Chung Dean et al., "[G-PCC] CE13.5 Report on combine frame coding in TMC13", 125. MPEG Meeting; Jan. 14-18, 2019; Marrakech; (Motion Picture Expert Group or ISO/IEC JTC1/SC29/WG11 ), No. m46101 Jan. 9, 2019 (Jan. 9, 2019), XP030214599, Retrieved from the Internet: URL:http://phenix.int-evry.fr/mpeg/doc_end_user/documents/125_Marrakech/wg11/m46101-v1-m46101_v1 .zip m46101_v1 .docx [retrieved on Jan. 9, 2019].

* cited by examiner

| | GEOMETRY INFORMATION | ATTRIBUTE INFORMATION |
|---|---|---|
| n = 1 | $G(1) = (x_1, y_1, z_1)$ | $A(1) = (R_1, G_1, B_1)$ |
| n = 2 | $G(2) = (x_2, y_2, z_2)$ | $A(2) = (R_2, G_2, B_2)$ |
| ⋮ | ⋮ | ⋮ |
| n = N | $G(N) = (x_N, y_N, z_N)$ | $A(N) = (R_N, G_N, B_N)$ |

FIG. 14

| ftyp | moov | mdat |
|------|------|------|

FIG. 15

| Codec 1 | Codec 2 |
|---------|---------|
| Codec 1 NAL unit | Codec 2 NAL unit |
| PCC NAL Unit ||
| Carriage of Codec 1 | Carriage of Codec 2 |
| ISOBMFF ||

FIG. 35

```
EXAMPLES OF SEMANTICS OF pcc_nal_unit_type
(1) if pcc_codec_type == Codec 1
      0:Codec1 Goemetry
      1:Codec1 AttributeX
      2:Codec1 AttributeY
      3:Codec1 Geom. PS
      4:Codec1 AttrX. PS
      5:Codec1 AttrX. PS
      6:Codec1 Geometry Sequence PS
      7:Codec1 AttributeX Sequence PS
      8:Codec1 AttributeY Sequence PS
      9:Codec1 AU Header
     10:Codec1 GOF Header
   11 ~:Codec1 reserved for future use (2) if pcc_codec_type == Codec 2
      0:Codec2 DataA
      1:Codec2 MetaDataA
      2:Codec2 MetaDataB
    3 ~:Codec2 reserved for future use
```

FIG. 58

```
TileMetaData{
    type_of_divide  1:top_view, 2:other
    if(type_of_divide == 1){ //top_view
        topview_shape    //1: square, 2:circle
        tile_overlap_flag  //1:true, 2:false
        if(tile_overlap_flag){
            type_of_overlap
        }
        independent_tile_height_flag
        if(independent_tile_height_flag){
            tile_height //1: road, flyover
        } tile_number for(tile_number){
            global_position or relative_position
            if(independent_tile_height_flag){
                tile_height
            }
        }
    }
}
```

FIG. 60

```
SliceMetaData{
    type_of_divide    1:object, 2:other
    if(type_of_divide == 1) {   //object
       slice_overlap_flag   //1:true, 2:false
       if(slice_overlap_flag){
          type_of_overlap
       } slice_number for(slice_number){
          global_position or relative_position
          slice_bounding_box_size
       }
    }
}
```

< DEFAULT VALUE >

FIG. 78

```
pc_header() {
...
MergeDuplicatedPointFlag
...
}
```

FIG. 79

```
node(depth, index) {
...
isleaf
if (isleaf) {   //leaf
 if (MergeDuplicatedPointFlag == 0)
    num_point_per_leaf
}
else {      //node
 ...
}
 ...
}
```

```
GPS0{
  gps_idx ..PCC frame number
  sps_idx gps_information(){
    ...
    MergeDuplicatedPointFlag
    QP_value
    ...
  };
  if(tile){
    tile_information();
  }
}
```

FIG. 91

```
tile_information(){
  type_of_divide
  independent_quantization_flag
  if(type_of_divide == A){
    number_of_tiles
    for(number_of_tiles){
      tile_null_flag
      if(tile_null_flag=false){
        origin_x
        origin_y
        origin_z
        node_size
        if(independent_quantization_flag){
          TileMergeDuplicatedPointFlag
          qp_delta;
        }
      }else if (tile_null_flag==true){
        //no data
      }
    }
  }
}
```

FIG. 92

```
node(depth, index) {
 . . .
 isleaf
 if (isleaf) { //leaf
  if (MergeDuplicatedPointFlag == 0)
    num_point_per_leaf
 }
 else {      //node
  . . .
 }
 . . .
}
```

FIG. 100

```
GPS0{
gps_idx ..PCC frame number
sps_idx gps_information(){
  ...
  MergeDuplicatedPointFlag
  QP_value
  ...
};
if(tile){
  UniqueBetweenTilesFlag
  tile_information();
}
...
}
```

TILE A        TILE B

THREE-DIMENSIONAL DATA ENCODING METHOD, THREE-DIMENSIONAL DATA DECODING METHOD, THREE-DIMENSIONAL DATA ENCODING DEVICE, AND THREE-DIMENSIONAL DATA DECODING DEVICE

CROSS REFERENCE TO RELATED APPLICATIONS

This application is a U.S. continuation application of PCT International Patent Application Number PCT/JP2019/044913 filed on Nov. 15, 2019, claiming the benefit of priority of U.S. Provisional Patent Application No. 62/768,488 filed on Nov. 16, 2018, the entire contents of which are hereby incorporated by reference.

BACKGROUND

1. Technical Field

The present disclosure relates to a three-dimensional data encoding method, a three-dimensional data decoding method, a three-dimensional data encoding device, and a three-dimensional data decoding device.

2. Description of the Related Art

Devices or services utilizing three-dimensional data are expected to find their widespread use in a wide range of fields, such as computer vision that enables autonomous operations of cars or robots, map information, monitoring, infrastructure inspection, and video distribution. Three-dimensional data is obtained through various means including a distance sensor such as a rangefinder, as well as a stereo camera and a combination of a plurality of monocular cameras.

Methods of representing three-dimensional data include a method known as a point cloud scheme that represents the shape of a three-dimensional structure by a point cloud in a three-dimensional space. In the point cloud scheme, the positions and colors of a point cloud are stored. While point cloud is expected to be a mainstream method of representing three-dimensional data, a massive amount of data of a point cloud necessitates compression of the amount of three-dimensional data by encoding for accumulation and transmission, as in the case of a two-dimensional moving picture (examples include Moving Picture Experts Group-4 Advanced Video Coding (MPEG-4 AVC) and High Efficiency Video Coding (HEVC) standardized by MPEG).

Meanwhile, point cloud compression is partially supported by, for example, an open-source library (Point Cloud Library) for point cloud-related processing.

Furthermore, a technique for searching for and displaying a facility located in the surroundings of the vehicle by using three-dimensional map data is known (for example, see International Publication WO 2014/020663).

SUMMARY

There has been a demand for reducing a data amount in a three-dimensional data encoding process.

The present disclosure provides a three-dimensional data encoding method, a three-dimensional data decoding method, a three-dimensional data encoding device, or a three-dimensional data decoding device that is capable of reducing a data amount.

A three-dimensional data encoding method according to one aspect of the present disclosure includes: dividing a current frame including three-dimensional points into processing units; and encoding the processing units to generate a bitstream. Control information for each frame included in the bitstream includes first information indicating whether (i) one of the processing units included in the current frame includes duplicated points that are three-dimensional points having same geometry information or (ii) none of the processing units includes the duplicated points.

A three-dimensional data decoding method according to one aspect of the present disclosure includes: obtaining a bitstream generated by encoding processing units into which a current frame including three-dimensional points is divided; and decoding the processing units from the bitstream. Control information for each frame included in the bitstream includes first information indicating whether (i) one of the processing units included in the current frame includes duplicated points that are three-dimensional points having same geometry information or (ii) none of the processing units includes the duplicated points, and the decoding of the processing units from the bitstream includes decoding the processing units using the first information.

The provides a three-dimensional data encoding method, a three-dimensional data decoding method, a three-dimensional data encoding device, or a three-dimensional data decoding device that is capable of reducing a data amount.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 14 is a diagram illustrating a basic structure of ISOBMFF according to Embodiment 2;

FIG. 15 is a diagram illustrating a protocol stack according to Embodiment 2;

FIG. 35 is a diagram illustrating a semantics example of pcc_nal_unit_type according to Embodiment 4;

FIG. 58 is a diagram illustrating an example of syntax of tile additional information according to Embodiment 6;

FIG. 60 is a diagram illustrating an example of syntax of slice additional information according to Embodiment 6;

FIG. 78 is a diagram illustrating an example of a syntax of header information according to Embodiment 8;

FIG. 79 is a diagram illustrating an example of a syntax of information of a node according to Embodiment 8;

FIG. 91 is a diagram showing a syntax example of tile information according to Embodiment 9;

FIG. 92 is a diagram showing a syntax example of node information according to Embodiment 9;

FIG. 100 is a diagram showing a syntax example of GPS according to Embodiment 9;

DETAILED DESCRIPTION OF THE EMBODIMENTS

Figure 1:
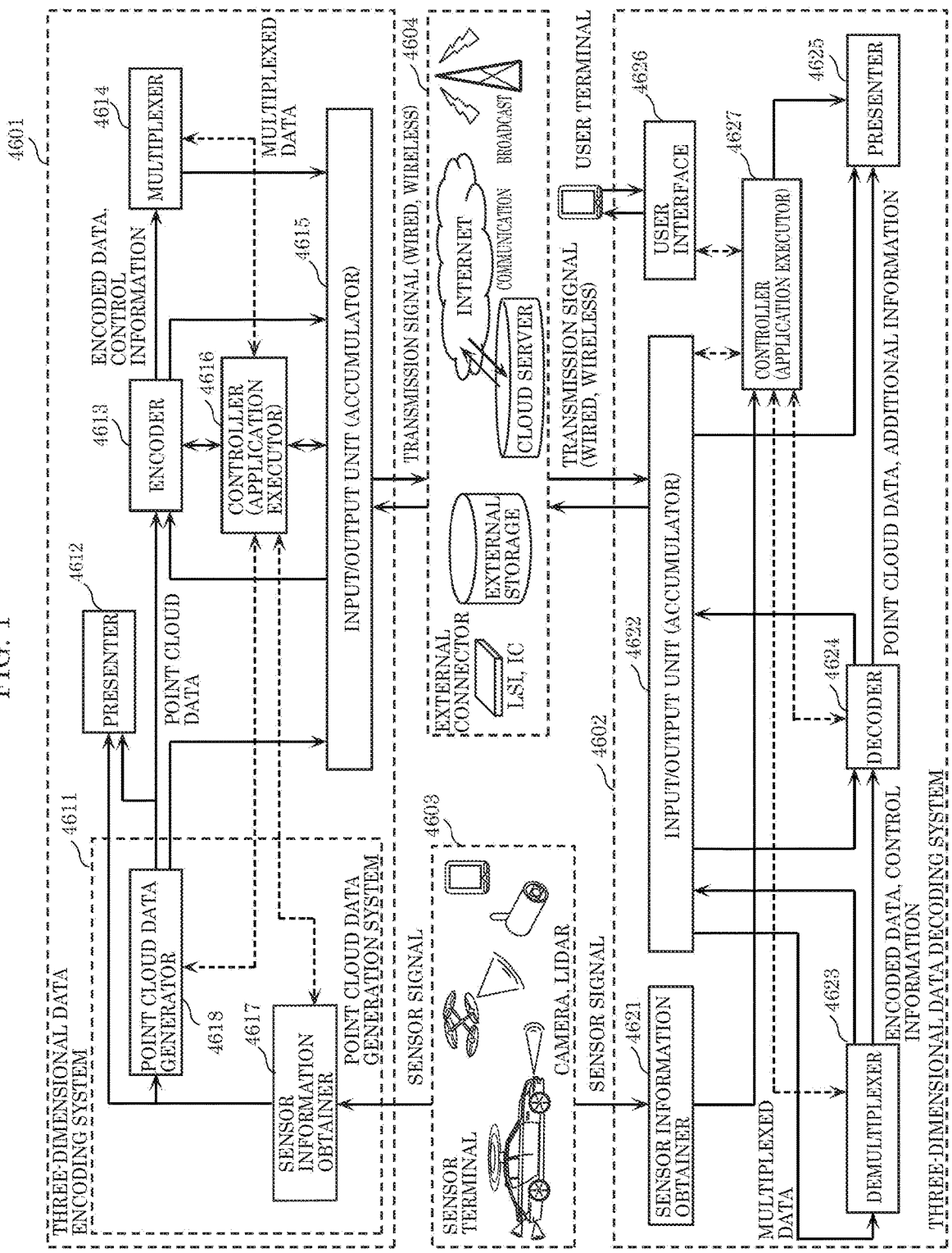
FIG. 1 is a diagram illustrating a configuration of a three-dimensional data encoding and decoding system according to Embodiment 1.

A three-dimensional data encoding method according to one aspect of the present disclosure includes: dividing a current frame including three-dimensional points into processing units; and encoding the processing units to generate a bitstream. Control information for each frame included in the bitstream includes first information indicating whether (i) one of the processing units included in the current frame includes duplicated points that are three-dimensional points having same geometry information or (ii) none of the processing units includes the duplicated points.

With this configuration, a notification of the presence or absence of duplicated points can be made on a frame basis, and therefore, the data amount of the bitstream can be reduced.

For example, the encoding may include quantizing, and the control information for each frame may further include second information indicating whether a same parameter or separate parameters are to be used as quantization parameters used in the quantizing, for the processing units.

With this configuration, a notification of whether to set a quantization parameter or not can be made on a frame basis, and therefore, the data amount of the bitstream can be reduced.

For example, the processing units may include two processing units spatially overlapping each other, and the bitstream may include third information indicating whether three-dimensional points having same geometry information and belonging to different processing units are located in a region in which the two processing units overlap each other.

With this configuration, a three-dimensional data decoding device can control the details of the process based on whether there are duplicated points in the overlapping area of the processing units using the third information. Therefore, the processing load on the three-dimensional data decoding device can be reduced.

A three-dimensional data decoding method according to one aspect of the present disclosure includes: obtaining a bitstream generated by encoding processing units into which a current frame including three-dimensional points is divided; and decoding the processing units from the bitstream. Control information for each frame included in the bitstream includes first information indicating whether (i) one of the processing units included in the current frame includes duplicated points that are three-dimensional points having same geometry information or (ii) none of the processing units includes the duplicated points, and the decoding of the processing units from the bitstream includes decoding the processing units using the first information.

With this configuration, a notification of the presence or absence of duplicated points can be made on a frame basis, and therefore, the data amount of the bitstream can be reduced.

With this configuration, a notification of the presence or absence of duplicated points can be made on a frame basis, and therefore, the data amount of the bitstream can be reduced.

With this configuration, a notification of the presence or absence of duplicated points can be made on a frame basis, and therefore, the data amount of the bitstream can be reduced.

For example, the processing units may include two processing units spatially overlapping each other, and the bitstream may include third information indicating whether three-dimensional points having same geometry information and belonging to different processing units are located in a region in which the two processing units overlap each other.

With this configuration, a three-dimensional data decoding device can control the details of the process based on whether there are duplicated points in the overlapping area of the processing units using the third information. Therefore, the processing load on the three-dimensional data decoding device can be reduced.

A three-dimensional data encoding device according to one aspect of the present disclosure includes: a processor and memory. Using the memory, the processor divides a current frame including three-dimensional points into processing units, and encodes the processing units to generate a bitstream. Control information for each frame included in the bitstream includes first information indicating whether (i) one of the processing units included in the current frame includes duplicated points that are three-dimensional points having same geometry information or (ii) none of the processing units includes the duplicated points.

With this configuration, a notification of the presence or absence of duplicated points can be made on a frame basis, and therefore, the data amount of the bitstream can be reduced.

A three-dimensional data decoding device according to one aspect of the present disclosure includes: a processor and memory. Using the memory, the processor obtains a bitstream generated by encoding processing units into which a current frame including three-dimensional points is divided, and decodes the processing units from the bitstream. Control information for each frame included in the bitstream includes first information indicating whether (i) one of the processing units included in the current frame includes duplicated points that are three-dimensional points having same geometry information or (ii) none of the processing units includes the duplicated points, and in the decoding of the processing units from the bitstream, the processing units are decoded using the first information.

A three-dimensional data decoding device according to one aspect of the present disclosure includes: a processor and memory. Using the memory, the processor obtains a bitstream generated by encoding processing units into which a current frame including three-dimensional points is divided, and decodes the processing units from the bitstream. Control information for each frame included in the bitstream includes first information indicating whether (i) one of the processing units included in the current frame includes duplicated points that are three-dimensional points having same geometry information or (ii) none of the processing units includes the duplicated points, and in the decoding of the processing units from the bitstream, the processing units are decoded using the first information.

Note that these general or specific aspects may be implemented as a system, a method, an integrated circuit, a computer program, or a computer-readable recording medium such as a CD-ROM, or may be implemented as any combination of a system, a method, an integrated circuit, a computer program, and a recording medium.

The following describes embodiments with reference to the drawings. Note that the following embodiments show exemplary embodiments of the present disclosure. The numerical values, shapes, materials, structural components, the arrangement and connection of the structural components, steps, the processing order of the steps, etc. shown in the following embodiments are mere examples, and thus are not intended to limit the present disclosure. Of the structural components described in the following embodiments, structural components not recited in any one of the independent claims that indicate the broadest concepts will be described as optional structural components.

Embodiment 1

When using encoded data of a point cloud in a device or for a service in practice, required information for the application is desirably transmitted and received in order to reduce the network bandwidth. However, conventional encoding structures for three-dimensional data have no such a function, and there is also no encoding method for such a function.

Embodiment 1 described below relates to a three-dimensional data encoding method and a three-dimensional data encoding device for encoded data of a three-dimensional point cloud that provides a function of transmitting and receiving required information for an application, a three-dimensional data decoding method and a three-dimensional data decoding device for decoding the encoded data, a three-dimensional data multiplexing method for multiplexing the encoded data, and a three-dimensional data transmission method for transmitting the encoded data.

In particular, at present, a first encoding method and a second encoding method are under investigation as encoding methods (encoding schemes) for point cloud data. However, there is no method defined for storing the configuration of encoded data and the encoded data in a system format. Thus, there is a problem that an encoder cannot perform an MUX process (multiplexing), transmission, or accumulation of data.

In addition, there is no method for supporting a format that involves two codecs, the first encoding method and the second encoding method, such as point cloud compression (PCC).

With regard to this embodiment, a configuration of PCC-encoded data that involves two codecs, a first encoding method and a second encoding method, and a method of storing the encoded data in a system format will be described.

A configuration of a three-dimensional data (point cloud data) encoding and decoding system according to this embodiment will be first described. FIG. 1 is a diagram showing an example of a configuration of the three-dimensional data encoding and decoding system according to this embodiment. As shown in FIG. 1, the three-dimensional data encoding and decoding system includes three-dimensional data encoding system 4601, three-dimensional data decoding system 4602, sensor terminal 4603, and external connector 4604.

Three-dimensional data encoding system 4601 generates encoded data or multiplexed data by encoding point cloud data, which is three-dimensional data. Three-dimensional data encoding system 4601 may be a three-dimensional data encoding device implemented by a single device or a system implemented by a plurality of devices. The three-dimensional data encoding device may include a part of a plurality of processors included in three-dimensional data encoding system 4601.

Three-dimensional data encoding system 4601 includes point cloud data generation system 4611, presenter 4612, encoder 4613, multiplexer 4614, input/output unit 4615, and controller 4616. Point cloud data generation system 4611 includes sensor information obtainer 4617, and point cloud data generator 4618.

Sensor information obtainer 4617 obtains sensor information from sensor terminal 4603, and outputs the sensor information to point cloud data generator 4618. Point cloud data generator 4618 generates point cloud data from the sensor information, and outputs the point cloud data to encoder 4613.

Presenter 4612 presents the sensor information or point cloud data to a user. For example, presenter 4612 displays information or an image based on the sensor information or point cloud data.

Encoder 4613 encodes (compresses) the point cloud data, and outputs the resulting encoded data, control information (signaling information) obtained in the course of the encoding, and other additional information to multiplexer 4614. The additional information includes the sensor information, for example.

Multiplexer 4614 generates multiplexed data by multiplexing the encoded data, the control information, and the additional information input thereto from encoder 4613. A format of the multiplexed data is a file format for accumulation or a packet format for transmission, for example.

Input/output unit 4615 (a communication unit or interface, for example) outputs the multiplexed data to the outside. Alternatively, the multiplexed data may be accumulated in an accumulator, such as an internal memory. Controller 4616 (or an application executor) controls each processor. That is, controller 4616 controls the encoding, the multiplexing, or other processing.

Note that the sensor information may be input to encoder 4613 or multiplexer 4614. Alternatively, input/output unit 4615 may output the point cloud data or encoded data to the outside as it is.

A transmission signal (multiplexed data) output from three-dimensional data encoding system 4601 is input to three-dimensional data decoding system 4602 via external connector 4604.

Three-dimensional data decoding system 4602 generates point cloud data, which is three-dimensional data, by decoding the encoded data or multiplexed data. Note that three-dimensional data decoding system 4602 may be a three-dimensional data decoding device implemented by a single device or a system implemented by a plurality of devices. The three-dimensional data decoding device may include a part of a plurality of processors included in three-dimensional data decoding system 4602.

Three-dimensional data decoding system 4602 includes sensor information obtainer 4621, input/output unit 4622, demultiplexer 4623, decoder 4624, presenter 4625, user interface 4626, and controller 4627.

Sensor information obtainer 4621 obtains sensor information from sensor terminal 4603.

Input/output unit 4622 obtains the transmission signal, decodes the transmission signal into the multiplexed data (file format or packet), and outputs the multiplexed data to demultiplexer 4623.

Demultiplexer 4623 obtains the encoded data, the control information, and the additional information from the multiplexed data, and outputs the encoded data, the control information, and the additional information to decoder 4624.

Decoder 4624 reconstructs the point cloud data by decoding the encoded data.

Presenter 4625 presents the point cloud data to a user. For example, presenter 4625 displays information or an image based on the point cloud data. User interface 4626 obtains an indication based on a manipulation by the user. Controller 4627 (or an application executor) controls each processor. That is, controller 4627 controls the demultiplexing, the decoding, the presentation, or other processing.

Note that input/output unit 4622 may obtain the point cloud data or encoded data as it is from the outside. Presenter 4625 may obtain additional information, such as sensor information, and present information based on the additional information. Presenter 4625 may perform a presentation based on an indication from a user obtained on user interface 4626.

Sensor terminal 4603 generates sensor information, which is information obtained by a sensor. Sensor terminal 4603 is a terminal provided with a sensor or a camera. For example, sensor terminal 4603 is a mobile body, such as an automobile, a flying object, such as an aircraft, a mobile terminal, or a camera.

Sensor information that can be generated by sensor terminal 4603 includes (1) the distance between sensor terminal 4603 and an object or the reflectance of the object obtained by LIDAR, a millimeter wave radar, or an infrared sensor or (2) the distance between a camera and an object or the reflectance of the object obtained by a plurality of monocular camera images or a stereo-camera image, for example. The sensor information may include the posture, orientation, gyro (angular velocity), position (GPS information or altitude), velocity, or acceleration of the sensor, for example. The sensor information may include air temperature, air pressure, air humidity, or magnetism, for example.

External connector 4604 is implemented by an integrated circuit (LSI or IC), an external accumulator, communication with a cloud server via the Internet, or broadcasting, for example.

Figures 2, 3:
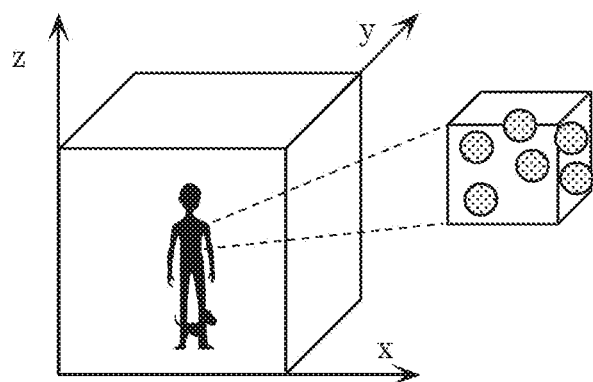
FIG. 2 is a diagram illustrating a structure example of point cloud data according to Embodiment 1.
FIG. 3 is a diagram illustrating a structure example of a data file indicating the point cloud data according to Embodiment 1.

Next, point cloud data will be described. FIG. 2 is a diagram showing a configuration of point cloud data. FIG. 3 is a diagram showing a configuration example of a data file describing information of the point cloud data.

Point cloud data includes data on a plurality of points. Data on each point includes geometry information (three-dimensional coordinates) and attribute information associated with the geometry information. A set of a plurality of such points is referred to as a point cloud. For example, a point cloud indicates a three-dimensional shape of an object.

Geometry information (position), such as three-dimensional coordinates, may be referred to as geometry. Data on each point may include attribute information (attribute) on a plurality of types of attributes. A type of attribute is color or reflectance, for example.

One piece of attribute information may be associated with one piece of geometry information, or attribute information on a plurality of different types of attributes may be associated with one piece of geometry information. Alternatively, a plurality of pieces of attribute information on the same type of attribute may be associated with one piece of geometry information.

The configuration example of a data file shown in FIG. 3 is an example in which geometry information and attribute information are associated with each other in a one-to-one relationship, and geometry information and attribute information on N points forming point cloud data are shown.

The geometry information is information on three axes, specifically, an x-axis, a y-axis, and a z-axis, for example. The attribute information is RGB color information, for example. A representative data file is ply file, for example.

Figure 4:
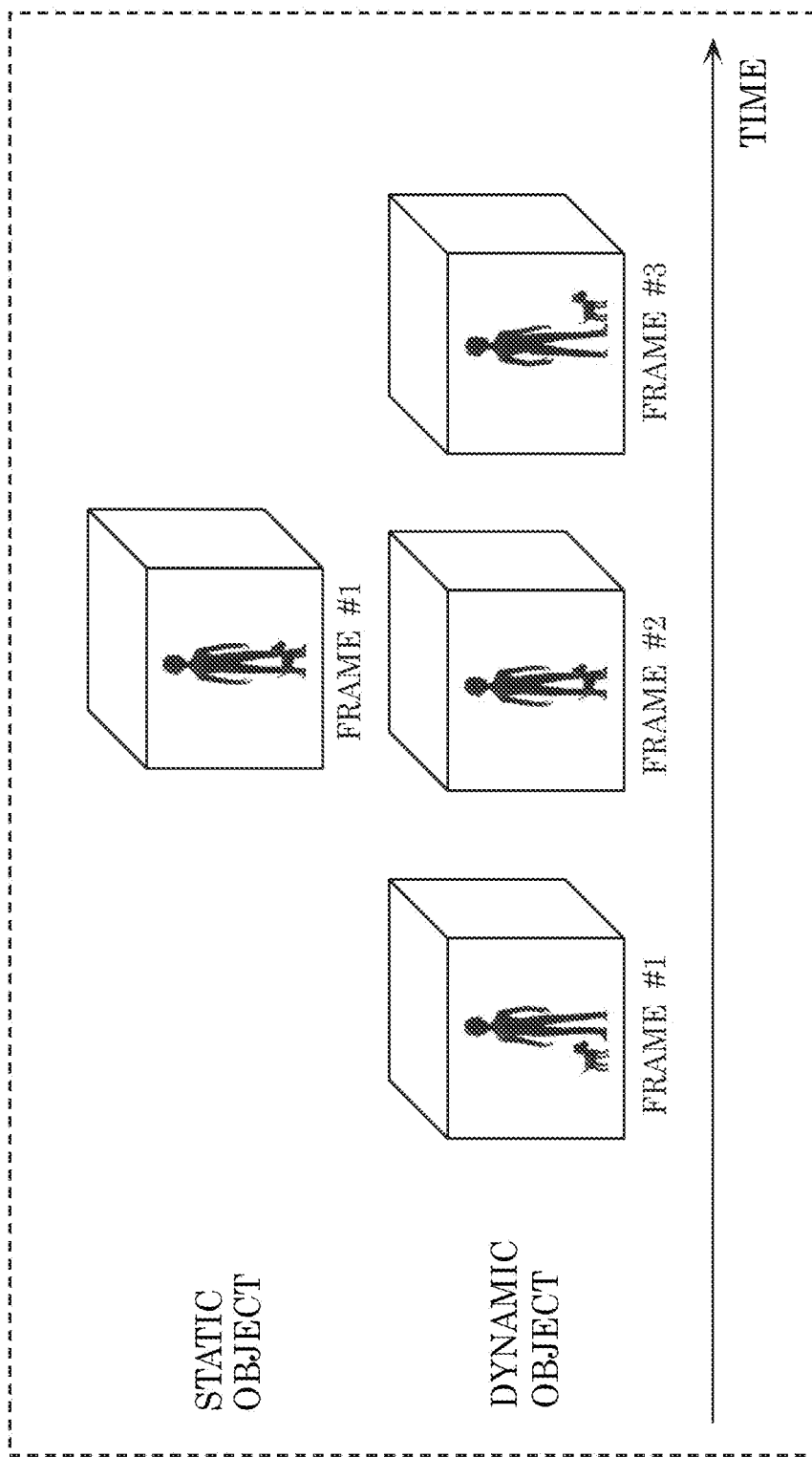
FIG. 4 is a diagram illustrating types of the point cloud data according to Embodiment 1.

Next, types of point cloud data will be described. FIG. 4 is a diagram showing types of point cloud data. As shown in FIG. 4, point cloud data includes a static object and a dynamic object.

The static object is three-dimensional point cloud data at an arbitrary time (a time point). The dynamic object is three-dimensional point cloud data that varies with time. In the following, three-dimensional point cloud data associated with a time point will be referred to as a PCC frame or a frame.

The object may be a point cloud whose range is limited to some extent, such as ordinary video data, or may be a large point cloud whose range is not limited, such as map information.

There are point cloud data having varying densities. There may be sparse point cloud data and dense point cloud data.

In the following, each processor will be described in detail. Sensor information is obtained by various means, including a distance sensor such as LIDAR or a range finder, a stereo camera, or a combination of a plurality of monocular cameras. Point cloud data generator 4618 generates point cloud data based on the sensor information obtained by sensor information obtainer 4617. Point cloud data generator 4618 generates geometry information as point cloud data, and adds attribute information associated with the geometry information to the geometry information.

When generating geometry information or adding attribute information, point cloud data generator 4618 may process the point cloud data. For example, point cloud data generator 4618 may reduce the data amount by omitting a point cloud whose position coincides with the position of another point cloud. Point cloud data generator 4618 may also convert the geometry information (such as shifting, rotating or normalizing the position) or render the attribute information.

Note that, although FIG. 1 shows point cloud data generation system 4611 as being included in three-dimensional data encoding system 4601, point cloud data generation system 4611 may be independently provided outside three-dimensional data encoding system 4601.

Encoder 4613 generates encoded data by encoding point cloud data according to an encoding method previously defined. In general, there are the two types of encoding methods described below. One is an encoding method using geometry information, which will be referred to as a first encoding method, hereinafter. The other is an encoding method using a video codec, which will be referred to as a second encoding method, hereinafter.

Decoder 4624 decodes the encoded data into the point cloud data using the encoding method previously defined.

Multiplexer 4614 generates multiplexed data by multiplexing the encoded data in an existing multiplexing method. The generated multiplexed data is transmitted or accumulated. Multiplexer 4614 multiplexes not only the PCC-encoded data but also another medium, such as a video, an audio, subtitles, an application, or a file, or reference time information. Multiplexer 4614 may further multiplex attribute information associated with sensor information or point cloud data.

Multiplexing schemes or file formats include ISOBMFF, MPEG-DASH, which is a transmission scheme based on ISOBMFF, MMT, MPEG-2 TS Systems, or RMP, for example.

Demultiplexer 4623 extracts PCC-encoded data, other media, time information and the like from the multiplexed data.

Input/output unit 4615 transmits the multiplexed data in a method suitable for the transmission medium or accumulation medium, such as broadcasting or communication. Input/output unit 4615 may communicate with another device over the Internet or communicate with an accumulator, such as a cloud server.

As a communication protocol, http, ftp, TCP, UDP or the like is used. The pull communication scheme or the push communication scheme can be used.

A wired transmission or a wireless transmission can be used. For the wired transmission, Ethernet (registered trademark), USB, RS-232C, HDMI (registered trademark), or a coaxial cable is used, for example. For the wireless transmission, wireless LAN, Wi-Fi (registered trademark), Bluetooth (registered trademark), or a millimeter wave is used, for example.

As a broadcasting scheme, DVB-T2, DVB-S2, DVB-C2, ATSC3.0, or ISDB-S3 is used, for example.

Figure 5:
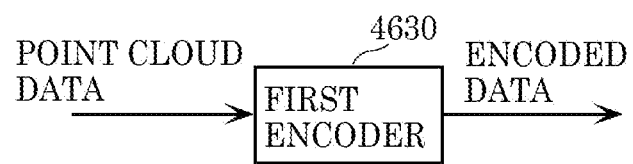
FIG. 5 is a diagram illustrating a structure of a first encoder according to Embodiment 1.
Figure 6:
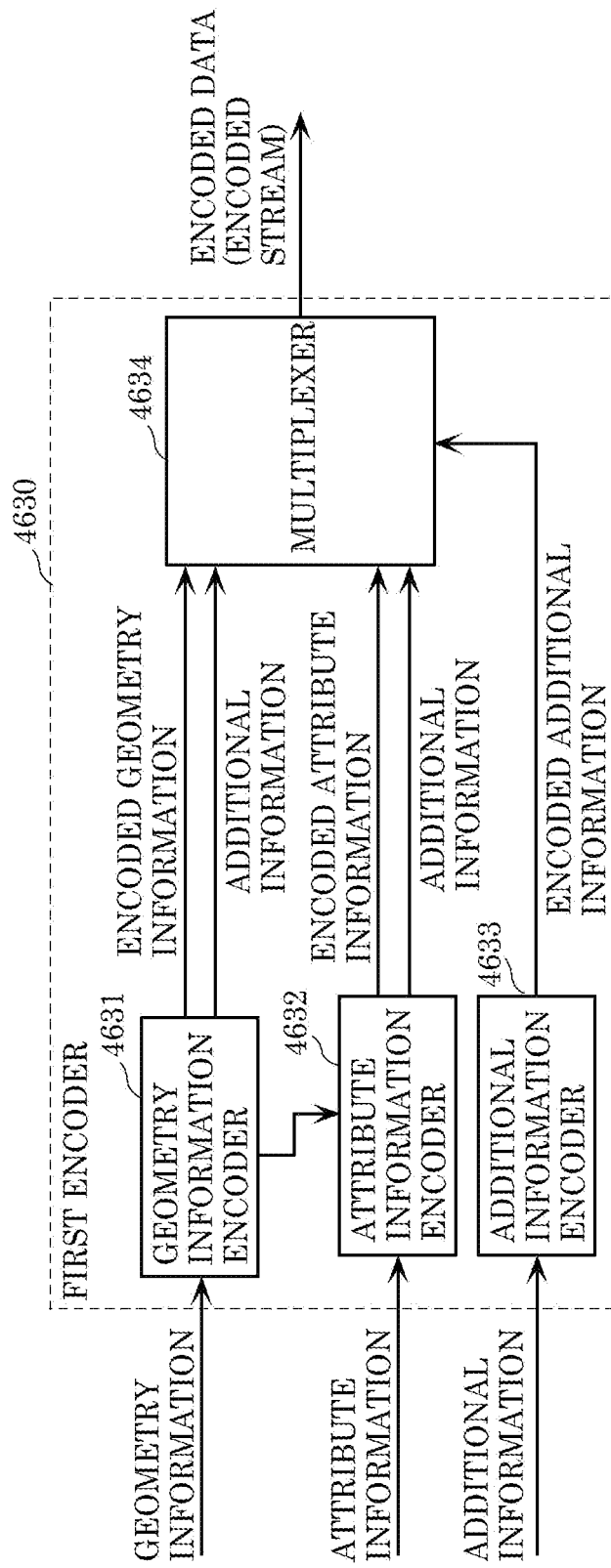
FIG. 6 is a block diagram illustrating the first encoder according to Embodiment 1.

FIG. 5 is a diagram showing a configuration of first encoder 4630, which is an example of encoder 4613 that performs encoding in the first encoding method. FIG. 6 is a block diagram showing first encoder 4630. First encoder 4630 generates encoded data (encoded stream) by encoding point cloud data in the first encoding method. First encoder 4630 includes geometry information encoder 4631, attribute information encoder 4632, additional information encoder 4633, and multiplexer 4634.

First encoder 4630 is characterized by performing encoding by keeping a three-dimensional structure in mind. First encoder 4630 is further characterized in that attribute information encoder 4632 performs encoding using information obtained from geometry information encoder 4631. The first encoding method is referred to also as geometry-based PCC (GPCC).

Point cloud data is PCC point cloud data like a PLY file or PCC point cloud data generated from sensor information, and includes geometry information (position), attribute information (attribute), and other additional information (metadata). The geometry information is input to geometry information encoder 4631, the attribute information is input to attribute information encoder 4632, and the additional information is input to additional information encoder 4633.

Geometry information encoder 4631 generates encoded geometry information (compressed geometry), which is encoded data, by encoding geometry information. For example, geometry information encoder 4631 encodes geometry information using an N-ary tree structure, such as an octree. Specifically, in the case of an octree, a current space is divided into eight nodes (subspaces), 8-bit information (occupancy code) that indicates whether each node includes a point cloud or not is generated. A node including a point cloud is further divided into eight nodes, and 8-bit information that indicates whether each of the eight nodes includes a point cloud or not is generated. This process is repeated until a predetermined level is reached or the number of the point clouds included in each node becomes equal to or less than a threshold.

Attribute information encoder 4632 generates encoded attribute information (compressed attribute), which is encoded data, by encoding attribute information using configuration information generated by geometry information encoder 4631. For example, attribute information encoder 4632 determines a reference point (reference node) that is to be referred to in encoding a current point (current node) to be processed based on the octree structure generated by geometry information encoder 4631. For example, attribute information encoder 4632 refers to a node whose parent node in the octree is the same as the parent node of the current node, of peripheral nodes or neighboring nodes. Note that the method of determining a reference relationship is not limited to this method.

The process of encoding attribute information may include at least one of a quantization process, a prediction process, and an arithmetic encoding process. In this case, "refer to" means using a reference node for calculating a predicted value of attribute information or using a state of a reference node (occupancy information that indicates whether a reference node includes a point cloud or not, for example) for determining a parameter of encoding. For example, the parameter of encoding is a quantization parameter in the quantization process or a context or the like in the arithmetic encoding.

Additional information encoder 4633 generates encoded additional information (compressed metadata), which is encoded data, by encoding compressible data of additional information.

Multiplexer 4634 generates encoded stream (compressed stream), which is encoded data, by multiplexing encoded geometry information, encoded attribute information, encoded additional information, and other additional information. The generated encoded stream is output to a processor in a system layer (not shown).

Figure 7:
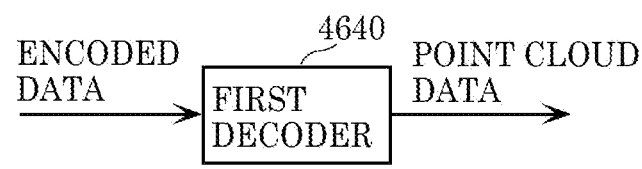
FIG. 7 is a diagram illustrating a structure of a first decoder according to Embodiment 1.
Figure 8:
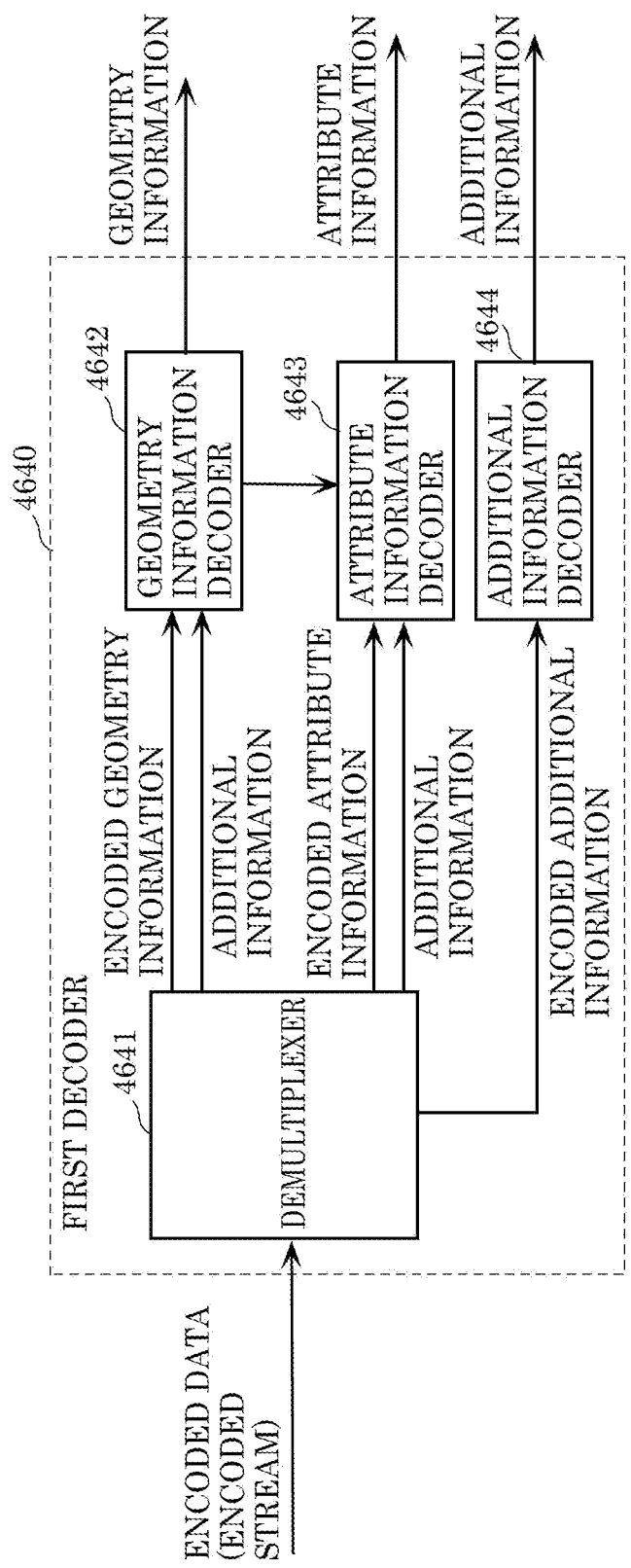
FIG. 8 is a block diagram illustrating the first decoder according to Embodiment 1.

Next, first decoder 4640, which is an example of decoder 4624 that performs decoding in the first encoding method, will be described. FIG. 7 is a diagram showing a configuration of first decoder 4640. FIG. 8 is a block diagram showing first decoder 4640. First decoder 4640 generates point cloud data by decoding encoded data (encoded stream) encoded in the first encoding method in the first encoding method. First decoder 4640 includes demultiplexer 4641, geometry information decoder 4642, attribute information decoder 4643, and additional information decoder 4644.

An encoded stream (compressed stream), which is encoded data, is input to first decoder 4640 from a processor in a system layer (not shown).

Demultiplexer 4641 separates encoded geometry information (compressed geometry), encoded attribute information (compressed attribute), encoded additional information (compressed metadata), and other additional information from the encoded data.

Geometry information decoder 4642 generates geometry information by decoding the encoded geometry information. For example, geometry information decoder 4642 restores the geometry information on a point cloud represented by three-dimensional coordinates from encoded geometry information represented by an N-ary structure, such as an octree.

Attribute information decoder 4643 decodes the encoded attribute information based on configuration information generated by geometry information decoder 4642. For example, attribute information decoder 4643 determines a reference point (reference node) that is to be referred to in decoding a current point (current node) to be processed based on the octree structure generated by geometry information decoder 4642. For example, attribute information decoder 4643 refers to a node whose parent node in the octree is the same as the parent node of the current node, of peripheral nodes or neighboring nodes. Note that the method of determining a reference relationship is not limited to this method.

The process of decoding attribute information may include at least one of an inverse quantization process, a prediction process, and an arithmetic decoding process. In this case, "refer to" means using a reference node for calculating a predicted value of attribute information or using a state of a reference node (occupancy information that indicates whether a reference node includes a point cloud or not, for example) for determining a parameter of decoding. For example, the parameter of decoding is a quantization parameter in the inverse quantization process or a context or the like in the arithmetic decoding.

Additional information decoder 4644 generates additional information by decoding the encoded additional information. First decoder 4640 uses additional information required for the decoding process for the geometry information and the attribute information in the decoding, and outputs additional information required for an application to the outside.

Figure 9:
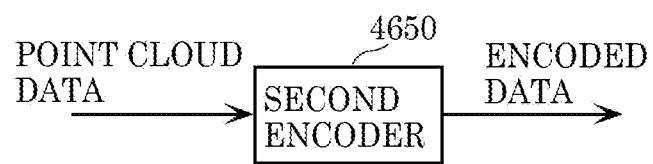
FIG. 9 is a diagram illustrating a structure of a second encoder according to Embodiment 1.
Figure 10:
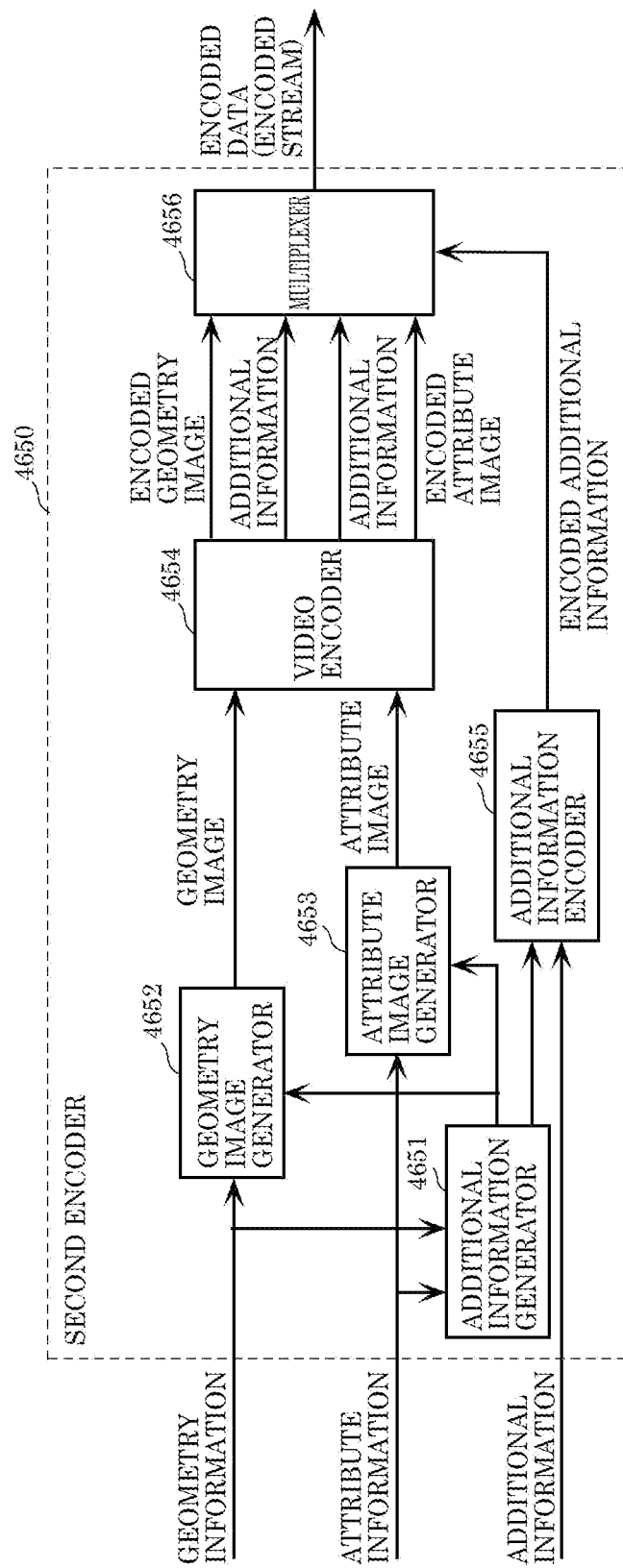
FIG. 10 is a block diagram illustrating the second encoder according to Embodiment 1.

Next, second encoder 4650, which is an example of encoder 4613 that performs encoding in the second encoding method, will be described. FIG. 9 is a diagram showing a configuration of second encoder 4650. FIG. 10 is a block diagram showing second encoder 4650.

Second encoder 4650 generates encoded data (encoded stream) by encoding point cloud data in the second encoding method. Second encoder 4650 includes additional information generator 4651, geometry image generator 4652, attribute image generator 4653, video encoder 4654, additional information encoder 4655, and multiplexer 4656.

Second encoder 4650 is characterized by generating a geometry image and an attribute image by projecting a three-dimensional structure onto a two-dimensional image, and encoding the generated geometry image and attribute image in an existing video encoding scheme. The second encoding method is referred to as video-based PCC (VPCC).

Point cloud data is PCC point cloud data like a PLY file or PCC point cloud data generated from sensor information, and includes geometry information (position), attribute information (attribute), and other additional information (metadata).

Additional information generator 4651 generates map information on a plurality of two-dimensional images by projecting a three-dimensional structure onto a two-dimensional image.

Geometry image generator 4652 generates a geometry image based on the geometry information and the map information generated by additional information generator 4651. The geometry image is a distance image in which distance (depth) is indicated as a pixel value, for example. The distance image may be an image of a plurality of point clouds viewed from one point of view (an image of a plurality of point clouds projected onto one two-dimensional plane), a plurality of images of a plurality of point clouds viewed from a plurality of points of view, or a single image integrating the plurality of images.

Attribute image generator 4653 generates an attribute image based on the attribute information and the map information generated by additional information generator 4651. The attribute image is an image in which attribute information (color (RGB), for example) is indicated as a pixel value, for example. The image may be an image of a plurality of point clouds viewed from one point of view (an image of a plurality of point clouds projected onto one two-dimensional plane), a plurality of images of a plurality of point clouds viewed from a plurality of points of view, or a single image integrating the plurality of images.

Video encoder 4654 generates an encoded geometry image (compressed geometry image) and an encoded attribute image (compressed attribute image), which are encoded data, by encoding the geometry image and the attribute image in a video encoding scheme. Note that, as the video encoding scheme, any well-known encoding method can be used. For example, the video encoding scheme is AVC or HEVC.

Additional information encoder 4655 generates encoded additional information (compressed metadata) by encoding the additional information, the map information and the like included in the point cloud data.

Multiplexer 4656 generates an encoded stream (compressed stream), which is encoded data, by multiplexing the encoded geometry image, the encoded attribute image, the encoded additional information, and other additional information. The generated encoded stream is output to a processor in a system layer (not shown).

Figure 11:
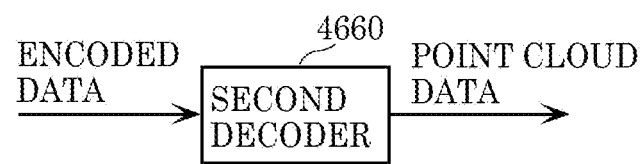
FIG. 11 is a diagram illustrating a structure of a second decoder according to Embodiment 1.
Figure 12:
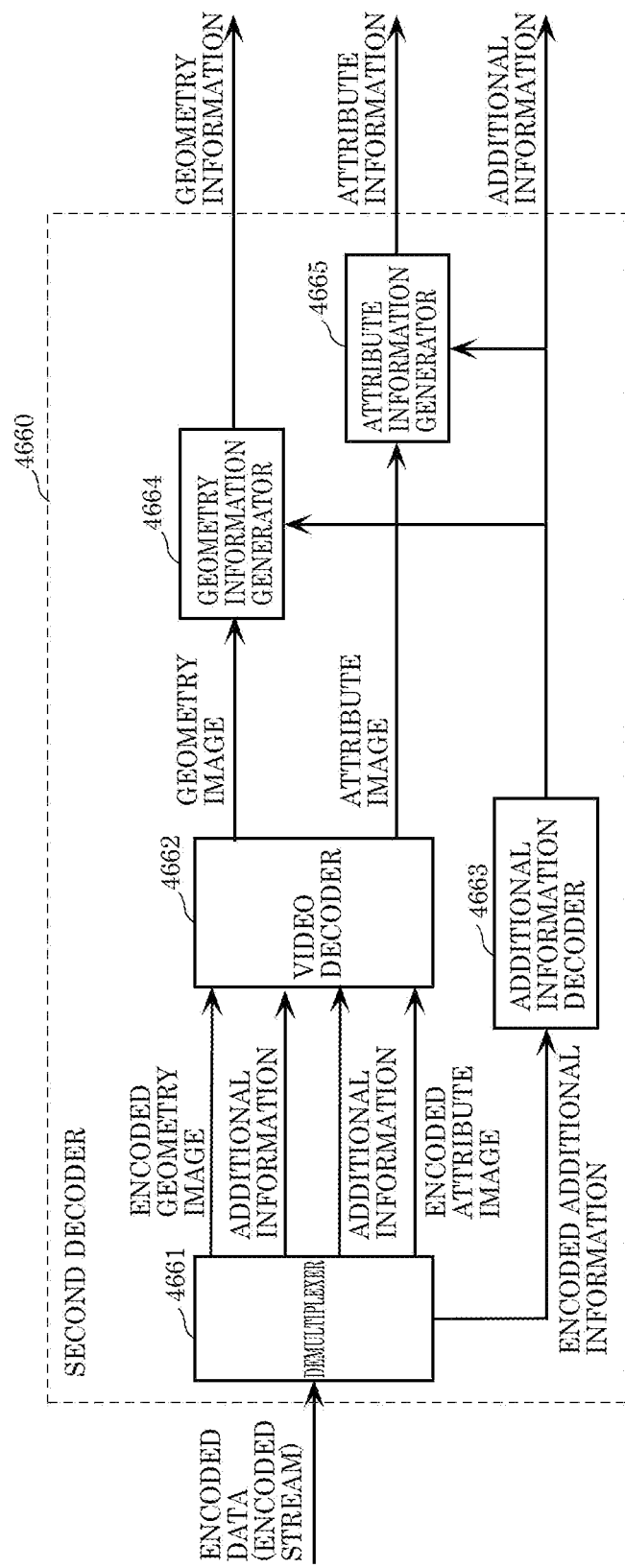
FIG. 12 is a block diagram illustrating the second decoder according to Embodiment 1.

Next, second decoder 4660, which is an example of decoder 4624 that performs decoding in the second encoding method, will be described. FIG. 11 is a diagram showing a configuration of second decoder 4660. FIG. 12 is a block diagram showing second decoder 4660. Second decoder 4660 generates point cloud data by decoding encoded data (encoded stream) encoded in the second encoding method in the second encoding method. Second decoder 4660 includes demultiplexer 4661, video decoder 4662, additional information decoder 4663, geometry information generator 4664, and attribute information generator 4665.

An encoded stream (compressed stream), which is encoded data, is input to second decoder 4660 from a processor in a system layer (not shown).

Demultiplexer 4661 separates an encoded geometry image (compressed geometry image), an encoded attribute image (compressed attribute image), an encoded additional information (compressed metadata), and other additional information from the encoded data.

Video decoder 4662 generates a geometry image and an attribute image by decoding the encoded geometry image and the encoded attribute image in a video encoding scheme. Note that, as the video encoding scheme, any well-known encoding method can be used. For example, the video encoding scheme is AVC or HEVC.

Additional information decoder 4663 generates additional information including map information or the like by decoding the encoded additional information.

Geometry information generator 4664 generates geometry information from the geometry image and the map information. Attribute information generator 4665 generates attribute information from the attribute image and the map information.

Second decoder 4660 uses additional information required for decoding in the decoding, and outputs additional information required for an application to the outside.

Figure 13:
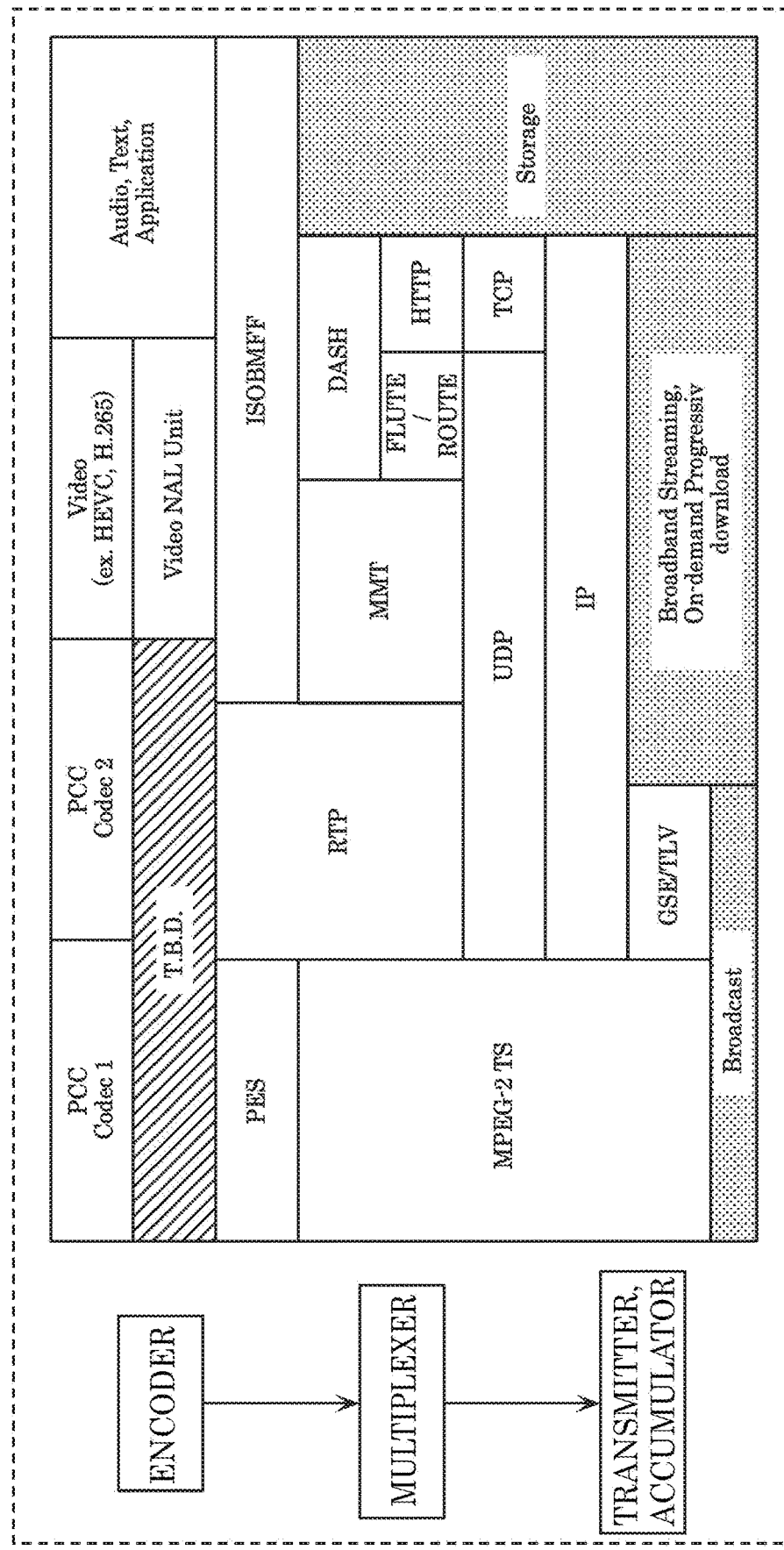
FIG. 13 is a diagram illustrating a protocol stack related to PCC encoded data according to Embodiment 1.

In the following, a problem with the PCC encoding scheme will be described. FIG. 13 is a diagram showing a protocol stack relating to PCC-encoded data. FIG. 13 shows an example in which PCC-encoded data is multiplexed with other medium data, such as a video (HEVC, for example) or an audio, and transmitted or accumulated.

A multiplexing scheme and a file format have a function of multiplexing various encoded data and transmitting or accumulating the data. To transmit or accumulate encoded data, the encoded data has to be converted into a format for the multiplexing scheme. For example, with HEVC, a technique for storing encoded data in a data structure referred to as a NAL unit and storing the NAL unit in ISOBMFF is prescribed.

At present, a first encoding method (Codec1) and a second encoding method (Codec2) are under investigation as encoding methods for point cloud data. However, there is no method defined for storing the configuration of encoded data and the encoded data in a system format. Thus, there is a problem that an encoder cannot perform an MUX process (multiplexing), transmission, or accumulation of data.

Note that, in the following, the term "encoding method" means any of the first encoding method and the second encoding method unless a particular encoding method is specified.

Embodiment 2

In Embodiment 2, a method of storing the NAL unit in an ISOBMFF file will be described.

ISOBMFF is a file format standard prescribed in ISO/IEC14496-12. ISOBMFF is a standard that does not depend on any medium, and prescribes a format that allows various media, such as a video, an audio, and a text, to be multiplexed and stored.

A basic structure (file) of ISOBMFF will be described. A basic unit of ISOBMFF is a box. A box is formed by type, length, and data, and a file is a set of various types of boxes.

FIG. 14 is a diagram showing a basic structure (file) of ISOBMFF. A file in ISOBMFF includes boxes, such as ftyp that indicates the brand of the file by four-character code (4CC), moov that stores metadata, such as control information (signaling information), and mdat that stores data.

A method for storing each medium in the ISOBMFF file is separately prescribed. For example, a method of storing an AVC video or an HEVC video is prescribed in ISO/IEC14496-15. Here, it can be contemplated to expand the functionality of ISOBMFF and use ISOBMFF to accumulate or transmit PCC-encoded data. However, there has been no convention for storing PCC-encoded data in an ISOBMFF file. In this embodiment, a method of storing PCC-encoded data in an ISOBMFF file will be described.

FIG. 15 is a diagram showing a protocol stack in a case where a common PCC codec NAL unit in an ISOBMFF file. Here, a common PCC codec NAL unit is stored in an ISOBMFF file. Although the NAL unit is common to PCC codecs, a storage method for each codec (Carriage of Codec1, Carriage of Codec2) is desirably prescribed, since a plurality of PCC codecs are stored in the NAL unit.

Figure 16:
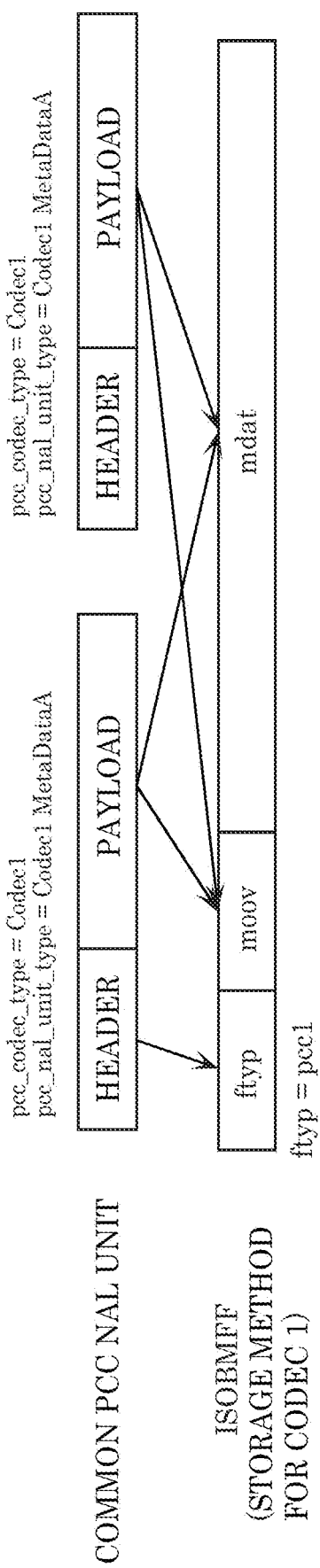
FIG. 16 is a diagram illustrating an example where a NAL unit is stored in a file for codec 1 according to Embodiment 2.
Figure 17:
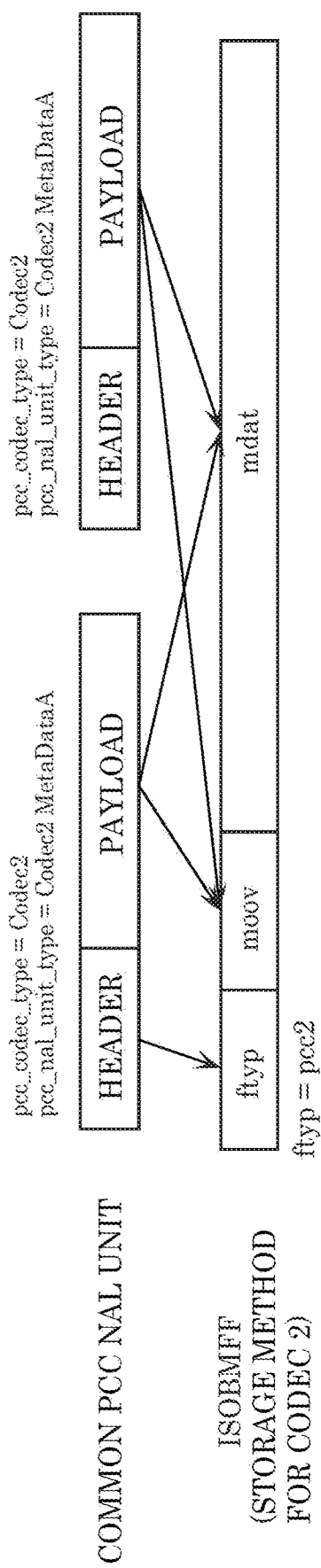
FIG. 17 is a diagram illustrating an example where a NAL unit is stored in a file for codec 2 according to Embodiment 2.

Next, a method of storing a common PCC NAL unit that supports a plurality of PCC codecs in an ISOBMFF file will be described. FIG. 16 is a diagram showing an example in which a common PCC NAL unit is stored in an ISOBMFF file for the storage method for codec 1 (Carriage of Codec1). FIG. 17 is a diagram showing an example in which a common PCC NAL unit is stored in an ISOBMFF file for the storage method for codec 2 (Carriage of Codec2).

Here, ftyp is information that is important for identification of the file format, and a different identifier of ftyp is defined for each codec. When PCC-encoded data encoded in the first encoding method (encoding scheme) is stored in the file, ftyp is set to pcc1. When PCC-encoded data encoded in the second encoding method is stored in the file, ftyp is set to pcc2.

Here, pcc1 indicates that PCC codec 1 (first encoding method) is used. pcc2 indicates that PCC codec 2 (second encoding method) is used. That is, pcc1 and pcc2 indicate that the data is PCC (encoded three-dimensional data (point cloud data)), and indicate the PCC codec (first encoding method or second encoding method).

In the following, a method of storing a NAL unit in an ISOBMFF file will be described. The multiplexer analyzes the NAL unit header, and describes pcc1 in ftyp of ISOBMFF if pcc_codec_type=Codec1.

The multiplexer analyzes the NAL unit header, and describes pcc2 in ftyp of ISOBMFF if pec_codec_type=Codec2.

If pcc_nal_unit_type is metadata, the multiplexer stores the NAL unit in moov or mdat in a predetermined manner, for example. If pcc_nal_unit_type is data, the multiplexer stores the NAL unit in moov or mdat in a predetermined manner, for example.

For example, the multiplexer may store the NAL unit size in the NAL unit, as with HEVC.

According to this storage method, the demultiplexer (a system layer) can determine whether the PCC-encoded data is encoded in the first encoding method or the second encoding method by analyzing ftyp included in the file. Furthermore, as described above, by determining whether the PCC-encoded data is encoded in the first encoding method or the second encoding method, the encoded data encoded in any one of the encoding methods can be extracted from the data including both the encoded data encoded in the encoding methods. Therefore, when transmitting the encoded data, the amount of data transmitted can be reduced. In addition, according to this storage method, different data (file) formats do not need to be set for the first encoding method and the second encoding method, and a common data format can be used for the first encoding method and the second encoding method.

Note that, when the identification information for the codec, such as ftyp of ISOBMFF, is indicated in the metadata of the system layer, the multiplexer can store a NAL unit without pcc_nal_unit_type in the ISOBMFF file.

Next, configurations and operations of the multiplexer of the three-dimensional data encoding system (three-dimensional data encoding device) according to this embodiment and the demultiplexer of the three-dimensional data decoding system (three-dimensional data decoding device) according to this embodiment will be described.

Figure 18:
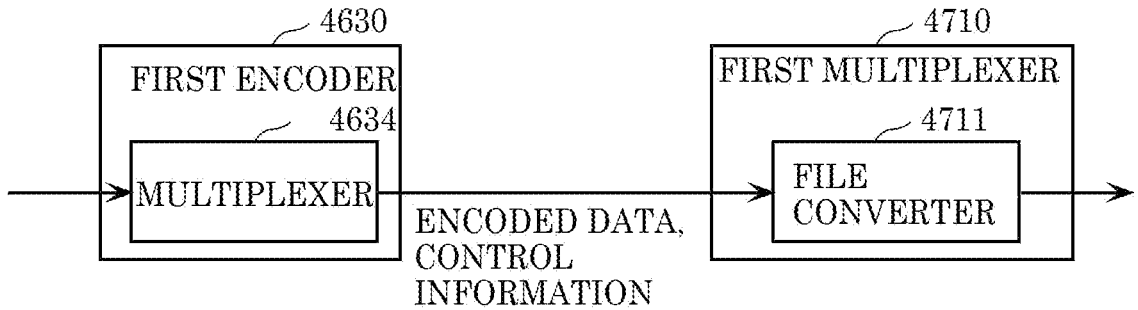
FIG. 18 is a diagram illustrating a structure of a first multiplexer according to Embodiment 2.

FIG. 18 is a diagram showing a configuration of first multiplexer 4710. First multiplexer 4710 includes file converter 4711 that generates multiplexed data (file) by storing encoded data generated by first encoder 4630 and control information (NAL unit) in an ISOBMFF file. First multiplexer 4710 is included in multiplexer 4614 shown in FIG. 1, for example.

Figure 19:
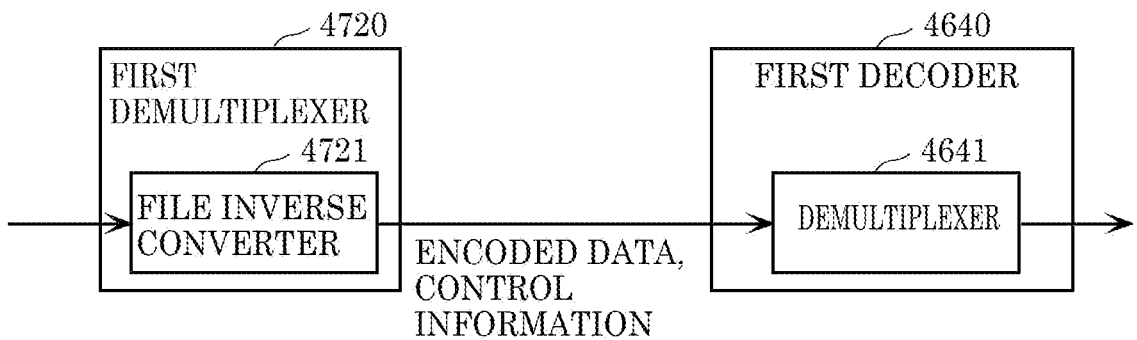
FIG. 19 is a diagram illustrating a structure of a first demultiplexer according to Embodiment 2.

FIG. 19 is a diagram showing a configuration of first demultiplexer 4720. First demultiplexer 4720 includes file inverse converter 4721 that obtains encoded data and control information (NAL unit) from multiplexed data (file) and outputs the obtained encoded data and control information to first decoder 4640. First demultiplexer 4720 is included in demultiplexer 4623 shown in FIG. 1, for example.

Figure 20:
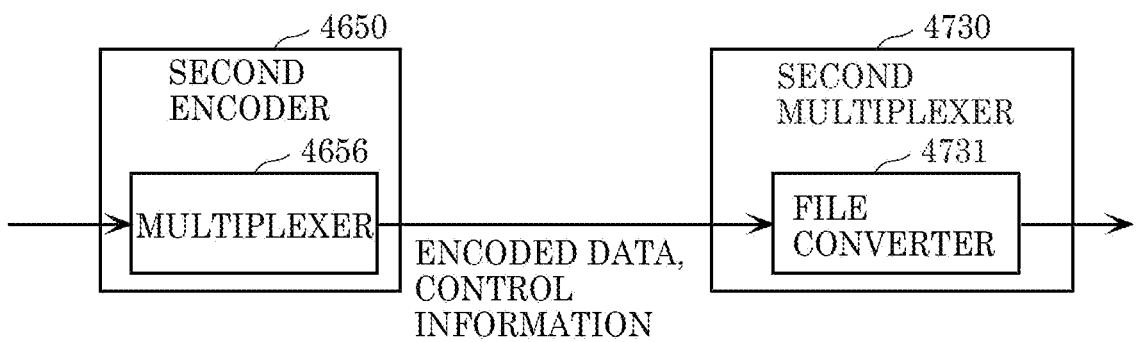
FIG. 20 is a diagram illustrating a structure of a second multiplexer according to Embodiment 2.

FIG. 20 is a diagram showing a configuration of second multiplexer 4730. Second multiplexer 4730 includes file converter 4731 that generates multiplexed data (file) by storing encoded data generated by second encoder 4650 and control information (NAL unit) in an ISOBMFF file. Second multiplexer 4730 is included in multiplexer 4614 shown in FIG. 1, for example.

Figure 21:
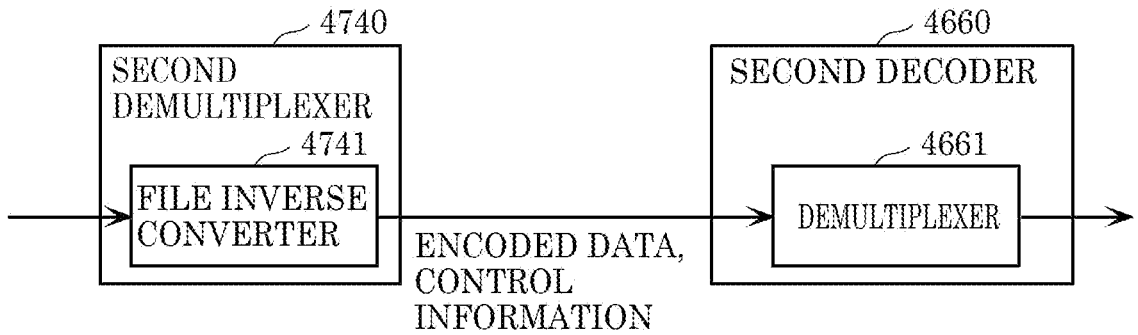
FIG. 21 is a diagram illustrating a structure of a second demultiplexer according to Embodiment 2.

FIG. 21 is a diagram showing a configuration of second demultiplexer 4740. Second demultiplexer 4740 includes file inverse converter 4741 that obtains encoded data and control information (NAL unit) from multiplexed data (file) and outputs the obtained encoded data and control information to second decoder 4660. Second demultiplexer 4740 is included in demultiplexer 4623 shown in FIG. 1, for example.

Figure 22:
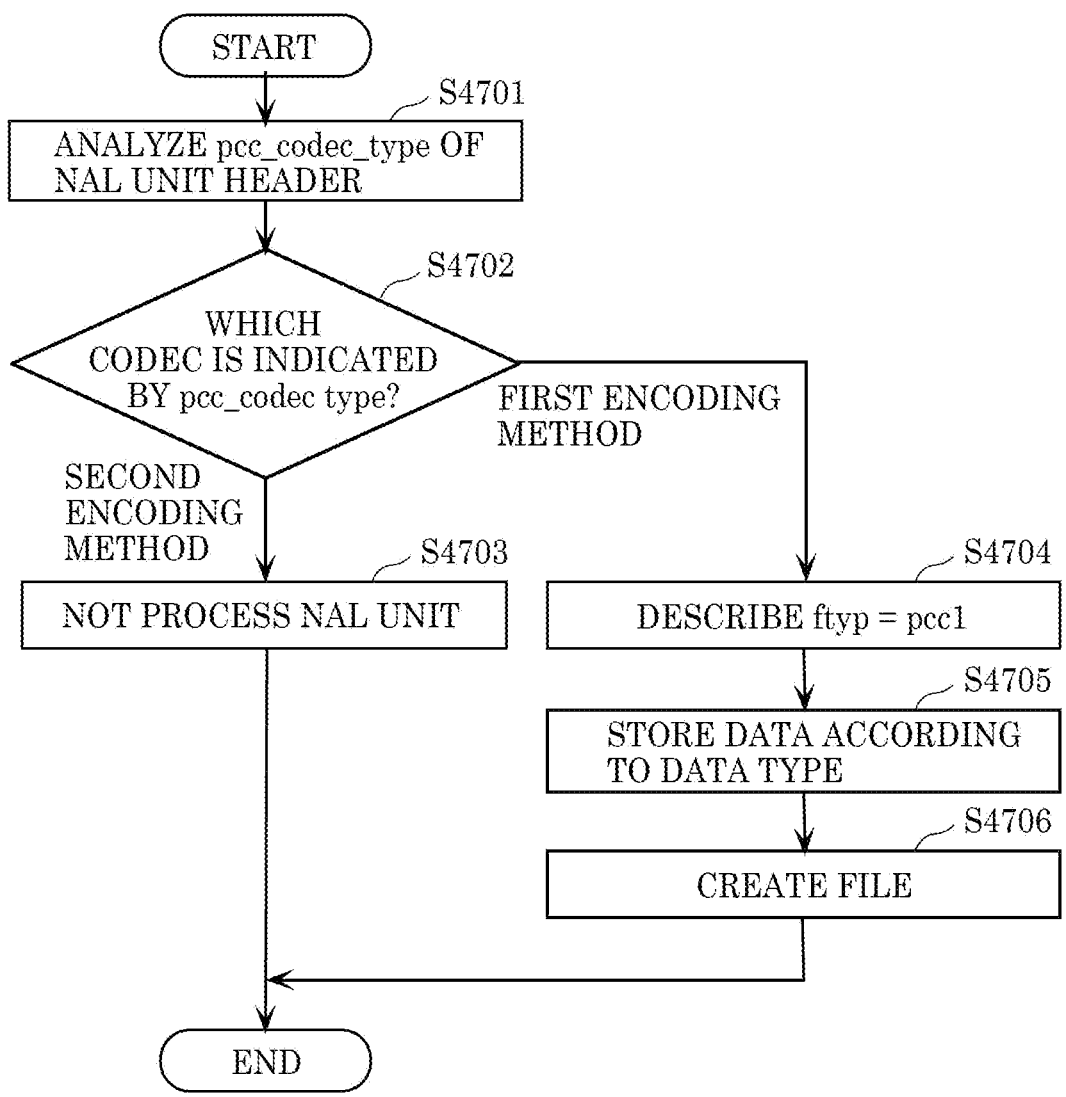
FIG. 22 is a flowchart of processing performed by the first multiplexer according to Embodiment 2.

FIG. 22 is a flowchart showing a multiplexing process by first multiplexer 4710. First, first multiplexer 4710 analyzes pec_codec_type in the NAL unit header, thereby determining whether the codec used is the first encoding method or the second encoding method (S4701).

When pec_codec_type represents the second encoding method (if "second encoding method" in S4702), first multiplexer 4710 does not process the NAL unit (S4703).

On the other hand, when pcc_codec_type represents the first encoding method (if "first encoding method" in S4702), first multiplexer 4710 describes pcc1 in ftyp (S4704). That is, first multiplexer 4710 describes information indicating that data encoded in the first encoding method is stored in the file in ftyp.

First multiplexer 4710 then analyzes pec_nal_unit_type in the NAL unit header, and stores the data in a box (moov or mdat, for example) in a predetermined manner suitable for the data type represented by pec_nal_unit_type (S4705). First multiplexer 4710 then creates an ISOBMFF file including the ftyp described above and the box described above (S4706).

Figure 23:
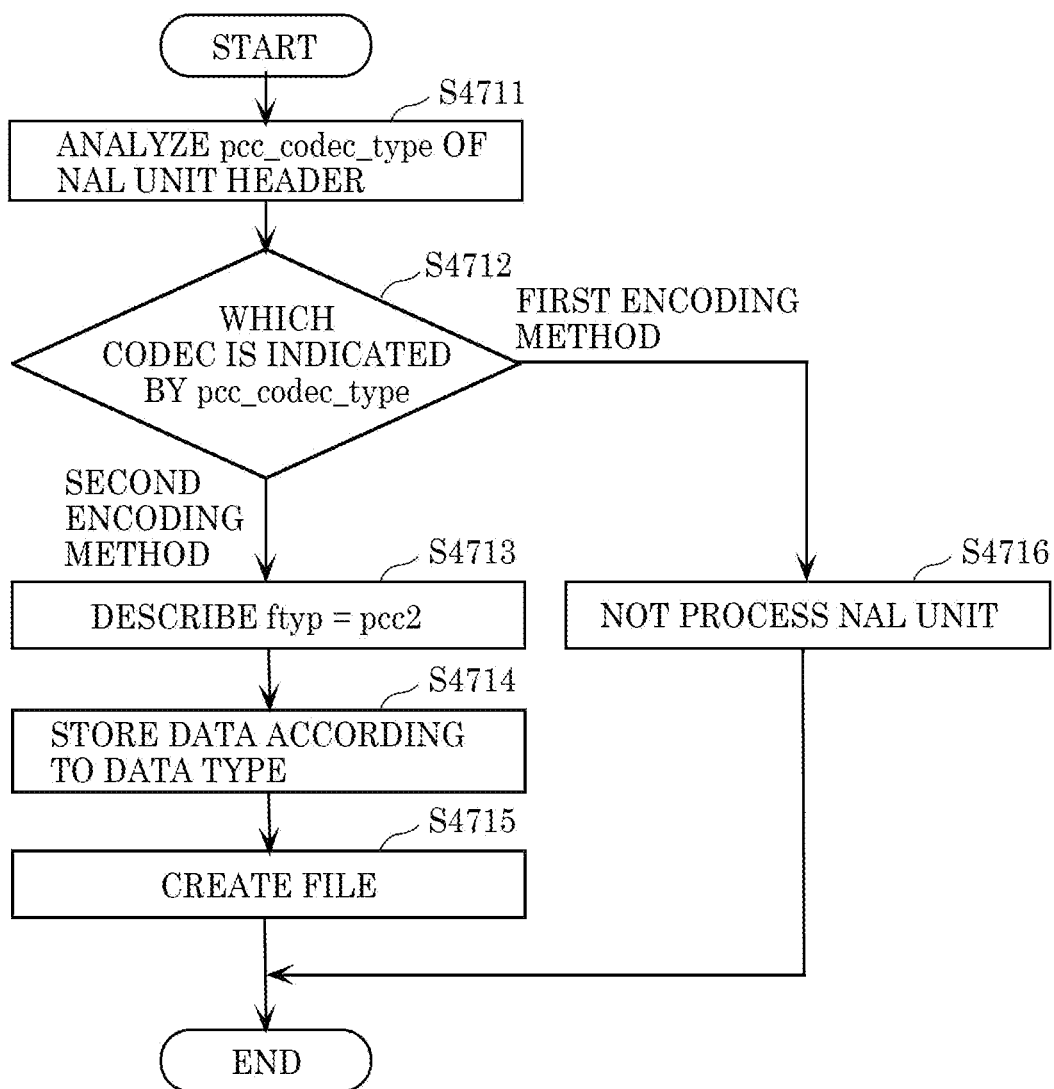
FIG. 23 is a flowchart of processing performed by the second multiplexer according to Embodiment 2.

FIG. 23 is a flowchart showing a multiplexing process by second multiplexer 4730. First, second multiplexer 4730 analyzes pcc_codec_type in the NAL unit header, thereby determining whether the codec used is the first encoding method or the second encoding method (S4711).

When pec_codec_type represents the second encoding method (if "second encoding method" in S4712), second multiplexer 4730 describes pcc2 in ftyp (S4713). That is, second multiplexer 4730 describes information indicating that data encoded in the second encoding method is stored in the file in ftyp.

Second multiplexer 4730 then analyzes pcc_nal_unit_type in the NAL unit header, and stores the data in a box (moov or mdat, for example) in a predetermined manner suitable for the data type represented by pcc_nal_unit_type (S4714). Second multiplexer 4730 then creates an ISOBMFF file including the ftyp described above and the box described above (S4715).

On the other hand, when pcc_codec_type represents the first encoding method (if "first encoding method" in S4712), second multiplexer 4730 does not process the NAL unit (S4716).

Note that the process described above is an example in which PCC data is encoded in any one of the first encoding method and the second encoding method. First multiplexer 4710 and second multiplexer 4730 store a desired NAL unit in a file by identifying the codec type of the NAL unit. Note that, when the identification information for the PCC codec is included in a location other than the NAL unit header, first multiplexer 4710 and second multiplexer 4730 may identify the codec type (first encoding method or second encoding method) based on the identification information for the PCC codec included in the location other than the NAL unit header in step S4701 or S4711.

When storing data in a file in step S4706 or S4714, first multiplexer 4710 and second multiplexer 4730 may store the data in the file after deleting pcc_nal_unit_type from the NAL unit header.

Figure 24:
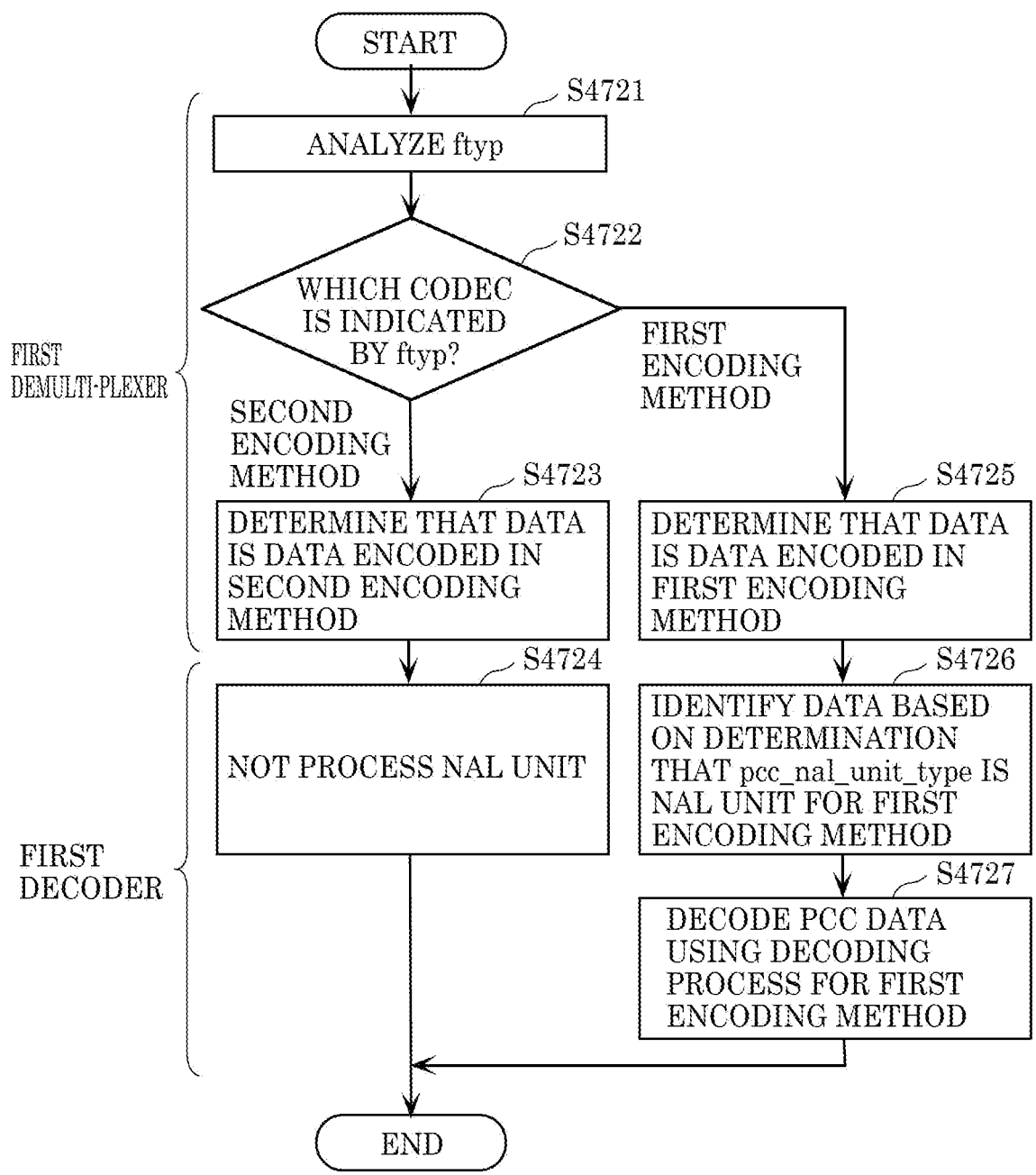
FIG. 24 is a flowchart of processing performed by the first demultiplexer and the first decoder according to Embodiment 2.

FIG. 24 is a flowchart showing a process performed by first demultiplexer 4720 and first decoder 4640. First, first demultiplexer 4720 analyzes ftyp in an ISOBMFF file (S4721). When the codec represented by ftyp is the second encoding method (pcc2) (if "second encoding method" in S4722), first demultiplexer 4720 determines that the data included in the payload of the NAL unit is data encoded in the second encoding method (S4723). First demultiplexer 4720 also transmits the result of the determination to first decoder 4640. First decoder 4640 does not process the NAL unit (S4724).

On the other hand, when the codec represented by ftyp is the first encoding method (pcc1) (if "first encoding method" in S4722), first demultiplexer 4720 determines that the data included in the payload of the NAL unit is data encoded in the first encoding method (S4725). First demultiplexer 4720 also transmits the result of the determination to first decoder 4640.

First decoder 4640 identifies the data based on the determination that pcc_nal_unit_type in the NAL unit header is the identifier of the NAL unit for the first encoding method (S4726). First decoder 4640 then decodes the PCC data using a decoding process for the first encoding method (S4727).

Figure 25:
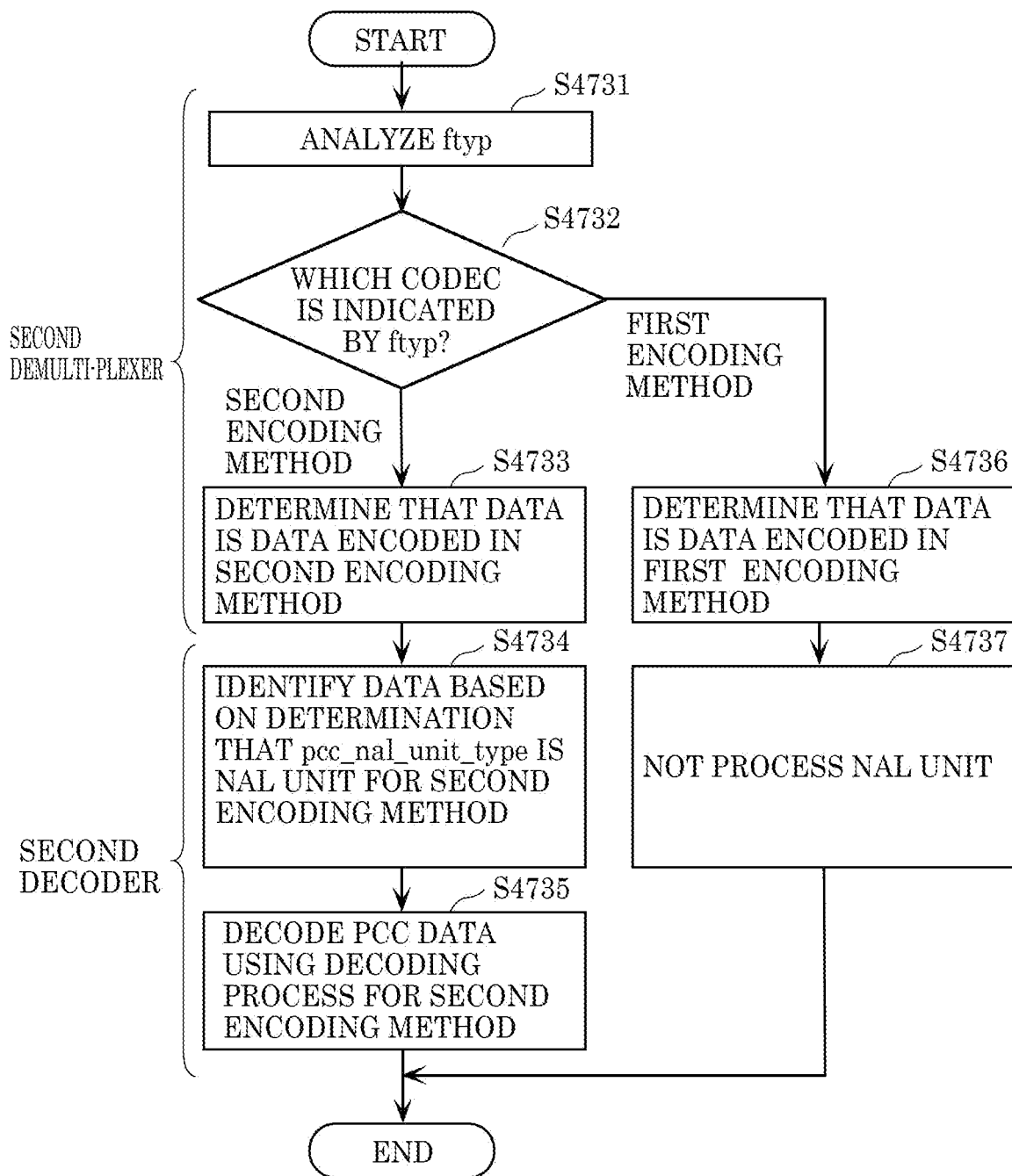
FIG. 25 is a flowchart of processing performed by the second demultiplexer and the second decoder according to Embodiment 2.

FIG. 25 is a flowchart showing a process performed by second demultiplexer 4740 and second decoder 4660. First, second demultiplexer 4740 analyzes ftyp in an ISOBMFF file (S4731). When the codec represented by ftyp is the second encoding method (pcc2) (if "second encoding method" in S4732), second demultiplexer 4740 determines that the data included in the payload of the NAL unit is data encoded in the second encoding method (S4733). Second demultiplexer 4740 also transmits the result of the determination to second decoder 4660.

Second decoder 4660 identifies the data based on the determination that pcc_nal_unit_type in the NAL unit header is the identifier of the NAL unit for the second encoding method (S4734). Second decoder 4660 then decodes the PCC data using a decoding process for the second encoding method (S4735).

On the other hand, when the codec represented by ftyp is the first encoding method (pcc1) (if "first encoding method" in S4732), second demultiplexer 4740 determines that the data included in the payload of the NAL unit is data encoded in the first encoding method (S4736). Second demultiplexer 4740 also transmits the result of the determination to second decoder 4660. Second decoder 4660 does not process the NAL unit (S4737).

As described above, for example, since the codec type of the NAL unit is identified in first demultiplexer 4720 or second demultiplexer 4740, the codec type can be identified in an early stage. Furthermore, a desired NAL unit can be input to first decoder 4640 or second decoder 4660, and an unwanted NAL unit can be removed. In this case, the process of first decoder 4640 or second decoder 4660 analyzing the identification information for the codec may be unnecessary. Note that a process of referring to the NAL unit type again and analyzing the identification information for the codec may be performed by first decoder 4640 or second decoder 4660.

Furthermore, if pcc_nal_unit_type is deleted from the NAL unit header by first multiplexer 4710 or second multiplexer 4730, first demultiplexer 4720 or second demultiplexer 4740 can output the NAL unit to first decoder 4640 or second decoder 4660 after adding pcc_nal_unit_type to the NAL unit.

Embodiment 3

Figure 26:
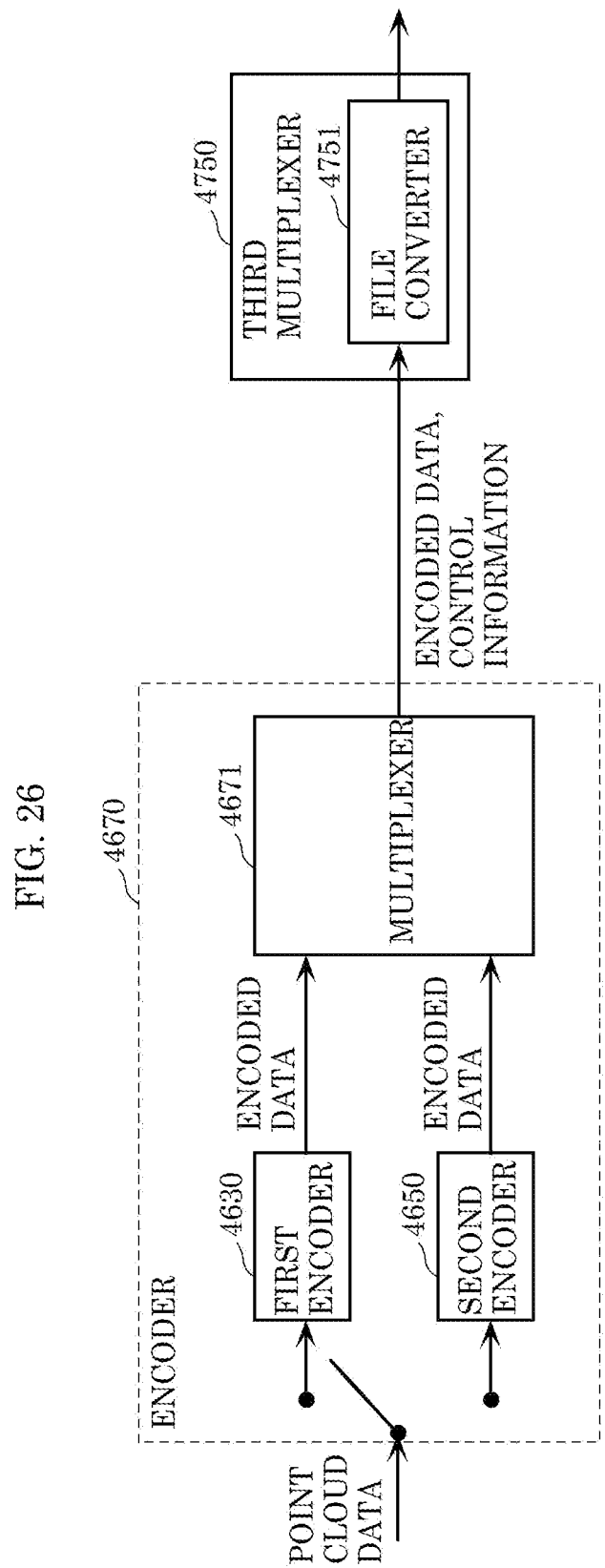
FIG. 26 is a diagram illustrating structures of an encoder and a third multiplexer according to Embodiment 3.

In Embodiment 3, a multiplexer and a demultiplexer that correspond to encoder 4670 and decoder 4680 ready for a plurality of codecs described above with regard to Embodiment 1 will be described. FIG. 26 is a diagram showing configurations of encoder 4670 and third multiplexer 4750 according to this embodiment.

Encoder 4670 encodes point cloud data in both or one of the first encoding method and the second encoding method. Encoder 4670 may change the encoding method (between the first encoding method and the second encoding method) on a point-cloud-data basis or on a frame basis. Alternatively, encoder 4670 may change the encoding method on the basis of an encodable unit.

Encoder 4670 generates encoded data (encoded stream) including the identification information for a PCC codec.

Third multiplexer 4750 includes file converter 4751. File converter 4751 converts a NAL unit output from encoder 4670 into a PCC data file. File converter 4751 analyzes the codec identification information included in the NAL unit header, and determines whether the PCC-encoded data is data encoded in the first encoding method, data encoded in the second encoding method, or data encoded in both the encoding methods. File converter 4751 describes a brand name that allows codec identification in ftyp. For example, when indicating the data is encoded in both the encoding methods, pcc3 is described in ftyp.

Note that, when encoder 4670 describes the PCC codec identification information in a location other than the NAL unit, file converter 4751 may determine the PCC codec (encoding method) based on the identification information.

Figure 27:
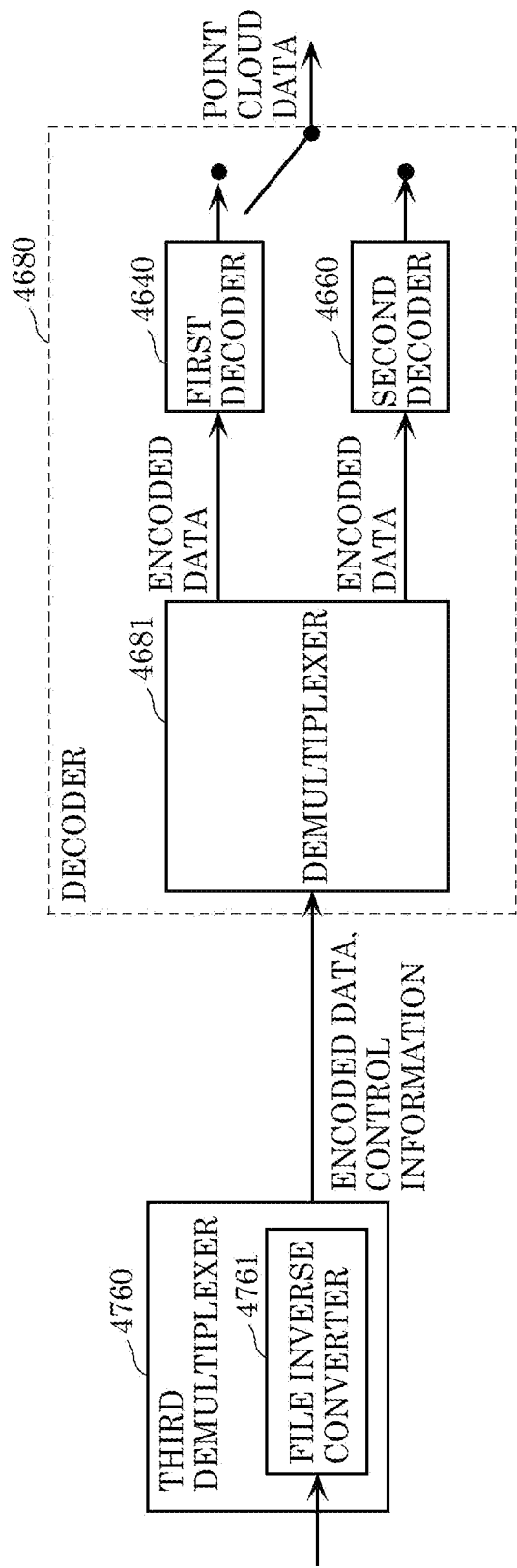
FIG. 27 is a diagram illustrating structures of a third demultiplexer and a decoder according to Embodiment 3.

FIG. 27 is a diagram showing configurations of third demultiplexer 4760 and decoder 4680 according to this embodiment.

Third demultiplexer 4760 includes file inverse converter 4761. File inverse converter 4761 analyzes ftyp included in a file, and determines whether the PCC-encoded data is data encoded in the first encoding method, data encoded in the second encoding method, or data encoded in both the encoding methods.

When the PCC-encoded data is data encoded in any one of the encoding methods, the data is input to an appropriate one of first decoder 4640 and second decoder 4660, and is not input to the other decoder. When the PCC-encoded data is data encoded in both the encoding methods, the data is input to decoder 4680 ready for both the encoding methods.

Decoder 4680 decodes the PCC-encoded data in both or one of the first encoding method and the second encoding method.

Figure 28:
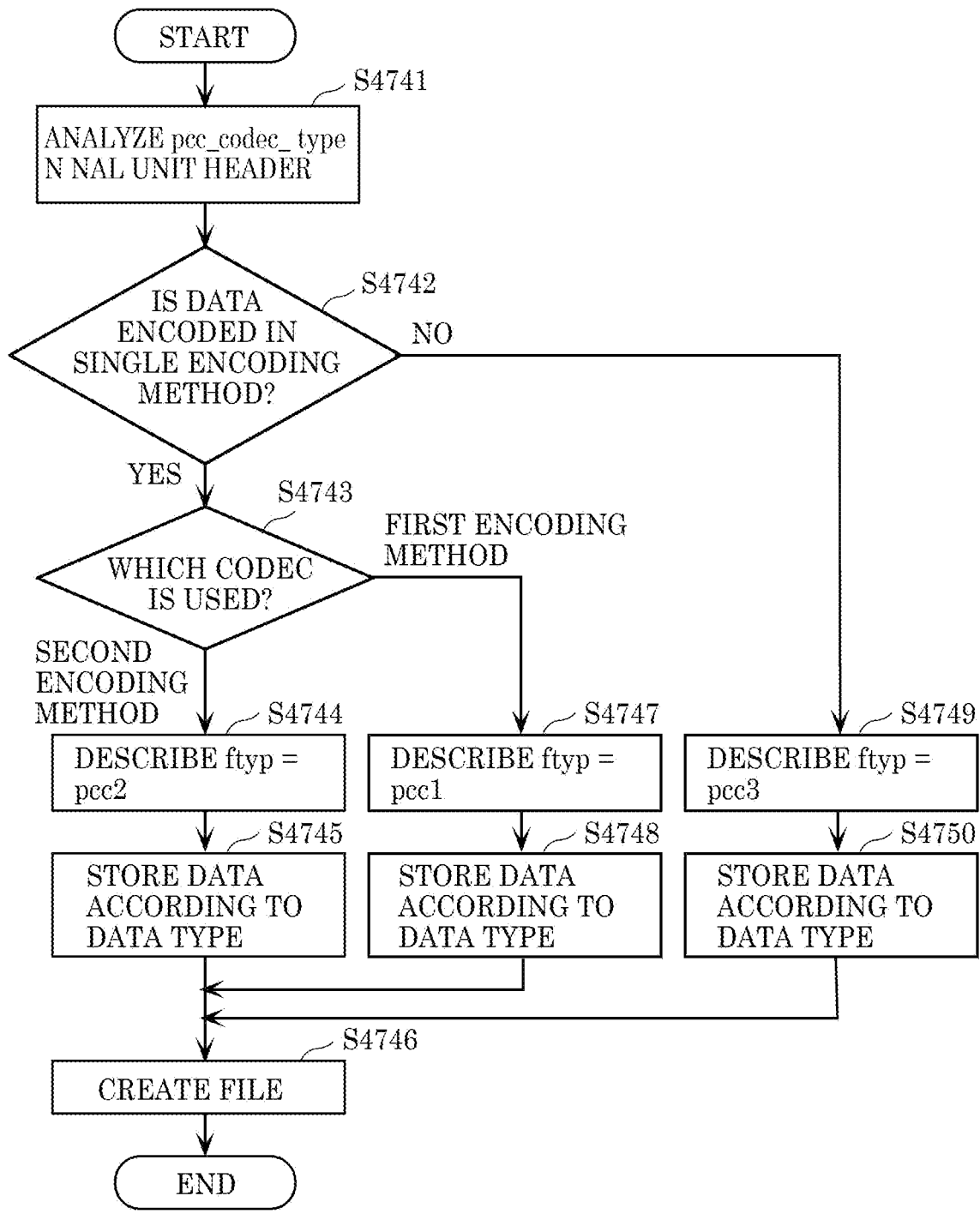
FIG. 28 is a flowchart of processing performed by the third multiplexer according to Embodiment 3.

FIG. 28 is a flowchart showing a process performed by third multiplexer 4750 according to this embodiment.

First, third multiplexer 4750 analyzes pec_codec_type in the NAL unit header, thereby determining whether the codec(s) used is the first encoding method, the second encoding method, or both the first encoding method and the second encoding method (S4741).

When the second encoding method is used (if Yes in S4742 and "second encoding method" in S4743), third multiplexer 4750 describes pcc2 in ftyp (S4744). That is, third multiplexer 4750 describes information indicating that data encoded in the second encoding method is stored in the file in ftyp.

Third multiplexer 4750 then analyzes pec_nal_unit_type in the NAL unit header, and stores the data in a box (moov or mdat, for example) in a predetermined manner suitable for the data type represented by pec_nal_unit_type (S4745). Third multiplexer 4750 then creates an ISOBMFF file including the ftyp described above and the box described above (S4746).

When the first encoding method is used (if Yes in S4742 and "first encoding method" in S4743), third multiplexer 4750 describes pcc1 in ftyp (S4747). That is, third multiplexer 4750 describes information indicating that data encoded in the first encoding method is stored in the file in ftyp.

Third multiplexer 4750 then analyzes pcc_nal_unit_type in the NAL unit header, and stores the data in a box (moov or mdat, for example) in a predetermined manner suitable for the data type represented by pcc_nal_unit_type (S4748). Third multiplexer 4750 then creates an ISOBMFF file including the ftyp described above and the box described above (S4746).

When both the first encoding method and the second encoding method are used (if No in S4742), third multiplexer 4750 describes pcc3 in ftyp (S4749). That is, third multiplexer 4750 describes information indicating that data encoded in both the encoding methods is stored in the file in ftyp.

Third multiplexer 4750 then analyzes pcc_nal_unit_type in the NAL unit header, and stores the data in a box (moov or mdat, for example) in a predetermined manner suitable for the data type represented by pcc_nal_unit_type (S4750). Third multiplexer 4750 then creates an ISOBMFF file including the ftyp described above and the box described above (S4746).

Figure 29:
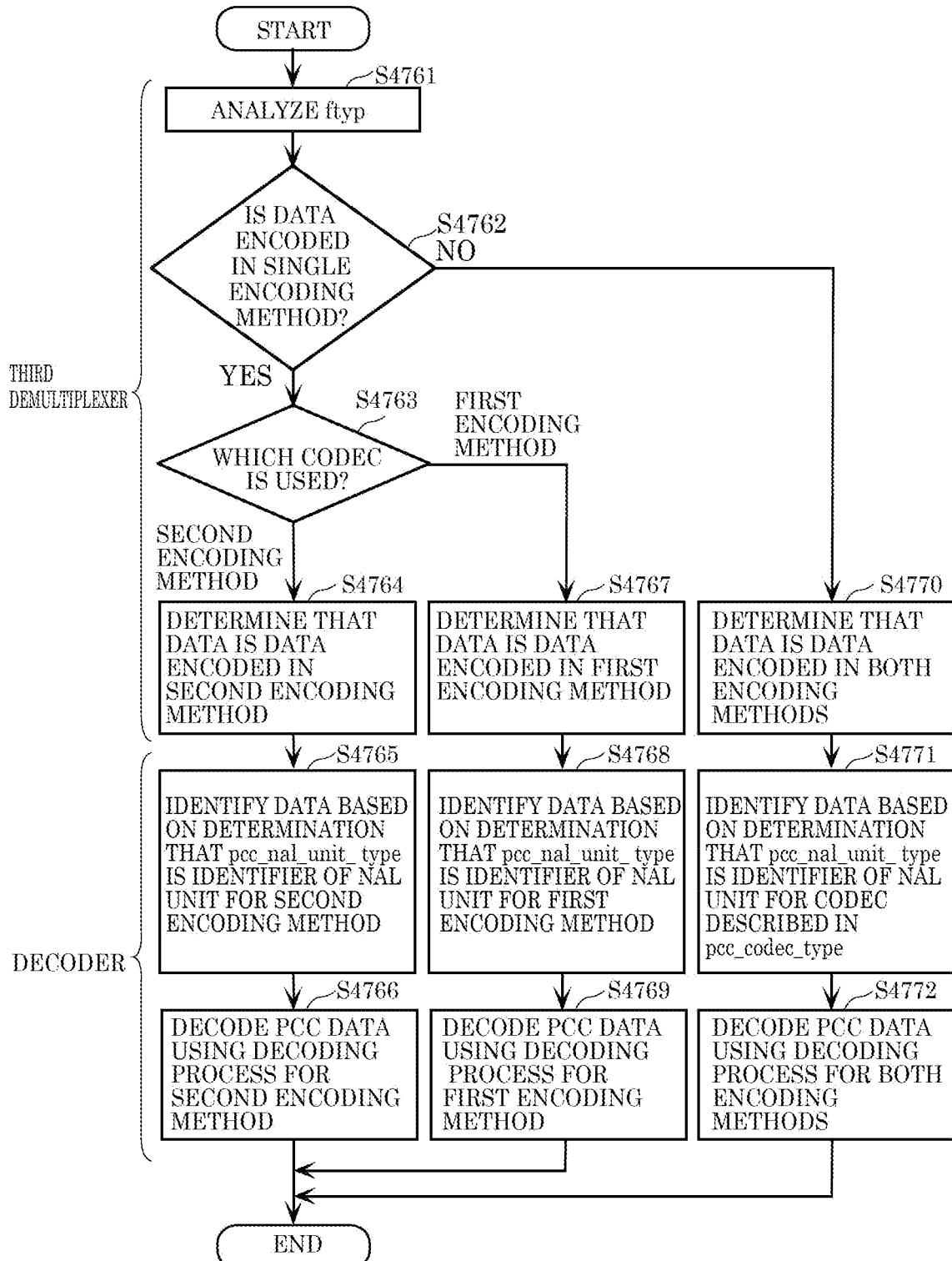
FIG. 29 is a flowchart of processing performed by the third demultiplexer and the decoder according to Embodiment 3.

FIG. 29 is a flowchart showing a process performed by third demultiplexer 4760 and decoder 4680. First, third demultiplexer 4760 analyzes ftyp included in an ISOBMFF file (S4761). When the codec represented by ftyp is the second encoding method (pcc2) (if Yes in S4762 and "second encoding method" in S4763), third demultiplexer 4760 determines that the data included in the payload of the NAL unit is data encoded in the second encoding method (S4764). Third demultiplexer 4760 also transmits the result of the determination to decoder 4680.

Decoder 4680 identifies the data based on the determination that pcc_nal_unit_type in the NAL unit header is the identifier of the NAL unit for the second encoding method (S4765). Decoder 4680 then decodes the PCC data using a decoding process for the second encoding method (S4766).

When the codec represented by ftyp is the first encoding method (pcc1) (if Yes in S4762 and "first encoding method" in S4763), third demultiplexer 4760 determines that the data included in the payload of the NAL unit is data encoded in the first encoding method (S4767). Third demultiplexer 4760 also transmits the result of the determination to decoder 4680.

Decoder 4680 identifies the data based on the determination that pcc_nal_unit_type in the NAL unit header is the identifier of the NAL unit for the first encoding method (S4768). Decoder 4680 then decodes the PCC data using a decoding process for the first encoding method (S4769).

When ftyp indicates that both the encoding methods are used (pcc3) (if No in S4762), third demultiplexer 4760 determines that the data included in the payload of the NAL unit is data encoded in both the first encoding method and the second encoding method (S4770). Third demultiplexer 4760 also transmits the result of the determination to decoder 4680.

Decoder 4680 identifies the data based on the determination that pcc_nal_unit_type in the NAL unit header is the identifier of the NAL unit for the codecs described in pcc_codec_type (S4771). Decoder 4680 then decodes the PCC data using decoding processes for both the encoding methods (S4772). That is, decoder 4680 decodes the data encoded in the first encoding method using a decoding process for the first encoding method, and decodes the data encoded in the second encoding method using a decoding process for the second encoding method.

In the following, variations of this embodiment will be described. As types of brands represented by ftyp, the types described below can be indicated by the identification information. Furthermore, a combination of a plurality of the types described below can also be indicated by the identification information.

The identification information may indicate whether the original data object yet to be PCC-encoded is a point cloud whose range is limited or a large point cloud whose range is not limited, such as map information.

The identification information may indicate whether the original data yet to be PCC-encoded is a static object or a dynamic object.

As described above, the identification information may indicate whether the PCC-encoded data is data encoded in the first encoding method or data encoded in the second encoding method.

The identification information may indicate an algorithm used in the PCC encoding. Here, the "algorithm" means an encoding method that can be used in the first encoding method or the second encoding method, for example.

The identification information may indicate a differentiation between methods of storing the PCC-encoded data into an ISOBMFF file. For example, the identification information may indicate whether the storage method used is a storage method for accumulation or a storage method for real-time transmission, such as dynamic streaming.

Although an example in which ISOBMFF is used as a file format has been described in Embodiments 2 and 3, other formats can also be used. For example, the method according to this embodiment can also be used when PCC-encoded data is stored in MPEG-2 TS Systems, MPEG-DASH, MMT, or RMP.

Although an example in which metadata, such as the identification information, is stored in ftyp has been shown above, metadata can also be stored in a location other than ftyp. For example, the metadata may be stored in moov.

Figure 30:
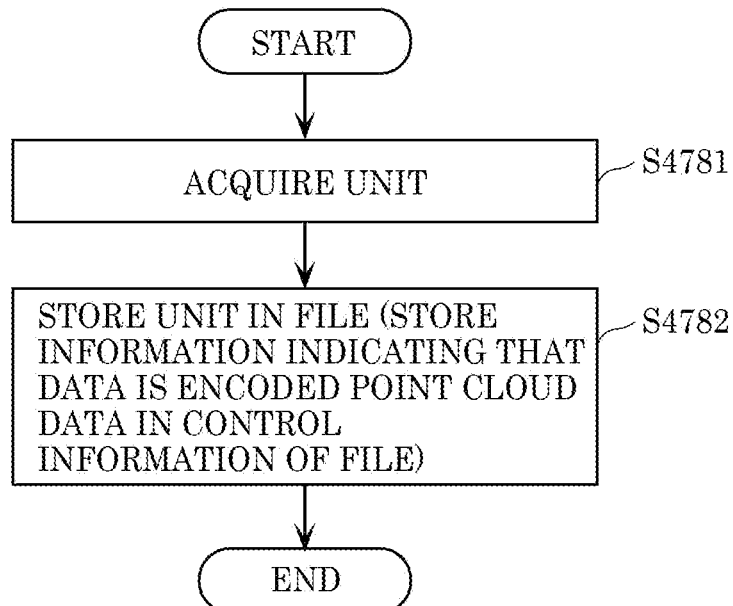
FIG. 30 is a flowchart of processing performed by a three-dimensional data storage device according to Embodiment 3.

As described above, a three-dimensional data storing device (or three-dimensional data multiplexing device or three-dimensional data encoding device) performs the process shown in FIG. 30.

First, the three-dimensional data storing device (which includes first multiplexer 4710, second multiplexer 4730 or third multiplexer 4750, for example) acquires one or more units (NAL units, for example) that store an encoded stream, which is encoded point cloud data (S4781). The three-dimensional data storing device then stores the one or more units in a file (an ISOBMFF file, for example) (S4782). In the storage (S4782), the three-dimensional data storing device also stores information indicating that the data stored in the file is encoded point cloud data (pcc1, pcc2, or pcc3, for example) in the control information (ftyp, for example) (referred to also as signaling information) for the file.

With such a configuration, a device that processes the file generated by the three-dimensional data storing device can quickly determine whether the data stored in the file is encoded point cloud data or not by referring to the control information for the file. Therefore, the processing amount of the device can be reduced, or the processing speed of the device can be increased.

For example, the information indicates the encoding method used for the encoding of the point cloud data among the first encoding method and the second encoding method. Note that the fact that the data stored in the file is encoded point cloud data and the encoding method used for the encoding of the point cloud data among the first encoding method and the second encoding method may be indicated by a single piece of information or different pieces of information.

With such a configuration, a device that processes the file generated by the three-dimensional data storing device can quickly determine the codec used for the data stored in the file by referring to the control information for the file. Therefore, the processing amount of the device can be reduced, or the processing speed of the device can be increased.

For example, the first encoding method is a method (GPCC) that encodes geometry information that represents the position of point cloud data as an N-ary tree (N represents an integer equal to or greater than 2) and encodes attribute information using the geometry information, and the second encoding method is a method (VPCC) that generates a two-dimensional image from point cloud data and encodes the two-dimensional image in a video encoding method.

For example, the file described above is in conformity with ISOBMFF (ISO-based media file format).

For example, the three-dimensional data storing device includes a processor and a memory, and the processor performs the processes described above using the memory.

Figure 31:
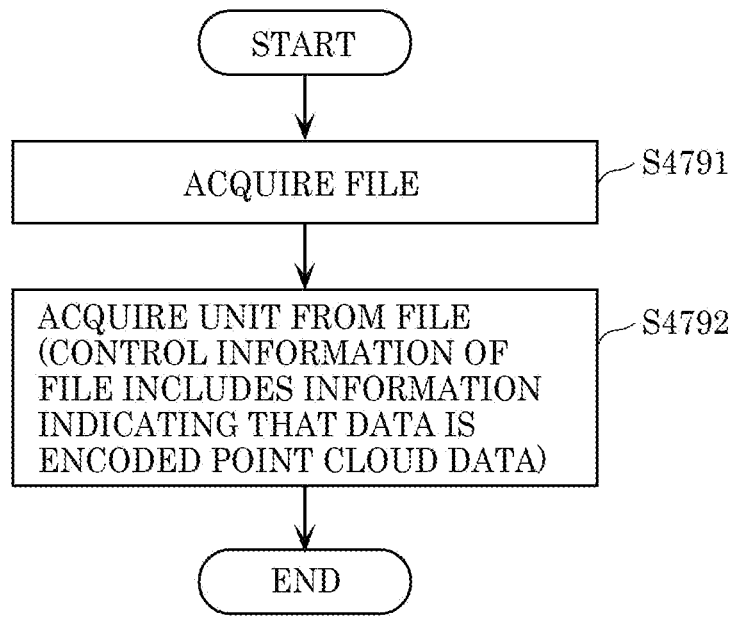
FIG. 31 is a flowchart of processing performed by a three-dimensional data acquisition device according to Embodiment 3.

As described above, a three-dimensional data acquisition device (or three-dimensional data demultiplexing device or three-dimensional data decoding device) performs the process shown in FIG. 31.

The three-dimensional data acquisition device (which includes first demultiplexer 4720, second demultiplexer 4740, or third demultiplexer 4760, for example) acquires a file (an ISOBMFF file, for example) that stores one or more units (NAL units, for example) that store an encoded stream, which is encoded point cloud data (S4791). The three-dimensional data acquisition device acquires the one or more units from the file (S4792). The control information (ftyp, for example) for the file includes information indicating that the data stored in the file is encoded point cloud data (pcc1, pcc2, or pcc3, for example).

For example, the three-dimensional data acquisition device determines whether the data stored in the file is encoded point cloud data or not by referring to the information. When the three-dimensional data acquisition device determines that the data stored in the file is encoded point cloud data, the three-dimensional data acquisition device generates point cloud data by decoding the encoded point cloud data included in the one or more units. Alternatively, when the three-dimensional data acquisition device determines that the data stored in the file is encoded point cloud data, the three-dimensional data acquisition device outputs information indicating that the data included in the one or more units is encoded point cloud data to a processor in a subsequent stage (first decoder 4640, second decoder 4660, or decoder 4680, for example) (or notifies a processor in a subsequent stage that the data included in the one or more units is encoded point cloud data).

With such a configuration, the three-dimensional data acquisition device can quickly determine whether the data stored in the file is encoded point cloud data or not by referring to the control information for the file. Therefore, the processing amount of the three-dimensional data acquisition device or a device in a subsequent stage can be reduced, or the processing speed of the three-dimensional data acquisition device or a device in a subsequent stage can be increased.

For example, the information represents the encoding method used for the encoding among the first encoding method and the second encoding method. Note that the fact that the data stored in the file is encoded point cloud data and the encoding method used for the encoding of the point cloud data among the first encoding method and the second encoding method may be indicated by a single piece of information or different pieces of information.

With such a configuration, the three-dimensional data acquisition device can quickly determine the codec used for the data stored in the file by referring to the control information for the file. Therefore, the processing amount of the three-dimensional data acquisition device or a device in a subsequent stage can be reduced, or the processing speed of the three-dimensional data acquisition device or a device in a subsequent stage can be increased.

For example, based on the information, the three-dimensional data acquisition device acquires the data encoded in any one of the first encoding method and the second encoding method from the encoded point cloud data including the data encoded in the first encoding method and the data encoded in the second encoding method.

For example, the first encoding method is a method (GPCC) that encodes geometry information that represents the position of point cloud data as an N-ary tree (N represents an integer equal to or greater than 2) and encodes attribute information using the geometry information, and the second encoding method is a method (VPCC) that generates a two-dimensional image from point cloud data and encodes the two-dimensional image in a video encoding method.

For example, the file described above is in conformity with ISOBMFF (ISO-based media file format).

For example, the three-dimensional data acquisition device includes a processor and a memory, and the processor performs the processes described above using the memory.

Embodiment 4

In this embodiment, types of the encoded data (geometry information (geometry), attribute information (attribute), and additional information (metadata)) generated by first encoder 4630 or second encoder 4650 described above, a method of generating additional information (metadata), and a multiplexing process in the multiplexer will be described. The additional information (metadata) may be referred to as a parameter set or control information (signaling information).

In this embodiment, the dynamic object (three-dimensional point cloud data that varies with time) described above with reference to FIG. 4 will be described, for example. However, the same method can also be used for the static object (three-dimensional point cloud data associated with an arbitrary time point).

Figure 32:
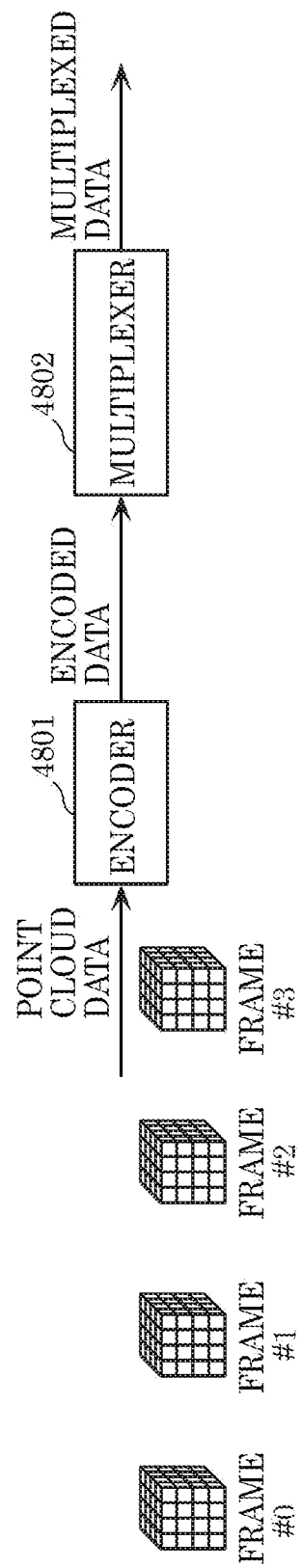
FIG. 32 is a diagram illustrating structures of an encoder and a multiplexer according to Embodiment 4.

FIG. 32 is a diagram showing configurations of encoder 4801 and multiplexer 4802 in a three-dimensional data encoding device according to this embodiment. Encoder 4801 corresponds to first encoder 4630 or second encoder 4650 described above, for example. Multiplexer 4802 corresponds to multiplexer 4634 or 4656 described above.

Encoder 4801 encodes a plurality of PCC (point cloud compression) frames of point cloud data to generate a plurality of pieces of encoded data (multiple compressed data) of geometry information, attribute information, and additional information.

Multiplexer 4802 integrates a plurality of types of data (geometry information, attribute information, and additional information) into a NAL unit, thereby converting the data into a data configuration that takes data access in the decoding device into consideration.

Figure 33:
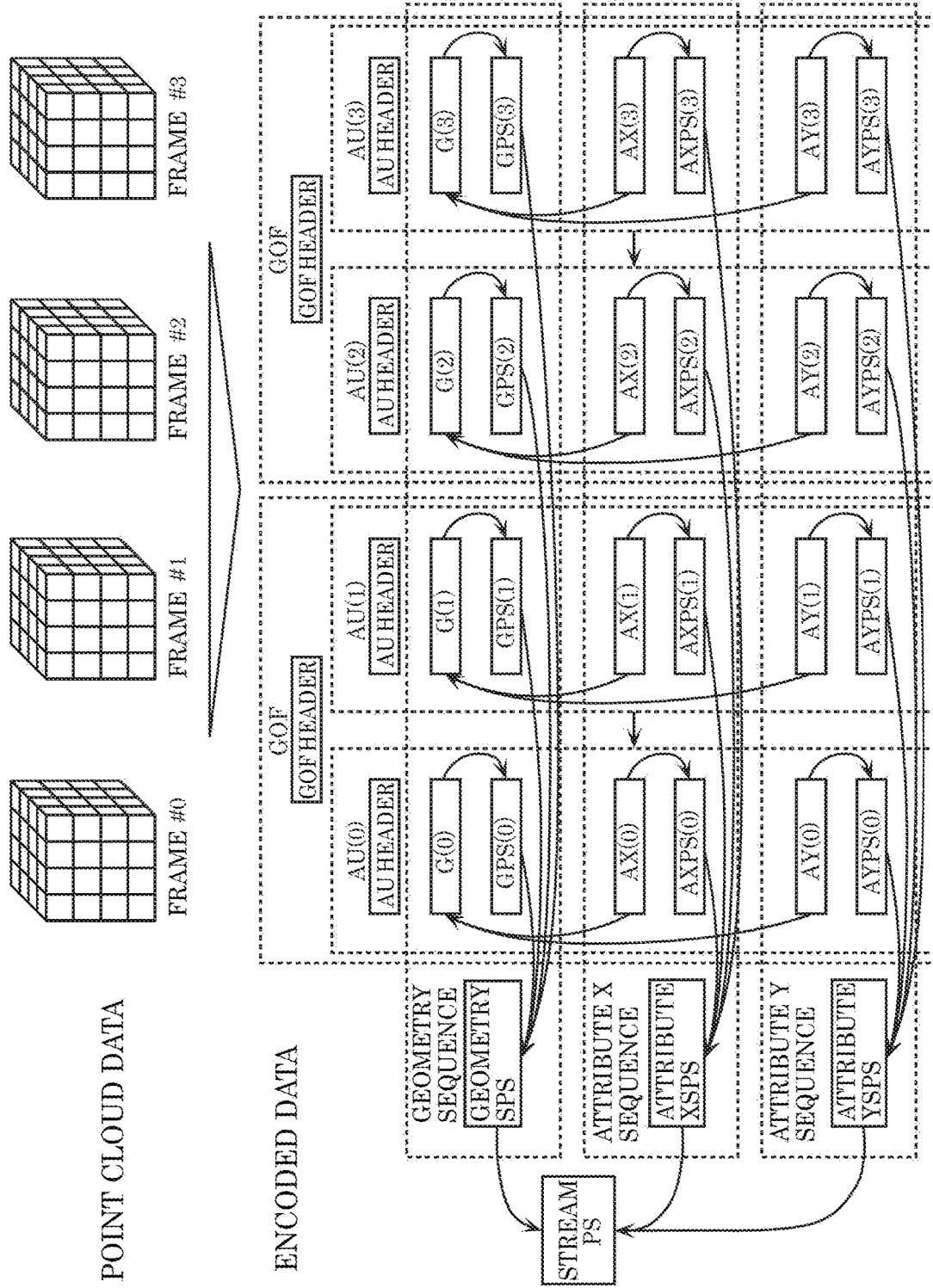
FIG. 33 is a diagram illustrating a structure example of encoded data according to Embodiment 4.

FIG. 33 is a diagram showing a configuration example of the encoded data generated by encoder 4801. Arrows in the drawing indicate a dependence involved in decoding of the encoded data. The source of an arrow depends on data of the destination of the arrow. That is, the decoding device decodes the data of the destination of an arrow, and decodes the data of the source of the arrow using the decoded data. In other words, "a first entity depends on a second entity" means that data of the second entity is referred to (used) in processing (encoding, decoding, or the like) of data of the first entity.

First, a process of generating encoded data of geometry information will be described. Encoder 4801 encodes geometry information of each frame to generate encoded geometry data (compressed geometry data) for each frame. The encoded geometry data is denoted by G(i). i denotes a frame number or a time point of a frame, for example.

Furthermore, encoder 4801 generates a geometry parameter set (GPS(i)) for each frame. The geometry parameter set includes a parameter that can be used for decoding of the encoded geometry data. The encoded geometry data for each frame depends on an associated geometry parameter set.

The encoded geometry data formed by a plurality of frames is defined as a geometry sequence. Encoder 4801 generates a geometry sequence parameter set (referred to also as geometry sequence PS or geometry SPS) that stores a parameter commonly used for a decoding process for the plurality of frames in the geometry sequence. The geometry sequence depends on the geometry SPS.

Next, a process of generating encoded data of attribute information will be described. Encoder 4801 encodes attribute information of each frame to generate encoded attribute data (compressed attribute data) for each frame. The encoded attribute data is denoted by A(i). FIG. 33 shows an example in which there are attribute X and attribute Y, and encoded attribute data for attribute X is denoted by AX(i), and encoded attribute data for attribute Y is denoted by AY(i).

Furthermore, encoder 4801 generates an attribute parameter set (APS(i)) for each frame. The attribute parameter set for attribute X is denoted by AXPS(i), and the attribute parameter set for attribute Y is denoted by AYPS(i). The attribute parameter set includes a parameter that can be used for decoding of the encoded attribute information. The encoded attribute data depends on an associated attribute parameter set.

The encoded attribute data formed by a plurality of frames is defined as an attribute sequence. Encoder 4801 generates an attribute sequence parameter set (referred to also as attribute sequence PS or attribute SPS) that stores a parameter commonly used for a decoding process for the plurality of frames in the attribute sequence. The attribute sequence depends on the attribute SPS.

In the first encoding method, the encoded attribute data depends on the encoded geometry data.

FIG. 33 shows an example in which there are two types of attribute information (attribute X and attribute Y). When there are two types of attribute information, for example, two encoders generate data and metadata for the two types of attribute information. For example, an attribute sequence is defined for each type of attribute information, and an attribute SPS is generated for each type of attribute information.

Note that, although FIG. 33 shows an example in which there is one type of geometry information, and there are two types of attribute information, the present invention is not limited thereto. There may be one type of attribute information or three or more types of attribute information. In such cases, encoded data can be generated in the same manner. If the point cloud data has no attribute information, there may be no attribute information. In such a case, encoder 4801 does not have to generate a parameter set associated with attribute information.

Next, a process of generating encoded data of additional information (metadata) will be described. Encoder 4801 generates a PCC stream PS (referred to also as PCC stream PS or stream PS), which is a parameter set for the entire PCC stream. Encoder 4801 stores a parameter that can be commonly used for a decoding process for one or more geometry sequences and one or more attribute sequences in the stream PS. For example, the stream PS includes identification information indicating the codec for the point cloud data and information indicating an algorithm used for the encoding, for example. The geometry sequence and the attribute sequence depend on the stream PS.

Next, an access unit and a GOF will be described. In this embodiment, concepts of access unit (AU) and group of frames (GOF) are newly introduced.

An access unit is a basic unit for accessing data in decoding, and is formed by one or more pieces of data and one or more pieces of metadata. For example, an access unit is formed by geometry information and one or more pieces of attribute information associated with a same time point. A GOF is a random access unit, and is formed by one or more access units.

Encoder 4801 generates an access unit header (AU header) as identification information indicating the top of an access unit. Encoder 4801 stores a parameter relating to the access unit in the access unit header. For example, the access unit header includes a configuration of or information on the encoded data included in the access unit. The access unit header further includes a parameter commonly used for the data included in the access unit, such as a parameter relating to decoding of the encoded data.

Note that encoder 4801 may generate an access unit delimiter that includes no parameter relating to the access unit, instead of the access unit header. The access unit delimiter is used as identification information indicating the top of the access unit. The decoding device identifies the top of the access unit by detecting the access unit header or the access unit delimiter.

Next, generation of identification information for the top of a GOF will be described. As identification information indicating the top of a GOF, encoder 4801 generates a GOF header. Encoder 4801 stores a parameter relating to the GOF in the GOF header. For example, the GOF header includes a configuration of or information on the encoded data included in the GOF. The GOF header further includes a parameter commonly used for the data included in the GOF, such as a parameter relating to decoding of the encoded data.

Note that encoder 4801 may generate a GOF delimiter that includes no parameter relating to the GOF, instead of the GOF header. The GOF delimiter is used as identification information indicating the top of the GOF. The decoding device identifies the top of the GOF by detecting the GOF header or the GOF delimiter.

In the PCC-encoded data, the access unit is defined as a PCC frame unit, for example. The decoding device accesses a PCC frame based on the identification information for the top of the access unit.

For example, the GOF is defined as one random access unit. The decoding device accesses a random access unit based on the identification information for the top of the GOF. For example, if PCC frames are independent from each other and can be separately decoded, a PCC frame can be defined as a random access unit.

Note that two or more PCC frames may be assigned to one access unit, and a plurality of random access units may be assigned to one GOF.

Encoder 4801 may define and generate a parameter set or metadata other than those described above. For example, encoder 4801 may generate supplemental enhancement information (SEI) that stores a parameter (an optional parameter) that is not always used for decoding.

Next, a configuration of encoded data and a method of storing encoded data in a NAL unit will be described.

Figure 34:
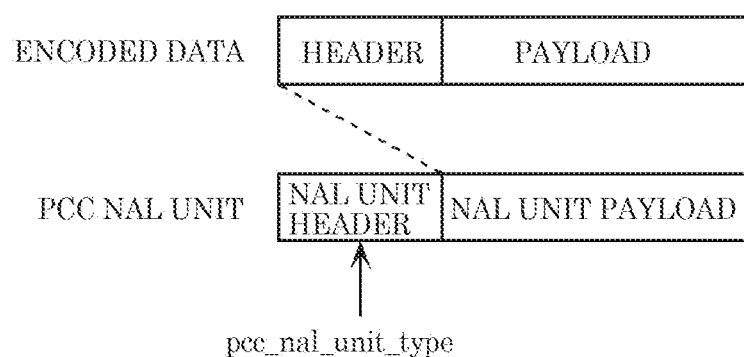
FIG. 34 is a diagram illustrating a structure example of encoded data and a NAL unit according to Embodiment 4.

For example, a data format is defined for each type of encoded data. FIG. 34 is a diagram showing an example of encoded data and a NAL unit.

For example, as shown in FIG. 34, encoded data includes a header and a payload. The encoded data may include length information indicating the length (data amount) of the encoded data, the header, or the payload. The encoded data may include no header.

The header includes identification information for identifying the data, for example. The identification information indicates a data type or a frame number, for example.

The header includes identification information indicating a reference relationship, for example. The identification information is stored in the header when there is a dependence relationship between data, for example, and allows an entity to refer to another entity. For example, the header of the entity to be referred to includes identification information for identifying the data. The header of the referring entity includes identification information indicating the entity to be referred to.

Note that, when the entity to be referred to or the referring entity can be identified or determined from other information, the identification information for identifying the data or identification information indicating the reference relationship can be omitted.

Multiplexer 4802 stores the encoded data in the payload of the NAL unit. The NAL unit header includes pcc_nal_unit_type, which is identification information for the encoded data. FIG. 35 is a diagram showing a semantics example of pcc_nal_unit_type.

As shown in FIG. 35, when pec_codec_type is codec 1 (Codec1: first encoding method), values 0 to 10 of pcc_nal_unit_type are assigned to encoded geometry data (Geometry), encoded attribute X data (AttributeX), encoded attribute Y data (AttributeY), geometry PS (Geom. PS), attribute XPS (AttrX. S), attribute YPS (AttrY. PS), geometry SPS (Geometry Sequence PS), attribute X SPS (AttributeX Sequence PS), attribute Y SPS (AttributeY Sequence PS), AU header (AU Header), and GOF header (GOF Header) in codec 1. Values of 11 and greater are reserved in codec 1.

When pec_codec_type is codec 2 (Codec2: second encoding method), values of 0 to 2 of pcc_nal_unit_type are assigned to data A (DataA), metadata A (MetaDataA), and metadata B (MetaDataB) in the codec. Values of 3 and greater are reserved in codec 2.

Next, an order of transmission of data will be described. In the following, restrictions on the order of transmission of NAL units will be described.

Multiplexer 4802 transmits NAL units on a GOF basis or on an AU basis. Multiplexer 4802 arranges the GOF header at the top of a GOF, and arranges the AU header at the top of an AU.

In order to allow the decoding device to decode the next AU and the following AUs even when data is lost because of a packet loss or the like, multiplexer 4802 may arrange a sequence parameter set (SPS) in each AU.

When there is a dependence relationship for decoding between encoded data, the decoding device decodes the data of the entity to be referred to and then decodes the data of the referring entity. In order to allow the decoding device to perform decoding in the order of reception without rearranging the data, multiplexer 4802 first transmits the data of the entity to be referred to.

Figure 36:
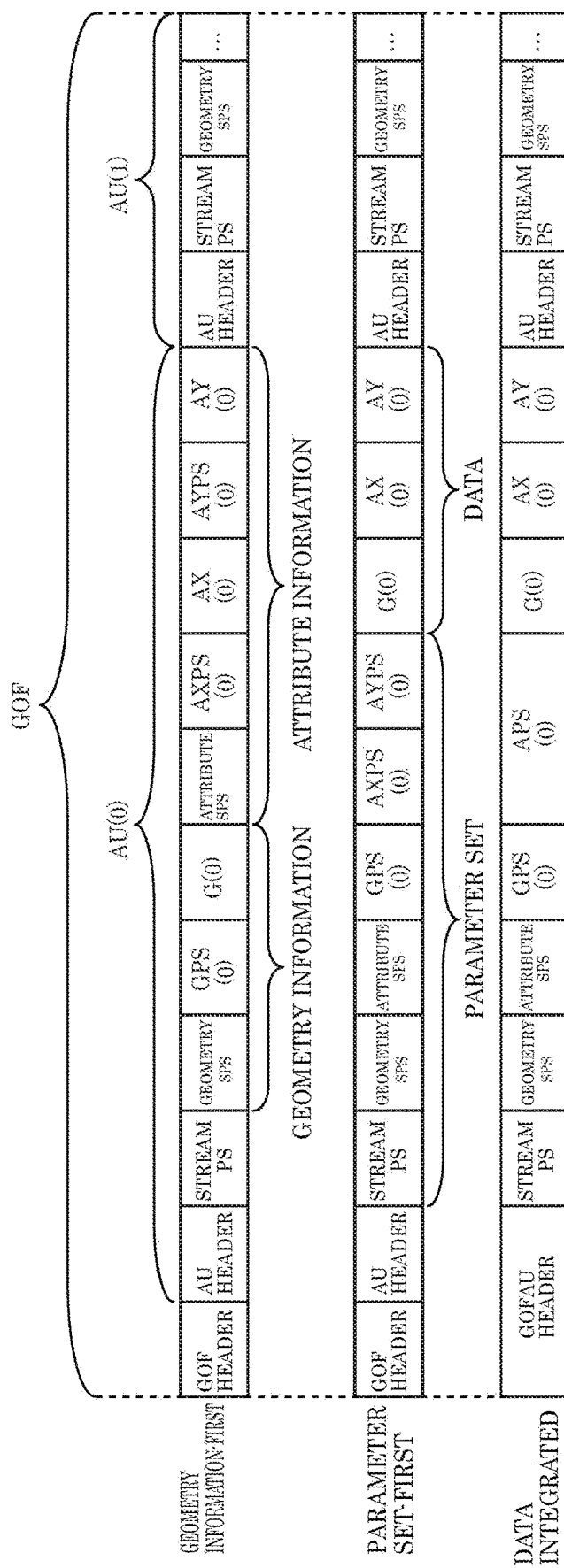
FIG. 36 is a diagram illustrating an example of a transmitting order of NAL units according to Embodiment 4.

FIG. 36 is a diagram showing examples of the order of transmission of NAL units. FIG. 36 shows three examples, that is, geometry information-first order, parameter-first order, and data-integrated order.

The geometry information-first order of transmission is an example in which information relating to geometry information is transmitted together, and information relating to attribute information is transmitted together. In the case of this order of transmission, the transmission of the information relating to the geometry information ends earlier than the transmission of the information relating to the attribute information.

For example, according to this order of transmission is used, when the decoding device does not decode attribute information, the decoding device may be able to have an idle time since the decoding device can omit decoding of attribute information. When the decoding device is required to decode geometry information early, the decoding device may be able to decode geometry information earlier since the decoding device obtains encoded data of the geometry information earlier.

Note that, although in FIG. 36 the attribute X SPS and the attribute Y SPS are integrated and shown as the attribute SPS, the attribute X SPS and the attribute Y SPS may be separately arranged.

In the parameter set-first order of transmission, a parameter set is first transmitted, and data is then transmitted.

As described above, as far as the restrictions on the order of transmission of NAL units are met, multiplexer 4802 can transmit NAL units in any order. For example, order identification information may be defined, and multiplexer 4802 may have a function of transmitting NAL units in a plurality of orders. For example, the order identification information for NAL units is stored in the stream PS.

The three-dimensional data decoding device may perform decoding based on the order identification information. The three-dimensional data decoding device may indicate a desired order of transmission to the three-dimensional data encoding device, and the three-dimensional data encoding device (multiplexer 4802) may control the order of transmission according to the indicated order of transmission.

Note that multiplexer 4802 can generate encoded data having a plurality of functions merged to each other as in the case of the data-integrated order of transmission, as far as the restrictions on the order of transmission are met. For example, as shown in FIG. 36, the GOF header and the AU header may be integrated, or AXPS and AYPS may be integrated. In such a case, an identifier that indicates data having a plurality of functions is defined in pcc_nal_unit_type.

In the following, variations of this embodiment will be described. There are levels of PSs, such as a frame-level PS, a sequence-level PS, and a PCC sequence-level PS. Provided that the PCC sequence level is a higher level, and the frame level is a lower level, parameters can be stored in the manner described below.

The value of a default PS is indicated in a PS at a higher level. If the value of a PS at a lower level differs from the value of the PS at a higher level, the value of the PS is indicated in the PS at the lower level. Alternatively, the value of the PS is not described in the PS at the higher level but is described in the PS at the lower level. Alternatively, information indicating whether the value of the PS is indicated in the PS at the lower level, at the higher level, or at both the levels is indicated in both or one of the PS at the lower level and the PS at the higher level. Alternatively, the PS at the lower level may be merged with the PS at the higher level. If the PS at the lower level and the PS at the higher level overlap with each other, multiplexer 4802 may omit transmission of one of the PSs.

Note that encoder 4801 or multiplexer 4802 may divide data into slices or tiles and transmit each of the divided slices or tiles as divided data. The divided data includes information for identifying the divided data, and a parameter used for decoding of the divided data is included in the parameter set. In this case, an identifier that indicates that the data is data relating to a tile or slice or data storing a parameter is defined in pcc_nal_unit_type.

Embodiment 5

Figure 37:
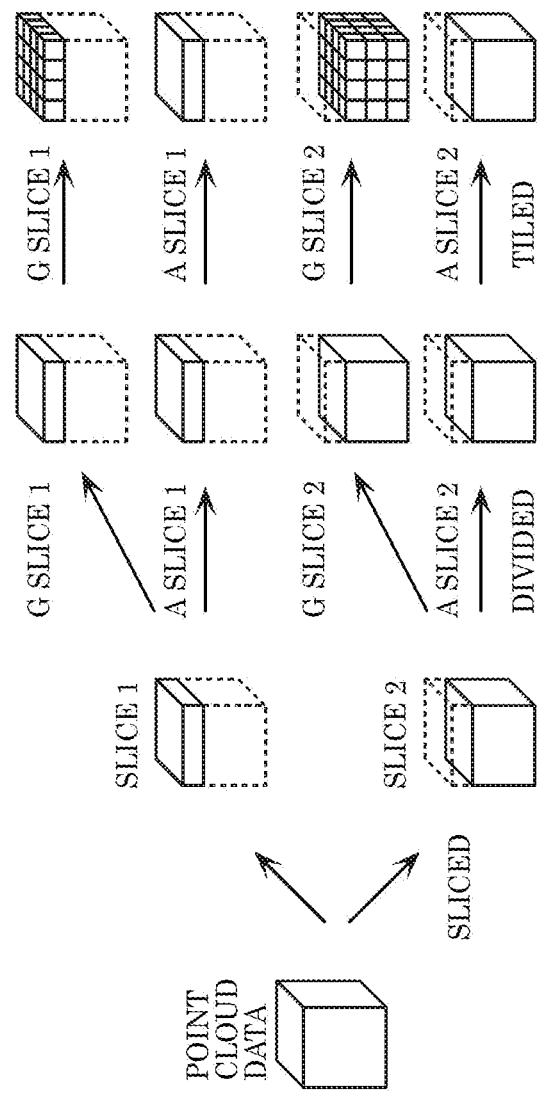
FIG. 37 is a diagram illustrating an example of dividing slices and tiles according to Embodiment 5.

Hereinafter, the dividing method for point cloud data will be described. FIG. 37 is a diagram illustrating an example of slice and tile dividing.

First, the method for slice dividing will be described. The three-dimensional data encoding device divides three-dimensional point cloud data into arbitrary point clouds on a slice-by-slice basis. In slice dividing, the three-dimensional data encoding device does not divide the geometry information and the attribute information constituting points, but collectively divides the geometry information and the attribute information. That is, the three-dimensional data encoding device performs slice dividing so that the geometry information and the attribute information of an arbitrary point belong to the same slice. Note that, as long as these are followed, the number of divisions and the dividing method may be any number and any method. Furthermore, the minimum unit of division is a point. For example, the numbers of divisions of geometry information and attribute information are the same. For example, a three-dimensional point corresponding to geometry information after slice dividing, and a three-dimensional point corresponding to attribute information are included in the same slice.

Also, the three-dimensional data encoding device generates slice additional information, which is additional information related to the number of divisions and the dividing method at the time of slice dividing. The slice additional information is the same for geometry information and attribute information. For example, the slice additional information includes the information indicating the reference coordinate position, size, or side length of a bounding box after division. Also, the slice additional information includes the information indicating the number of divisions, the division type, etc.

Next, the method for tile dividing will be described. The three-dimensional data encoding device divides the data divided into slices into slice geometry information (G slice) and slice attribute information (A slice), and divides each of the slice geometry information and the slice attribute information on a tile-by-tile basis.

Note that, although FIG. 37 illustrates the example in which division is performed with an octree structure, the number of divisions and the dividing method may be any number and any method.

Also, the three-dimensional data encoding device may divide geometry information and attribute information with different dividing methods, or may divide geometry information and attribute information with the same dividing method. Additionally, the three-dimensional data encoding device may divide a plurality of slices into tiles with different dividing methods, or may divide a plurality of slices into tiles with the same dividing method.

Furthermore, the three-dimensional data encoding device generates tile additional information related to the number of divisions and the dividing method at the time of tile dividing. The tile additional information (geometry tile additional information and attribute tile additional information) is separate for geometry information and attribute information. For example, the tile additional information includes the information indicating the reference coordinate position, size, or side length of a bounding box after division. Additionally, the tile additional information includes the information indicating the number of divisions, the division type, etc.

Next, an example of the method of dividing point cloud data into slices or tiles will be described. As the method for slice or tile dividing, the three-dimensional data encoding device may use a predetermined method, or may adaptively switch methods to be used according to point cloud data.

At the time of slice dividing, the three-dimensional data encoding device divides a three-dimensional space by collectively handling geometry information and attribute information. For example, the three-dimensional data encoding device determines the shape of an object, and divides a three-dimensional space into slices according to the shape of the object. For example, the three-dimensional data encoding device extracts objects such as trees or buildings, and performs division on an object-by-object basis. For example, the three-dimensional data encoding device performs slice dividing so that the entirety of one or a plurality of objects are included in one slice. Alternatively, the three-dimensional data encoding device divides one object into a plurality of slices.

In this case, the encoding device may change the encoding method for each slice, for example. For example, the encoding device may use a high-quality compression method for a specific object or a specific part of the object. In this case, the encoding device may store the information indicating the encoding method for each slice in additional information (metadata).

Also, the three-dimensional data encoding device may perform slice dividing so that each slice corresponds to a predetermined coordinate space based on map information or geometry information.

At the time of tile dividing, the three-dimensional data encoding device separately divides geometry information and attribute information. For example, the three-dimensional data encoding device divides slices into tiles according to the data amount or the processing amount. For example, the three-dimensional data encoding device determines whether the data amount of a slice (for example, the number of three-dimensional points included in a slice) is greater than a predetermined threshold value. When the data amount of the slice is greater than the threshold value, the three-dimensional data encoding device divides slices into tiles. When the data amount of the slice is less than the threshold value, the three-dimensional data encoding device does not divide slices into tiles.

For example, the three-dimensional data encoding device divides slices into tiles so that the processing amount or processing time in the decoding device is within a certain range (equal to or less than a predetermined value). Accordingly, the processing amount per tile in the decoding device becomes constant, and distributed processing in the decoding device becomes easy.

Additionally, when the processing amount is different between geometry information and attribute information, for example, when the processing amount of geometry information is greater than the processing amount of attribute information, the three-dimensional data encoding device makes the number of divisions of geometry information larger than the number of divisions of attribute information.

Furthermore, for example, when geometry information may be decoded and displayed earlier, and attribute information may be slowly decoded and displayed later in the decoding device according to contents, the three-dimensional data encoding device may make the number of divisions of geometry information larger than the number of divisions of attribute information. Accordingly, since the decoding device can increase the parallel number of geometry information, it is possible to make the processing of geometry information faster than the processing of attribute information.

Note that the decoding device does not necessarily have to process sliced or tiled data in parallel, and may determine whether or not to process them in parallel according to the number or capability of decoding processors.

By performing division with the method as described above, it is possible to achieve adaptive encoding according to contents or objects. Also, parallel processing in decoding processing can be achieved. Accordingly, the flexibility of a point cloud encoding system or a point cloud decoding system is improved.

Figure 38:
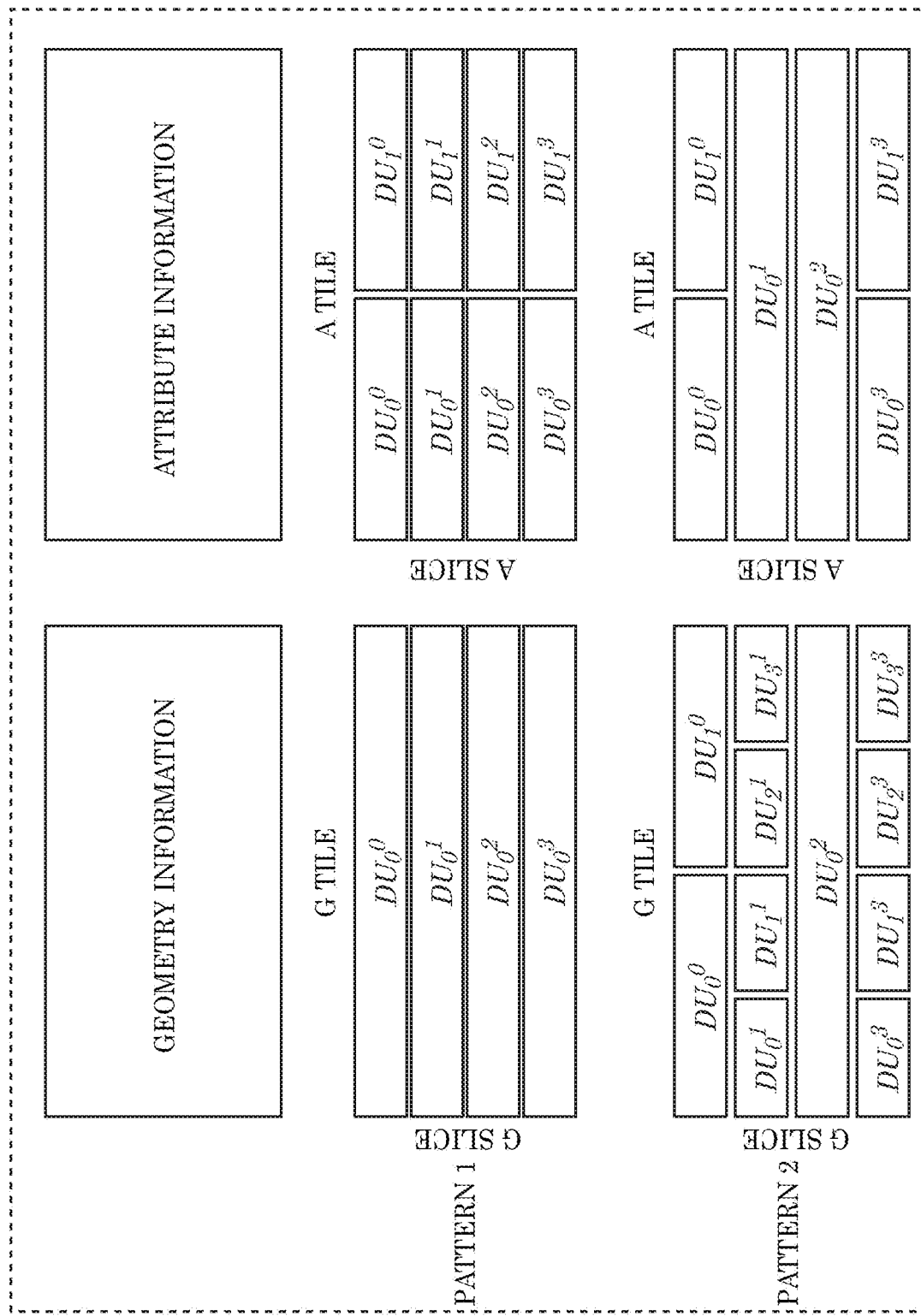
FIG. 38 is a diagram illustrating dividing pattern examples of slices and tiles according to Embodiment 5.

FIG. 38 is a diagram illustrating dividing pattern examples of slices and tiles. DU in the diagram is a data unit (DataUnit), and indicates the data of a tile or a slice. Additionally, each DU includes a slice index (SliceIndex) and a tile index (TileIndex). The top right numerical value of a DU in the diagram indicates the slice index, and the bottom left numerical value of the DU indicates the tile index.

In Pattern 1, in slice dividing, the number of divisions and the dividing method are the same for G slice and A slice. In tile dividing, the number of divisions and the dividing method for G slice are different from the number of divisions and the dividing method for A slice. Additionally, the same number of divisions and dividing method are used among a plurality of G slices. The same number of divisions and dividing method are used among a plurality of A slices.

In Pattern 2, in slice dividing, the number of divisions and the dividing method are the same for G slice and A slice. In tile dividing, the number of divisions and the dividing method for G slice are different from the number of divisions and the dividing method for A slice. Additionally, the number of divisions and the dividing method are different among a plurality of G slices. The number of divisions and the dividing method are different among a plurality of A slices.

Embodiment 6

Hereinafter, an example of performing slice division after tile division will be described. An autonomous application for automated driving of a vehicle etc. requires not point cloud data of all areas but point cloud data of an area surrounding a vehicle or an area in a traveling direction of a vehicle. Here, tiles and slices can be used to selectively decode original point cloud data. It is possible to achieve the improvement of coding efficiency or parallel processing by dividing three-dimensional point cloud data into tiles and further dividing the tiles into slices. When data is divided, additional information (metadata) is generated, and the generated additional information is transmitted to a multiplexer.

Figure 39:
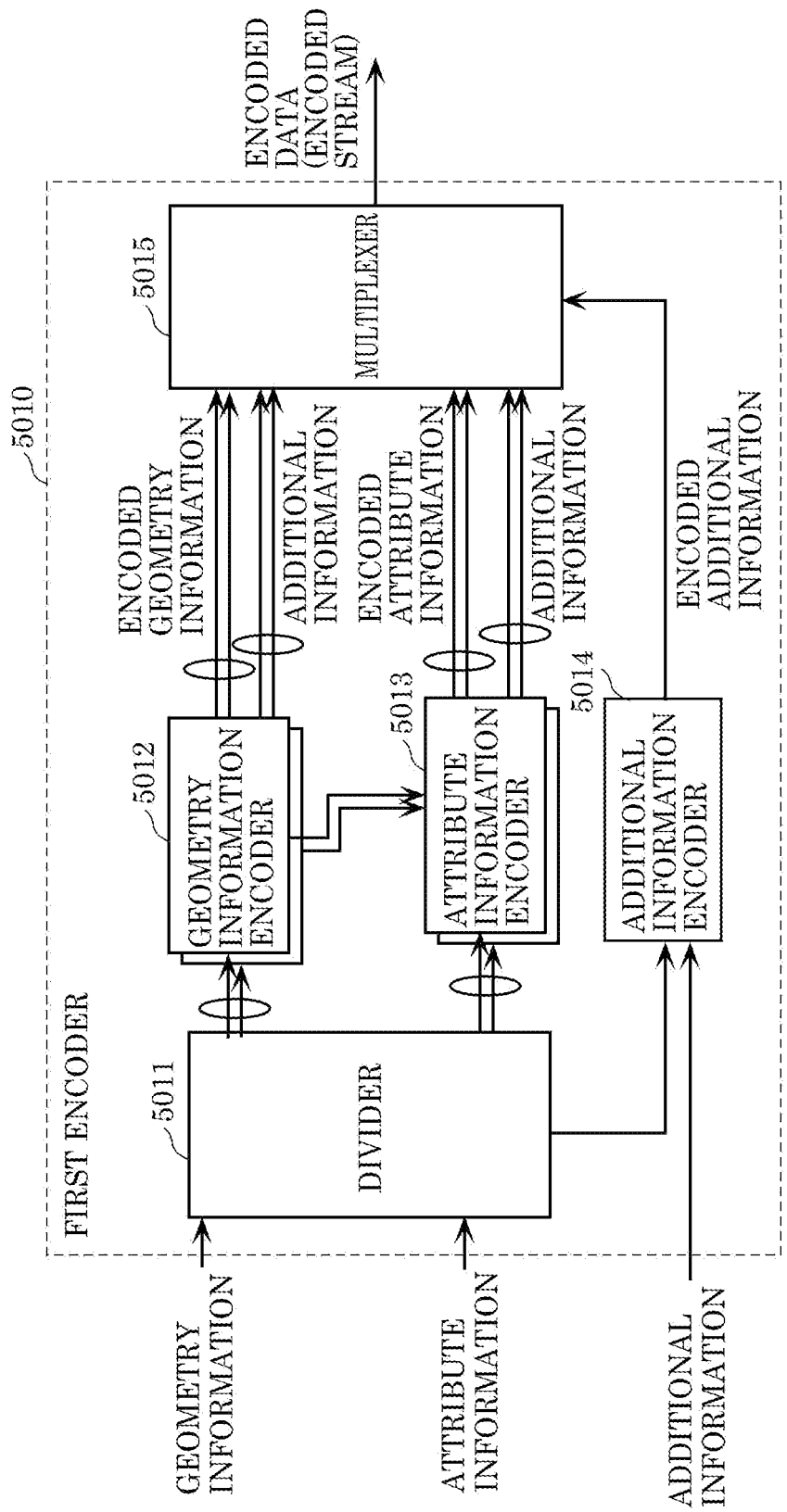
FIG. 39 is a block diagram of a first encoder according to Embodiment 6.

FIG. 39 is a block diagram illustrating a configuration of first encoder 5010 included in a three-dimensional data encoding device according to the present embodiment. First encoder 5010 generates encoded data (encoded stream) by encoding point cloud data using a first encoding method (geometry based PCC (GPCC)). First encoder 5010 includes divider 5011, geometry information encoders 5012, attribute information encoders 5013, additional information encoder 5014, and multiplexer 5015.

Divider 5011 generates pieces of divided data by dividing point cloud data. Specifically, divider 5011 generates pieces of divided data by dividing a space of point cloud data into subspaces. Here, a subspace is one of a tile and a slice, or a combination of a tile and a slice. More specifically, point cloud data includes geometry information, attribute information, and additional information. Divider 5011 divides geometry information into pieces of divided geometry information and attribute information into pieces of divided attribute information. In addition, divider 5011 generates additional information regarding division.

For example, first, divider 5011 divides a point cloud into tiles. Next, divider 5011 further divides the obtained tiles into slices.

Geometry information encoders 5012 generate pieces of encoded geometry information by encoding pieces of divided geometry information. For example, geometry information encoders 5012 process pieces of divided geometry information in parallel.

Attribute information encoders 5013 generate pieces of encoded attribute information by encoding pieces of divided attribute information. For example, attribute information encoders 5013 process pieces of divided geometry information in parallel.

Additional information encoder 5014 generates encoded additional information by encoding additional information included in point cloud data and additional information regarding data division generated at the time of dividing by divider 5011.

Multiplexer 5015 generates encoded data (encoded stream) by multiplexing pieces of encoded geometry information, pieces of encoded attribute information, and encoded additional information, and transmits the generated encoded data. The encoded additional information is also used at the time of decoding.

It should be noted that although FIG. 39 shows two geometry information encoders 5012 and two attribute information encoders 5013 as an example, the number of geometry information encoders 5012 and the number of attribute information encoders 5013 may be one or at least three. Moreover, pieces of divided data may be processed in parallel in identical chips, such as cores in a CPU, in a core of each of chips, or in cores of each of chips.

Figure 40:
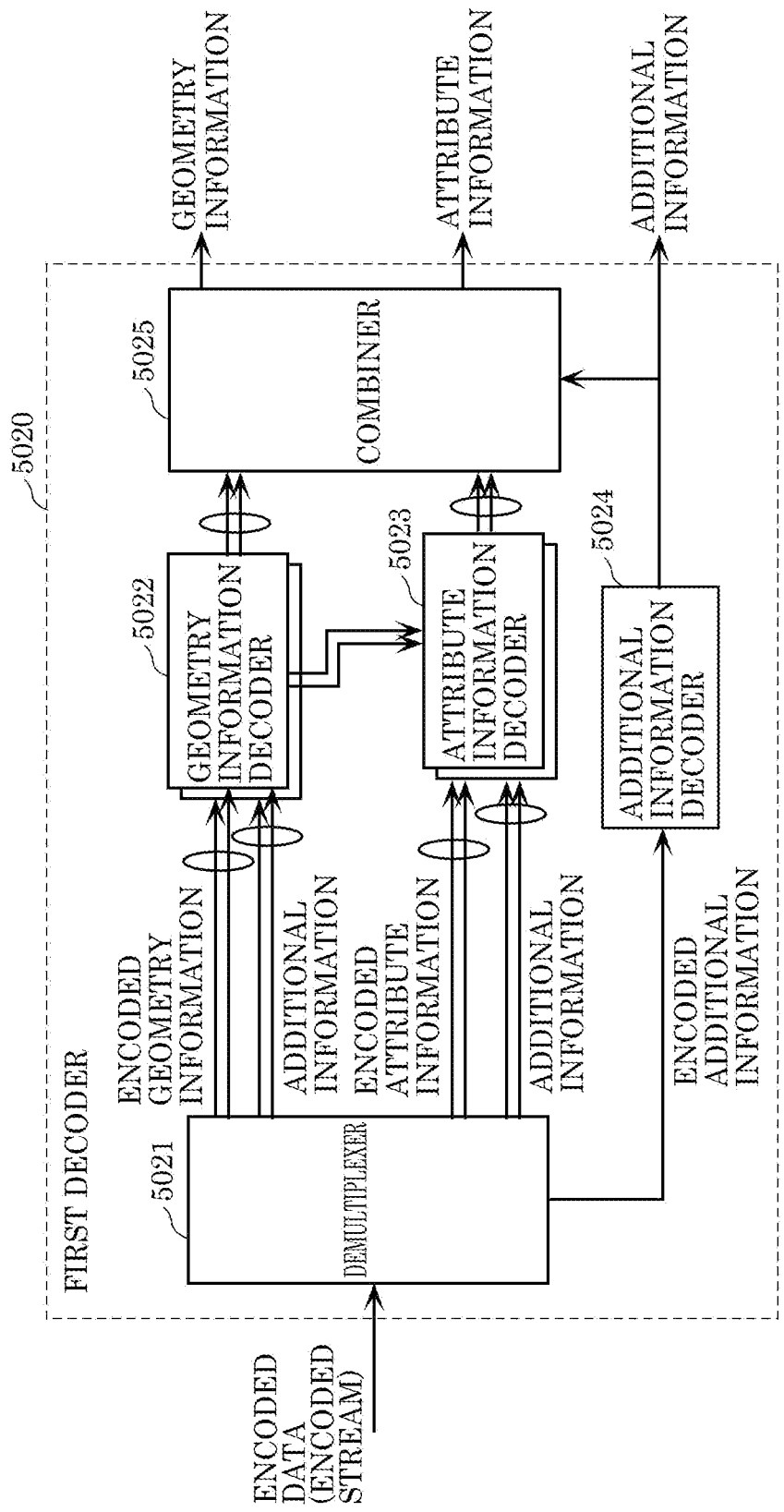
FIG. 40 is a block diagram of a first decoder according to Embodiment 6.

The following describes a decoding process. FIG. 40 is a block diagram illustrating a configuration of first decoder 5020. First decoder 5020 restores point cloud data by decoding encoded data (encoded stream) generated by encoding the point cloud data using the first encoding method (GPCC). First decoder 5020 includes demultiplexer 5021, geometry information decoders 5022, attribute information decoders 5023, additional information decoder 5024, and combiner 5025.

Demultiplexer 5021 generates pieces of encoded geometry information, pieces of encoded attribute information, and encoded additional information by demultiplexing encoded data (encoded stream).

Geometry information decoders 5022 generate pieces of divided geometry information by decoding pieces of encoded geometry information. For example, geometry information decoders 5022 process pieces of encoded geometry information in parallel.

Attribute information decoders 5023 generate pieces of divided attribute information by decoding pieces of encoded attribute information. For example, attribute information decoders 5023 process pieces of encoded attribute information in parallel.

Additional information decoder 5024 generates additional information by decoding encoded additional information.

Combiner 5025 generates geometry information by combining pieces of divided geometry information using additional information. Combiner 5025 also generates attribute information by combining pieces of divided attribute information using additional information. For example, first, combiner 5025 generates pieces of point cloud data corresponding to tiles by combing pieces of decoded point cloud data corresponding to slices using slice additional information. Next, combiner 5025 restores original point cloud data by combining pieces of point cloud data corresponding to the tiles using tile additional information.

It should be noted that although FIG. 39 shows two geometry information decoders 5022 and two attribute information decoders 5023 as an example, the number of geometry information decoders 5022 and the number of attribute information decoders 5023 may be one or at least three. Moreover, pieces of divided data may be processed in parallel in identical chips, such as cores in a CPU, in a core of each of chips, or in cores of each of chips.

The following describes a method of dividing point cloud data. An autonomous application for automated driving of a vehicle etc. requires not point cloud data of all areas but point cloud data of an area surrounding a vehicle or an area in a traveling direction of a vehicle.

Figure 41:
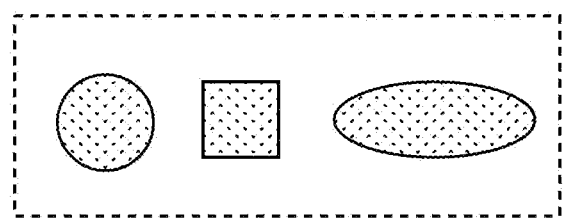
FIG. 41 is a diagram illustrating examples of a tile shape according to Embodiment 6.

FIG. 41 is a diagram illustrating examples of a tile shape. As shown in FIG. 41, examples of the tile shape may include various shapes such as a circle, a rectangle, or an ellipse.

Figure 42:
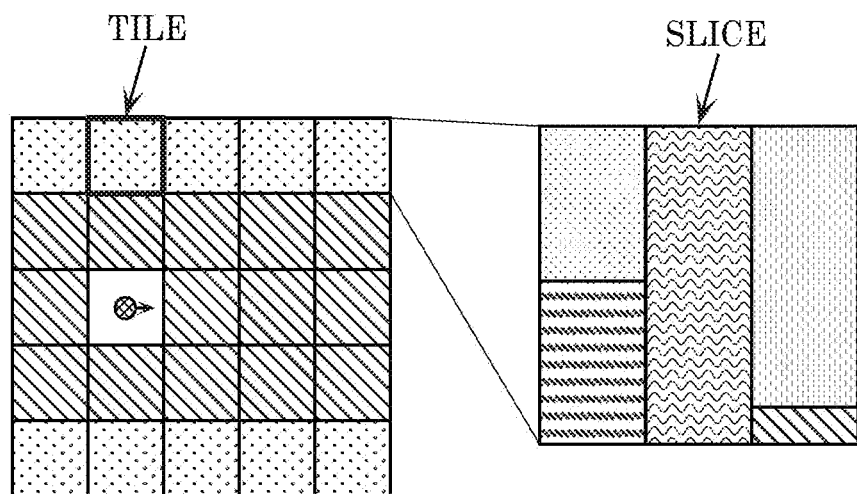
FIG. 42 is a diagram illustrating an example of tiles and slices according to Embodiment 6.

FIG. 42 is a diagram illustrating an example of tiles and slices. A composition of slices may differ between tiles. For example, a composition of tiles or slices may be optimized based on a data volume. Alternatively, a composition of tiles or slices may be optimized based on decoding speed.

Tile division may be performed based on geometry information. In this case, attribute information is divided in the same manner as corresponding geometry information.

Moreover, in slice division after tile division, geometry information and attribute information may be divided into slices using different methods. For example, a slice division method in each tile may be selected upon request from an application. A different slice division method or a different tile division method may be used based on a request from an application.

For example, divider 5011 divides three-dimensional point cloud data into one or more tiles in a two-dimensional shape obtained by seeing the three-dimensional point cloud data from top, based on position information such as map information. Divider 5011 divides each of the one or more tiles into one or more slices afterward.

It should be noted that divider 5011 may divide geometry information (geometry) and attribute information (attribute) into slices using the same method.

It should be noted that each of geometry information and attribute information may be of one type or two or more types. In addition, when point cloud data has no attribute information, attribute information may be unnecessary.

Figure 43:
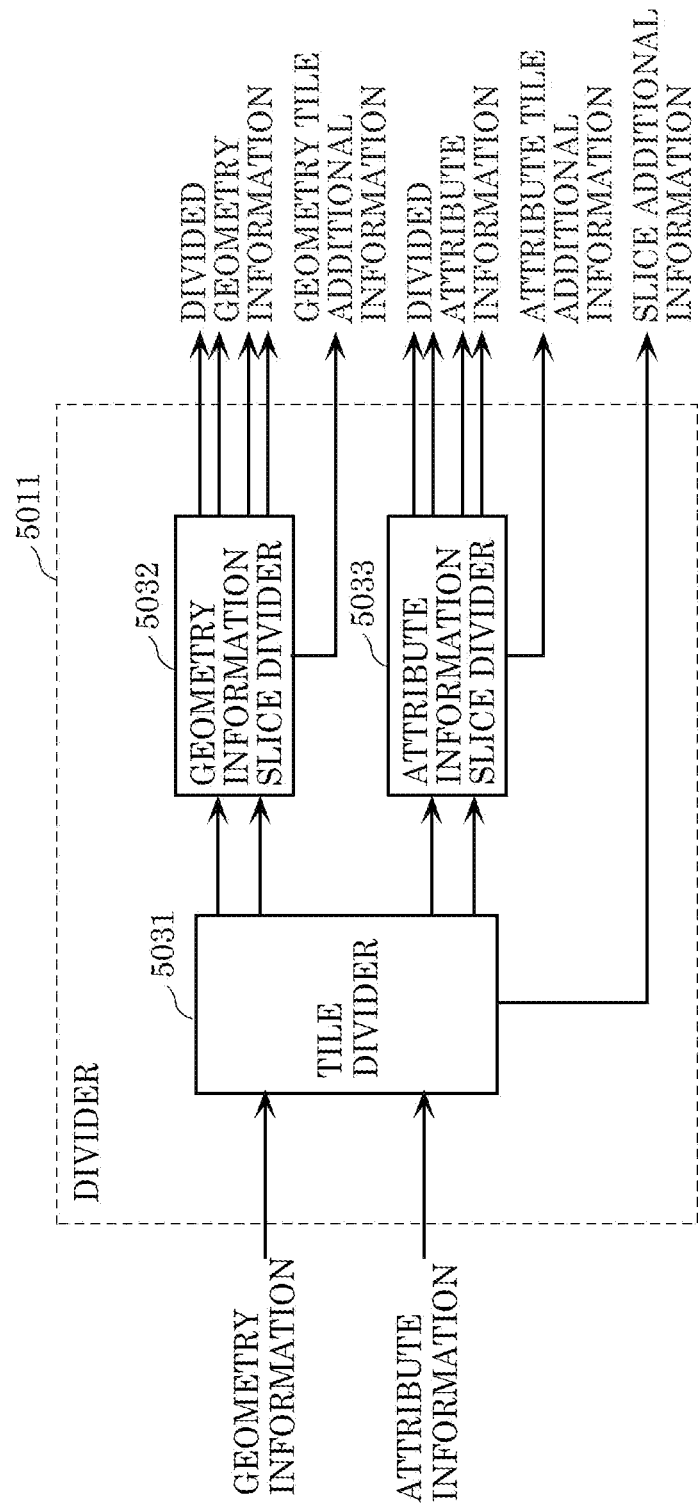
FIG. 43 is a block diagram of a divider according to Embodiment 6.

FIG. 43 is a block diagram of divider 5011. Divider 5011 includes tile divider 5031, geometry information slice divider (geometry slice divider) 5032, and attribute information slice divider (attribute slice divider) 5033.

Tile divider 5031 generates pieces of tile geometry information by dividing geometry information (position (geometry)) into tiles. In addition, tile divider 5031 generates pieces of tile attribute information by dividing attribute information (attribute) into tiles. Additionally, tile divider 5031 outputs tile additional information (tile metadata) including information regarding tile division and information generated in the tile division.

Geometry information slice divider 5032 generates pieces of divided geometry information (pieces of slice geometry information) by dividing pieces of tile geometry information into slices. In addition, geometry information slice divider 5032 outputs geometry slice additional information (geometry slice metadata) including information regarding slice division of geometry information and information generated in the slice division of the geometry information.

Attribute information slice divider 5033 generates pieces of divided attribute information (pieces of slice attribute information) by dividing pieces of tile attribute information into slices. In addition, attribute information slice divider 5033 outputs attribute slice additional information (attribute slice metadata) including information regarding slice division of attribute information and information generated in the slice division of the attribute information.

The following describes examples of a tile shape. An entire three-dimensional map (3D map) is divided into tiles. Data of the tiles are selectively transmitted to a three-dimensional data decoding device. Alternatively, the data of the tiles are transmitted to the three-dimensional data decoding device in decreasing order of importance. A tile shape may be selected from shapes according to a situation.

Figure 44:
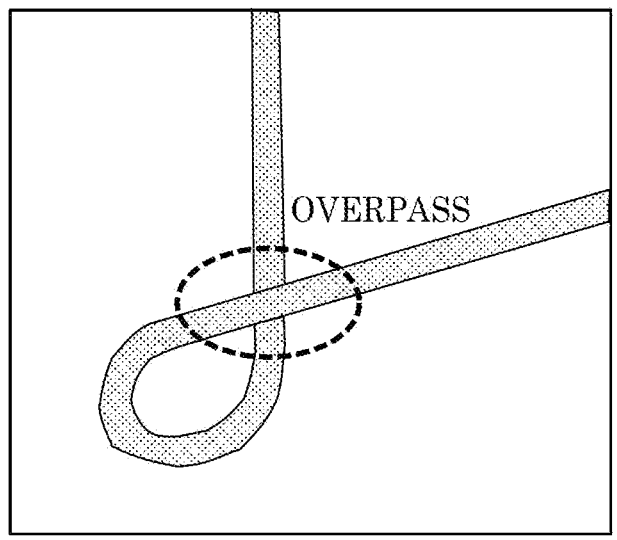
FIG. 44 is a diagram illustrating an example of a map in a top view of point cloud data according to Embodiment 6.

FIG. 44 is a diagram illustrating an example of a map in a top of view of point cloud data obtained by LiDAR. The example shown in FIG. 44 is point cloud data of a highway and includes an overpass (flyover).

Figure 45:
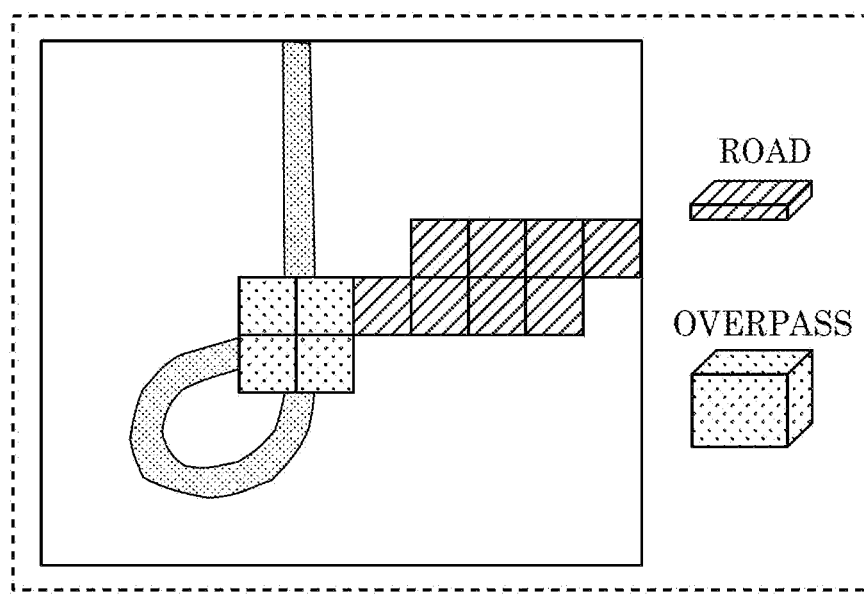
FIG. 45 is a diagram illustrating an example of tile division according to Embodiment 6.

FIG. 45 is a diagram illustrating an example of dividing the point cloud data shown in FIG. 44 into square tiles. It is easy to make such a division into squares in a map server. For a normal road, the height of a tile is set low. The height of tiles is set higher for an overpass than for the normal road so that the tiles contain the overpass.

Figure 46:
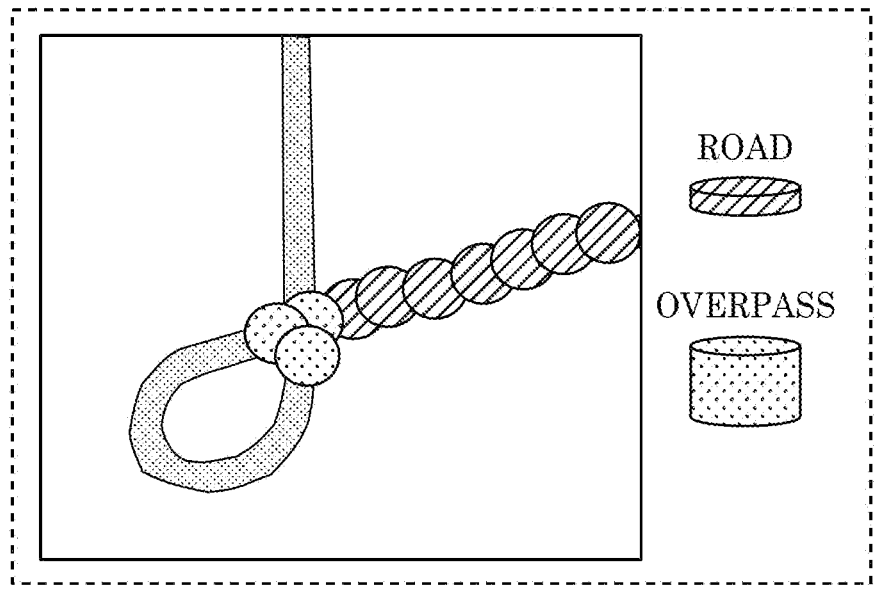
FIG. 46 is a diagram illustrating an example of tile division according to Embodiment 6.

FIG. 46 is a diagram illustrating an example of dividing the point cloud data shown in FIG. 44 into circular tiles. In this case, neighboring tiles may overlap each other in plan view. When a vehicle requires point cloud data of a surrounding area, the three-dimensional data encoding device transmits, to the vehicle, point cloud data of an area including columns (circles in top view) surrounding the vehicle.

As with the example shown in FIG. 45, for a normal road, the height of a tile is set low. The height of tiles is set higher for an overpass than for the normal road so that the tiles contain the overpass.

The three-dimensional data encoding device may change the height of a tile according to, for example, the shape or height of a road or building. In addition, the three-dimensional data encoding device may change the height of a tile according to position information or area information. Additionally, the three-dimensional data encoding device may change the height of each tile. Alternatively, the three-dimensional data encoding device may change the height of tiles for each zone including the tiles. To put it another way, the three-dimensional data encoding device may set tiles in a zone to the same height. Moreover, tiles having different heights may overlap each other in top view.

Figure 47:
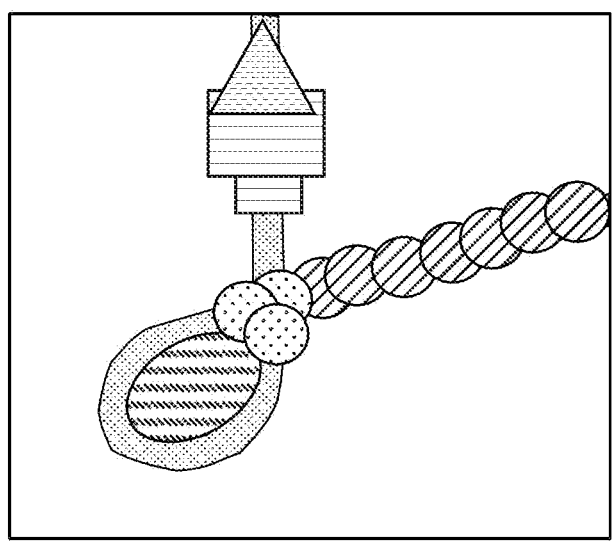
FIG. 47 is a diagram illustrating an example of tile division according to Embodiment 6.

FIG. 47 is a diagram illustrating an example of tile division when tiles having various shapes, sizes, and heights are used. Any tile may have any shape or size, or a combination of these.

For example, in addition to making a division into non-overlapping square tiles and making a division into overlapping circular tiles as described above, the three-dimensional data encoding device may make a division into overlapping square tiles. Moreover, the tile shape need not be a square or a circle, and may be a polygon having three or more vertices, or a shape having no vertices.

Furthermore, a tile shape may be of two or more types, and tiles having different shapes may overlap each other. In addition, a tile shape may be of one or more types; and when the same shape is used for divided tiles, the same shape may include shapes different in size or such shapes may overlap each other.

For example, a tile to be used is larger for an area including no object such as a road than for an area including an object. Moreover, the three-dimensional data encoding device may adaptively change a tile shape or size according to an object.

Furthermore, for example, the three-dimensional data encoding device may set tiles in a traveling direction of an automobile (a vehicle) to a large size because reading of tiles at a great distance ahead of the automobile in the traveling direction is likely to be needed; and set tiles in a side lateral to the automobile to a smaller size than the tiles in the traveling direction because the automobile is less likely to move to the side.

Figure 48:
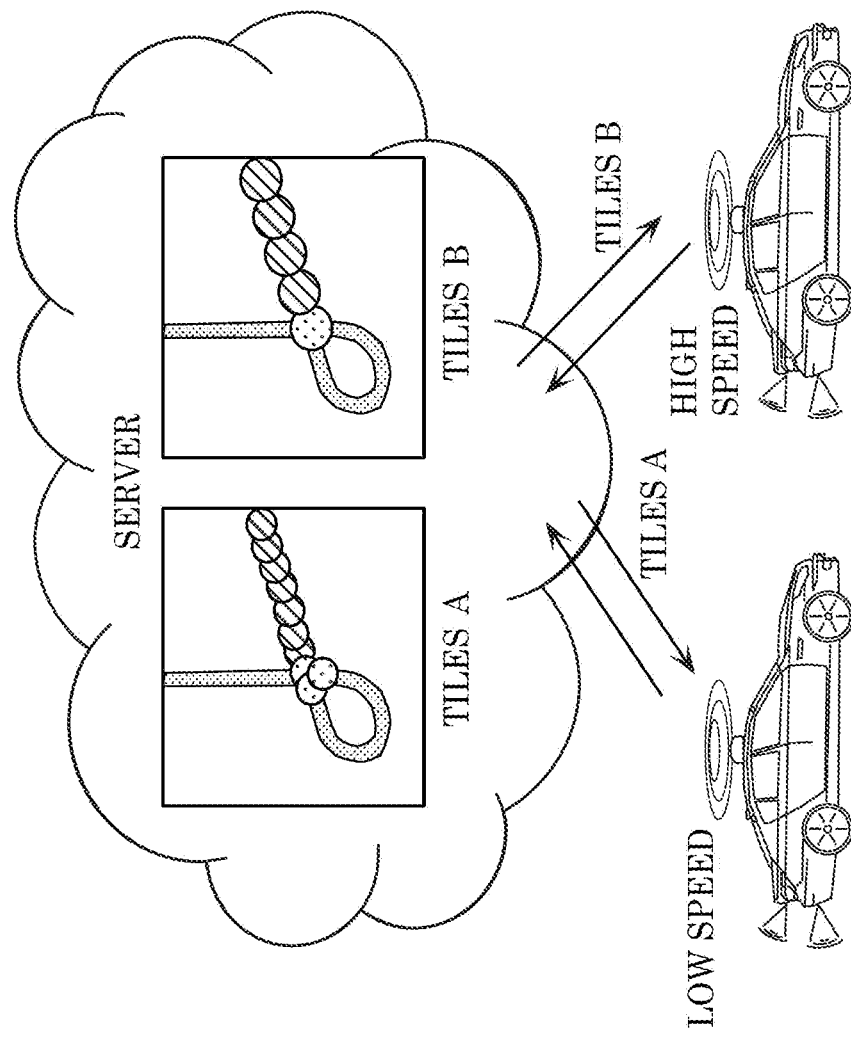
FIG. 48 is a diagram illustrating an example of data of tiles stored in a server according to Embodiment 6.

FIG. 48 is a diagram illustrating an example of data of tiles stored in a server. For example, point cloud data is divided into tiles and encoded in advance, and the obtained encoded data is stored in a server. A user obtains the data of desired tiles from the server when necessary. Alternatively, the server (the three-dimensional data encoding device) may perform tile division and encoding so that tiles include data desired by the user, in response to an instruction from the user.

For example, when a movable body (a vehicle) travels at a high speed, it is conceivable that more extensive point cloud data is needed. For this reason, the server may determine a tile shape and size based on a pre-estimated vehicular speed (e.g., a legal speed on a road, a vehicular speed estimated from the width or shape of a road, or a statistical vehicular speed), and perform tile division. Alternatively, as shown in FIG. 48, the server may encode tiles having a shape or size in advance, and store the obtained data. The movable body may obtain data of tiles having an appropriate shape or size according to the traveling direction and speed of the movable body.

Figure 49:
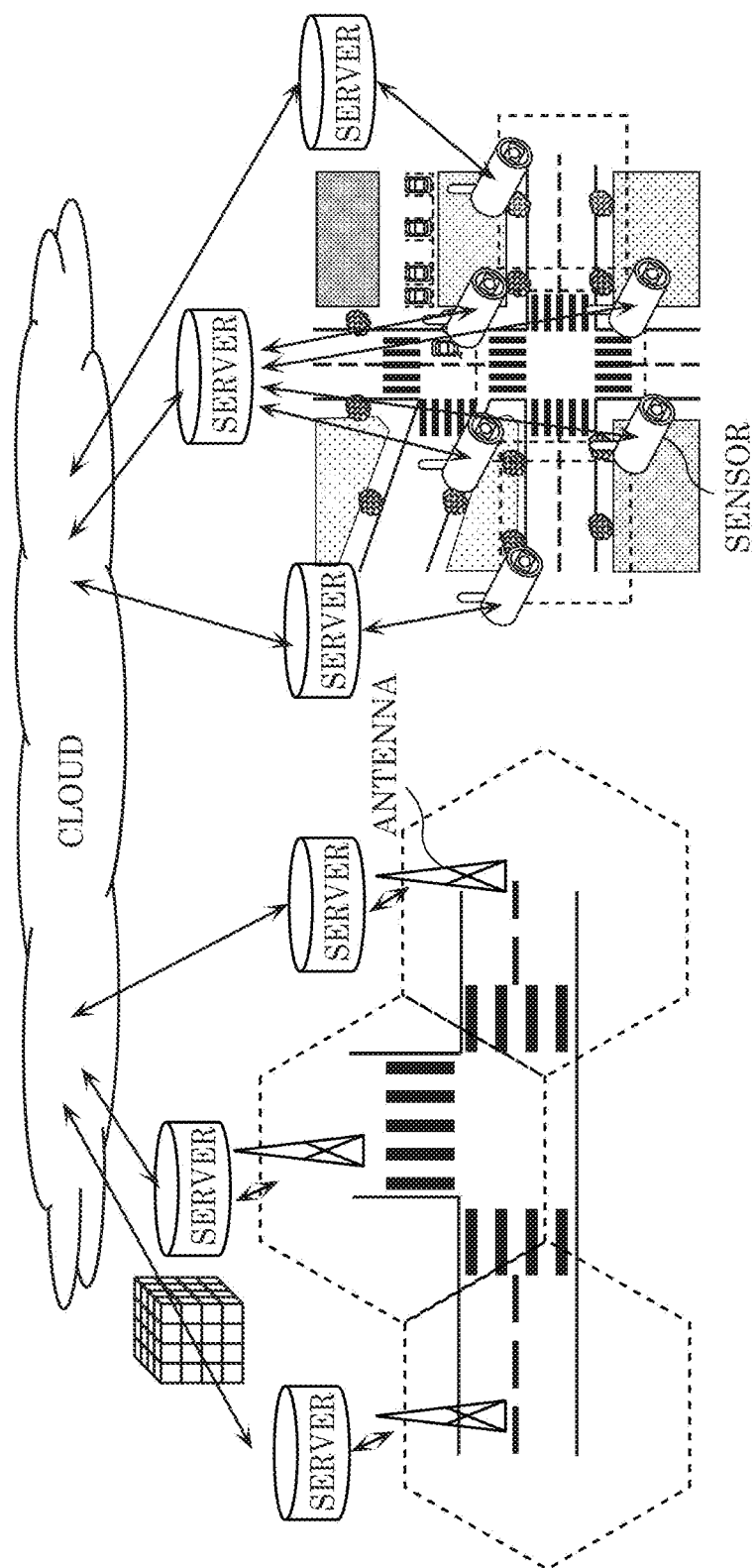
FIG. 49 is a diagram illustrating a system regarding tile division according to Embodiment 6.

FIG. 49 is a diagram illustrating an example of a system regarding tile division. As shown in FIG. 49, a tile shape and an area may be determined based on the location of an antenna (a base station) that is a means of communication transmitting point cloud data, or on a communication area supported by an antenna. Alternatively, when point cloud data is generated by a sensor such as a camera, a tile shape and an area may be determined based on the location or a target range (a detection range) of the sensor.

One tile may be assigned to one antenna or one sensor, or one tile may be assigned to antennas or sensors. In addition, tiles may be assigned to one antenna or one sensor. An antenna or a sensor may be fixed or movable.

For example, encoded data divided into tiles may be managed by a server connected to an antenna or a sensor for an area assigned to the tiles. The server may manage the encoded data of the area and tile information of a neighboring area. Pieces of encoded data of tiles may be managed in a centralized server (a cloud) that manages servers each corresponding to a different one of the tiles. Alternatively, instead of providing the servers each corresponding to the different one of the tiles, antennas or sensors may be directly connected to the centralized server.

It should be noted that the target range of an antenna or a sensor may change depending on the power of radio waves, differences between devices, and installation conditions, and a tile shape and size may change in conformity with these. Instead of a tile, a slice or a PCC frame may be assigned based on the target range of the antenna or the sensor.

The following describes a method of dividing a tile into slices. It is possible to improve the coding efficiency by assigning similar objects to the same slice.

For example, the three-dimensional data encoding device may recognize objects (e.g., a road, a building, a tree) using features of point cloud data, and perform slice division by clustering point clouds for each of the objects.

Alternatively, the three-dimensional data encoding device may classify objects having the same attribute into groups, and perform slice division by assigning a slice to each of the groups. Here, an attribute is, for example, information regarding motion. Objects are classified into groups according to dynamic information about pedestrians, cars, etc., quasi-dynamic information about accidents, congestion, etc., quasi-static information about traffic controls, roadwork, etc., and static information about road surfaces, structures, etc.

It should be noted that slices may have overlapping data. For example, when slice division is performed for each object group, any object may belong to one object group or two or more object groups.

Figure 50:
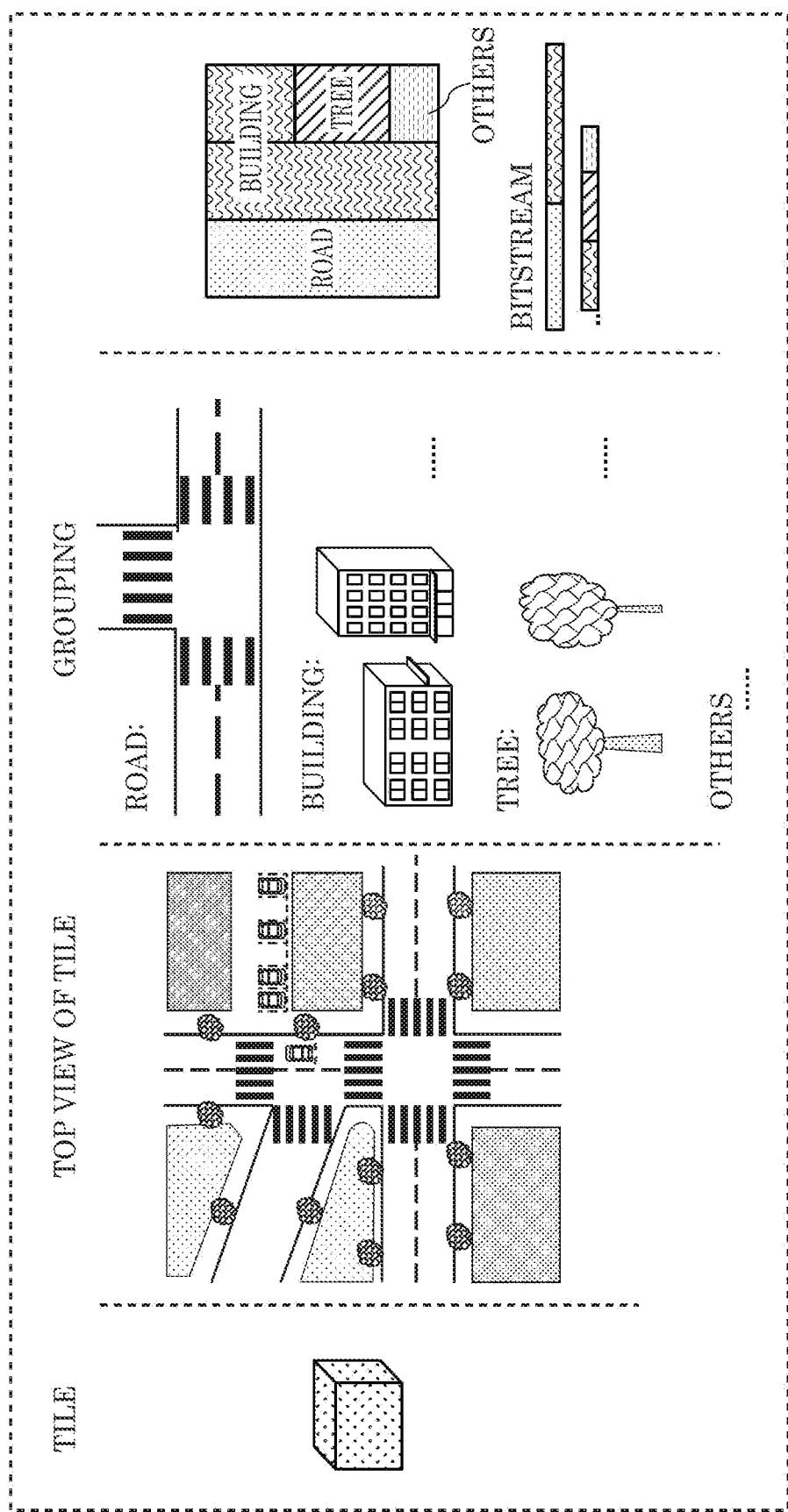
FIG. 50 is a diagram illustrating an example of slice division according to Embodiment 6.

FIG. 50 is a diagram illustrating an example of this slice division. For example, a tile is a cuboid in the example shown in FIG. 50. It should be noted that a tile may be columnar or have another shape.

Point clouds included in a tile are classified into object groups such as road, building, and tree. Then, slice division is performed so that each object group is included in a different one of slices. Subsequently, the slices are encoded separately.

The following describes a method of encoding divided data. The three-dimensional data encoding device (first encoder 5010) encodes each divided data. When the three-dimensional data encoding device encodes attribute information, the three-dimensional data encoding device generates, as additional information, dependency relationship information indicating based on which composition information (geometry information, additional information, or another attribute information) encoding has been performed. In other words, dependency relationship information indicates, for example, composition information of a reference destination (a dependee). In this case, the three-dimensional data encoding device generates dependency relationship information based on composition information corresponding to a divided shape for attribute information. It should be noted that the three-dimensional data encoding device may generate dependency relationship information based on composition information corresponding to divided shapes.

Dependency relationship information may be generated by the three-dimensional data encoding device, and the generated dependency relationship information may be transmitted to the three-dimensional data decoding device. Alternatively, the three-dimensional data decoding device may generate dependency relationship information, and the three-dimensional data encoding device need not transmit dependency relationship information. In addition, a dependency relationship to be used by the three-dimensional data encoding device may be determined in advance, and the three-dimensional data encoding device need not transmit dependency relationship information.

Figure 51:
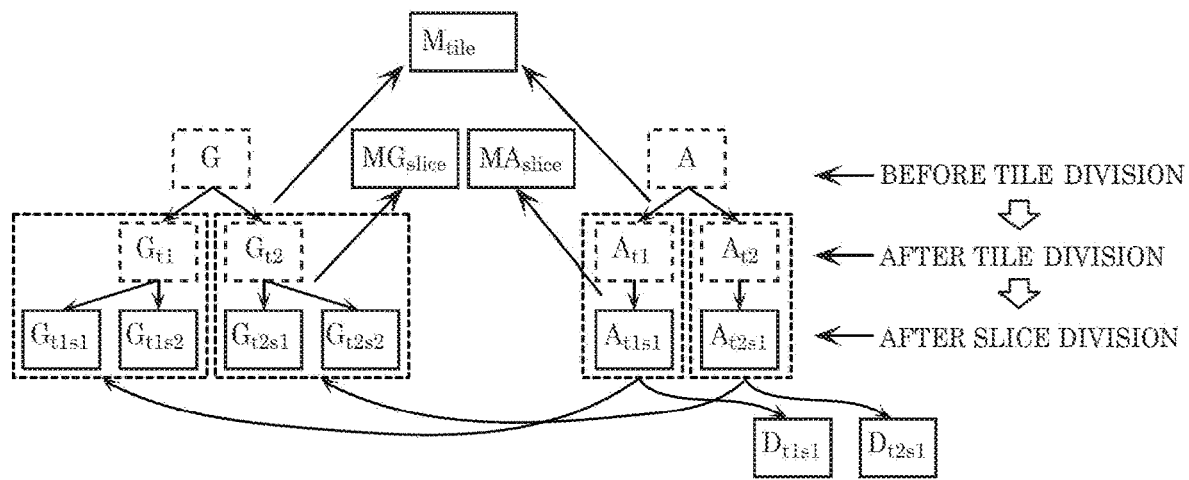
FIG. 51 is a diagram illustrating an example of dependency relationships according to Embodiment 6.

FIG. 51 is a diagram illustrating an example of a dependency relationship of each data. The pointed end of an arrow in the figure indicates a dependee, and the other end of the arrow indicates a depender. The three-dimensional data decoding device decodes data in order from dependee to depender. Data indicated by a solid line in the figure is data actually transmitted, and data indicated by a broken line is data not transmitted.

In the figure, G denotes geometry information, and A denotes attribute information. $G_{t1}$ denotes geometry information for tile number 1, and $G_{t2}$ denotes geometry information for tile number 2. $G_{t1s1}$ denotes geometry information for tile number 1 and slice number 1, $G_{t1s2}$ denotes geometry information for tile number 1 and slice number 2, $G_{t2s1}$ denotes geometry information for tile number 2 and slice number 1, and $G_{t2s2}$ denotes geometry information for tile number 2 and slice number 2. Likewise, $A_{t1}$ denotes attribute information for tile number 1, and $A_{t2}$ denotes attribute information for tile number 2. $A_{t1s1}$ denotes attribute information for tile number 1 and slice number 1, $A_{t1s2}$ denotes attribute information for tile number 1 and slice number 2, $A_{t2s1}$ denotes attribute information for tile number 2 and slice number 1, and $A_{t2s2}$ denotes attribute information for tile number 2 and slice number 2.

Mtile denotes tile additional information, MGslice denotes geometry slice additional information, and MAslice denotes attribute slice additional information. $D_{t1s1}$ denotes dependency relationship information of attribute information $A_{t1s1}$, and $D_{t2s1}$ denotes dependency relationship information of attribute information $A_{t2s1}$.

It should be noted that a different structure resulting from tile division or slice division may be used according to an application etc.

The three-dimensional data encoding device may rearrange data in decoding order so that the three-dimensional data decoding device need not rearrange data. It should be noted that the three-dimensional data decoding device may rearrange data, or both the three-dimensional data encoding device and the three-dimensional data decoding device may rearrange data.

Figure 52:
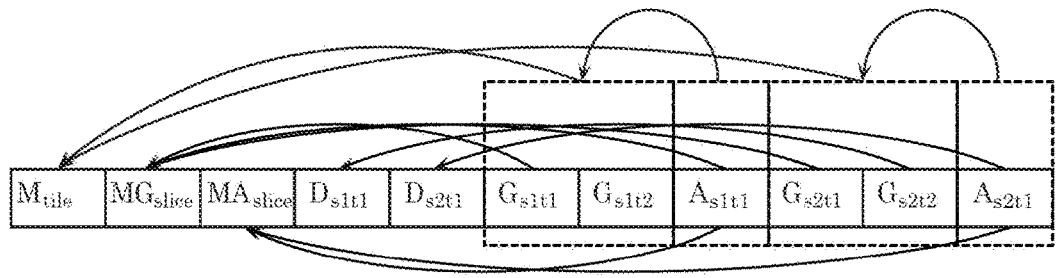
FIG. 52 is a diagram illustrating an example of decoding order of data according to Embodiment 6.

FIG. 52 is a diagram illustrating an example of decoding order of data. In the example shown in FIG. 52, data are decoded in order from the left. The three-dimensional data decoding device decodes, out of data having a dependency relationship with each other, data of a dependee first. For example, the three-dimensional data encoding device rearranges data in this order and transmits the data. It should be noted that any order may be used as long as data of a dependee takes precedence. Moreover, the three-dimensional data encoding device may transmit additional information and dependency relationship information before data.

Figure 53:
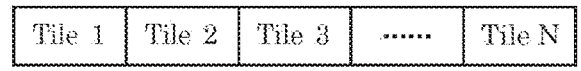
FIG. 53 is a diagram illustrating an example of encoded data of tiles according to Embodiment 6.

Furthermore, the three-dimensional data decoding device may selectively decode tiles based on a request from an application and information obtained from a NAL unit header. FIG. 53 is a diagram illustrating an example of encoded data of tiles. For example, decoding order of tiles is optional. In other words, tiles need not have a dependency relationship with each other.

Figure 54:
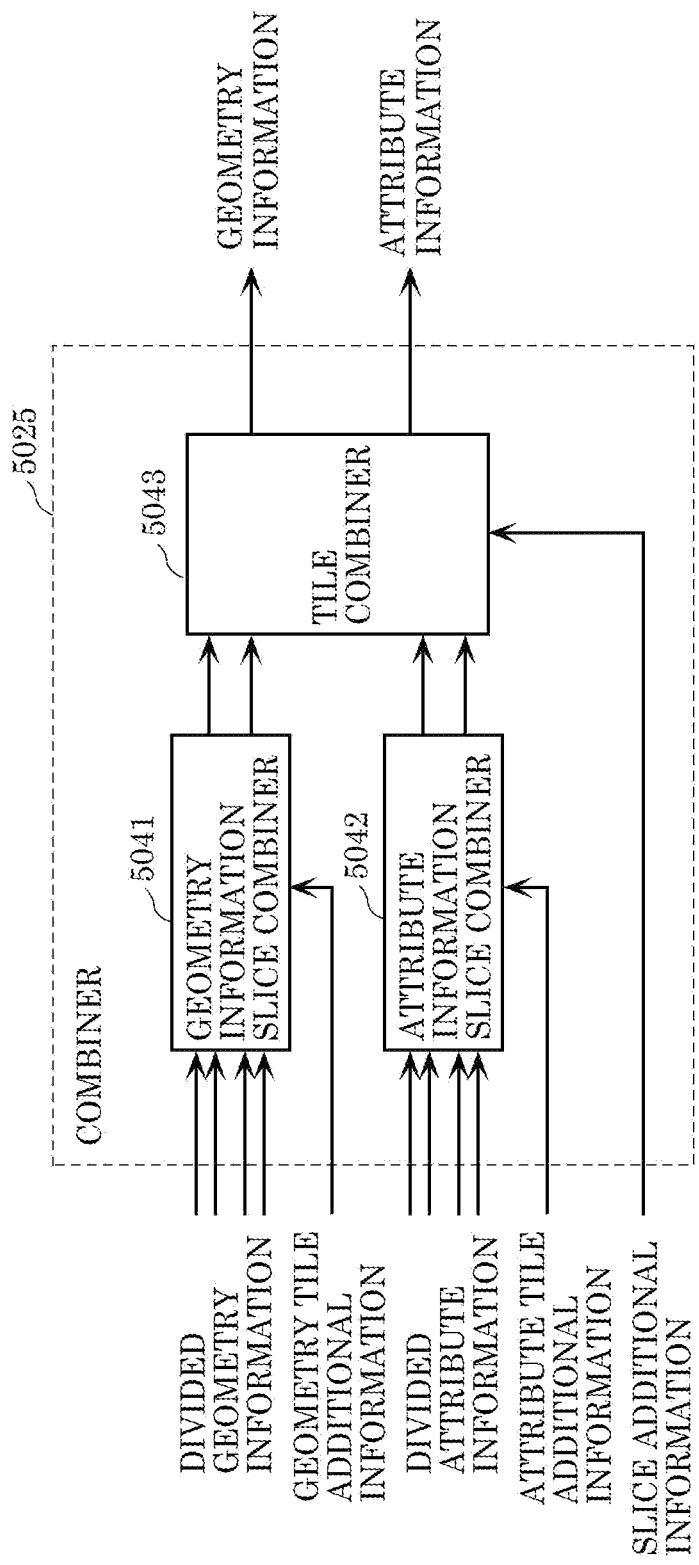
FIG. 54 is a block diagram of a combiner according to Embodiment 6.

The following describes a configuration of combiner 5025 included in first decoder 5020. FIG. 54 is a block diagram illustrating a configuration of combiner 5025. Combiner 5025 includes geometry information slice combiner (geometry slice combiner) 5041, attribute information slice combiner (attribute slice combiner) 5042, and tile combiner 5043.

Geometry information slice combiner 5041 generates pieces of tile geometry information by combining pieces of divided geometry information using geometry slice additional information. Attribute information slice combiner 5042 generates pieces of tile attribute information by combining pieces of divided attribute information using attribute slice additional information.

Tile combiner 5043 generates geometry information by combining pieces of tile geometry information using tile additional information. Besides, tile combiner 5043 generates attribute information by combining pieces of tile attribute information using tile additional information.

It should be noted that the number of divided slices or tiles is at least one. In other words, slice division or tile division need not be performed.

Figure 55:
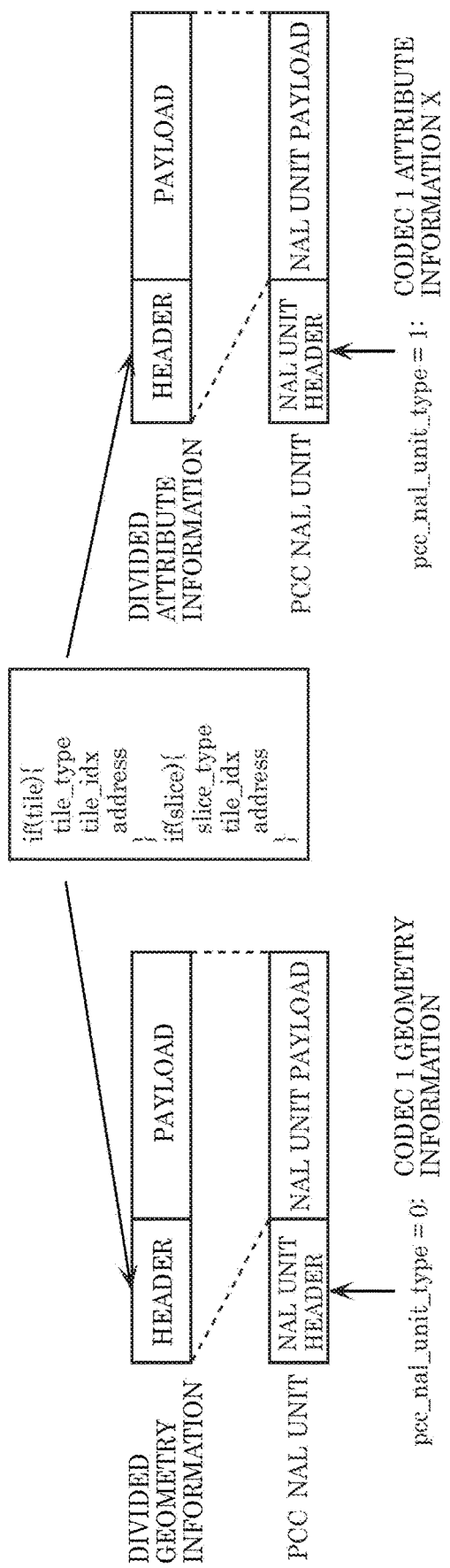
FIG. 55 is a diagram illustrating a structural example of encoded data and NAL units according to Embodiment 6.

The following describes a structure of encoded data subjected to slice division or tile division, and a method of storing encoded data in a NAL unit (a multiplexing method). FIG. 55 is a diagram illustrating a structure of encoded data and a method of storing encoded data in a NAL unit.

Encoded data (divided geometry information or divided attribute information) is stored in a NAL unit payload.

Encoded data includes a header and a payload. The header includes identification information for identifying data included in the payload. Examples of the identification information include a type of slice division or tile division information (slice_type, tile_type), index information for identifying a slice or a tile (slice_idx, tile_idx), geometry information of data (a slice or tile), or an address of data (address). Index information for identifying a slice is also referred to as a slice index (SliceIndex). Index information for identifying a tile is also referred to as a tile index (TileIndex). A division type indicates, for example, a method based on an object shape as described above, a method based on map information or position information, or a method based on a data volume or an amount of processing.

Moreover, the header of the encoded data includes identification information indicating a dependency relationship. To put it another way, when data have a dependency relationship with each other, the header includes identification information for a depender to refer to a dependee. For example, the header of data of a dependee includes identification information for identifying the data. The header of data of a depender includes identification information indicating a dependee. It should be noted that when identification information for identifying data, additional information regarding slice division or tile division, and identification information indicating a dependency relationship are identifiable or derivable from other information, these pieces of information may be omitted.

Figure 56:
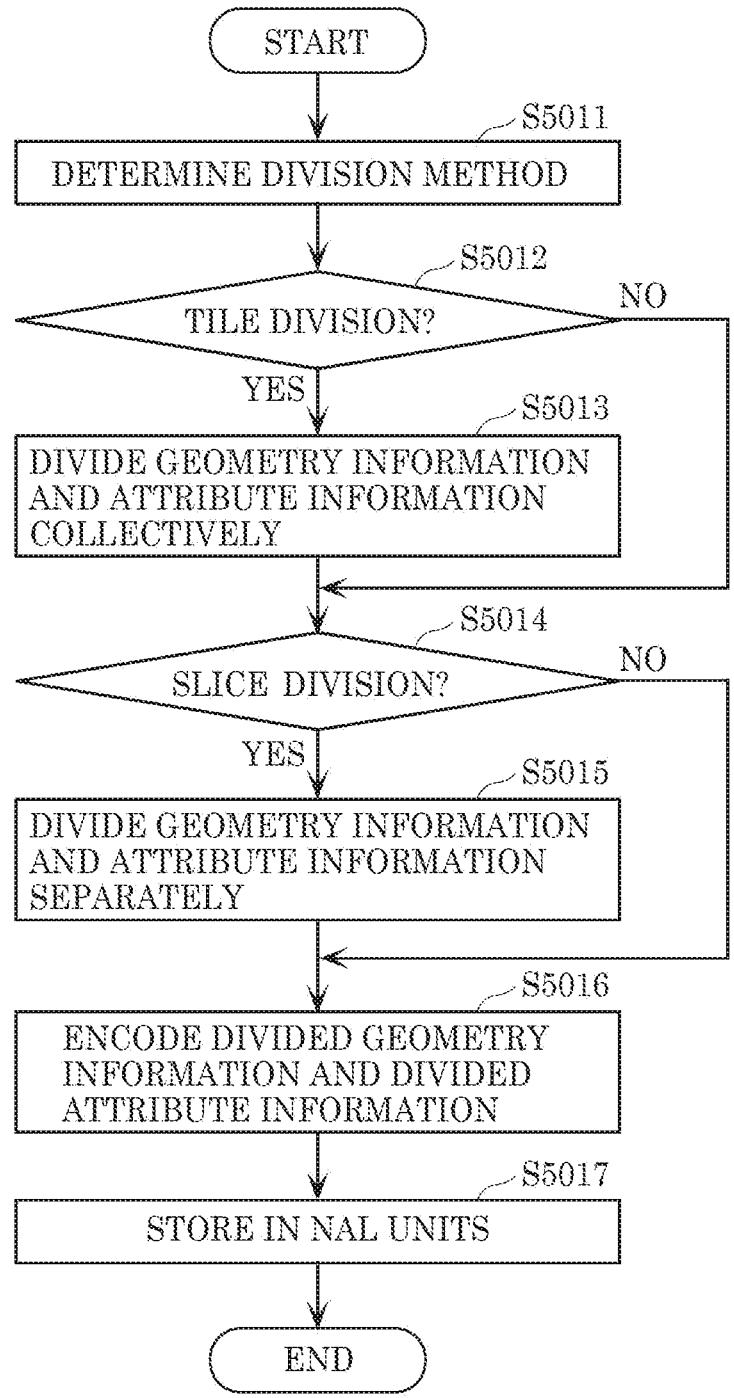
FIG. 56 is a flowchart of an encoding process according to Embodiment 6.

The following describes procedures of a point cloud data encoding process and a point cloud data decoding process according to the present embodiment. FIG. 56 is a flowchart of a point cloud data encoding process according to the present embodiment.

First, the three-dimensional data encoding device determines a division method to be used (S5011). Examples of the division method include tile division and slice division. A division method may include a division number, a division type, etc. when tile division or slice division is performed. A division type indicates, for example, a method based on an object shape as described above, a method based on map information or geometry information, or a method based on a data volume or an amount of processing. It should be noted that a division method may be determined in advance.

When tile division is performed (YES in S5012), the three-dimensional data encoding device generates pieces of tile geometry information and pieces of tile attribute information by dividing geometry information and attribute information collectively (S5013). Besides, the three-dimensional data encoding device generates tile additional information regarding the tile division. It should be noted that the three-dimensional data encoding device may divide geometry information and attribute information separately.

When slice division is performed (YES in S5014), the three-dimensional data encoding device generates pieces of divided geometry information and pieces of divided attribute information by dividing the pieces of tile geometry information and the pieces of tile attribute information (or the geometry information and the attribute information) separately (S5015). Also, the three-dimensional data encoding device generates geometry slice additional information and attribute slice additional information regarding the slice division. It should be noted that the three-dimensional data encoding device may divide tile geometry information and tile attribute information collectively.

Next, the three-dimensional data encoding device generates pieces of encoded geometry information and pieces of encoded attribute information by respectively encoding the pieces of divided geometry information and the pieces of divided attribute information (S5016). In addition, the three-dimensional data encoding device generates dependency relationship information.

Finally, the three-dimensional data encoding device generates encoded data (an encoded stream) by storing in NAL units (multiplexing) the pieces of encoded geometry information, the pieces of encoded attribute information, and additional information (S5017). Additionally, the three-dimensional data encoding device transmits the generated encoded data.

Figure 57:
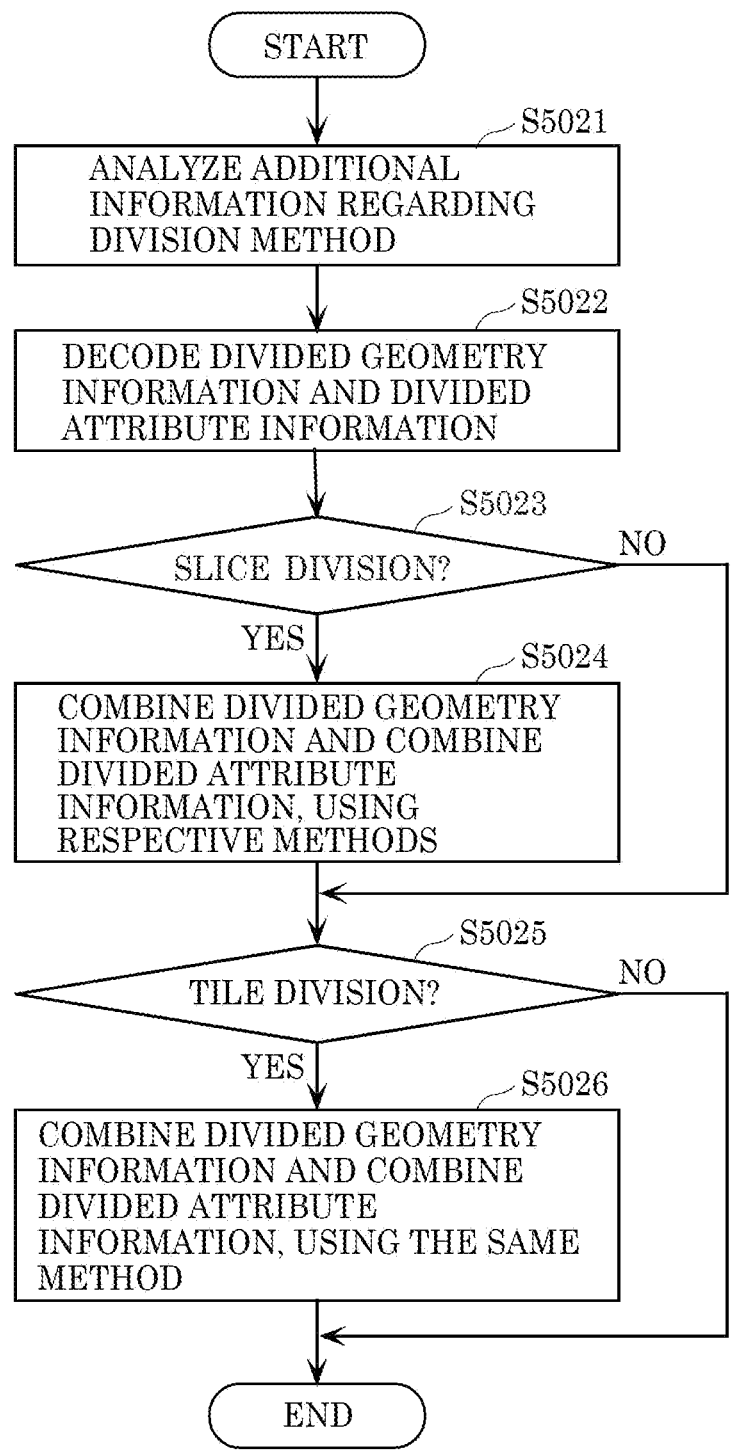
FIG. 57 is a flowchart of a decoding process according to Embodiment 6.

FIG. 57 is a flowchart of a point cloud data decoding process according to the present embodiment. First, the three-dimensional data decoding device determines a division method by analyzing additional information (tile additional information, geometry slice additional information, attribute slice additional information) regarding a division method included in encoded data (an encoded stream) (S5021). Examples of the division method include tile division and slice division. A division method may include a division number, a division type, etc. when tile division or slice division is performed.

Next, the three-dimensional data decoding device generates divided geometry information and divided attribute information by decoding pieces of encoded geometry information and pieces of encoded attribute information included in the encoded data, using dependency relationship information included in the encoded data (S5022).

When the additional information indicates that slice division has been performed (YES in S5023), the three-dimensional data decoding device generates pieces of tile geometry information and pieces of tile attribute information by combining pieces of divided geometry information and combining pieces of divided attribute information, using respective methods, based on the geometry slice additional information and the attribute slice additional information (S5024). It should be noted that the three-dimensional data decoding device may combine the pieces of divided geometry information and combine the pieces of divided attribute information, using the same method.

When the additional information indicates that tile division has been performed (YES in S5025), the three-dimensional data decoding device generates geometry information and attribute information by combining the pieces of tile geometry information (the pieces of divided geometry information) and combining the pieces of tile attribute information (the pieces of divided attribute information), using the same method, based on tile additional information (S5026). It should be noted that the three-dimensional data decoding device may combine the pieces of tile geometry information and combine the pieces of tile attribute information, using respective methods.

The following describes tile additional information. The three-dimensional data encoding device generates tile additional information that is metadata regarding a tile division method, and transmits the generated tile additional information to the three-dimensional data decoding device.

FIG. 58 is a diagram illustrating an example of syntax of tile additional information (TileMetaData). As shown in FIG. 58, for example, tile additional information includes division method information (type_of_divide), shape information (topview_shape), an overlap flag (tile_overlap_flag), overlap information (type_of_overlap), height information (tile_height), a tile number (tile_number), and tile position information (global_position, relative_position).

Division method information (type_of_divide) indicates a tile division method. For example, division method information indicates whether a tile division method is division based on map information, that is, division based on top view (top_view) or another division (other).

Shape information (topview_shape) is included in tile additional information when a tile division method is, for example, division based on top view. Shape information indicates a shape in top view of a tile. Examples of the shape include a square and a circle. Moreover, the examples of the shape may include an ellipse, a rectangle, or a polygon other than a quadrangle, or may include a shape other than these. It should be noted that shape information may indicate not only a shape in top view of a tile but also a three-dimensional shape (e.g., a cube, a round column) of a tile.

An overlap flag (tile_overlap_flag) indicates whether tiles overlap each other. For example, an overlap flag is included in tile additional information when a tile division method is division based on top view. In this case, the overlap flag indicates whether tiles overlap each other in top view. It should be noted that an overlap flag may indicate whether tiles overlap each other in a three-dimensional space.

Overlap information (type_of_overlap) is included in tile additional information when, for example, tiles overlap each other. Overlap information indicates, for example, how tiles overlap each other. For example, overlap information indicates the size of an overlapping region.

Height information (tile_height) indicates the height of a tile. It should be noted that height information may include information indicating a tile shape. For example, when the shape of a tile in top view is a rectangle, the information may indicate the length of a side (a vertical length, a horizontal length) of the rectangle. When the shape of a tile in top view is a circle, the information may indicate the diameter or radius of the circle.

Moreover, height information may indicate the height of each tile or a height common to tiles. In addition, height types such as roads and overpasses may be set in advance, and height information may indicate the height of each of the height types and a height type of each tile. Alternatively, a height of each height type may be specified in advance, and height information may indicate a height type of each tile. In other words, height information need not indicate a height of each height type.

A tile number (tile_number) indicates the number of tiles. It should be noted that tile additional information may include information indicating an interval between tiles.

Tile position information (global_position, relative_position) is information for identifying the position of each tile. For example, tile position information indicates the absolute coordinates or relative coordinates of each tile.

It should be noted that part or all of the above-mentioned information may be provided for each tile or each group of tiles (e.g., for each frame or group of frames).

The three-dimensional data encoding device may include tile additional information in supplemental enhancement information (SEI) and transmit the SEI. Alternatively, the three-dimensional data encoding device may store tile additional information in an existing parameter set (PPS, GPS, or APS, etc.) and transmit the parameter set.

For example, when tile additional information changes for each frame, the tile additional information may be stored in a parameter set for each frame (GPS or APS etc.). When tile additional information does not change in a sequence, the tile additional information may be stored in a parameter set for sequence (geometry SPS or attribute SPS). Further, when the same tile division information is used for geometry information and attribute information, tile additional information may be stored in a parameter set for a PCC stream (a stream PS).

Moreover, tile additional information may be stored in any one of the above-mentioned parameter sets or in parameter sets. In addition, tile additional information may be stored in the header of encoded data. Additionally, tile additional information may be stored in the header of a NAL unit.

Furthermore, part or all of tile additional information may be stored in one of the header of divided geometry information and the header of divided attribute information, and need not be stored in the other. For example, when the same tile additional information is used for geometry information and attribute information, the tile additional information may be included in the header of one of the geometry information and the attribute information. For example, when attribute information depends on geometry information, the geometry information is processed first. For this reason, the tile additional information may be included in the header of the geometry information, and need not be included in the header of the attribute information. In this case, for example, the three-dimensional data decoding device determines that the attribute information of the dependee belongs to the same tile as a tile having the geometry information of the dependee.

The three-dimensional data decoding device reconstructs point cloud data subjected to tile division, based on tile additional information. When there are pieces of overlapping point cloud data, the three-dimensional data decoding device specifies the pieces of overlapping point cloud data and selects one of the pieces of overlapping point cloud data or merges pieces of point cloud data.

Moreover, the three-dimensional data decoding device may perform decoding using tile additional information. For example, when tiles overlap each other, the three-dimensional data decoding device may perform decoding for each tile, perform processing (e.g., smoothing or filtering) using the pieces of decoded data, and generate point cloud data. This makes it possible to perform highly accurate decoding.

Figure 59:
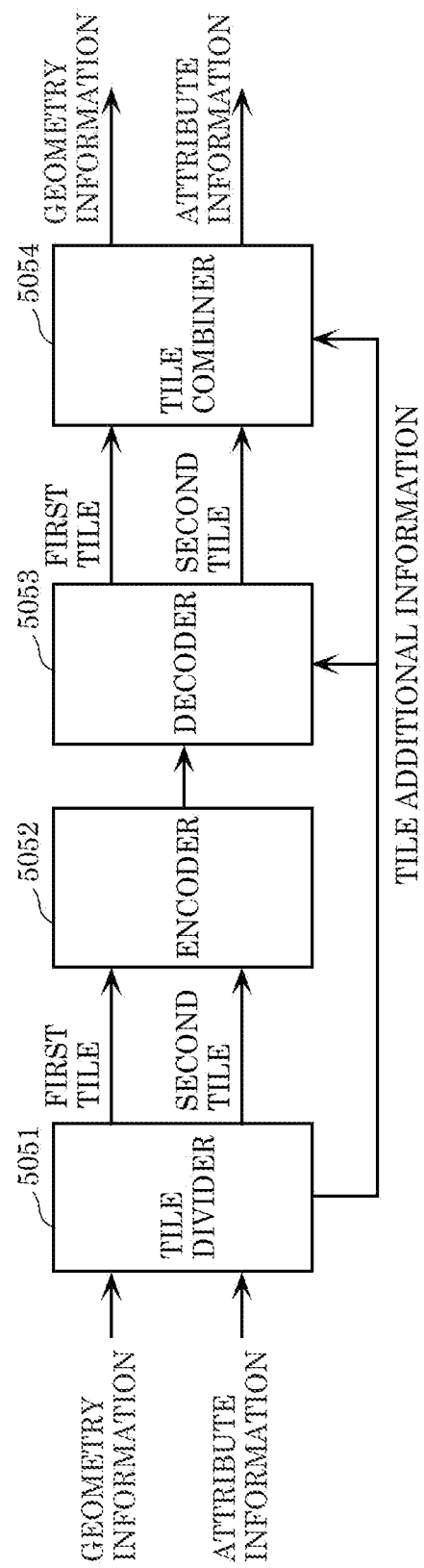
FIG. 59 is a block diagram of an encoding and decoding system according to Embodiment 6.

FIG. 59 is a diagram illustrating a configuration example of a system including the three-dimensional data encoding device and the three-dimensional data decoding device. Tile divider 5051 divides point cloud data including geometry information and attribute information into a first tile and a second tile. In addition, tile divider 5051 transmits tile additional information regarding tile division to decoder 5053 and tile combiner 5054.

Encoder 5052 generates encoded data by encoding the first tile and the second tile.

Decoder 5053 restores the first tile and the second tile by decoding the encoded data generated by encoder 5052. Tile combiner 5054 restores the point cloud data (the geometry information and the attribute information) by combining the first tile and the second tile using the tile additional information.

The following describes slice additional information. The three-dimensional data encoding device generates slice additional information that is metadata regarding a slice division method, and transmits the generated slice additional information to the three-dimensional data decoding device.

FIG. 60 is a diagram illustrating an example of syntax of slice additional information (SliceMetaData). As shown in FIG. 60, for example, slice additional information includes division method information (type_of_divide), an overlap flag (slice_overlap_flag), overlap information (type_of_overlap), a slice number (slice_number), slice position information (global_position, relative_position), and slice size information (slice_bounding_box_size).

Division method information (type_of_divide) indicates a slice division method. For example, division method information indicates whether a slice division method is division based on information about an object (object) as shown in FIG. 50. It should be noted that slice additional information may include information indicating an object division method. For example, this information indicates whether one object is to be divided into slices or assigned to one slice. In addition, the information may indicate, for example, a division number when one object is divided into slices.

An overlap flag (slice_overlap_flag) indicates whether slices overlap each other. Overlap information (type_of_overlap) is included in slice additional information when, for example, slices overlap each other. Overlap information indicates, for example, how slices overlap each other. For example, overlap information indicates the size of an overlapping region.

A slice number (slice_number) indicates the number of slices.

Slice position information (global_position, relative_position) and slice size information (slice_bounding_box_size) are information about a region of a slice. Slice position information is information for identifying the position of each slice. For example, slice position information indicates the absolute coordinates or relative coordinates of each slice. Slice size information (slice_bounding_box_size) indicates the size of each slice. For example, slice size information indicates the size of a bounding box of each slice.

The three-dimensional data encoding device may include slice additional information in SEI and transmit the SEI. Alternatively, the three-dimensional data encoding device may store slice additional information in an existing parameter set (PPS, GPS, or APS, etc.) and transmit the parameter set.

For example, when slice additional information changes for each frame, the slice additional information may be stored in a parameter set for each frame (GPS or APS etc.). When slice additional information does not change in a sequence, the slice additional information may be stored in a parameter set for sequence (geometry SPS or attribute SPS). Further, when the same slice division information is used for geometry information and attribute information, slice additional information may be stored in a parameter set for a PCC stream (a stream PS).

Moreover, slice additional information may be stored in any one of the above-mentioned parameter sets or in parameter sets. In addition, slice additional information may be stored in the header of encoded data. Additionally, slice additional information may be stored in the header of a NAL unit.

Furthermore, part or all of slice additional information may be stored in one of the header of divided geometry information and the header of divided attribute information, and need not be stored in the other. For example, when the same slice additional information is used for geometry information and attribute information, the slice additional information may be included in the header of one of the geometry information and the attribute information. For example, when attribute information depends on geometry information, the geometry information is processed first. For this reason, the slice additional information may be included in the header of the geometry information, and need not be included in the header of the attribute information. In this case, for example, the three-dimensional data decoding device determines that the attribute information of the depender belongs to the same slice as a slice having the geometry information of the dependee.

The three-dimensional data decoding device reconstructs point cloud data subjected to slice division, based on slice additional information. When there are pieces of overlapping point cloud data, the three-dimensional data decoding device specifies the pieces of overlapping point cloud data and selects one of the pieces of overlapping point cloud data or merges pieces of point cloud data.

Moreover, the three-dimensional data decoding device may perform decoding using slice additional information. For example, when slices overlap each other, the three-dimensional data decoding device may perform decoding for each slice, perform processing (e.g., smoothing or filtering) using the pieces of decoded data, and generate point cloud data. This makes it possible to perform highly accurate decoding.

Figure 61:
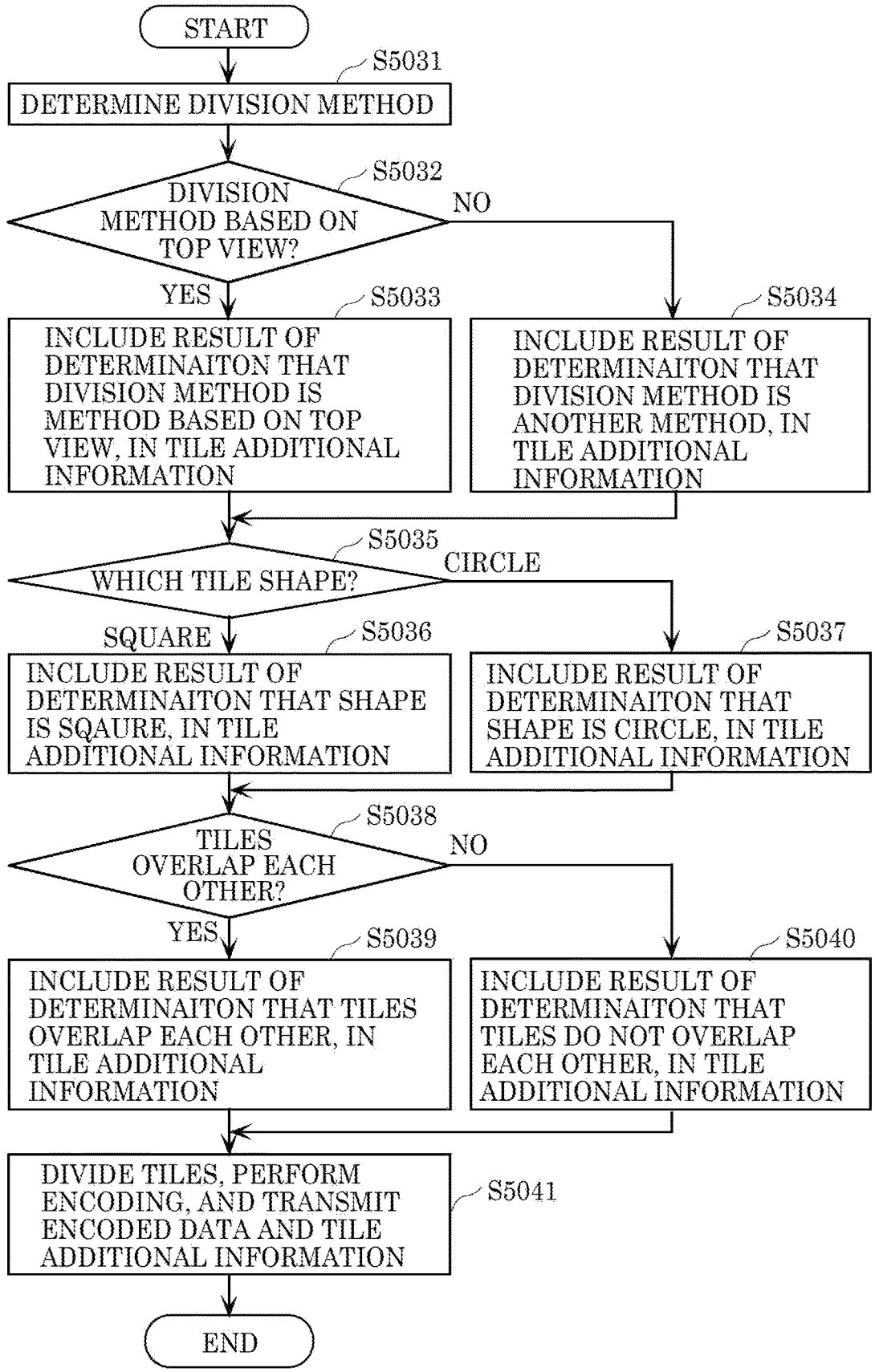
FIG. 61 is a flowchart of an encoding process according to Embodiment 6.

FIG. 61 is a flowchart of a three-dimensional data encoding process including a tile additional information generation process performed by the three-dimensional data encoding device according to the present embodiment.

First, the three-dimensional data encoding device determines a division method to be used (S5031). Specifically, the three-dimensional data encoding device determines whether a division method based on top view (top_view) or another method (other) is to be used as a tile division method. In addition, the three-dimensional data encoding device determines a tile shape when the division method based on top view is used. Additionally, the three-dimensional data encoding device determines whether tiles overlap with other tiles.

When the tile division method determined in step S5031 is the division method based on top view (YES in S5032), the three-dimensional data encoding device includes a result of the determination that the tile division method is the division method based on top view (top_view), in tile additional information (S5033).

On the other hand, when the tile division method determined in step S5031 is a method other than the division method based on top view (NO in S5032), the three-dimensional data encoding device includes a result of the determination that the tile division method is the method other than the division method based on top view (top_view), in tile additional information (S5034).

Moreover, when a shape in top view of a tile determined in step S5031 is a square (SQUARE in S5035), the three-dimensional data encoding device includes a result of the determination that the shape in top view of the tile is the square, in the tile additional information (S5036). In contrast, when a shape in top view of a tile determined in step S5031 is a circle (CIRCLE in S5035), the three-dimensional data encoding device includes a result of the determination that the shape in top view of the tile is the circle, in the tile additional information (S5037).

Next, the three-dimensional data encoding device determines whether tiles overlap with other tiles (S5038). When the tiles overlap with the other tiles (YES in S5038), the three-dimensional data encoding device includes a result of the determination that the tiles overlap with the other tiles, in the tile additional information (S5039). On the other hand, when the tiles do not overlap with other tiles (NO in S5038), the three-dimensional data encoding device includes a result of the determination that the tiles do not overlap with the other tiles, in the tile additional information (S5040).

Finally, the three-dimensional data encoding device divides the tiles based on the tile division method determined in step S5031, encodes each of the tiles, and transmits the generated encoded data and the tile additional information (S5041).

Figure 62:
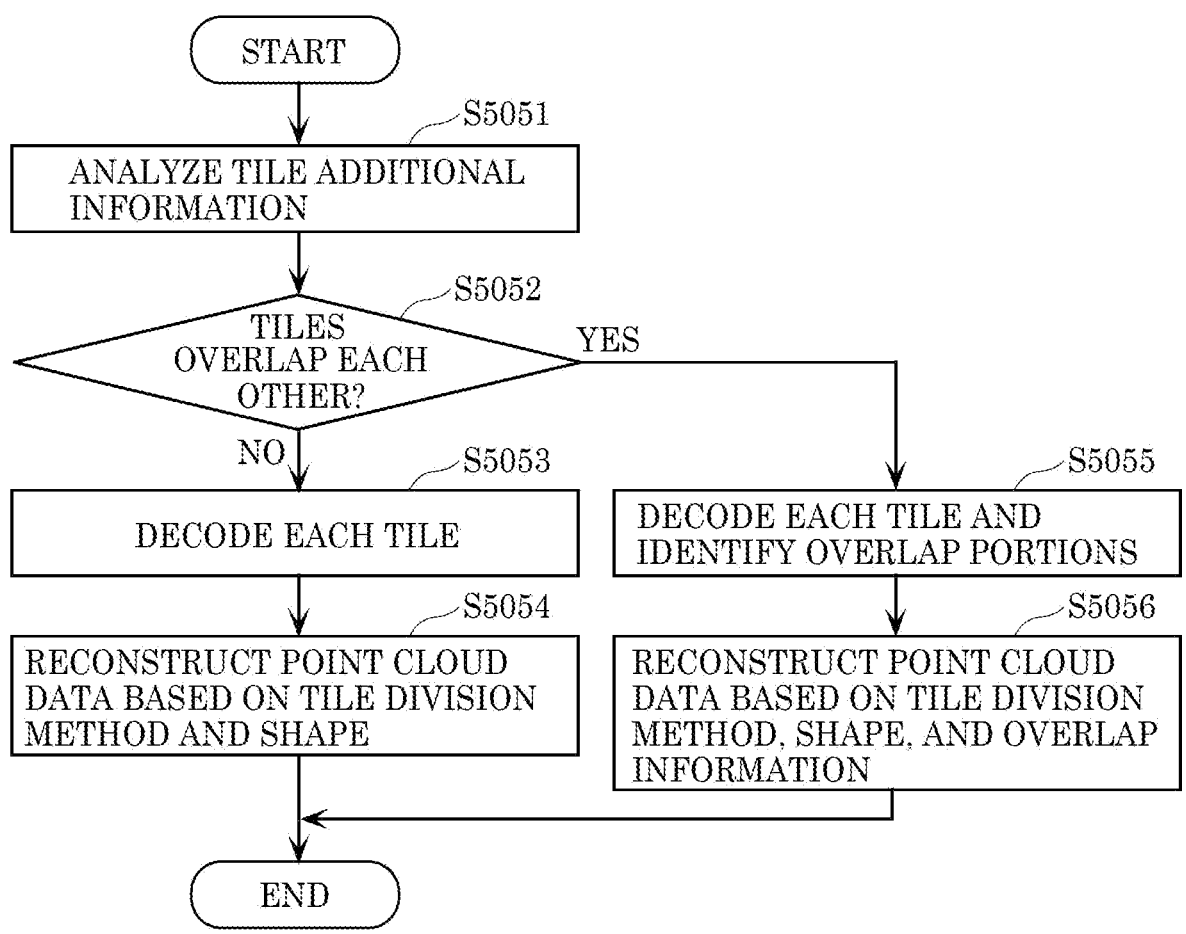
FIG. 62 is a flowchart of a decoding process according to Embodiment 6.

FIG. 62 is a flowchart of a three-dimensional data decoding process performed by the three-dimensional data decoding device according to the present embodiment using tile additional information.

First, the three-dimensional data decoding device analyzes tile additional information included in a bitstream (S5051).

When the tile additional information indicates that tiles do not overlap with other tiles (NO in S5052), the three-dimensional data decoding device generates point cloud data of each tile by decoding the tile (S5053). Finally, the three-dimensional data decoding device reconstructs point cloud data from the point cloud data of each tile, based on a tile division method and a tile shape indicated by the tile additional information (S5054).

In contrast, when the tile additional information indicates that tiles overlap with other tiles (YES in S5052), the three-dimensional data decoding device generates point cloud data of each tile by decoding the tile. In addition, the three-dimensional data decoding device identifies overlap portions of the tiles based on the tile additional information (S5055). It should be noted that, regarding the overlap portions, the three-dimensional data decoding device may perform decoding using pieces of overlapping information. Finally, the three-dimensional data decoding device reconstructs point cloud data from the point cloud data of each tile, based on a tile division method, a tile shape, and overlap information indicated by the tile additional information (S5056).

The following describes, for example, variations regarding slice. The three-dimensional data encoding device may transmit, as additional information, information indicating a type (a road, a building, a tree, etc.) or attribute (dynamic information, static information, etc.) of an object. Alternatively, a coding parameter may be predetermined according to an object, and the three-dimensional data encoding device may notify the coding parameter to the three-dimensional data decoding device by transmitting a type or attribute of the object.

The following methods may be used regarding slice data encoding order and transmitting order. For example, the three-dimensional data encoding device may encode slice data in decreasing order of ease of object recognition or clustering. Alternatively, the three-dimensional data encoding device may encode slice data in the order in which clustering is completed. Moreover, the three-dimensional data encoding device may transmit slice data in the order in which the slice data is encoded. Alternatively, the three-dimensional data encoding device may transmit slice data in decreasing order of priority for decoding in an application. For example, when dynamic information has high priority for decoding, the three-dimensional data encoding device may transmit slice data in the order in which slices are grouped using the dynamic information.

Furthermore, when encoded data order is different from the order of priority for decoding, the three-dimensional data encoding device may transmit encoded data after rearranging the encoded data. In addition, when storing encoded data, the three-dimensional data encoding device may store encoded data after rearranging the encoded data.

An application (the three-dimensional data decoding device) requests a server (the three-dimensional data encoding device) to transmit slices including desired data. The server may transmit slice data required by the application, and need not transmit slice data unnecessary for the application.

An application requests a server to transmit a tile including desired data. The server may transmit tile data required by the application, and need not transmit tile data unnecessary for the application.

Figure 63:
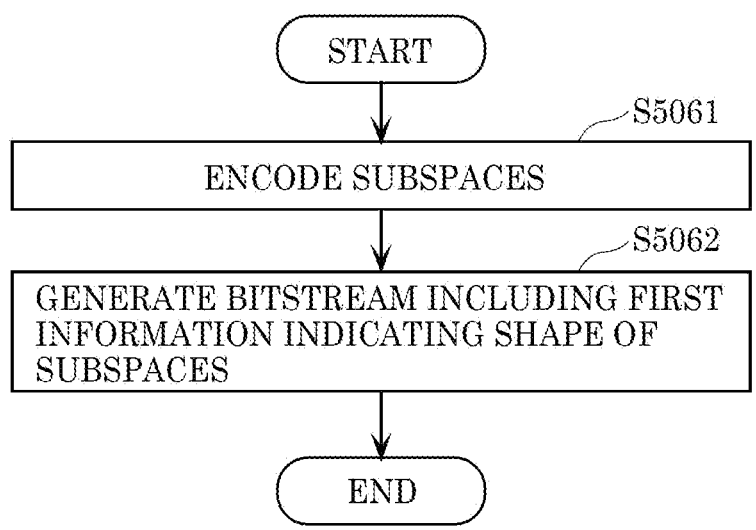
FIG. 63 is a flowchart of an encoding process according to Embodiment 6.

As stated above, the three-dimensional data encoding device according to the present embodiment performs the process shown in FIG. 63. First, the three-dimensional data encoding device encodes subspaces (e.g., tiles) obtained by dividing a current space which includes three-dimensional points, to generate pieces of encoded data (S5061). The three-dimensional data encoding device generates a bitstream including the pieces of encoded data and first information (e.g., topview_shape) indicating a shape of each of the subspaces (S5062).

Accordingly, since the three-dimensional data encoding device can select any shape from various types of shapes of subspaces, the three-dimensional data encoding device can improve the coding efficiency.

For example, the shape is a two-dimensional shape or a three-dimensional shape of each of the subspaces. For example, the shape is a shape in a top view of the subspace. To put it another way, the first information indicates a shape of the subspace viewed from a specific direction (e.g., an upper direction). In short, the first information indicates a shape in an overhead view of the subspace. For example, the shape is rectangular or circular.

For example, the bitstream includes second information (e.g., tile_overlap_flag) indicating whether the subspaces overlap.

Accordingly, since the three-dimensional data encoding device allows subspaces to overlap, the three-dimensional data encoding device can generate the subspaces without making a shape of each of the subspaces complex.

For example, the bitstream includes third information (e.g., type_of_divide) indicating whether a division method used to obtain the subspaces is a division method using a top view.

For example, the bitstream includes fourth information (e.g., tile_height) indicating at least one of a height, a width, a depth, or a radius of each of the subspaces.

For example, the bitstream includes fifth information (e.g., global_position or relative_position) indicating a position of each of the subspaces.

For example, the bitstream includes sixth information (e.g., tile_number) indicating a total number of the subspaces.

For example, the bitstream includes seventh information indicating an interval between the subspaces.

For example, the three-dimensional data encoding device includes a processor and memory, and the processor performs the above process using the memory.

Figure 64:
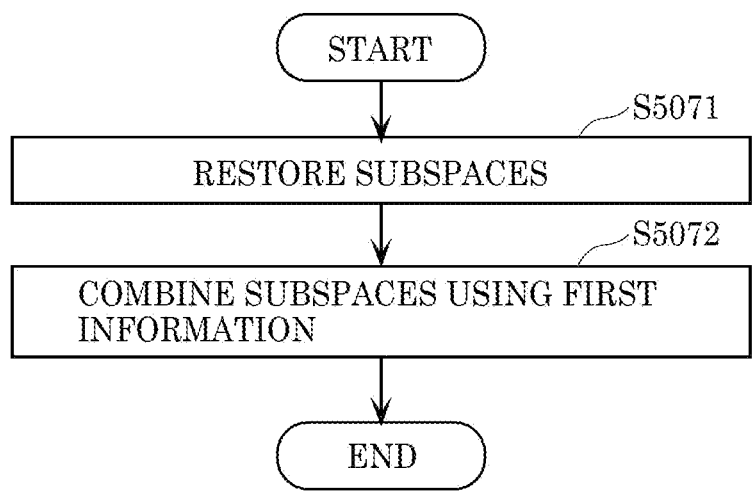
FIG. 64 is a flowchart of a decoding process according to Embodiment 6.

Moreover, the three-dimensional data decoding device according to the present embodiment performs the process shown in FIG. 64. First, the three-dimensional data decoding device decodes pieces of encoded data included in a bitstream and generated by encoding subspaces (e.g., tiles) obtained by dividing a current space which includes three-dimensional points, to restore the subspaces (S5071). The three-dimensional data decoding device restores the current space by combining the subspaces using first information (e.g., topview_shape) which is included in the bitstream and indicates a shape of each of the subspaces (S5072). For example, the three-dimensional data decoding device can determine a position and a range of each of subspaces in a current space by recognizing a shape of the subspace using the first information. The three-dimensional data decoding device can combine the subspaces based on the determined positions and ranges of the subspaces. Accordingly, the three-dimensional data decoding device can combine the subspaces correctly.

For example, the shape is a two-dimensional shape or a three-dimensional shape of each of the subspaces. For example, the shape is rectangular or circular.

For example, the bitstream includes second information (e.g., tile_overlap_flag) indicating whether the subspaces overlap. In the restoring of the current space, the three-dimensional data decoding device combines the subspaces by further using the second information. For example, the three-dimensional data decoding device determines whether subspaces overlap, using the second information. When the subspaces overlap, the three-dimensional data decoding device identifies overlap regions and performs a predetermined process on the identified regions.

For example, the bitstream includes third information (e.g., type_of_divide) indicating whether a division method used to obtain the subspaces is a division method using a top view. In the restoring of the current space, when the third information indicates that the division method used to obtain the subspaces is the division method using the top view, the three-dimensional data decoding device combines the subspaces using the first information.

For example, the bitstream includes fourth information (e.g., tile_height) indicating at least one of a height, a width, a depth, or a radius of each of the subspaces. In the restoring of the current space, the three-dimensional data decoding device combines the subspaces by further using the fourth information. For example, the three-dimensional data decoding device can determine a position and a range of each of subspaces in a current space by recognizing a height of the subspace using the fourth information. The three-dimensional data decoding device can combine the subspaces based on the determined positions and ranges of the subspaces.

For example, the bitstream includes fifth information (e.g., global_position or relative_position) indicating a position of each of the subspaces. In the restoring of the current space, the three-dimensional data decoding device combines the subspaces by further using the fifth information. For example, the three-dimensional data decoding device can determine a position of each of subspaces in a current space by recognizing a position of the subspace using the fifth information. The three-dimensional data decoding device can combine the subspaces based on the determined positions of the subspaces.

For example, the bitstream includes sixth information (e.g., tile_number) indicating a total number of the subspaces. In the restoring of the current space, the three-dimensional data decoding device combines the subspaces by further using the sixth information.

For example, the bitstream includes seventh information indicating an interval between the subspaces. In the restoring of the current space, the three-dimensional data decoding device combines the subspaces by further using the seventh information. For example, the three-dimensional data decoding device can determine a position and a range of each of subspaces in a current space by recognizing an interval between the subspaces using the seventh information. The three-dimensional data decoding device can combine the subspaces based on the determined positions and ranges of the subspaces.

For example, the three-dimensional data decoding device includes a processor and memory, and the processor performs the above process using the memory.

Embodiment 7

Next, a quantization parameter will be described.

In order to divide point cloud data based on characteristics and positions concerning the point cloud data, a slice and a tile are used. Here, a different quality may be required for each of the pieces of divisional point cloud data, because of hardware restrictions or requirements for real-time processing, for example. For example, when encoding point cloud data by dividing the point cloud data into slices on an object basis, slice data including a plant is less important, so that the resolution (quality) of the slice data can be decreased by quantization. On the other hand, the resolution (quality) of important slice data can be increased by setting the quantization value at a lower value. A quantization parameter is used to enable such a control of quantization value.

Here, data to be quantized, a scale used for the quantization, and quantized data, which is the result of calculation by the quantization, are expressed by Equations G1 and G2 below.

quantized data=data/scale (Equation G1)

data=quantized data*scale (Equation G2)

Figure 65:
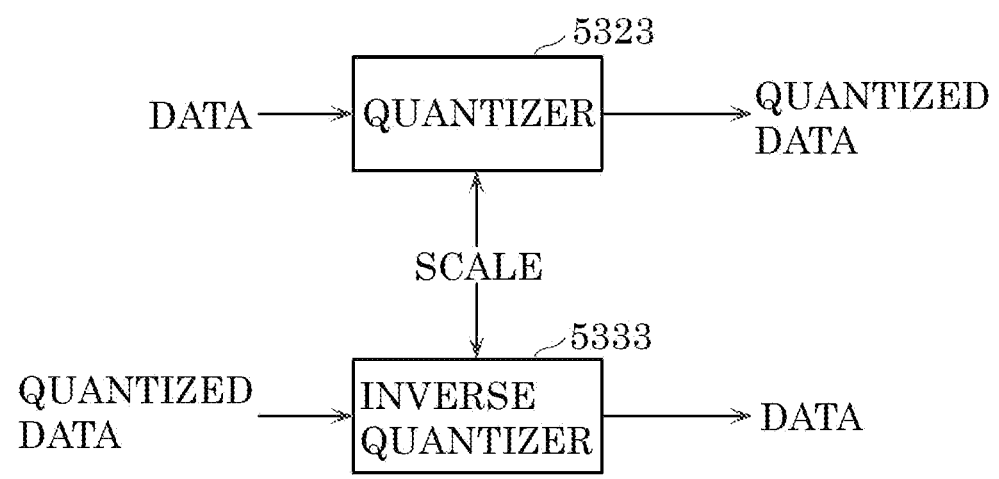
FIG. 65 is a diagram for describing a process performed by a quantizer and an inverse quantizer according to Embodiment 7.

FIG. 65 is a diagram for describing a process performed by quantizer 5323 that quantizes data and inverse quantizer 5333 that inverse-quantizes quantized data.

Quantizer 5323 quantizes data using a scale. That is, quantizer 5323 calculates quantized data, which is data quantized, by performing a process according to Equation G1.

Inverse quantizer 5333 inverse-quantizes quantized data using the scale. That is, inverse quantizer calculates inverse-quantized quantized data by performing a process according to Equation G2.

The scale and the quantization value (quantization parameter (QP) value) are expressed by Equation G3 below.

quantization value (QP value)=log(scale) (Equation G3)

quantization value (QP value)=default value (reference value)+quantization delta (difference information) (Equation G4)

These parameters are generically referred to as a quantization parameter.

Figure 66:
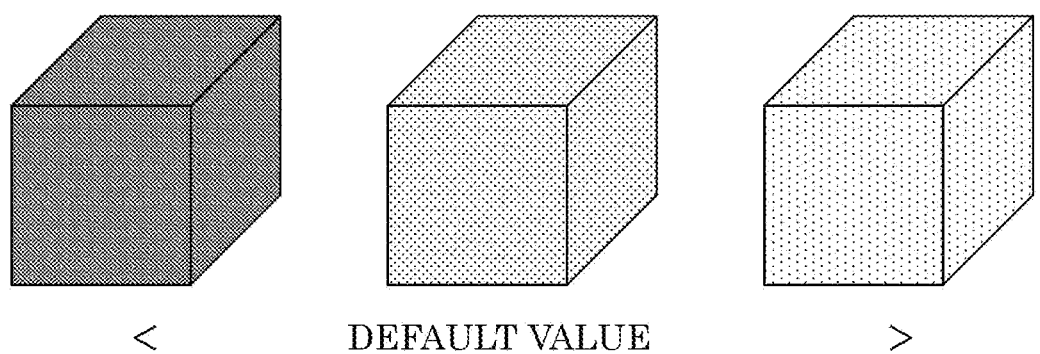
FIG. 66 is a diagram for describing a default value and a quantization delta of a quantization value according to Embodiment 7.

For example, as illustrated in FIG. 66, a quantization value is a value with respect to a default value, and is calculated by adding a quantization delta to the default value. If the quantization value is smaller than the default value, the quantization delta is a negative value. If the quantization value is greater than the default value, the quantization delta is a positive value. If the quantization value is equal to the default value, the quantization delta is 0. When the quantization delta is 0, the quantization delta can be omitted.

Figure 67:
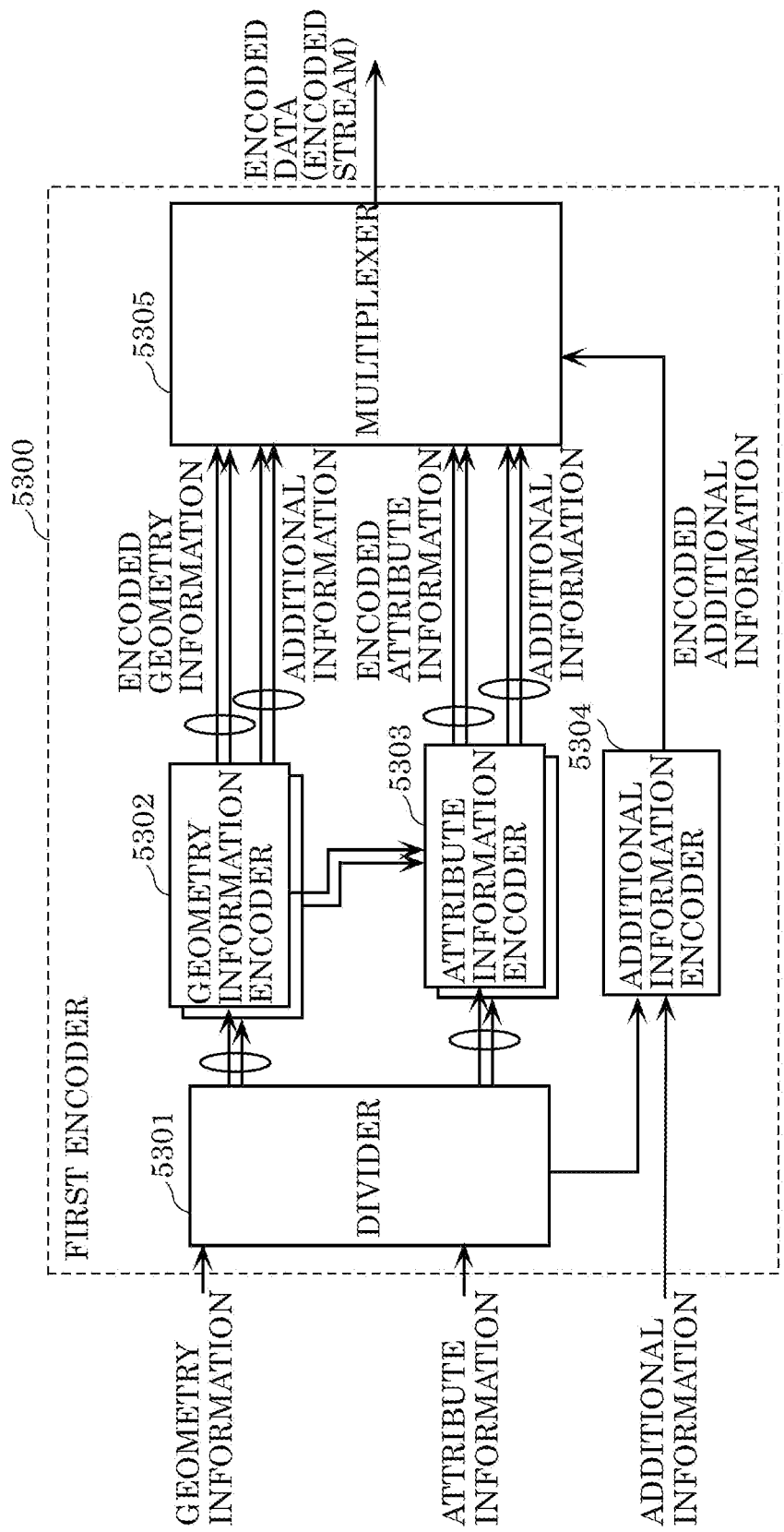
FIG. 67 is a block diagram illustrating a configuration of a first encoder included in a three-dimensional data encoding device according to Embodiment 7.
Figure 68:
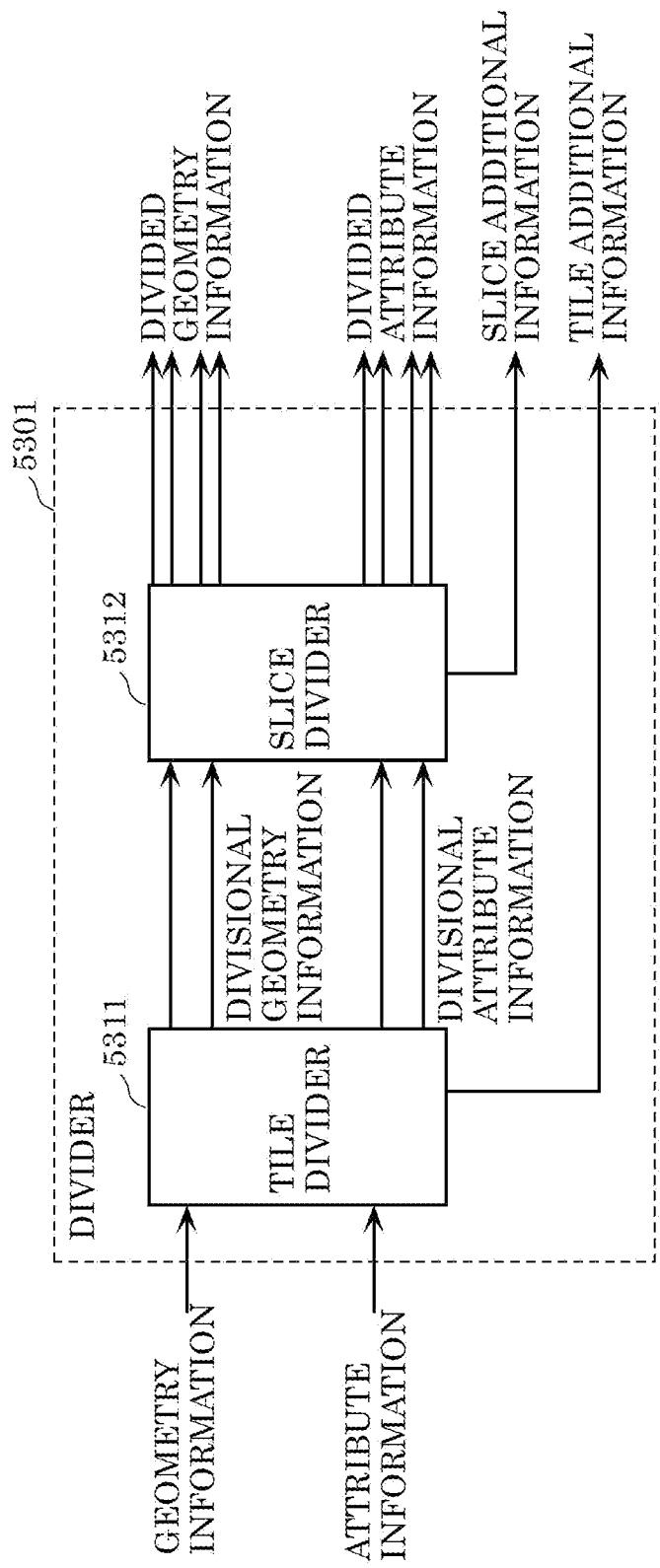
FIG. 68 is a block diagram illustrating a configuration of a divider according to Embodiment 7.
Figure 69:
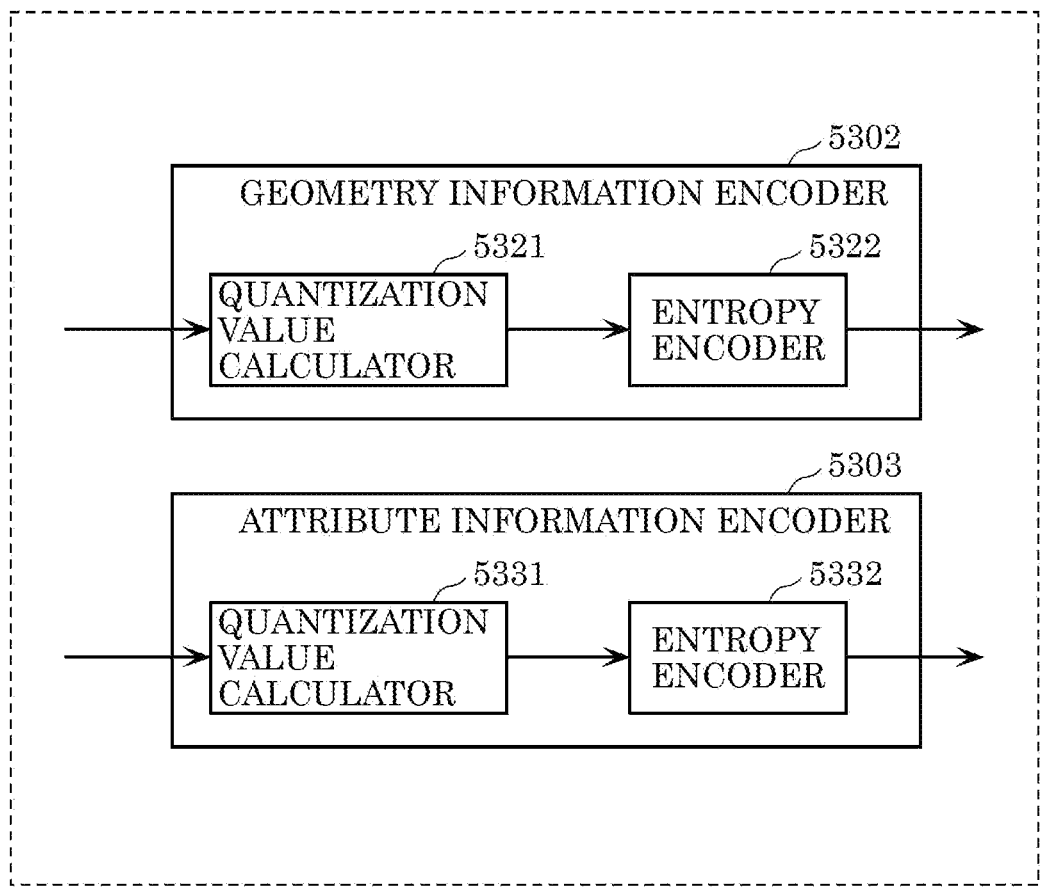
FIG. 69 is a block diagram illustrating a configuration of a geometry information encoder and an attribute information encoder according to Embodiment 7.

An encoding process will be described. FIG. 67 is a block diagram illustrating a configuration of first encoder 5300 included in the three-dimensional data encoding device according to this embodiment. FIG. 68 is a block diagram illustrating a configuration of divider 5301 according to this embodiment. FIG. 69 is a block diagram illustrating a configuration of geometry information encoder 5302 and attribute information encoder 5303 according to this embodiment.

First encoder 5300 generates encoded data (encoded stream) by encoding point cloud data in a first encoding method (geometry-based PCC (GPCC)). First encoder 5300 includes divider 5301, a plurality of geometry information encoders 5302, a plurality of attribute information encoders 5303, additional information encoder 5304, and multiplexer 5305.

Divider 5301 generates a plurality of pieces of divisional data by dividing point cloud data. Specifically, divider 5301 generates a plurality of pieces of divisional data by dividing a space of point cloud data into a plurality of subspaces. Here, a subspace is a combination of tiles or slices, or a combination of tiles and slices. More specifically, point cloud data includes geometry information, attribute information, and additional information. Divider 5301 divides geometry information into a plurality of pieces of divisional geometry information, and divides attribute information into a plurality of pieces of divisional attribute information. Divider 5301 also generates additional information concerning the division.

As illustrated in FIG. 68, divider 5301 includes tile divider 5311 and slice divider 5312. For example, tile divider 5311 divides a point cloud into tiles. Tile divider 5311 may determine a quantization value used for each divisional tile as tile additional information.

Slice divider 5312 further divides a tile obtained by tile divider 5311 into slices. Slice divider 5312 may determine a quantization value used for each divisional slice as slice additional information.

The plurality of geometry information encoders 5302 generate a plurality of pieces of encoded geometry information by encoding a plurality of pieces of divisional geometry information. For example, the plurality of geometry information encoders 5302 process a plurality of pieces of divisional geometry information in parallel.

As illustrated in FIG. 69, geometry information encoder 5302 includes quantization value calculator 5321 and entropy encoder 5322. Quantization value calculator 5321 generates a quantization value (quantization parameter) of divisional geometry information to be encoded. Entropy encoder 5322 calculates quantized geometry information by quantizing the divisional geometry information using the quantization value (quantization parameter) generated by quantization value calculator 5321.

The plurality of attribute information encoders 5303 generate a plurality of pieces of encoded attribute information by encoding a plurality of pieces of divisional attribute information. For example, the plurality of attribute information encoders 5303 process a plurality of pieces of divisional attribute information in parallel.

As illustrated in FIG. 69, attribute information encoder 5303 includes quantization value calculator 5331 and entropy encoder 5332. Quantization value calculator 5321 generates a quantization value (quantization parameter) of divisional attribute information to be encoded. Entropy encoder 5332 calculates quantized attribute information by quantizing the divisional attribute information using the quantization value (quantization parameter) generated by quantization value calculator 5331.

Additional information encoder 5304 generates encoded additional information by encoding additional information included in the point cloud data and additional information concerning the data division generated in the division by divider 5301.

Multiplexer 5305 generates encoded data (encoded stream) by multiplexing a plurality of pieces of encoded geometry information, a plurality of pieces of encoded attribute information, and encoded additional information, and transmits the generated encoded data. The encoded additional information is used for decoding.

Note that, although FIG. 67 shows an example in which there are two geometry information encoders 5302 and two attribute information encoders 5303, the number of geometry information encoders 5302 and the number of attribute information encoders 5303 may be one, or three or more. The plurality of pieces of divisional data may be processed in parallel in the same chip, such as by a plurality of cores of a CPU, processed in parallel by cores of a plurality of chips, or processed in parallel by a plurality of cores of a plurality of chips.

Figure 70:
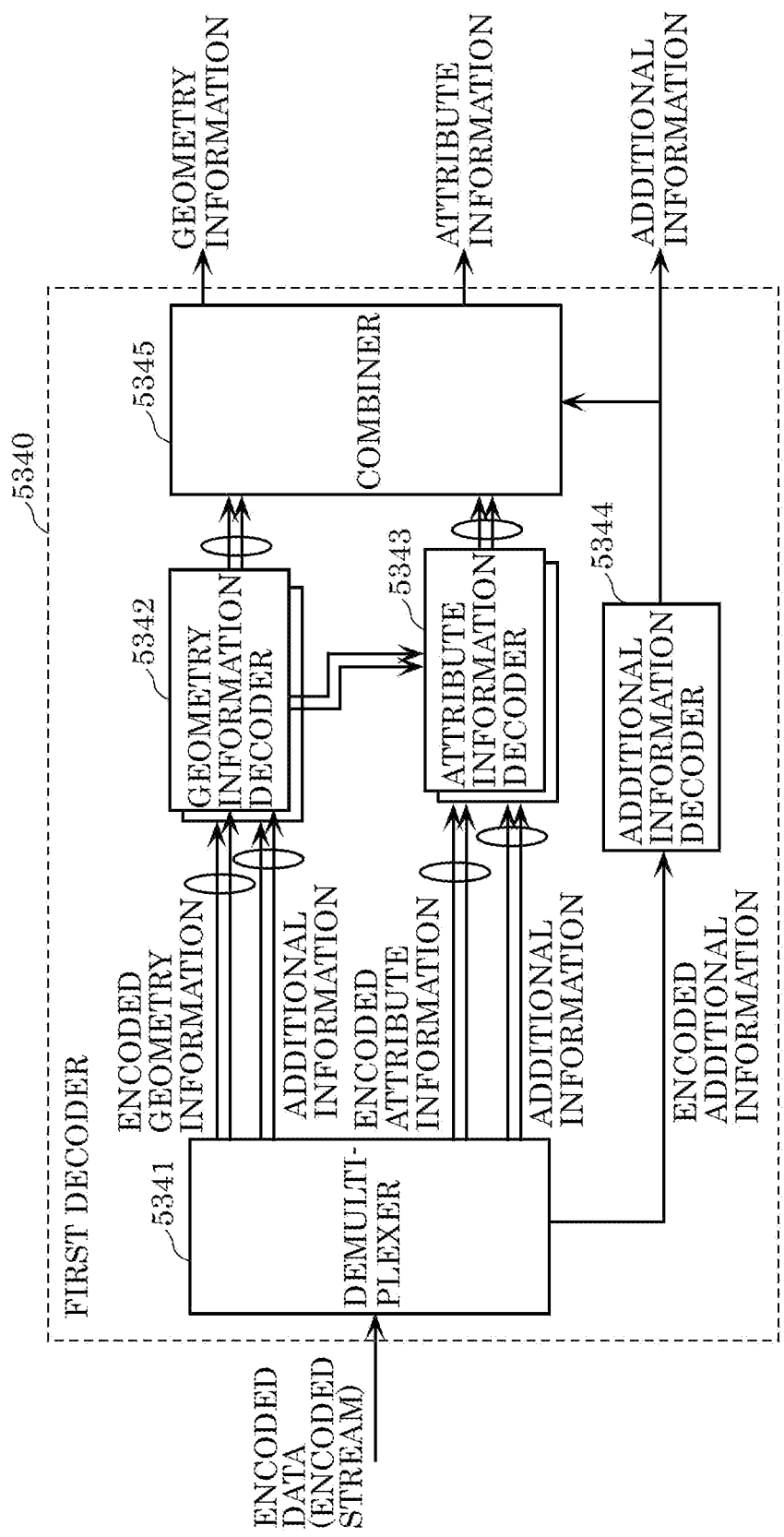
FIG. 70 is a block diagram illustrating a configuration of a first decoder according to Embodiment 7.
Figure 71:
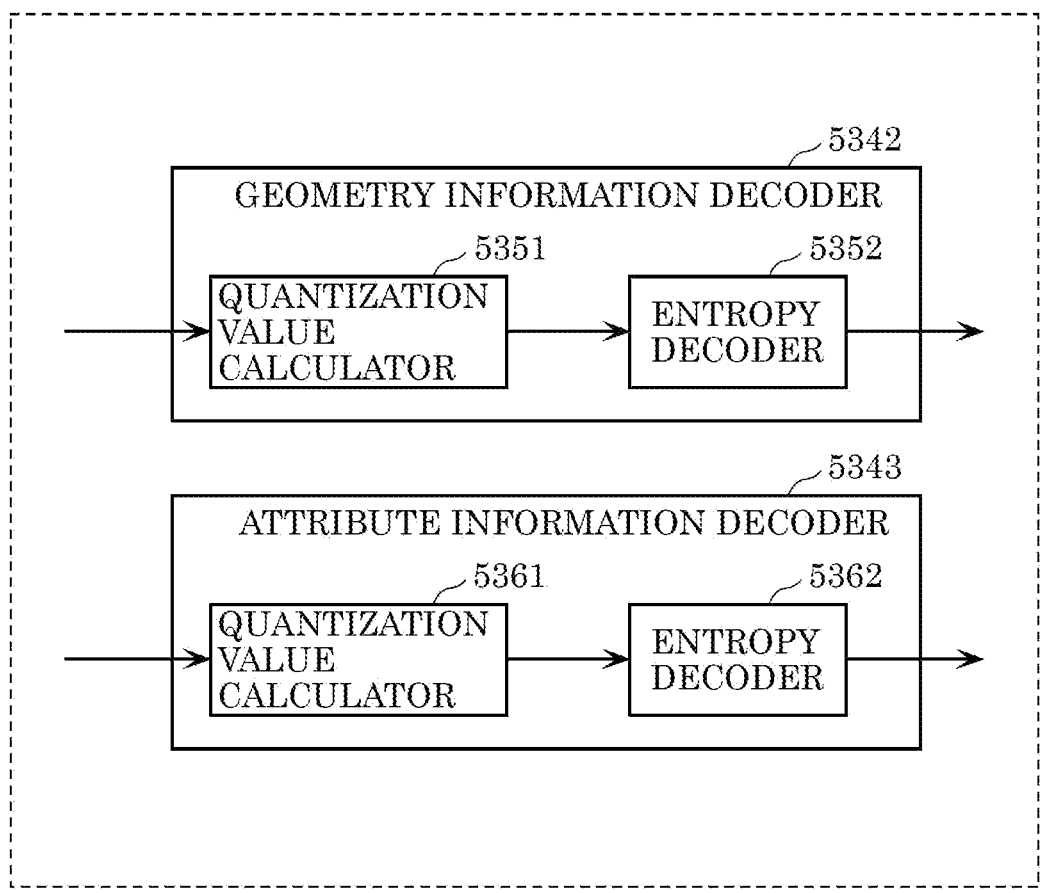
FIG. 71 is a block diagram illustrating a configuration of a geometry information decoder and an attribute information decoder according to Embodiment 7.

Next, a decoding process will be described. FIG. 70 is a block diagram illustrating a configuration of first decoder 5340. FIG. 71 is a block diagram illustrating a configuration of geometry information decoder 5342 and attribute information decoder 5343.

First decoder 5340 reproduces point cloud data by decoding encoded data (encoded stream) generated by encoding the point cloud data in the first encoding method (GPCC). First decoder 5340 includes demultiplexer 5341, a plurality of geometry information decoders 5342, a plurality of attribute information decoders 5343, additional information decoder 5344, and combiner 5345.

Demultiplexer 5341 generates a plurality of pieces of encoded geometry information, a plurality of pieces of encoded attribute information, and encoded additional information by demultiplexing encoded data (encoded stream).

The plurality of geometry information decoders 5342 generate a plurality of pieces of quantized geometry information by decoding a plurality of pieces of encoded geometry information. For example, the plurality of geometry information decoders 5342 process a plurality of pieces of encoded geometry information in parallel.

As illustrated in FIG. 71, geometry information decoder 5342 includes quantization value calculator 5351 and entropy decoder 5352. Quantization value calculator 5351 generates a quantization value of quantized geometry information. Entropy decoder 5352 calculates geometry information by inverse-quantizing the quantized geometry information using the quantization value generated by quantization value calculator 5351.

The plurality of attribute information decoders 5343 generate a plurality of pieces of divisional attribute information by decoding a plurality of pieces of encoded attribute information. For example, the plurality of attribute information decoders 5343 process a plurality of pieces of encoded attribute information in parallel.

As illustrated in FIG. 71, attribute information decoder 5343 includes quantization value calculator 5361 and entropy decoder 5362. Quantization value calculator 5361 generates a quantization value of quantized attribute information. Entropy decoder 5362 calculates attribute information by inverse-quantizing the quantized attribute information using the quantization value generated by quantization value calculator 5361.

The plurality of additional information decoders 5344 generate additional information by decoding encoded additional information.

Combiner 5345 generates geometry information by combining a plurality of pieces of divisional geometry information using additional information. Combiner 5345 generates attribute information by combining a plurality of pieces of divisional attribute information using additional information. For example, combiner 5345 first generates point cloud data associated with a tile by combining decoded point cloud data associated with slices using slice additional information. Combiner 5345 then reproduces the original point cloud data by combining point cloud data associated with tiles using tile additional information.

Note that, although FIG. 70 shows an example in which there are two geometry information decoders 5342 and two attribute information decoders 5343, the number of geometry information decoders 5342 and the number of attribute information decoders 5343 may be one, or three or more. The plurality of pieces of divisional data may be processed in parallel in the same chip, such as by a plurality of cores of a CPU, processed in parallel by cores of a plurality of chips, or processed in parallel by a plurality of cores of a plurality of chips.

[Method of Determining Quantization Parameter]

Figure 72:
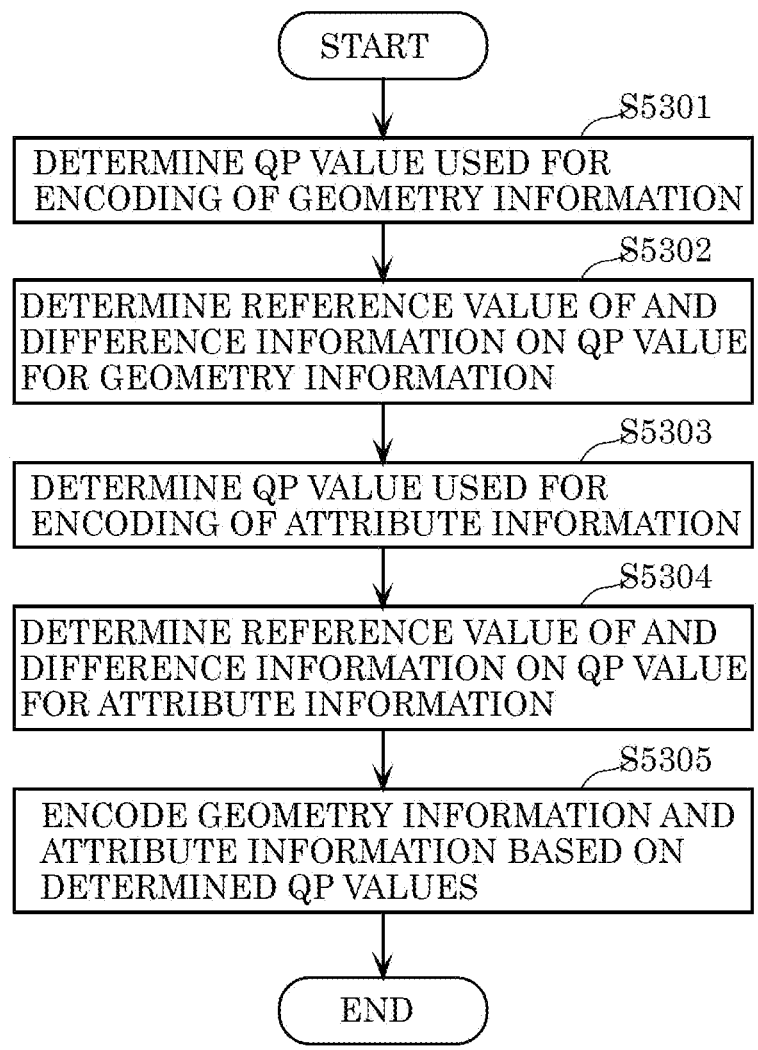
FIG. 72 is a flowchart illustrating an example of a process concerning determination of a quantization value in the encoding of geometry information or the encoding of attribute information according to Embodiment 7.

FIG. 72 is a flowchart illustrating an example of a process concerning determination of a quantization value (quantization parameter value: QP value) in the encoding of geometry information (geometry) or the encoding of attribute information (attribute).

A QP value is determined by considering the coding efficiency on a basis of data units of geometry information or attribute information forming a PCC frame, for example. When the data unit is a tile or slice resulting from division, the QP value is determined on a basis of divisional data units by considering the coding efficiency of the divisional data units. The QP value may be determined on a basis of data units before division.

As illustrated in FIG. 72, the three-dimensional data encoding device determines a QP value used for the encoding of geometry information (S5301). The three-dimensional data encoding device may determine the QP value for each of a plurality of divisional slices in a predetermined manner. Specifically, the three-dimensional data encoding device determines the QP value based on the characteristics or quality of the data of the geometry information. For example, the three-dimensional data encoding device may determine the density of point cloud data for each data unit, that is, the number of points per unit area belonging to each slice, and determine a value corresponding to the density of point cloud data as the QP value. Alternatively, the three-dimensional data encoding device may determine, as the QP value, any of the following values corresponding to geometry information: the number of points of point cloud data, the distribution of points of point cloud data, the imbalance of points of point cloud data, a feature quantity obtained from information on points, the number of feature points, or a recognized object. The three-dimensional data encoding device may also determine an object associated with geometry information of a map and determine the QP value based on the object based on the geometry information, or may determine the QP value based on information or a feature quantity obtained by projecting three-dimensional point cloud onto a two-dimensional plane. The corresponding QP value may be stored in a memory in advance in the form of a table that associates the QP value with the density, the number of points, the distribution of points, or the imbalance of points of point cloud data. The corresponding QP value may also be stored in a memory in advance in the form of a table that associates the QP value with a feature quantity or the number of feature points obtained from information on points or an object recognized based on the information on points. The corresponding QP value may be determined based on a result of simulation of the coding efficiency or the like using various QP values in the encoding of the geometry information concerning point cloud data.

The three-dimensional data encoding device then determines a reference value (default value) of and difference information (quantization delta) on the QP value for geometry information (S5302). Specifically, the three-dimensional data encoding device determines a reference value and difference information to be transmitted using the determined QP value in a predetermined manner, and sets (adds) the determined reference value and difference information in at least one of the additional information or the header of the data.

The three-dimensional data encoding device then determines a QP value used for the encoding of attribute information (S5303). The three-dimensional data encoding device may determine the QP value for each of a plurality of divisional slices in a predetermined manner. Specifically, the three-dimensional data encoding device determines the QP value based on the characteristics or quality of the data of the attribute information. For example, the three-dimensional data encoding device may determine the QP value on a basis of data units based on the characteristics of the attribute information. Color characteristics include luminance, chromaticity, and chroma, a histogram thereof, and color continuity, for example. When the attribute information is reflectance, the QP value may be determined based on information based on the reflectance. For example, when a face is detected as an object from point cloud data, the three-dimensional data encoding device may determine a high-quality QP value for the point cloud data forming the object detected as a face. In this way, the three-dimensional data encoding device may determine the QP value for the point cloud data forming an object depending on the type of the object.

When a three-dimensional point has a plurality of pieces of attribute information, the three-dimensional data encoding device may determine a different QP value for each piece of attribute information based on the piece of attribute information. Alternatively, the three-dimensional data encoding device may determine a QP value for the plurality of pieces of attribute information based on any one of the pieces of attribute information, or determine a QP value for the plurality of pieces of attribute information based on a plurality of pieces of attribute information.

The three-dimensional data encoding device then determines a reference value (default value) of and difference information (quantization delta) on the QP value for attribute information (S5304). Specifically, the three-dimensional data encoding device determines a reference value and difference information to be transmitted using the determined QP value in a predetermined manner, and sets (adds) the determined reference value and difference information in at least one of the additional information or the header of the data.

The three-dimensional data encoding device then quantizes and encodes the geometry information and the attribute information based on the determined QP values for geometry information and attribute information, respectively (S5305).

Note that although an example has been described in which the QP value for geometry information is determined based on the geometry information, and the QP value for attribute information is determined based on the attribute information, the present disclosure is not limited thereto. For example, the QP values for geometry information and attribute information may be determined based on the geometry information, based on the attribute information, or based on the geometry information and the attribute information.

Note that the QP values for geometry information and attribute information may be adjusted by considering the balance between the quality of the geometry information and the quality of the attribute information in the point cloud data. For example, the QP values for geometry information and attribute information may be set in such a manner that the quality of the geometry information is high, and the quality of the attribute information is lower than the quality of the geometry information. For example, the QP value for attribute information may be determined under a restriction that the QP value for attribute information is equal to or higher than the QP value for geometry information.

The QP value may be adjusted so that encoded data is generated within a predetermined range of rate. For example, when the code amount of the encoding of the preceding data unit is expected to exceed a predetermined rate, that is, when the difference from a predetermined rate is less than a first difference, the QP value may be adjusted to decrease the coding quality so that the difference between the predetermined rate and the code amount of the data unit is less than the first difference. On the other hand, when the difference from the predetermined rate is greater than a second difference, which is greater than the first difference, and there is a substantial difference, the QP value may be adjusted to improve the coding quality of the data unit. The adjustment between data units may be made between PCC frames or between tiles or slices. The adjustment of the QP value for attribute information may be made based on the rate of encoding of geometry information.

Note that, in the flowchart of FIG. 72, the processing concerning geometry information and the processing concerning attribute information may be performed in reverse order or in parallel.

Note that, although the flowchart of FIG. 72 shows a slice-based process as an example, a tile-based process or a process on a basis of other data units can be performed in the same manner as the slice-based process. That is, slice in the flowchart of FIG. 72 can be replaced with tile or other data units.

Figure 73:
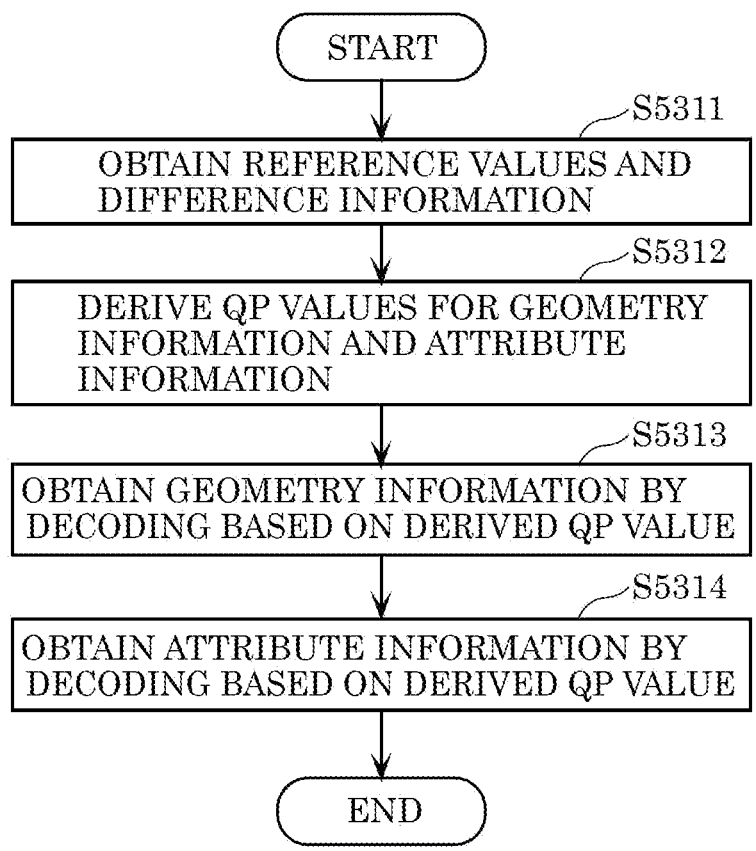
FIG. 73 is a flowchart illustrating an example of a process of decoding geometry information and attribute information according to Embodiment 7.

FIG. 73 is a flowchart illustrating an example of a process of decoding geometry information and attribute information.

As illustrated in FIG. 73, the three-dimensional data decoding device obtains a reference value and difference information that indicate a QP value for geometry information, and a reference value and difference information that indicate a QP value for attribute information (S5311). Specifically, the three-dimensional data decoding device analyzes one or both of the transmitted metadata or the header of the transmitted encoded data, and obtains reference values and difference information for deriving the QP values.

The three-dimensional data decoding device then derives the QP values using the obtained reference values and difference information in a predetermined manner.

The three-dimensional data decoding device then obtains quantized geometry information, and obtains geometry information by inverse-quantizing the quantized geometry information using the derived QP value (S5313).

The three-dimensional data decoding device then obtains quantized attribute information, and obtains attribute information by inverse-quantizing the quantized attribute information using the derived QP value (S5314).

Next, a method of transmitting a quantization parameter will be described.

Figure 74:
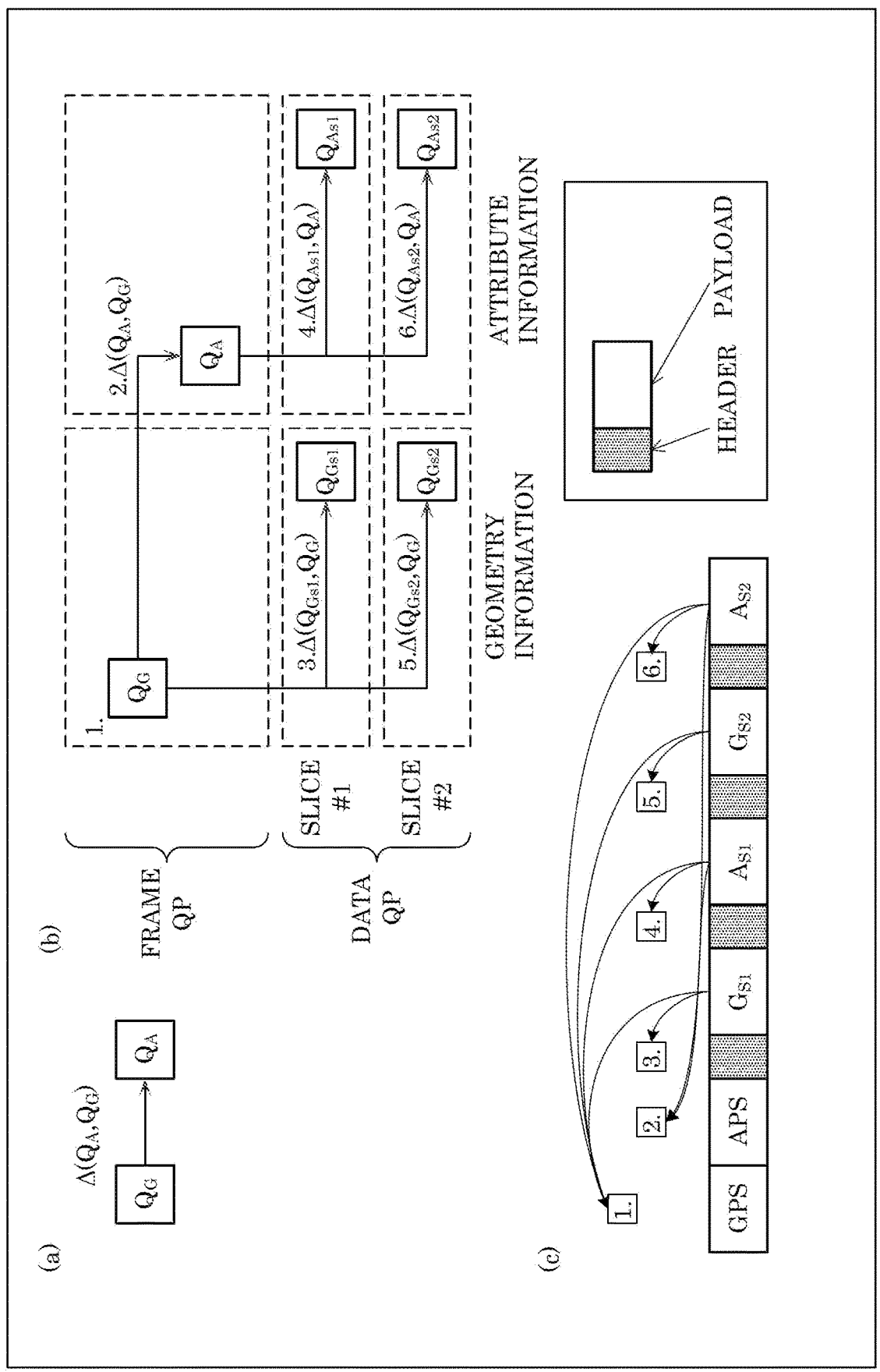
FIG. 74 is a diagram for describing a first example of a method of transmitting a quantization parameter according to Embodiment 7.

FIG. 74 is a diagram for describing a first example of the method of transmitting a quantization parameter. Part (a) of FIG. 74 shows an example of a relationship between QP values.

In FIG. 74, $Q_G$ and $Q_A$ denote an absolute value of a QP value used for the encoding of geometry information and an absolute value of a QP value used for the encoding of attribute information, respectively. $Q_G$ is an example of a first quantization parameter used for quantizing geometry information on each of a plurality of three-dimensional points. $\Delta(Q_A, Q_G)$ denotes difference information that indicates a difference between $Q_A$ and $Q_G$ used for deriving $Q_A$. That is, $Q_A$ is derived using $Q_G$ and $\Delta(Q_A, Q_G)$. In this way, a QP value is separated into a reference value (absolute value) and difference information (relative value) for transmission. In the decoding, a desired QP value is derived from the transmitted reference value and difference information.

For example, in part (a) of FIG. 74, the absolute value $Q_G$ and the difference information $\Delta(Q_A, Q_G)$ are transmitted, and in the decoding, $Q_A$ is derived by adding $\Delta(Q_A, Q_G)$ to $Q_G$ as shown by Equation G5 below.

$$Q_A = Q_G + \Delta(Q_A, Q_G) \quad \text{(Equation G5)}$$

With reference to parts (b) and (c) of FIG. 74, a method of transmitting QP values in a case where point cloud data including geometry information and attribute information is divided into slices will be described. Part (b) of FIG. 74 shows a first example of a relationship between a reference value and difference information for each QP value. Part (c) of FIG. 74 shows a first example of an order of transmission of QP values, geometry information, and attribute information.

For each piece of geometry information and each piece of attribute information, QP values are classified into QP values (frame QPs) in units of PCC frames and QP values (data QPs) in units of data units. The QP value used for the encoding determined in step S5301 in FIG. 72 is a QP value in units of data units.

Here, $Q_G$, which is a QP value used for the encoding of geometry information in units of PCC frames, is used as a reference value, and a QP value in units of data units is generated and transmitted as difference information that indicates the difference from $Q_G$.

$Q_G$: a QP value for the encoding of geometry information for a PCC frame, which is transmitted as a reference value "1." using GPS.

$Q_A$: a QP value for the encoding of attribute information for a PCC frame, which is transmitted as difference information "2." using APS.

$Q_{Gs1}$, $Q_{Gs2}$: QP values for the encoding of geometry information of slice data, which are transmitted as difference information "3." and "5." indicating a difference from $Q_G$, respectively, using the header of the encoded data of the geometry information.

$Q_{As1}$, $Q_{As2}$: QP values for the encoding of attribute information of slice data, which are transmitted as difference information "4." and "6." indicating a difference from $Q_A$, respectively, using the header of the encoded data of the attribute information.

Note that information used for deriving a frame QP is described in metadata (GPS, APS) associated with the frame, and information used for deriving a data QP is described in metadata (header of encoded data) associated with the data.

In this way, the data QP is generated and transmitted as difference information indicating a difference from the frame QP. Therefore, the data amount of the data QP can be reduced.

In each piece of encoded data, first decoder 5340 refers to metadata indicated by an arrow in part (c) of FIG. 74, and obtains a reference value and difference information associated with the encoded data. First decoder 5340 then derives a QP value corresponding to the encoded data to be decoded based on the obtained reference value and difference information.

For example, first decoder 5340 obtains the reference information "1." and the difference information "2." and "6." indicated by arrows in part (c) of FIG. 74 from the metadata or the header, and derives the QP value of $As_2$ by adding the difference information "2." and "6." to the reference information "1." as shown by Equation G6 below.

$$Q_{As2} = Q_G \Delta(Q_A, Q_G) + \Delta(Q_{As2}, Q_A) \quad \text{(Equation G6)}$$

Figure 75:
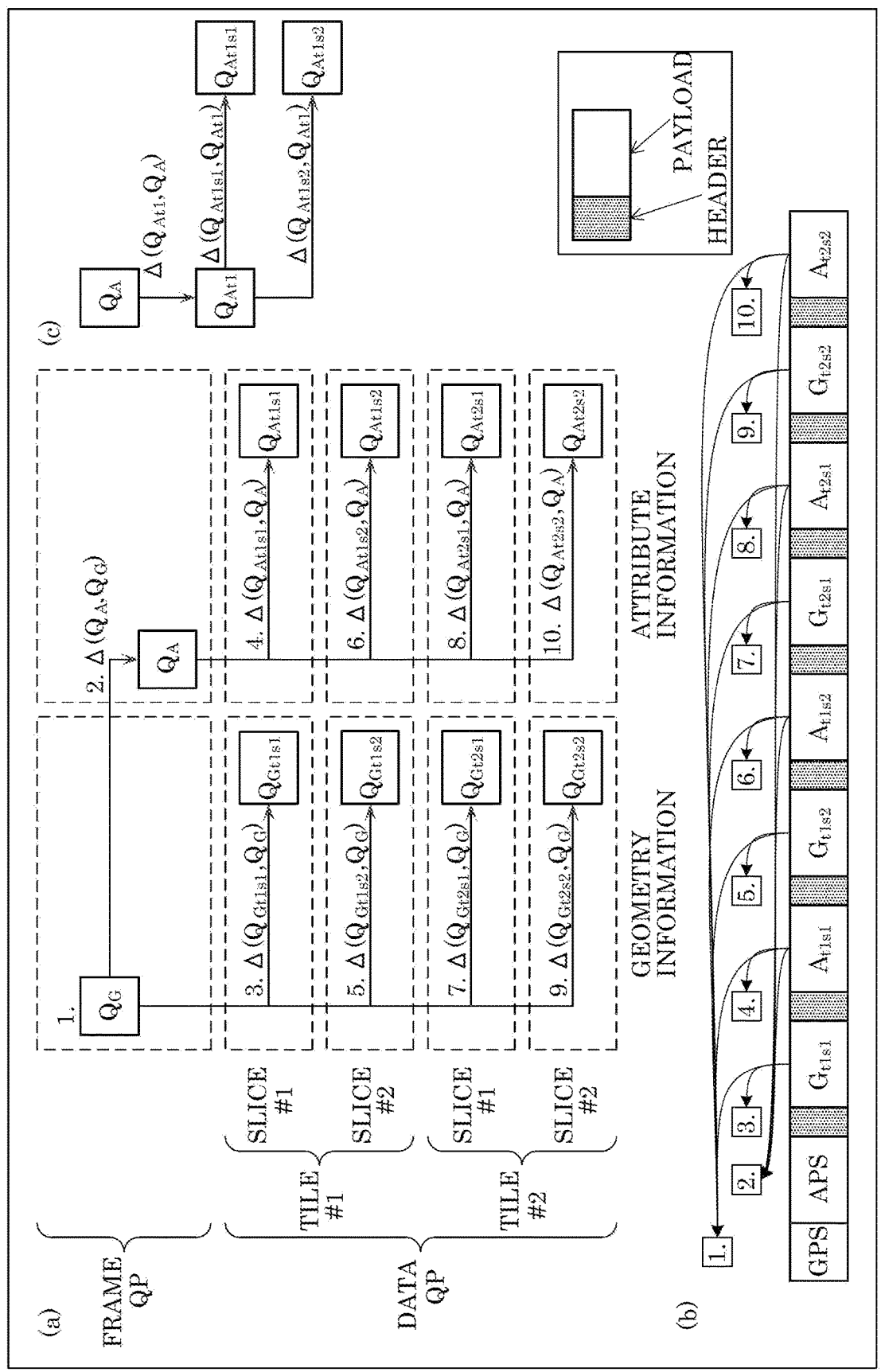
FIG. 75 is a diagram for describing a second example of the method of transmitting a quantization parameter according to Embodiment 7.

Next, an example of a case where geometry information and attribute information are divided into two tiles and then divided into two slices will be described with reference to FIG. 75. FIG. 75 is a diagram for describing a third example of the method of transmitting a quantization parameter. Part (a) of FIG. 75 shows a third example of the relationship between a reference value and difference information for each QP value. Part (b) of FIG. 75 shows a third example of the order of transmission of QP values, geometry information, and attribute information. Part (c) of FIG. 75 describes an intermediate generated value for difference information in the third example.

When geometry information and attribute information are divided into a plurality of tiles and then further divided into a plurality of slices, as illustrated in part (c) of FIG. 75, after the attribute information is divided into tiles, a QP value ($Q_{At1}$) and difference information $\Delta(Q_{At1}, Q_A)$ for each tile are generated as intermediate generated values. After the tile is divided into slices, QP values ($Q_{At1s1}$, $Q_{At1s2}$) and difference information ($\Delta(Q_{At1s1}, Q_{At1})$, $\Delta(Q_{At1s2}, Q_{At1})$) are generated for each slice.

In this case, difference information "4." in part (a) of FIG. 75 is derived according to Equation G8 below.

$$\Delta(Q_{At1s1}, Q_A) = \Delta(Q_{At1}, Q_A) + \Delta(Q_{At1s1}, Q_{At1}) \quad \text{(Equation G8)}$$

When obtaining attribute information $A_{t2s1}$ for slice 1 in tile 2 by decoding, for example, first decoder 5340 obtains reference information "1." and difference information "2." and "8." indicated by arrows in part (b) of FIG. 75 from the metadata or the header, and derives the QP value of attribute information $At_2s_1$ by adding difference information "2." and "8." to reference information "1." as shown by Equation G9 below.

$$Q_{At2s1} = Q_G + \Delta(Q_{At2s1}, Q_A) + \Delta(Q_A, Q_G) \quad \text{(Equation G9)}$$

Embodiment 8

Figure 76:
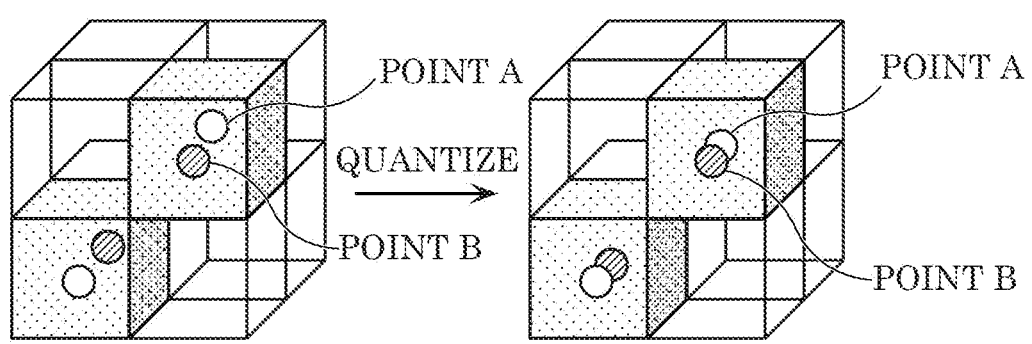
FIG. 76 is a diagram for illustrating duplicated points according to Embodiment 8.

In the present embodiment, a three-dimensional data encoding device performs quantization on three-dimensional position information of an inputted three-dimensional point cloud, and encodes the three-dimensional position information using an octree structure. At this time, three-dimensional points (hereinafter referred to as duplicated points) occur that have the same three-dimensional position but have different attribute information such as a color or a degree of reflection due to quantization. The three-dimensional data encoding device appends, to a header, information for controlling how to encode these duplicated points as leaf information of an octree. As a result, a three-dimensional data decoding device can decode the leaf information correctly. Here, the expression "have the same three-dimensional position . . . due to quantization" includes a state in which, as with point A and point B illustrated in FIG. 76, original three-dimensional positions are close to each other and values of the three-dimensional positions become identical due to quantization of information of the three-dimensional positions.

Figure 77:
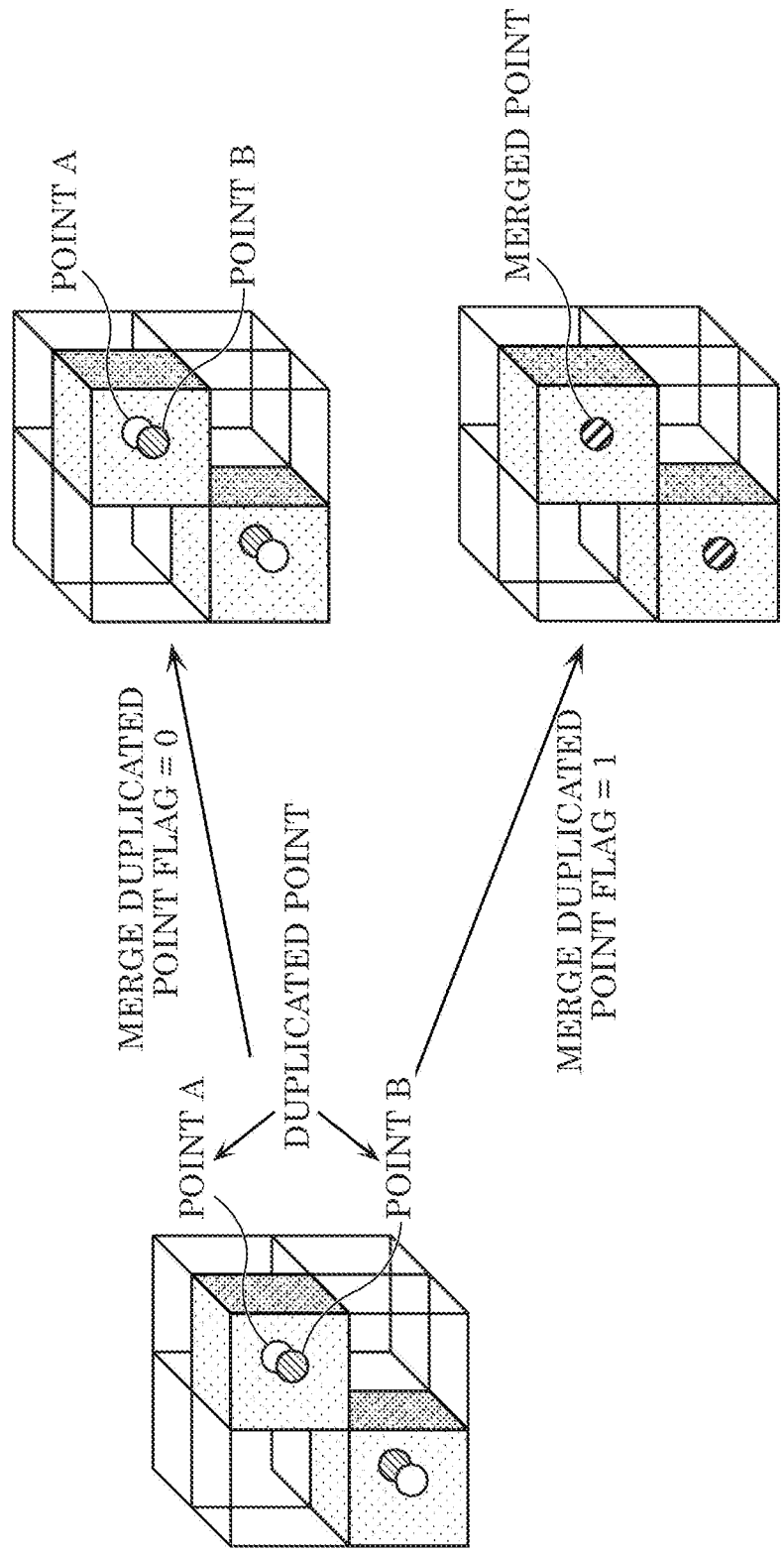
FIG. 77 is a diagram for illustrating a process performed on duplicated points according to Embodiment 8.

For example, the three-dimensional data encoding device appends, to header information, a merge duplicated point flag (MergeDuplicatedPointFlag) that is a flag for controlling whether to merge duplicated points. FIG. 77 is a diagram schematically illustrating a process according to a merge duplicated point flag.

When the merge duplicated point flag is 1, the three-dimensional data encoding device merges duplicated points into a point and encodes the point. Here, the term "merge" means, when, for example, point A and point B are duplicated points, keeping point A and removing point B or vice versa. It should be noted that, in such case, the three-dimensional data encoding device may calculate new attribute information from pieces of attribute information, such as a color or a degree of reflection, of point A and point B; and may assign the calculated attribute information to the merged point. For example, the three-dimensional data encoding device may assign an average value of the pieces of attribute information of point A and point B to the merged point.

Moreover, since each leaf when encoding is performed using the octree includes a single point when the merge duplicated point flag is 1, the three-dimensional data encoding device need not encode, as leaf information, information indicating how many three-dimensional points the leaf includes. The three-dimensional data encoding device may also encode three-dimensional position information of the single point in the leaf, and information regarding attribute information such as a color or a degree of reflection.

As stated above, when duplicated points are unnecessary after decoding, the three-dimensional data encoding device sets a merge duplicated point flag to 1, appends the merge duplicated point flag to a stream, merges the duplicated points, and encodes the merged point. Consequently, it is possible to reduce a data mount of the unnecessary duplicated points, thereby increasing the coding efficiency.

When the merge duplicated point flag is 0, the three-dimensional data encoding device encodes information of the duplicated points as leaf information. For example, since each leaf may include one or more duplicated points, the three-dimensional data encoding device encodes information indicating how many three-dimensional points the leaf includes. The three-dimensional data encoding device may also encode attribute information of each of the duplicated points. For example, when point A and point B are present as duplicated points in a leaf, the three-dimensional data encoding device may encode information indicating that two points are present in the leaf. In addition, the three-dimensional data encoding device may encode attribute information of each of point A and point B.

As stated above, when duplicated points are necessary after decoding, the three-dimensional data encoding device sets a merge duplicated point flag to 0, appends the merge duplicated point flag to a stream, and encodes the duplicated points. As a result, the three-dimensional data decoding device can decode information regarding the duplicated points correctly.

For example, as an example of quantization of a three-dimensional position, the three-dimensional data encoding device calculates a quantization position (x/qx, y/qy, z/qz) by dividing a three-dimensional position (x, y, z) by a quantization parameter (qx, qy, qz).

The merge duplicated point flag may be included in header information of a bitstream. For example, the merge duplicated point flag may be included in the header of a bitstream such as WLD, SPC, or VLM.

It should be noted that although examples of the attribute information include a color or a degree of reflection in the above description, the attribute information is not limited to this. For example, the attribute information may include a normal vector of a point, information indicating a degree of importance of a point, a three-dimensional feature of a point, or position information such as a latitude, a longitude, and an altitude of a point.

The term "merge" represents combining two or more points into a point. In addition, the term "merge" may represent combining M or more points into N points, where M>N.

As stated above, duplicated points occur that have the same coordinates as a three-dimensional point cloud but has different attribute information such as a color or a degree of reflection due to quantization. For example, although point A and point B have different three-dimensional positions before quantization, there occurs a case in which point A and point B come to have the same three-dimensional position but have different attribute information due to quantization. In short, point A and point B are duplicated points.

It should be noted that the above case is not limited to quantization, and there is also a case in which duplicated points are caused to occur by a sensor such as LiDAR obtaining three-dimensional positions and attribute information of a point cloud of the same object at different times or in different directions.

The expression "have the same three-dimensional position" is not limited to a case in which three-dimensional positions are completely the same. For example, when a difference between three-dimensional positions of point A and point B is less than or equal to threshold value a, the three-dimensional data encoding device may regard point A and point B as having the same three-dimensional position and determine that point A and point B are duplicated points. In addition, the three-dimensional data encoding device may add threshold value a to a stream and notify the three-dimensional data decoding device that any point less than or equal to threshold value a has been handled as a duplicated point.

Moreover, the three-dimensional data encoding device may use the three-dimensional position of point A as a three-dimensional position of a duplicated point. Alternatively, the three-dimensional data encoding device may use the three-dimensional position of point B as a three-dimensional position of a duplicated point. Alternatively, the three-dimensional data encoding device may use, as a three-dimensional position of a duplicated point, a three-dimensional position calculated from the three-dimensional position of point A and the three-dimensional position of point B. For example, the three-dimensional data encoding device may use an average value between the three-dimensional position of point A and the three-dimensional position of point B.

The three-dimensional data encoding device may merge, among duplicated points, points having the same three-dimensional position and the same attribute information or may delete one of the points regardless of a value of a merge duplicated point flag.

When a merge duplicated point flag is 1, the three-dimensional data encoding device may merge M points in a leaf into N points, where M>N. In this case, the three-dimensional data encoding device may encode, as leaf information, each of pieces of three-dimensional position information and pieces of attribute information of N points. In addition, the three-dimensional data encoding device may calculate N pieces of attribute information using M pieces of attribute information.

The three-dimensional data encoding device may add the number of points (N) in a leaf after merging to a header and notify the number of the points (N) to the three-dimensional data decoding device. A value of N may be set in advance as a fixed value by standards etc. This eliminates the need for adding information indicating N for each leaf, and it is thus possible to reduce a generated coding amount. Accordingly, the three-dimensional data decoding device can decode N points correctly.

When a merge duplicated point flag is 1, duplicated points are merged into a point. For example, the three-dimensional data encoding device may merge point A and point B into point C having the same three-dimensional position information as point A and point B. It should be noted that the three-dimensional data encoding device may assign, to point C, an average value of pieces of attribute information, such as a color or a degree of reflection, of point A and point B. Additionally, the three-dimensional data encoding device may merge point B with point A or merge point A with point B.

Next, an example of a syntax of a merge duplicated point flag will be described. FIG. 78 is a diagram illustrating an example of a syntax of header information. FIG. 79 is a diagram illustrating an example of a syntax of information of a node.

As illustrated in FIG. 78, the header information includes a merge duplicated point flag (MergeDuplicatedPointFlag). The merge duplicated point flag is information indicating whether to merge duplicated points. For example, a value of 1 of the merge duplicated point flag indicates that duplicated points are to be merged, and a value of 0 of the merge duplicated point flag indicates that duplicated points are not to be merged.

It should be noted that the three-dimensional data encoding device may specify whether to merge duplicated points, based on standards or a profile or level, etc. of standards, without appending a merge duplicated point flag to a header. This enables the three-dimensional data decoding device to determine whether a stream includes a duplicated point by reference to standards information, and to restore a bitstream correctly.

As illustrated in FIG. 79, the information of the node includes isleaf and num_point_per_leaf. isleaf is a flag indicating whether a current node is a leaf. A value of 1 indicates that a current node is a leaf, and a value of 0 indicates that a current node is not a leaf but a node. It should be noted that information indicating whether a node is a leaf need not be appended to a header. In this case, the three-dimensional data decoding device determines whether a node is a leaf using another method. For example, the three-dimensional data decoding device may determine whether each node of an octree is divided into the smallest possible size, and may determine that a node is a leaf when determining that each node is divided into the smallest possible size. This eliminates the need for encoding the flag indicating whether the node is the leaf, which makes it possible to reduce the code amount of the header.

num_point_per_leaf is leaf information and indicates the number of three-dimensional points included in a leaf. When a merge duplicated point flag is 0, num_point_per_leaf is encoded. Additionally, since the number of points in a leaf is 1 when a merge duplicated point flag is 1, num_point_per_leaf is not encoded. Accordingly, it is possible to reduce the code amount.

It should be noted that although whether to encode leaf information is selected directly according to a merge duplicated point flag in the example described here, whether to encode leaf information may be selected indirectly. For example, the three-dimensional data encoding device may change single_point_per_leaf according to a merge duplicated point flag, and select whether to encode leaf information, based on the syntax. In other words, when the merge duplicated point flag is 1, the three-dimensional data encoding device may set single_point_per_leaf to 1; and when the merge duplicated point flag is 0, the three-dimensional data encoding device may set single_point_per_leaf to 0. In this case, the three-dimensional data encoding device also need not append the merge duplicated point flag to a bitstream.

The three-dimensional data encoding device may entropy encode num_point_per_leaf. At this time, the three-dimensional data encoding device may also perform encoding while switching coding tables. For example, the three-dimensional data encoding device may perform arithmetic encoding on the first bit using coding table A, and may perform arithmetic encoding on a remaining bit using coding table B.

As stated above, the three-dimensional data encoding device appends, to the header of a bitstream, information indicating whether to merge duplicated points, and selects whether to merge the duplicated points according to the value. When merging the duplicated points, the three-dimensional data encoding device need not encode, as leaf information, the number of points included in a leaf. When not merging the duplicated points, the three-dimensional data encoding device may encode, as leaf information, the number of points included in a leaf.

The three-dimensional data encoding device may also entropy encode isleaf, MergeDuplicatedPointFlag, and num_point_per_leaf generated by the above method. For example, the three-dimensional data encoding device may binarize each value and perform arithmetic encoding on the value.

Although the octree structure has been described as an example in the present embodiment, the present disclosure is not necessarily limited to this. The aforementioned procedure may be applied to an N-ary tree such as the quadtree and the hexadecatree, or other tree structures, where N is an integer greater than or equal to 2.

When encoding is performed with a merge duplicated point flag=1, and an original inputted three-dimensional point cloud or quantized three-dimensional point cloud includes duplicated points, lossy coding is used, and it is thus possible to reduce the code amount. Besides, when the original inputted three-dimensional point cloud includes no duplicated point and encoding is performed using lossless coding (encoding is performed while skipping quantization), the three-dimensional data encoding device may perform encoding with the merge duplicated point flag=1. Accordingly, it is possible to reduce a code amount by as much as a code amount resulting from not encoding num_point_per_leaf while maintaining lossless coding.

Moreover, when the three-dimensional data encoding device encodes, as leaf information, each of two or more duplicated points in the same leaf, the three-dimensional data encoding device may also encode each of pieces of attribute information (e.g., a color or a degree of reflection) of the respective points. In this case, the pieces of attribute information of the respective points may be associated in a coding order of the points. For example, when the three-dimensional data encoding device encodes each of points A and B in the same leaf as leaf information, the three-dimensional data encoding device may encode pieces of attribute information of both points A and B and append the pieces of attribute information to a bitstream. Additionally, the pieces of attribute information may be associated in a coding order of points A and B. For example, when each three-dimensional position is encoded in order from point A to point B, it is conceivable that the pieces of attribute information are encoded in order from point A to point B and are associated.

Moreover, when the three-dimensional data encoding device merges M or more point clouds in the same leaf and encodes the merged point clouds as N points, where M>N, the three-dimensional data encoding device may round off M or more pieces of attribute information of M or more point clouds by, for example, averaging to generate pieces of attribute information of N points, and may encode the pieces of attribute information. For example, when the three-dimensional data encoding device merges points A and B in the same leaf into a point and encodes the point, the three-dimensional data encoding device may round off pieces of attribute information of points A and B by, for example, averaging to calculate attribute information of the point, and may encode the calculated attribute information.

Moreover, the three-dimensional data encoding device may change a method of calculating attribute information according to a degree of importance or feature of a point. For example, the three-dimensional data encoding device may give a high weight to attribute information of a point having a high degree of importance or a point having a great feature, calculate a weighted average value, and use the calculated value as attribute information after merging. In addition, the three-dimensional data encoding device may change a weight according to a difference between three-dimensional positions before and after quantization. For example, a higher weight may be given as the difference is smaller, a weighted average value may be calculated, and the calculated value may be used as attribute information after merging.

Figure 80:
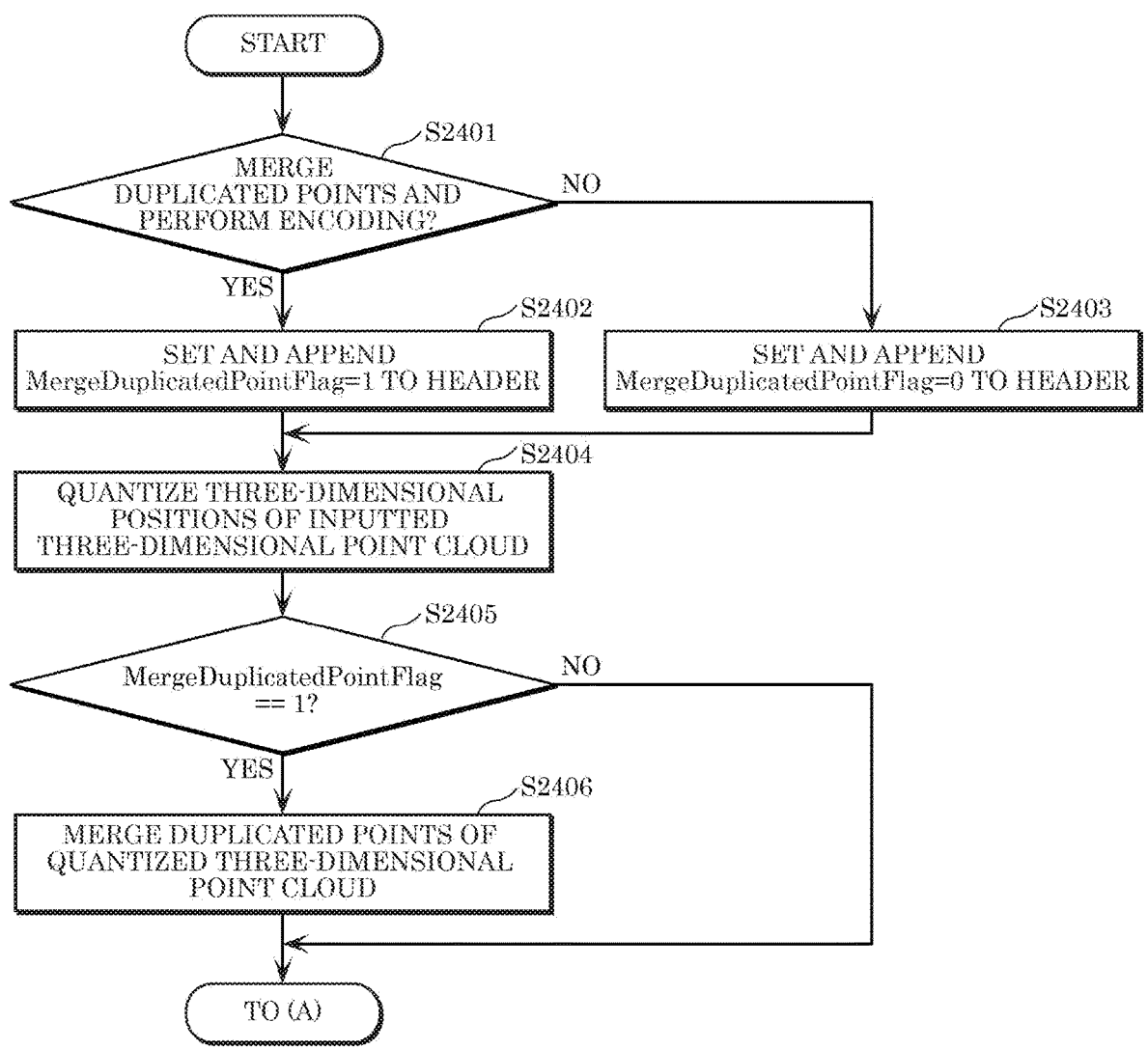
FIG. 80 is a flowchart of a three-dimensional data encoding process according to Embodiment 8.
Figure 81:
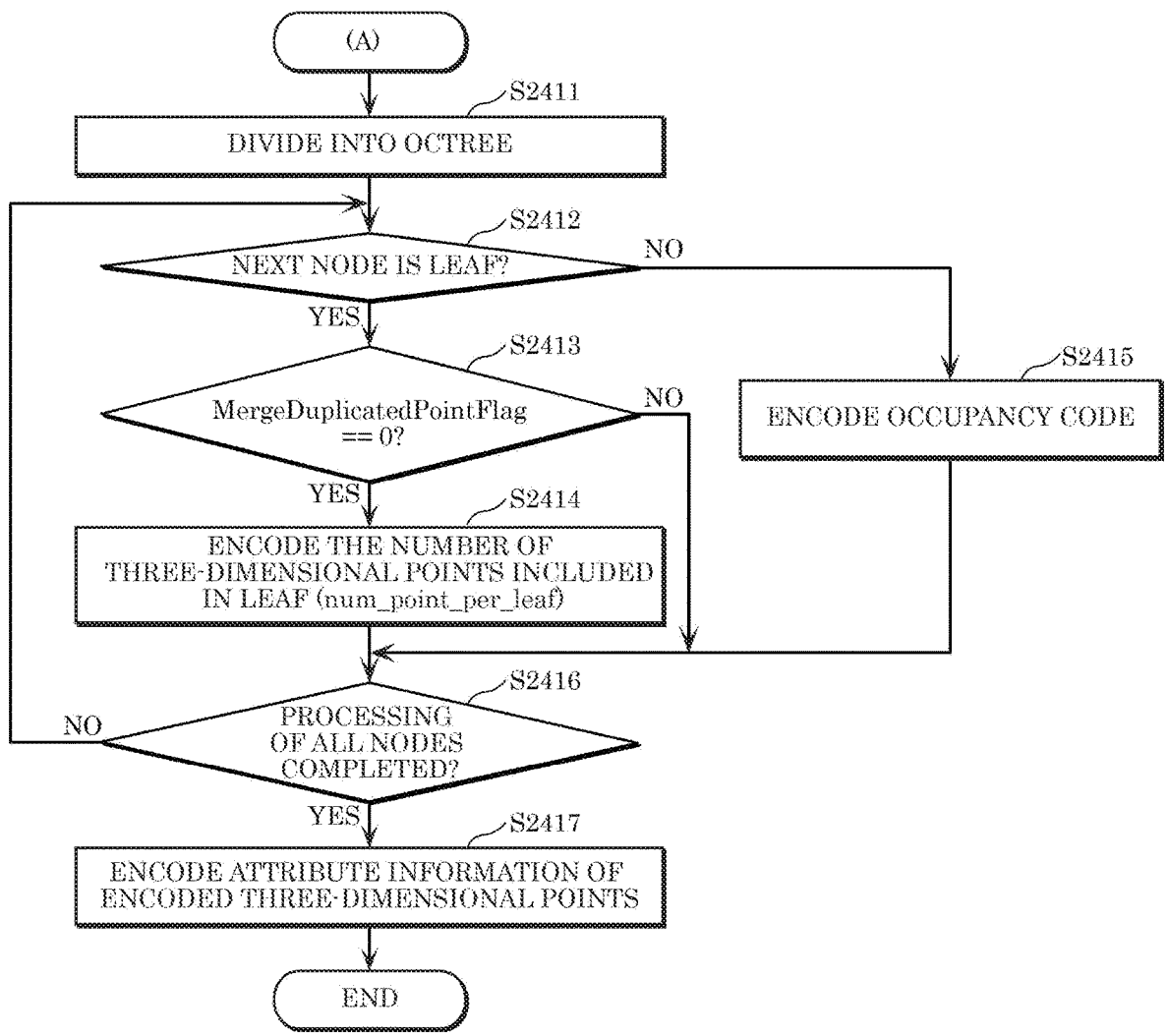
FIG. 81 is a flowchart of the three-dimensional data encoding process according to Embodiment 8.

Next, a procedure for a three-dimensional data encoding process performed by the three-dimensional data encoding device will be described. FIG. 80 and FIG. 81 each are a flowchart of a three-dimensional data encoding process performed by the three-dimensional data encoding device.

First, the three-dimensional data encoding device determines whether to merge duplicated points and perform encoding (S2401). For example, when the three-dimensional data encoding device prioritizes the coding efficiency, the three-dimensional data encoding device may determine to merge duplicated points. When duplicated points are necessary in the three-dimensional data decoding device, the three-dimensional data encoding device may also determine not to merge the duplicated points. Moreover, when an inputted three-dimensional point cloud includes no duplicated point, and no lossless coding, that is, no quantization is performed, the three-dimensional data encoding device may set a merge duplicated point flag to 1. Since this prevents the number of points in a leaf from being encoded as leaf information, it is possible to reduce the code amount.

When the three-dimensional data encoding device merges the duplicated points and performs encoding (YES in S2401), the three-dimensional data encoding device sets a merge duplicated point flag to 1 and appends the merge duplicated point flag to a header (S2402).

When the three-dimensional data encoding device neither merges the duplicated points nor performs encoding (NO in S2401), the three-dimensional data encoding device sets a merge duplicated point flag to 0 and appends the merge duplicated point flag to a header (S2403).

Next, the three-dimensional data encoding device quantizes three-dimensional positions of an inputted three-dimensional point cloud (S2404). As an example of quantization of a three-dimensional position, the three-dimensional data encoding device calculates a quantization position (x/qx, y/qy, z/qz) by dividing a three-dimensional position (x, y, z) by a quantization parameter (qx, qy, qz). Additionally, the three-dimensional data encoding device may append the quantization parameter to the header, and the three-dimensional data decoding device may perform inverse quantization using the quantization parameter. It should be noted that the three-dimensional data encoding device may skip quantization at the time of lossless coding.

Then, the three-dimensional data encoding device determines whether the merge duplicated point flag is 1 (S2405). When the merge duplicated point flag is 1 (YES in S2405), the three-dimensional data encoding device merges duplicated points of the quantized three-dimensional point cloud (S2406). It should be noted that when lossless coding is performed and the inputted three-dimensional point cloud includes no duplicated point, the three-dimensional data encoding device may skip this step.

When the merge duplicated point flag is 0 (NO in S2405), the three-dimensional data encoding device merges no duplicated points.

After that, the three-dimensional data encoding device divides a node into an octree (S2411). For example, the three-dimensional data encoding device may calculate an occupancy code of each node of an octree sequentially while performing octree division initially on a large space (a root node) including a quantized three-dimensional point cloud, and may encode the calculated occupancy code. In addition, the three-dimensional data encoding device may perform octree division repeatedly and encode leaf information when octree division cannot be performed. It should be noted that the three-dimensional data encoding device may calculate occupancy codes and pieces of leaf information of all nodes in advance, and then encode these pieces of information.

Next, the three-dimensional data encoding device determines whether the next node (a current node) is a leaf (S2412). For example, the three-dimensional data encoding device may determine whether an octree is divided into the smallest possible size, and may determine that a node is a leaf when determining that the octree is divided into the smallest possible size.

When the current node is the leaf (YES in S2412), the three-dimensional data encoding device determines whether a merge duplicated point flag is 0 (S2413). When the merge duplicated point flag is 0 (YES in S2413), the three-dimensional data encoding device encodes the number of three-dimensional points included in the leaf (num_point_per_leaf) (S2414). When the merge duplicated point flag is 1 (NO in S2413), the three-dimensional data encoding device does not encode the number of three-dimensional points included in the leaf (num_point_per_leaf).

Moreover, when the current node is not the leaf (NO in S2412), the three-dimensional data encoding device encodes an occupancy code of the current node (S2415).

Then, the three-dimensional data encoding device determines whether processing of all the nodes is completed (S2416). When the processing of all the nodes is not completed (NO in S2416), the three-dimensional data encoding device performs step S2412 and the subsequent steps on the next node.

When the processing of all the nodes is completed (YES in S2416), the three-dimensional data encoding device encodes attribute information regarding the encoded three-dimensional points (S2417).

It should be noted that the three-dimensional data encoding device may adjust the size of the large space (the root node) along the x-axis, y-axis, or z-axis to a power-of-two size so that the large space can be always divided equally into two with respect to each axis. Besides, the three-dimensional data encoding device may adjust the size of the large space so that a divided node always becomes a cube. For example, when three-dimensional positions of three-dimensional point clouds take a value from 0 to 256 along the x-axis, a value from 0 to 120 along the y-axis, and a value from 0 to 62 along the z-axis, first, the three-dimensional data encoding device compares the minimum value and the maximum value of each axis and calculates the minimum value and the maximum value of coordinates of all the point clouds. In this case, the minimum value is 0, and the maximum value is 256. Next, the three-dimensional data encoding device calculates values that include the calculated minimum value and maximum value and enable the large space to have the power-of-two size. In this case, the size is 512, and the minimum value and maximum value of the coordinates in the space are 0 and 511, respectively. As a result, it is possible to include point clouds in a range of 0 to 256. In this case, the three-dimensional data encoding device also starts octree division initially on a large space having a size of 512×512×512.

Figure 82:
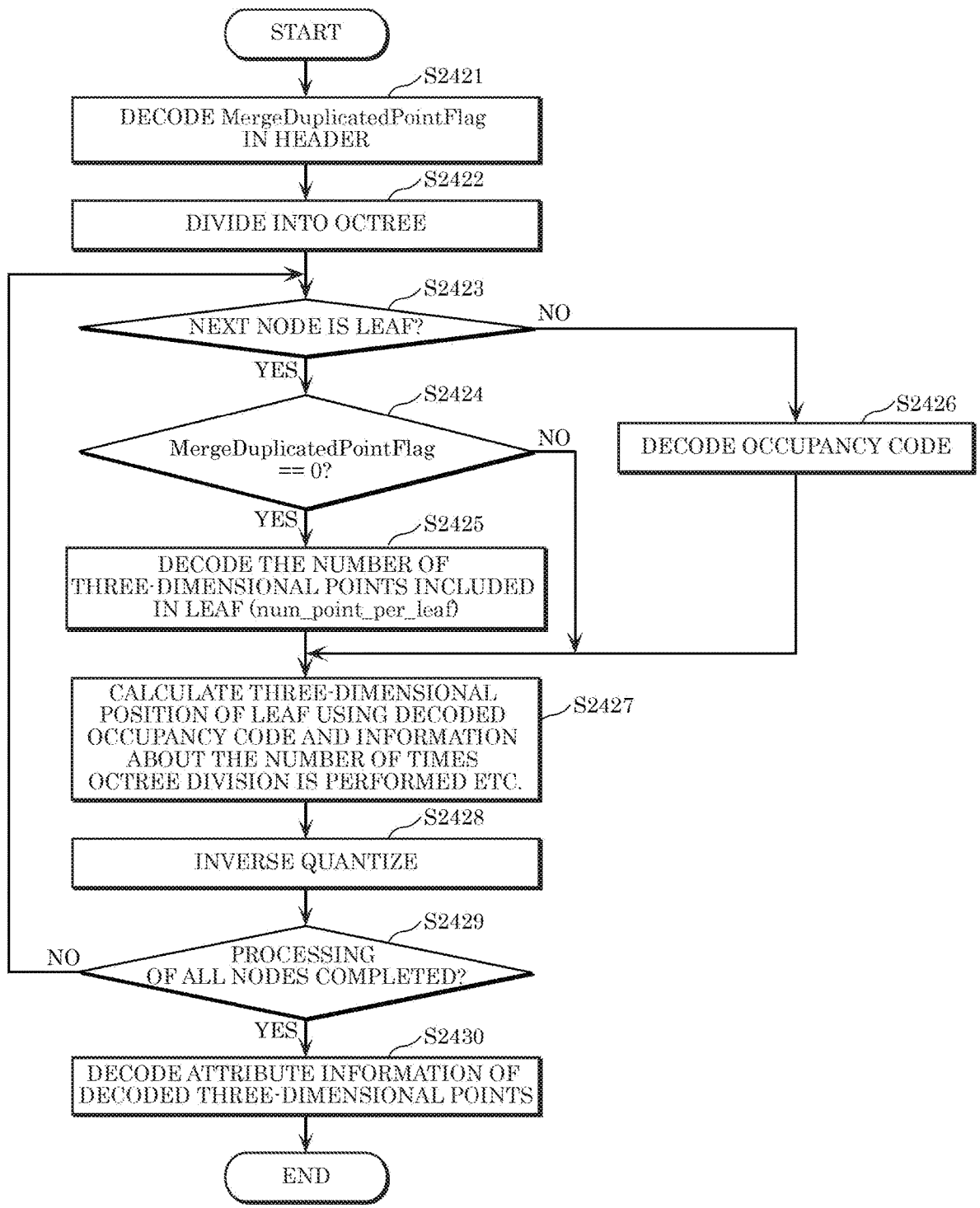
FIG. 82 is a flowchart of a three-dimensional data decoding process according to Embodiment 8.

Next, a procedure for a three-dimensional data decoding process performed by the three-dimensional data decoding device will be described. FIG. 82 is a flowchart of a three-dimensional data decoding process performed by the three-dimensional data decoding device. First, the three-dimensional data decoding device decodes a merge duplicated point flag in the header of a bitstream (S2421).

Next, the three-dimensional data decoding device divides a node into an octree (S2422). For example, the three-dimensional data decoding device generates an octree of a space (a node) using header information etc. of a bitstream. For example, the three-dimensional data decoding device generates a large space (a root node) using the size of a space along the x-axis, y-axis, and z-axis directions appended to the header information, and generates an octree by generating eight small spaces A (nodes A0 to A7) by dividing the space into two along each of the x-axis, y-axis, and z-axis directions. In a similar way, the three-dimensional data decoding device further divides each of nodes A0 to A7 into eight small spaces. As stated above, the three-dimensional data decoding device performs decoding of an occupancy code of each node and decoding of leaf information in sequence through the above-mentioned process.

Then, the three-dimensional data decoding device determines whether the next node (a current node) is a leaf (S2423). When the current node is the leaf (YES in S2423), the three-dimensional data decoding device determines whether a merge duplicated point flag is 0 (S2424). When the merge duplicated point flag is 0 (YES in S2424), the three-dimensional data decoding device decodes the number of three-dimensional points included in the leaf (num_point_per_leaf) from the bitstream (S2425). On the other hand, when the merge duplicated point flag is 1 (NO in S2424), the three-dimensional data decoding device does not decode the number of three-dimensional points included in the leaf (num_point_per_leaf) from the bitstream.

Moreover, when the next node is not the leaf (NO in S2423), the three-dimensional data decoding device decodes an occupancy code of the current node from the bitstream (S2426).

After that, the three-dimensional data decoding device calculates three-dimensional positions of leaves using the decoded occupancy code and information about the number of times octree division is performed etc (S2427). For example, when the large space has a size of 8×8×8, performing octree division three times causes a node to have a size of 1×1×1. This size (1×1×1) is the smallest divisible unit (leaf). Additionally, the three-dimensional data decoding device determines whether each leaf includes a point, based on a decoded occupancy code of a parent node of the leaf. Accordingly, the three-dimensional data decoding device can calculate a three-dimensional position of each leaf.

Next, the three-dimensional data decoding device inverse quantizes the calculated three-dimensional positions (S2428). Specifically, the three-dimensional data decoding device calculates three-dimensional positions of a point cloud by performing inverse quantization using a quantization parameter decoded from the header. For example, as an example of inverse quantization of a three-dimensional position, the three-dimensional data decoding device calculates an inverse quantization position (x×qx, y×qy, z×qz) by multiplying a three-dimensional position (x, y, z) prior to inverse quantization by a quantization parameter (qx, qy, qz). It should be noted that the three-dimensional data decoding device may skip inverse quantization at the time of lossless coding. In addition, when a scale need not be returned to an original scale, the three-dimensional data decoding device may skip inverse quantization even at the time of no lossless coding (lossy coding). For example, when not an absolute positional relationship between three-dimensional points but a relative positional relationship between three-dimensional points is necessary, the three-dimensional data decoding device may skip inverse quantization.

Then, the three-dimensional data decoding device determines whether processing of all the nodes is completed (S2429). When the processing of all the nodes is not completed (NO in S2429), the three-dimensional data decoding device performs step S2423 and the subsequent steps on the next node.

When the processing of all the nodes is completed (YES in S2429), the three-dimensional data decoding device finally decodes attribute information regarding the decoded three-dimensional points from the bitstream (S2430). It should be noted that when the merge duplicated point flag is 1, attribute information is associated with each point having a different decoded three-dimensional position after the decoding. Also, when the merge duplicated point flag is 0, different pieces of attribute information are decoded and associated with points having the same decoded three-dimensional position.

Figure 83:
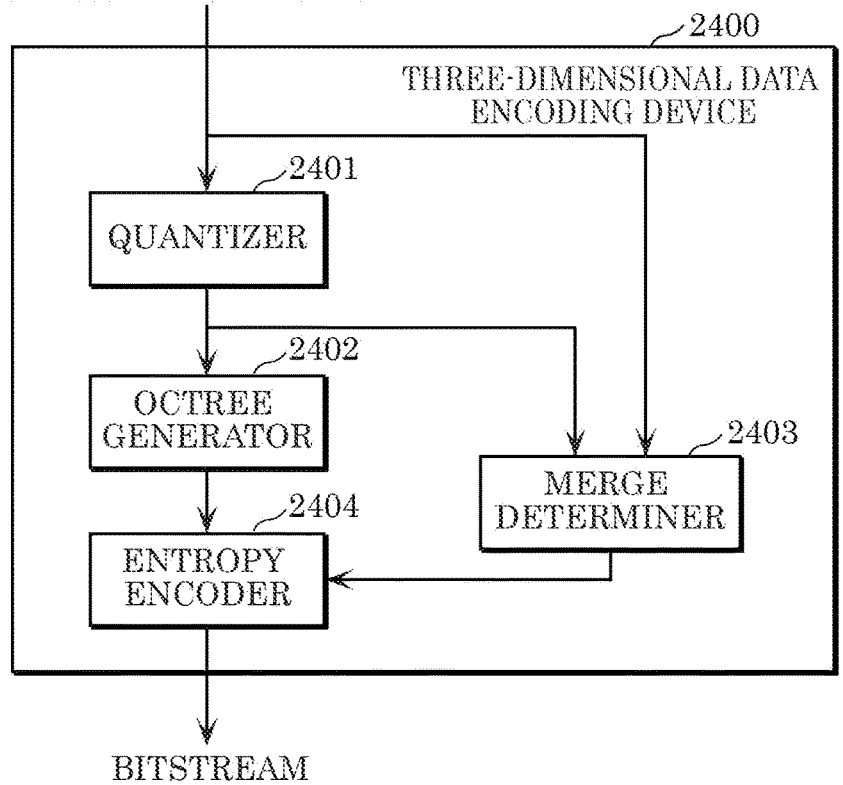
FIG. 83 is a block diagram of a three-dimensional data encoding device according to Embodiment 8.

Next, a configuration example of the three-dimensional data encoding device will be described. FIG. 83 is a block diagram of three-dimensional data encoding device 2400 according to the present embodiment. Three-dimensional data encoding device 2400 includes quantizer 2401, octree generator 2402, merge determiner 2403, and entropy encoder 2404.

Quantizer 2401 quantizes inputted three-dimensional points (a point cloud). It should be noted that in the event of lossless coding, quantization may be skipped.

Octree generator 2402 generates, for example, an octree from the inputted three-dimensional points (the point cloud), and generates a corresponding one of an occupancy code and leaf information for each node of the octree.

Merge determiner 2403 determines whether to merge duplicated points and perform encoding, and sets a value of a merge duplicated point flag, based on a result of the determination. For example, merge determiner 2403 determines the value of the merge duplicated point flag using information of a quantized three-dimensional point cloud. For example, merge determiner 2403 determines the value of the merge duplicated point flag, based on whether the quantized three-dimensional point cloud includes duplicated points.

Entropy encoder 2404 generates a bitstream by encoding the leaf information according to the merge duplicated point flag. Entropy encoder 2404 may append the merge duplicated point flag to the bitstream. Moreover, entropy encoder 2404 may encode the occupancy code. Furthermore, entropy encoder 2404 may encode attribute information regarding encoded three-dimensional points.

Figure 84:
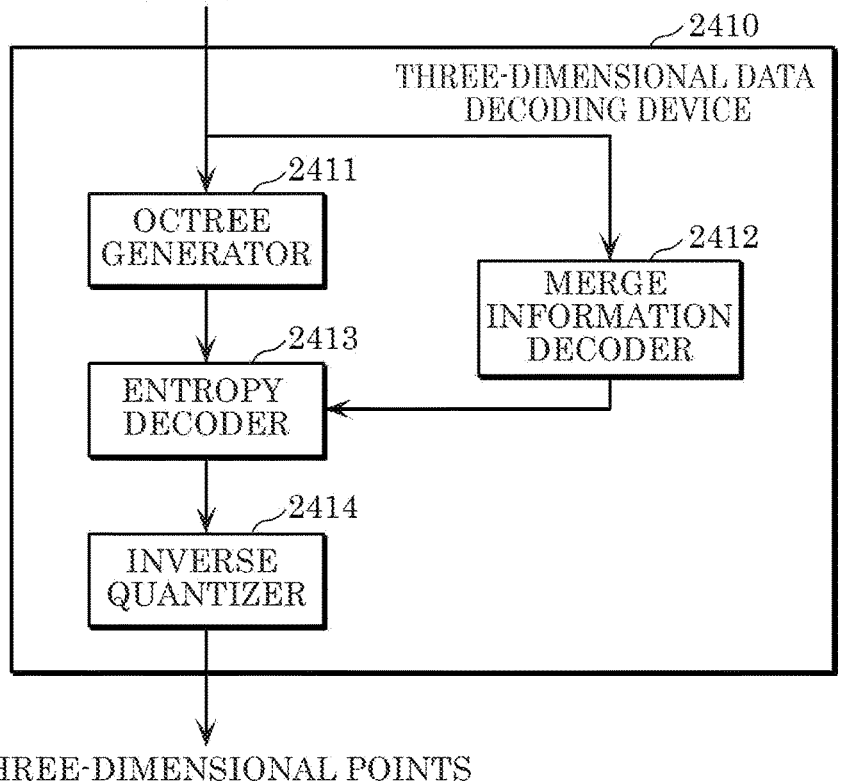
FIG. 84 is a block diagram of a three-dimensional data decoding device according to Embodiment 8.

Next, a configuration example of the three-dimensional data decoding device will be described. FIG. 84 is a block diagram of three-dimensional data decoding device 2410 according to the present embodiment. Three-dimensional data decoding device 2410 includes octree generator 2411, merge information decoder 2412, entropy decoder 2413, and inverse quantizer 2414.

Octree generator 2411 generates an octree of a space (a node) using, for example, header information of a bitstream. For example, octree generator 2411 generates a large space (a root node) using the size of a space along the x-axis, y-axis, and z-axis directions appended to the header information, and generates an octree by generating eight small spaces A (nodes A0 to A7) by dividing the space into two along each of the x-axis, y-axis, and z-axis directions. In a similar way, octree generator 2411 further divides each of nodes A0 to A7 into eight small spaces. As stated above, octree generator 2411 repeats the generation of an octree.

Merge information decoder 2412 decodes a merge duplicated point flag from the header information of the bitstream. It should be noted that merge information decoder 2412 may be included in entropy decoder 2413.

Entropy decoder 2413 decodes leaf information according to information of the decoded merge duplicated point flag, and generates a three-dimensional point cloud (three-dimensional positions). It should be noted that entropy decoder 2413 may decode attribute information regarding decoded three-dimensional points.

Inverse quantizer 2414 performs inverse quantization on the three-dimensional positions of the decoded point cloud, and generates an output three-dimensional point cloud. It should be noted that in the event of lossless coding, inverse quantization may be skipped. In addition, when a scale need not be returned to an original scale, the three-dimensional data decoding device may skip inverse quantization even in the event of lossy coding. For example, when not an absolute positional relationship between three-dimensional points but a relative positional relationship between three-dimensional points is necessary, the three-dimensional data decoding device may skip inverse quantization.

Figure 85:
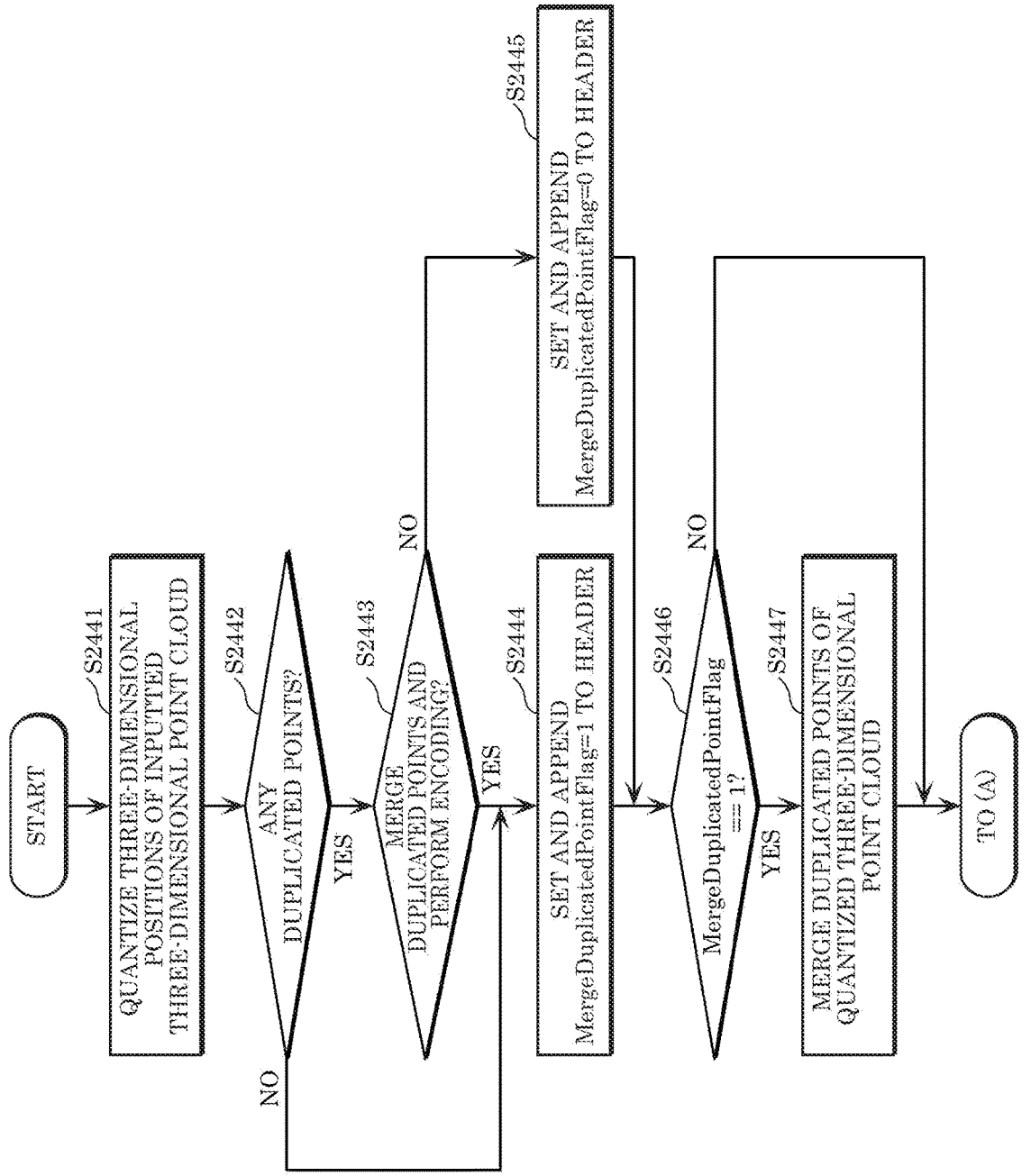
FIG. 85 is a flowchart of a variation of the three-dimensional data encoding process according to Embodiment 8.

Next, a variation of the three-dimensional data encoding process performed by the three-dimensional data encoding device will be described. FIG. 85 is a flowchart of a variation of the three-dimensional data encoding process.

First, the three-dimensional data encoding device quantizes three-dimensional positions of an inputted three-dimensional point cloud (S2441). For example, as an example of quantization of a three-dimensional position, the three-dimensional data encoding device calculates a quantization position (x/qx, y/qy, z/qz) by dividing a three-dimensional position (x, y, z) by a quantization parameter (qx, qy, qz). Additionally, the three-dimensional data encoding device may append the quantization parameter to a header, and the three-dimensional data decoding device may perform inverse quantization using the quantization parameter. It should be noted that the three-dimensional data encoding device may skip quantization at the time of lossless coding.

Next, the three-dimensional data encoding device determines whether the quantized three-dimensional point cloud includes duplicated points (S2442). For example, the three-dimensional data encoding device compares pieces of three-dimensional position information of all three-dimensional point clouds, and makes the determination, based on whether there is the same value. Alternatively, the three-dimensional data encoding device may calculate a difference between all the pieces of three-dimensional position information, and determine that the quantized three-dimensional point cloud includes no duplicated point when an absolute value of the difference is greater than a predetermined threshold value.

When the three-dimensional point cloud includes the duplicated points (YES in S2442), the three-dimensional data encoding device determines whether to merge the duplicated points and perform encoding (S2443). For example, when the three-dimensional data encoding device prioritizes the coding efficiency, the three-dimensional data encoding device may determine to merge duplicated points. When duplicated points are necessary in the three-dimensional data decoding device, the three-dimensional data encoding device may also determine not to merge duplicated points.

When the three-dimensional point cloud includes no duplicated point (NO in S2442) or the duplicated points are to be merged (YES in S2443), the three-dimensional data encoding device sets a merge duplicated point flag to 1 and appends the merge duplicated point flag to a header (S2444). In contrast, when the duplicated points are not to be merged (NO in S2443), the three-dimensional data encoding device sets a merge duplicated point flag to 0 and appends the merge duplicated point flag to a header (S2445).

After that, the three-dimensional data encoding device determines whether the merge duplicated point flag is 1 (S2446). When the merge duplicated point flag is 1 (YES in S2446), the three-dimensional data encoding device merges duplicated points of the quantized three-dimensional point cloud (S2447). It should be noted that when lossless coding is performed and the inputted three-dimensional point cloud includes no duplicated point, the three-dimensional data encoding device may skip this step. When the merge duplicated point flag is 0 (NO in S2446), the three-dimensional data encoding device does not merge duplicated points of the quantized three-dimensional point cloud. Subsequent steps are the same as those illustrated in FIG. 81.

Embodiment 9

Figure 86:
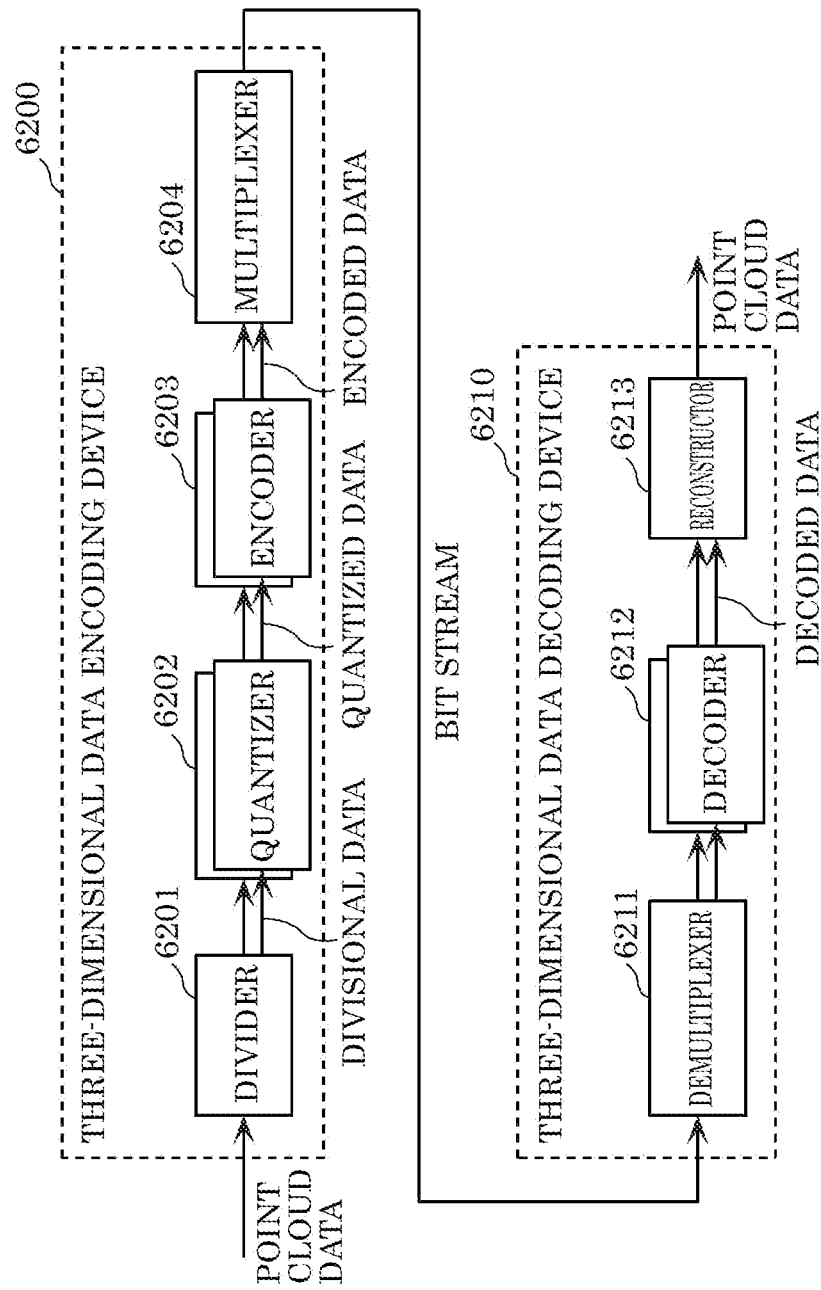
FIG. 86 is a block diagram showing a configuration of a three-dimensional data encoding device and a three-dimensional data decoding device according to Embodiment 9.

A configuration of a three-dimensional data encoding device and a three-dimensional data decoding device according to this embodiment will be described. FIG. 86 is a block diagram showing a configuration of three-dimensional data encoding device 6200 and three-dimensional data decoding device 6210 according to this embodiment. Note that this drawing shows only processors involved with the encoding of geometry information, among the processors of three-dimensional data encoding device 6200 and three-dimensional data decoding device 6210.

Here, when point cloud data is divided into tiles or slices, it is possible to perform quantization on a basis of a divisional data unit (tile or slice).

As shown in FIG. 86, three-dimensional data encoding device 6200 includes divider 6201, a plurality of quantizers 6202, a plurality of encodes 6203, and multiplexer 6204.

Divider 6201 divides point cloud data into one or more data units, such as tiles or slices, to generate a plurality of pieces of divisional data. The plurality of quantizers 6202 quantizes each of the plurality of pieces of divisional data to generate a plurality of pieces of quantized data.

The plurality of encoders 6203 encodes each of the plurality of pieces of quantized data to generate a plurality of pieces of encoded data. Multiplexer 6204 multiplexes the plurality of pieces of encoded data to generate a bitstream.

Three-dimensional data decoding device 6210 includes demultiplexer 6211, a plurality of decoders 6212, and reconstructor 6213. Demultiplexer 6211 demultiplexes a bitstream to generate a plurality of pieces of encoded data.

The plurality of decoders 6212 decodes each of the plurality of pieces of encoded data to generate a plurality of pieces of decoded data. Reconstructor 6213 reconstructs point cloud data from the plurality of pieces of decoded data.

Figure 87:
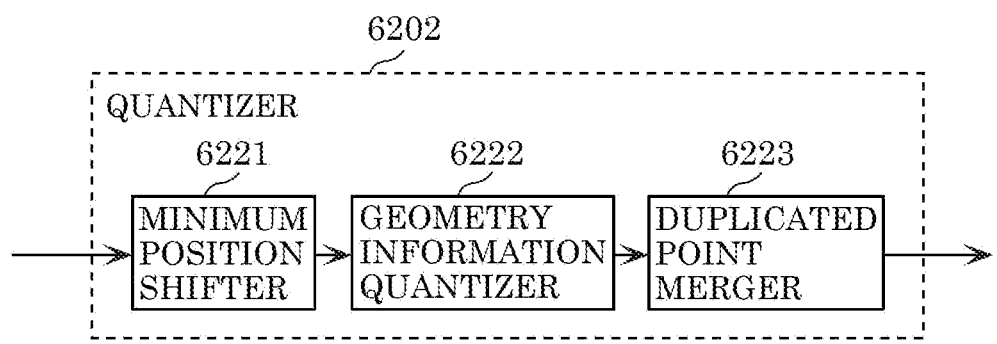
FIG. 87 is a block diagram showing a configuration of a quantizer according to Embodiment 9.

Next, details of quantizer 6202 will be described. FIG. 87 is a block diagram showing a configuration of quantizer 6202. Quantizer 6202 includes minimum position shifter 6221, geometry information quantizer 6222, and duplicated point merger 6223.

Figure 88:
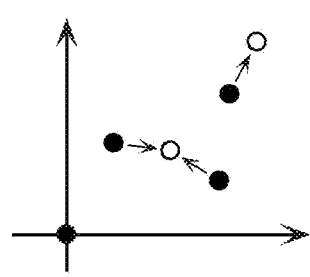
FIG. 88 is a diagram showing an example of a quantization process according to Embodiment 9.

Minimum position shifter 6221 shifts the whole of a point cloud in such a manner that a minimum point, which has the smallest value of a coordinate in the point cloud, is shifted to the origin. FIG. 88 is a diagram showing an example of a quantization process. In the drawing, a black dot indicates a point subjected to this shift.

Geometry information quantizer 6222 quantizes geometry information. This results in the shifts of the points shown as black dots to the points shown as white dots as shown in FIG. 88. This quantization may cause a duplication of a plurality of points. In that case, duplicated point merger 6223 mergers the duplicated points. Specifically, the plurality of points having the same geometry information are regarded as one point, and the pieces of attribute information corresponding to the points are integrated (merged). For example, duplicated point merger 6223 designates any of the plurality of pieces of attribute information as attribute information on the point resulting from the merging. Alternatively, duplicated point merger 6223 calculates the attribute information on the point resulting from the merging by performing a predetermined calculation (such as calculation of an average value) on the plurality of pieces of attribute information.

In this process, the duplicated points as a result of the quantization and the duplicated points that are originally present in the point cloud data are also merged. As a result, in the quantization of the point cloud data, precise geometry information and the precise number of points are lost. Furthermore, pieces of attribute information (such as color information) are also merged.

On the other hand, when the quantization is not performed, the quantization and the merging of duplicated points are not performed. Therefore, there are no duplicated points resulting from the quantization, although the duplicated points that are originally present in the point cloud data are not merged but remain.

Encoder 6203 transforms information on a point cloud into an occupancy code, for example. If there are duplicated points, there are duplicated points in a leaf node. Encoder 6203 arithmetically encodes the number of duplicated points and attribute information on each point to generate encoded data.

Figures 89, 90:
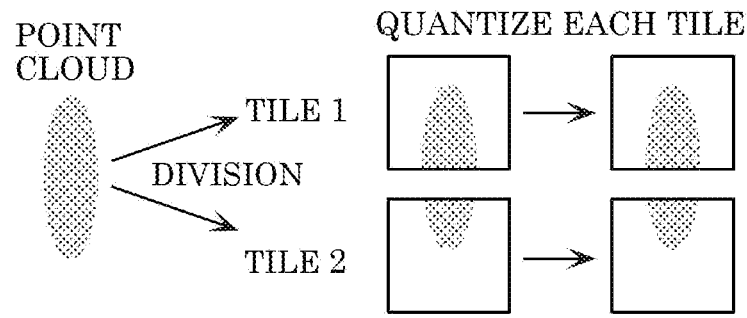
FIG. 89 is a diagram schematically showing a quantization process on a tile basis according to Embodiment 9.
FIG. 90 is a diagram showing a syntax example of GPS according to Embodiment 9.

In the following, a process of quantization on a tile basis will be described. FIG. 89 is a diagram schematically showing a quantization process on a tile basis.

The three-dimensional data encoding device divides point cloud data into a plurality of data units, such as tiles, that can be independently encoded and decoded, and quantizes each piece of divisional data obtained by the division.

If the quantization and the merging of duplicated points are performed in the tile division in the method described below, the coding efficiency of the quantized data can be improved.

When performing the quantization on a basis of divisional data, the three-dimensional data encoding device quantizes geometry information on a point belonging to each tile and merges duplicated points into one point. The three-dimensional data encoding device then transforms geometry information on the point cloud data into an occupancy code on a tile basis, and arithmetically encodes the occupancy code.

For example, the three-dimensional data encoding device may merge points A and B into point C having the same three-dimensional geometry information. Note that the three-dimensional data encoding device may assign an average value of the attribute information such as color or reflectance on points A and B to point C. The three-dimensional data encoding device may merge point B to point A or merge point A to point B.

When performing the merging, the three-dimensional data encoding device sets MergeDuplicatedPointFlag at 1. The MergeDuplicatedPointFlag indicates that any duplicated points in the tile are merged, and there are no duplicated points in the tile. The three-dimensional data encoding device stores MergeDuplicatedPointFlag in a parameter set as metadata (additional information).

When MergeDuplicatedPointFlag is 1, each leaf node includes one point in the occupancy code for each tile. Therefore, the three-dimensional data encoding device need not encode information indicating the number of points included in the leaf node as information on the leaf node. The three-dimensional data encoding device may encode three-dimensional geometry information and attribute information such as color and reflectance on one point.

When MergeDuplicatedPointFlag is 1, the three-dimensional data encoding device may merge M duplicated points into N points (M>N). In that case, the three-dimensional data encoding device may add information indicating the value of N to a header or the like. Alternatively, the value of N may be prescribed by a standard or the like. In that case, the three-dimensional data encoding device needs not add information indicating the value of N for each leaf node, and the required amount of encoding can be reduced.

When not quantizing the point cloud data divided into tiles, the three-dimensional data encoding device sets MergeDuplicatedPointFlag at 0. When MergeDuplicatedPointFlag is 0, the three-dimensional data encoding device encodes information concerning the duplicated points included in a leaf node in a tile as information on the leaf node. For example, each leaf node may include one or more duplicated points. Therefore, the three-dimensional data encoding device may encode information indicating the number of points included in a leaf node. The three-dimensional data encoding device may separately encode the attribute information on each duplicated point.

As described above, the three-dimensional data encoding device may change the encoded data structure based on MergeDuplicatedPointFlag.

The three-dimensional data encoding device may describe MergeDuplicatedPointFlag in GPS, which is a parameter set for each frame. In that case, a flag is used which indicates whether at least one of all the tiles excluding null tiles includes duplicated points or not, for example. The flag may be added for each frame, the same flag may be used for all or a plurality of frames. When the same flag is used for all or a plurality of frames, the three-dimensional data encoding device may describe the flag in SPS, rather than in GPS. This can reduce the amount of transmitted data. Here, SPS is a parameter set for a sequence (a plurality of frames).

Note that the three-dimensional data encoding device may change the quantization parameter for each tile, or may determine whether to perform the quantization or not for each tile.

When the three-dimensional data encoding device determines whether or not to perform the quantization or merging for each tile, the three-dimensional data encoding device stores a flag (such as MergeDuplicatedPointFlag) for each tile in GPS. Alternatively, the three-dimensional data encoding device stores MergeDuplicatedPointFlag in the header of the data for each tile and uses MergeDuplicatedPointFlag as a flag that indicates whether there are duplicated points in the tile or not. In that case, the three-dimensional data encoding device describes, in GPS, a flag that indicates that the flag is stored in the header of the data. Note that the three-dimensional data encoding device need not store a flag when the tile is a null tile.

Next, a data structure will be described. FIG. 90 is a diagram showing a syntax example of GPS, which is a geometry information parameter set for each frame. GPS includes at least one of gps_idx indicating a frame number and sps_idx indicating a sequence number.

GPS further includes duplicated point merging flag (MergeDuplicatedPointFlag) and tile information (tile_information).

When not performing the tile division, MergeDuplicatedPointFlag=1 indicates that the duplicated points in the point cloud data are merged and there are no duplicated points in the point cloud data. When performing the tile division, MergeDuplicatedPointFlag=1 indicates that the duplicated points are merged and there are no duplicated points in all the tiles excluding null tiles forming the point cloud data.

When not performing the tile division, MergeDuplicatedPointFlag=0 indicates that the duplicated points in the point cloud data are not merged and there can be duplicated points in the point cloud data. When performing the tile division, MergeDuplicatedPointFlag=0 indicates that the duplicated points are not merged in all the tiles excluding null tiles forming the point cloud data and there can be duplicated points in any of the tiles.

Tile information (tile_information) is information concerning the tile division. Specifically, the tile information indicates the type of the tile division, the number of divisions, the coordinates (position) of each tile, and the size of each tile, for example. Furthermore, the tile information may indicate the quantization parameter, or information on a null tile, for example. When the coordinates or size of each tile are known or can be derived on the three-dimensional data decoding device, information indicating the coordinates or size of each tile may be omitted. In this way, the code amount can be reduced.

FIG. 91 is a diagram showing a syntax example of the tile information (tile_information). The tile information includes an independent quantization flag (independent_quantization_flag). The independent quantization flag (independent_quantization_flag) is a flag that indicates whether to set the same quantization parameter for a plurality of tiles or set a different quantization parameter for each tile.

For example, independent_quantization_flag=1 indicates that the same quantization parameter is set for a plurality of tiles. In this case, MergeDuplicatedPointFlag and QP_value are indicated in GPS, and these pieces of information are used. Here, QP_value is a quantization parameter used for a plurality of tiles.

For example, independent_quantization_flag=2 indicates that a different quantization parameter is set for each tile. In this case, when the tile is not a null tile, TileMergeDuplicatedPointFlag and qp_value are indicated in a loop process for each tile. Alternatively, TileMergeDuplicatedPointFlag and qp_value are indicated in the header of the geometry information. Here, TileMergeDuplicatedPointFlag is a flag that indicates whether to merge duplicated points in a current tile, which is a tile to be processed. qp_value is a quantization parameter used for the current tile.

Note that a flag that indicates whether to set the same flag MergeDuplicatedPointFlag for a plurality of tiles or set a different flag MergeDuplicatedPointFlag for each tile and a flag that indicates whether to set the same QP value (quantization parameter) for a plurality of tiles or set a different QP value for each tile may be separately provided. Alternatively, a flag may be provided which indicates whether to indicate the value of MergeDuplicatecdPointFlag or QP in GPS or in the header of the geometry information. In this way, an independent quantization parameter can be set for each tile.

FIG. 92 is a diagram showing a syntax example of node information (node (depth, index)) included in the data of the geometry information. When MergeDuplicatedPointFlag=0, the node information includes information (num_point_per_leaf) that indicates the number of duplicated points in a leaf node. Furthermore, the corresponding number of pieces of attribute information is indicated in leaf node information included in the data of the attribute information.

Figure 93:
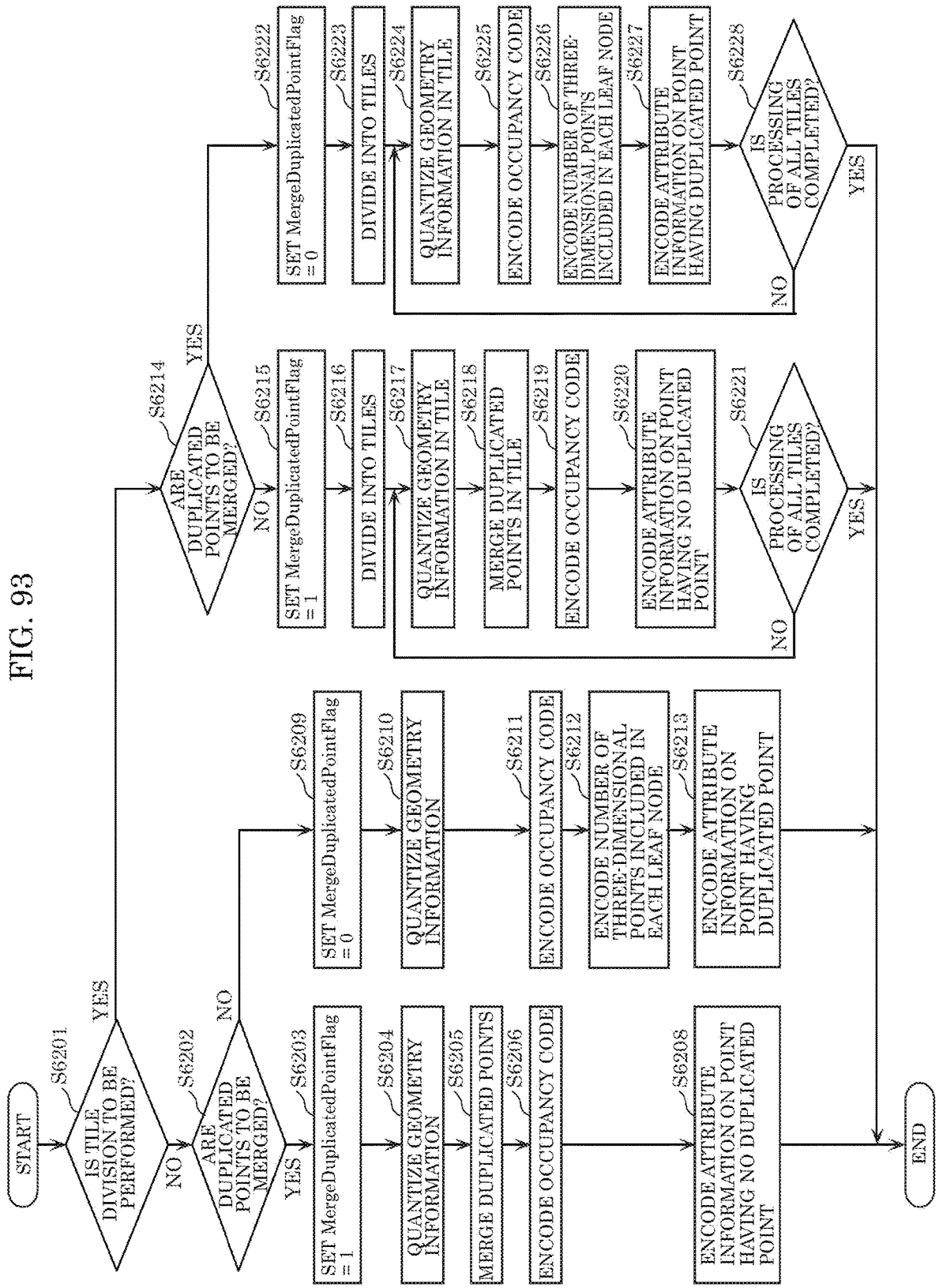
FIG. 93 is a flowchart of a three-dimensional data encoding process according to Embodiment 9.

In the following, a three-dimensional data encoding process according to this embodiment will be described. FIG. 93 is a flowchart of a three-dimensional data encoding process according to this embodiment.

First, the three-dimensional data encoding device determines whether or not to perform the tile division and whether or not to merge duplicated points (S6201, S6202, S6214). For example, the three-dimensional data encoding device determines whether or not to perform the tile division and whether or not to merge duplicated points according to an external indication.

When not performing the tile division but merging duplicated points (if No in S6201 and Yes in S6202), the three-dimensional data encoding device sets MergeDuplicatedPointFlag=1 that indicates that the point cloud to be output includes no duplicated points, and stores MergeDuplicatedPointFlag in metadata (additional information) (S6203).

The three-dimensional data encoding device then quantizes geometry information on the point cloud (S6204), and merges duplicated points based on the quantized geometry information (S6205). The three-dimensional data encoding device then encodes an occupancy code (S6206). The three-dimensional data encoding device then encodes attribute information on a point that has no duplicated point (S6208).

On the other hand, when not performing the tile division and not merging duplicated points (if No in S6201 and No in S6202), the three-dimensional data encoding device sets MergeDuplicatedPointFlag=0 that indicates that the point cloud to be output can include duplicated points, and stores MergeDuplicatedPointFlag in metadata (additional information) (S6209).

The three-dimensional data encoding device then quantizes geometry information on the point cloud (S6210), and encodes an occupancy code (S6211). In addition, the three-dimensional data encoding device encodes information that indicates the number of three-dimensional points included in each of all the leaf nodes (S6212). The three-dimensional data encoding device then encodes attribute information on a point that has a duplicated point (S6213).

On the other hand, when performing the tile division and merging duplicated points (if Yes in S6201 and Yes in S6214), the three-dimensional data encoding device sets MergeDuplicatedPointFlag=1 that indicates that there are no duplicated points in any tiles to be output, and stores MergeDuplicatedPointFlag in metadata (additional information) (S6215). The three-dimensional data encoding device then divides the point cloud into tiles (S6216).

The three-dimensional data encoding device then quantizes geometry information on a point cloud in a current tile to be processed (S6217), and merges duplicated points in the current tile based on the quantized geometry information (S6218). The three-dimensional data encoding device then encodes an occupancy code (S6219), and encodes attribute information on a point that has no duplicated point (S6220).

If the processing of all the tiles is not completed (if No in S6221), Step S6217 and the following processing are performed for the next tile. If the processing of all the tiles is completed (if Yes in S6221), the three-dimensional data encoding device ends the process.

On the other hand, when performing the tile division but not merging duplicated points (if Yes in S6201 and No in S6214), the three-dimensional data encoding device sets MergeDuplicatedPointFlag=0 that indicates that a tile to be output can include duplicated points, and stores MergeDuplicatedPointFlag in metadata (additional information) (S6222). The three-dimensional data encoding device divides the point cloud into tiles (S6223).

The three-dimensional data encoding device then quantizes geometry information on a point cloud in a current tile (S6224), and encodes an occupancy code (S6225). The three-dimensional data encoding device then encodes information that indicates the number of three-dimensional points included in each of all the leaf nodes (S6226). The three-dimensional data encoding device then encodes attribute information on a point that has a duplicated point (S6227).

If the processing of all the tiles is not completed (if No in S6228), Step S6224 and the following processing are performed for the next tile. If the processing of all the tiles is completed (if Yes in S6228), the three-dimensional data encoding device ends the process.

Note that, in the configuration of the encoder, the quantizer may be arranged to precede the tile divider. In other words, the tile division may be performed after all the point cloud data is quantized. The point cloud data is subjected to the position shift in the quantization, and the duplicated points are then merged. The duplicated points need not be merged.

In the case of the latter configuration, the flag (independent_quantization_flag) that indicates whether to set the same quantization parameter or different quantization parameters for the tiles is set at a value of 1 (which indicates to set the same quantization parameter for all the tiles).

Figure 94:
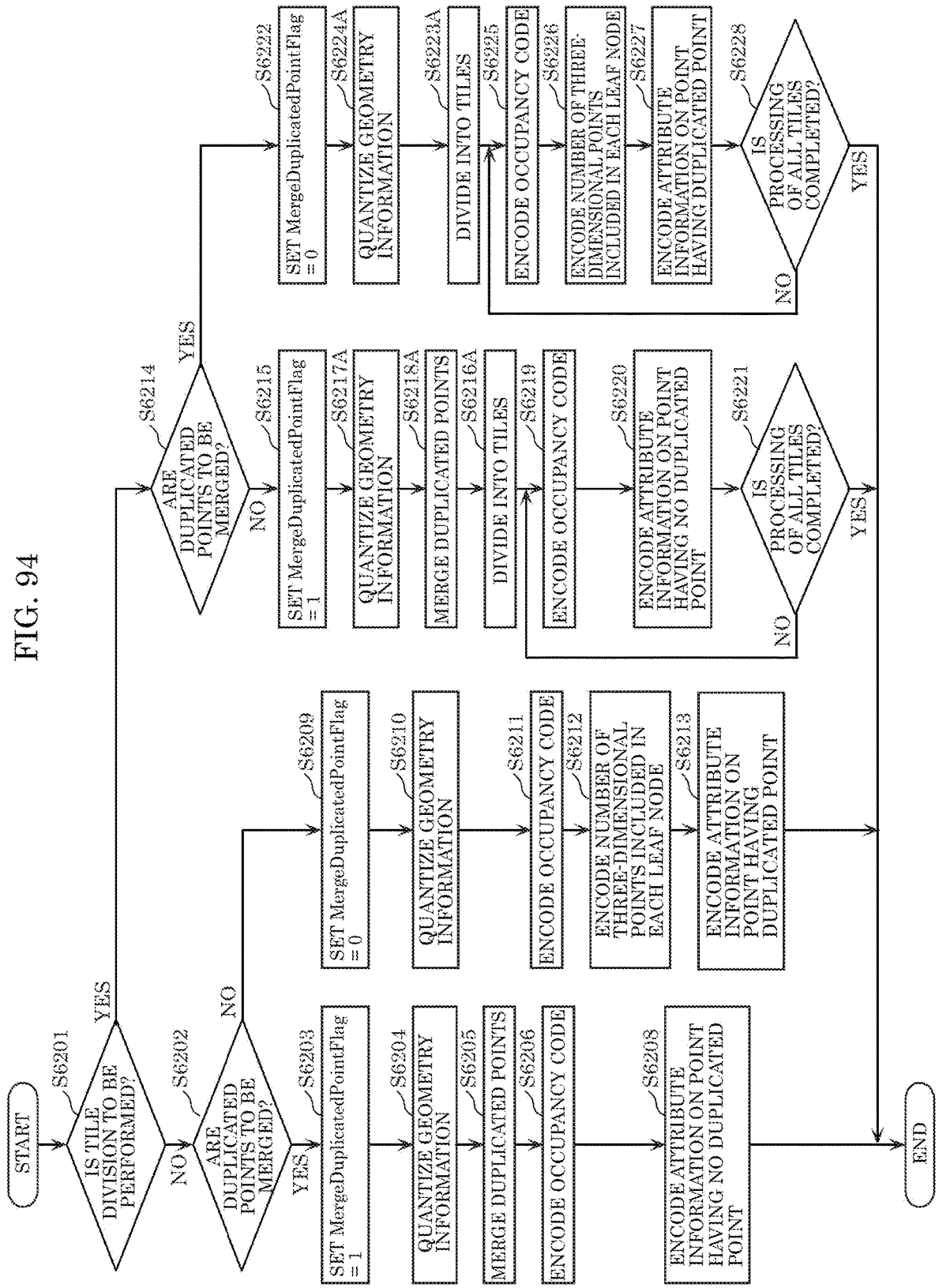
FIG. 94 is a flowchart of a three-dimensional data encoding process according to Embodiment 9.

FIG. 94 is a flowchart of a three-dimensional data encoding process in this case. Note that the process shown in FIG. 94 differs from the process shown in FIG. 93 in the order of the tile division processing and the quantization processing in the case where the tile division is performed (Yes in S6201). In the following, the difference will be primarily described.

When performing the tile division and merging duplicated points (if Yes in S6201 and Yes in S6214), the three-dimensional data encoding device sets MergeDuplicatedPointFlag=1 (S6215), and quantizes geometry information on the point cloud (S6217A). The three-dimensional data encoding device then merges the duplicated points based on the quantized geometry information (S6218A). The three-dimensional data encoding device then divides the point cloud resulting from the merging into tiles (S6216A).

On the other hand, when performing the tile division but not merging duplicated points (if Yes in S6201 and No in S6214), the three-dimensional data encoding device sets MergeDuplicatedPointFlag=0 (S6222), and quantizes geometry information on the point cloud (S6224A). The three-dimensional data encoding device then divides the point cloud after the quantization into tiles (S6223A).

Figure 95:
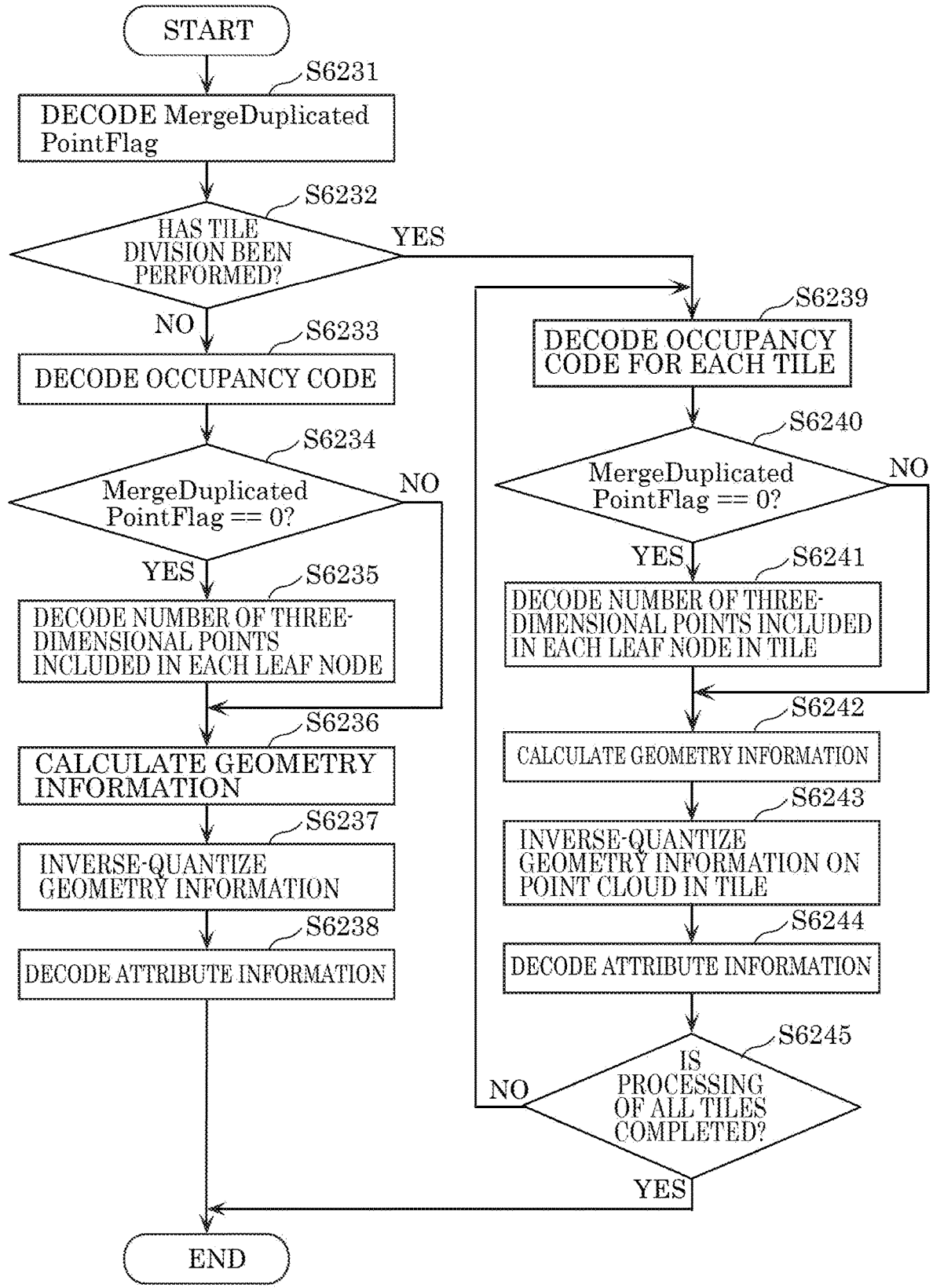
FIG. 95 is a flowchart of a three-dimensional data decoding process according to Embodiment 9.

Next, a three-dimensional data decoding process according to this embodiment will be described. FIG. 95 is a flowchart of a three-dimensional data decoding process according to this embodiment.

First, three-dimensional data decoding device decodes MergeDuplicatedPointFlag from the metadata included in the bitstream (S6231). The three-dimensional data decoding device then determines whether or not the tile division has been performed (S6232). For example, the three-dimensional data decoding device determines whether or not the tile division has been performed based on information included in the bitstream.

If the tile division has not been performed (if No in S6232), the three-dimensional data decoding device decodes the occupancy code from the bitstream (S6233). Specifically, the three-dimensional data decoding device generates an octree of a certain space (node) based on the header information included in the bitstream. For example, the three-dimensional data decoding device generates an octree by generating a large space (root node) based on dimensions in the x-axis direction, the y-axis direction, and the z-axis direction of a certain space added to the header information and dividing the large space into two parts in each of the x-axis direction, the y-axis direction, and the z-axis direction to generate eight small spaces A (nodes A0 to A7). Similarly, the three-dimensional data decoding device further divides each of nodes A0 to A7 into eight smaller spaces, and successively performs the decoding of the occupancy code for each node and the decoding of the leaf information in the process according to this flow.

When MergeDuplicatedPointFlag is 0 (if Yes in S6234), the three-dimensional data decoding device decodes the information that indicates the number of three-dimensional points included in each of all the leaf nodes (S6235). For example, the large space has a size of 8×8×8, a node resulting from three octree divisions has a size of 1×1×1. When this size is the minimum unit of division (leaf), the three-dimensional data decoding device determines whether each leaf node includes a point based on the decoded occupancy code for a parent node of the leaf node, and calculates the three-dimensional position of each leaf node.

After Step S6235, or when MergeDuplicatedPointFlag is 1 (if No in S6234), the three-dimensional data decoding device calculates the geometry information (three-dimensional position) on the leaf node based on information such as the decoded occupancy code or the number of divisions of the octree (S6236). The three-dimensional data decoding device then inverse-quantizes the geometry information (S6237).

Specifically, the three-dimensional data decoding device calculates the geometry information (three-dimensional position) on the point cloud by performing the inverse quantization using the quantization parameter decoded from the header. For example, the three-dimensional data decoding device calculates the inverse-quantized position (x×qx, y×qy, z×qz) by multiplying the three-dimensional position (x, y, z) yet to be inverse-quantized by the quantization parameter (qx, qy, qz). Note that, in lossless encoding, the inverse quantization process may be skipped.

The three-dimensional data decoding device then decodes the attribute information on a three-dimensional point whose geometry information has been decoded (S6238). When MergeDuplicatedPointFlag=1, each point having a different decoded three-dimensional position is linked with one piece of attribute information after the decoding. When MergeDuplicatedPointFlag=0, a plurality of points having the same decoded three-dimensional position are linked with a plurality of different decoded pieces of attribute information.

On the other hand, if the tile division has been performed (if Yes in S6232), the three-dimensional data decoding device decodes the occupancy code for each tile (S6239). When MergeDuplicatedPointFlag is 0 (if Yes in S6240), the three-dimensional data decoding device decodes the information that indicates the number of three-dimensional points included in each of all the leaf nodes in the tile (S6241).

After Step S6241, or when MergeDuplicatedPointFlag is 1 (if No in S6240), the three-dimensional data decoding device calculates the geometry information (three-dimensional position) on the leaf node based on information such as the decoded occupancy code or the number of divisions of the octree (S6242).

The three-dimensional data decoding device then inverse-quantizes the geometry information (three-dimensional position) on the point cloud in the tile (S6243), and decodes the attribute information on a three-dimensional point whose geometry information has been decoded (S6244).

If the processing of all the tiles is not completed (if No in S6245), Step S6239 and the following processing are performed for the next tile. If the processing of all the tiles is completed (if Yes in S6245), the three-dimensional data decoding device ends the process.

Figure 96:
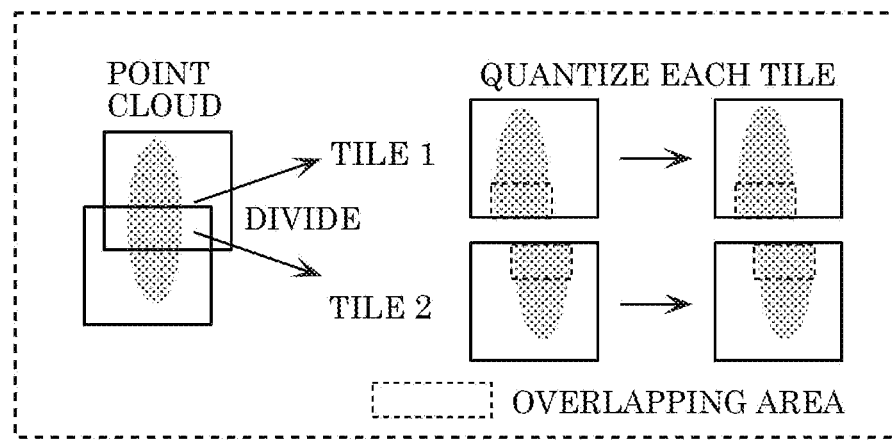
FIG. 96 is a diagram showing an example of tile division according to Embodiment 9.
Figure 97:
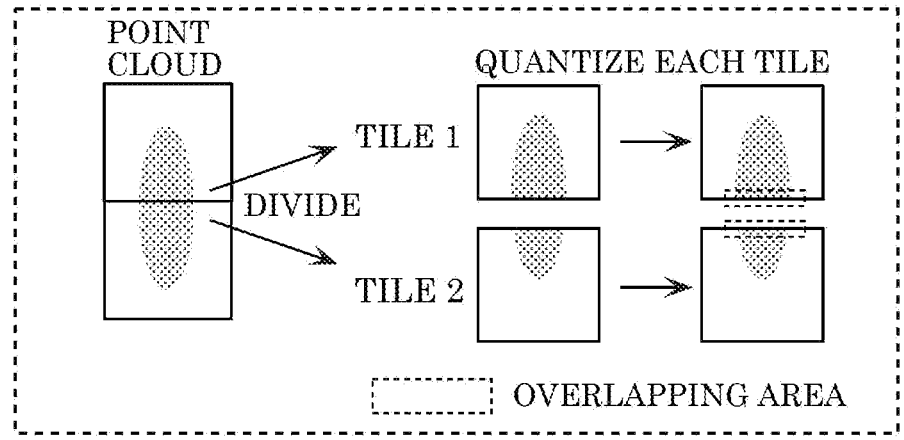
FIG. 97 is a diagram showing an example of tile division according to Embodiment 9.

In the following, an example where there is a three-dimensional point duplicated between tiles and an encoding method in such a case will be described. Cases where there is a duplicated point between tiles include the case described below. FIGS. 96 and 97 are diagrams showing examples of the tile division.

As shown in FIG. 96, when the divider divides a point cloud into tiles, if the point cloud is divided in such a manner that the tile areas overlap with each other as shown by the solid line, the division results in a duplicated point between tiles in the region indicated by the dashed line. If the point cloud is divided in such a manner that the tile areas do not overlap with each other as shown in FIG. 97, the division does not result in a duplicated point between tiles.

In addition, in the quantization of the geometry information on each tile, the position of each point is shifted. This also can result in a duplicated point in a tile or between tiles. In the subsequent intra-tile merging process for each tile, the duplicated points in each tile are merged into one point. However, duplicated points between tiles remain.

In the example in FIG. 96, a duplicated point can occur not only in the overlapping area of the tile areas but also in the vicinity of the tile boundary. In the example in FIG. 97, a duplicated point can occur in the vicinity of the tile boundary.

When there is a duplicated point between tiles, duplicated points occur in the point cloud data when the three-dimensional data decoding device reconstructs the tiles. As a result, the three-dimensional data decoding device is required to perform an unnecessary processing when the duplicated points are not necessary.

In view of this, the three-dimensional data encoding device stores MergeDuplicatedPointFlag or TileMergeDuplicatedPointFlag, which indicates whether there are duplicated points in a tile, in the bitstream and stores UniqueBetweenTilesFlag, which is a flag that indicates whether there is a duplicated point between tiles, in the bitstream. As a result, when UniqueBetweenTilesFlag=0, the three-dimensional data decoding device can delete or merge the duplicated points to reduce the number of points to be handled and can reduce the processing load.

When a duplicated point between tiles occurs in the tile division or quantization, the three-dimensional data encoding device may then delete or merge the duplicated points between tiles. In that case, the three-dimensional data encoding device stores, in the bitstream, UniqueBetweenTilesFlag=1 that indicates that there is no duplicated point between tiles. The three-dimensional data decoding device can determine that there is no need to merge duplicated points, based on UniqueBetweenTilesFlag.

When a duplicated point between tiles can occur, such as when the tile division is performed in such a manner that the tile areas overlap with each other or when each tile is quantized, the three-dimensional data encoding device sets UniqueBetweenTilesFlag at 0. Note that, even when the tile areas overlap with each other, if there is originally no point in the overlapping area, no duplicated point occurs. In such a case, again, the three-dimensional data encoding device can set UniqueBetweenTilesFlag at 0. When the three-dimensional data encoding device performs the quantization, even in a situation where a duplicated point does not always occur, the three-dimensional data encoding device can set UniqueBetweenTilesFlag at 0 if a duplicated point can occur.

Figure 98:
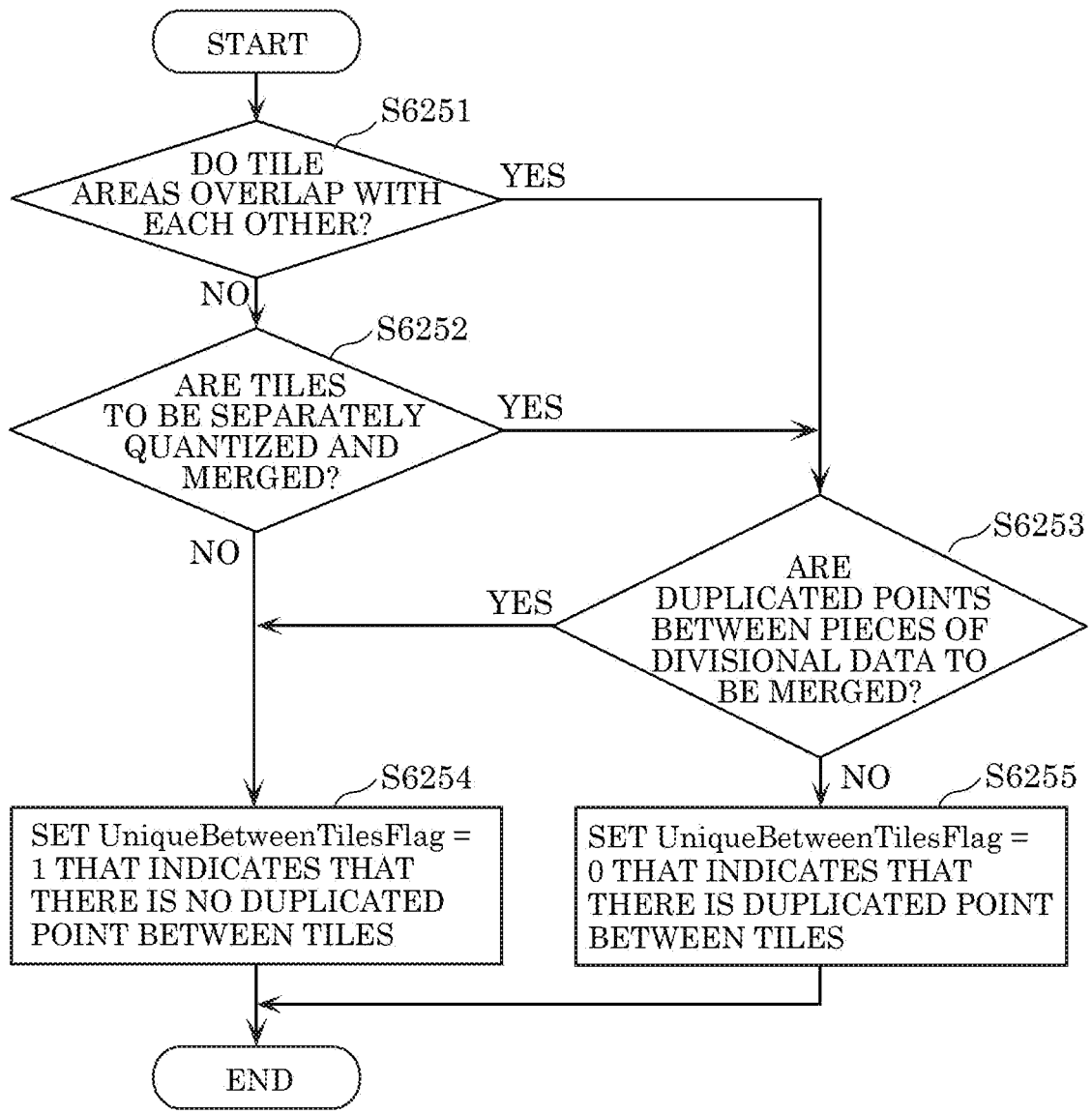
FIG. 98 is a flowchart of a three-dimensional data encoding process according to Embodiment 9.

FIG. 98 is a flowchart of a three-dimensional data encoding process. First, the three-dimensional data encoding device determines whether or not tile areas overlap with each other (S6251). When tile areas do not overlap with each other (if No in S6251), the three-dimensional data encoding device determines whether or not to separately quantize and merge the tiles (S6252). When tile areas overlap with each other (if Yes in S6251), or when separately quantizing and merging the tiles (if Yes in S6252), the three-dimensional data encoding device determines whether or not to merge duplicated points between pieces of divisional data (S6253).

When not separately quantizing and merging the tiles (if No in S6252), or when merging duplicated points between pieces of divisional data (if Yes in S6253), the three-dimensional data encoding device sets UniqueBetweenTilesFlag=1 that indicates that there is no duplicated point between tiles (S6254).

When not merging duplicated points between pieces of divisional data (if No in S6253), the three-dimensional data encoding device sets UniqueBetweenTilesFlag=0 that indicates that there is a duplicated point between tiles (S6255).

Note that a process other than the process shown in FIG. 98 may be used. For example, the three-dimensional data encoding device may determine whether there are duplicated points or not by actually reconstructing the tiles after the quantization and searching for a duplicated point between tiles, and set UniqueBetweenTilesFlag based on the result of the determination.

The three-dimensional data encoding device may store metadata concerning the overlapping area or range in the bitstream. For example, the metadata may indicate that there can be a duplicated point between tiles at the tile boundary. This allows the three-dimensional data decoding device to delete the duplicated points by searching the tile boundary, so that the processing load can be reduced.

Figure 99:
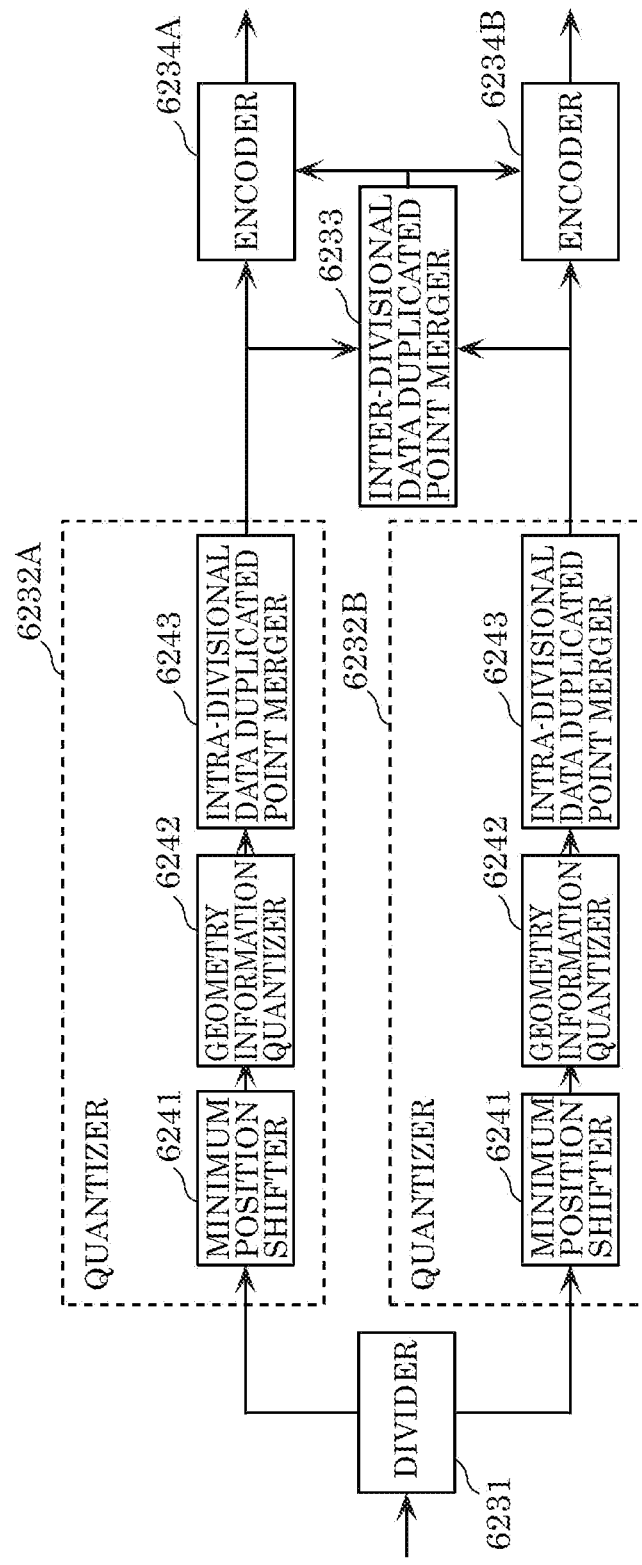
FIG. 99 is a block diagram showing a three-dimensional data encoding device according to Embodiment 9.

FIG. 99 is a block diagram showing a configuration of a three-dimensional data encoding device. As shown in FIG. 99, the three-dimensional data encoding device includes divider 6231, a plurality of quantizers 6232A and 6232B, inter-divisional data duplicated point merger 6233, and a plurality of encoders 6234A and 6234B.

Divider 6231 divides point cloud data into a plurality of tiles to generate a plurality of pieces of divisional data. The plurality of quantizers 6232A and 6232B quantizes the plurality of pieces of divisional data to generate a plurality of pieces of quantized data.

Each of the plurality of quantizers 6232A and 6232B includes minimum position shifter 6241, geometry information quantizer 62412, and intra-divisional data duplicated point merger 6243.

Minimum position shifter 6241 shifts a point cloud in such a manner that a minimum point, which has the smallest value of a coordinate in the point cloud, is shifted to the origin. Geometry information quantizer 6242 quantizes geometry information. Intra-divisional data duplicated point merger 6243 merges duplicated points in a tile.

Inter-divisional data duplicated point merger 6233 mergers duplicated points between tiles. The plurality of encoders 6234A and 6234B encode a plurality of pieces of quantized data resulting from the merging of duplicated points between tiles to generate a plurality of pieces of encoded data.

A configuration in which the quantizers are arranged to precede the divider can also be used. That is, the three-dimensional data encoding device may perform the tile division after quantizing all the point cloud data. In that case, a duplicated point between tiles does not occur in the quantization.

FIG. 100 is a diagram showing a syntax example of GPS. As shown in FIG. 100, GPS includes an inter-tile duplicated point flag (UniqueBetweenTilesFlag). The inter-tile duplicated point flag is a flag that indicates whether or not there can be a duplicated point between tiles.

Figure 101:
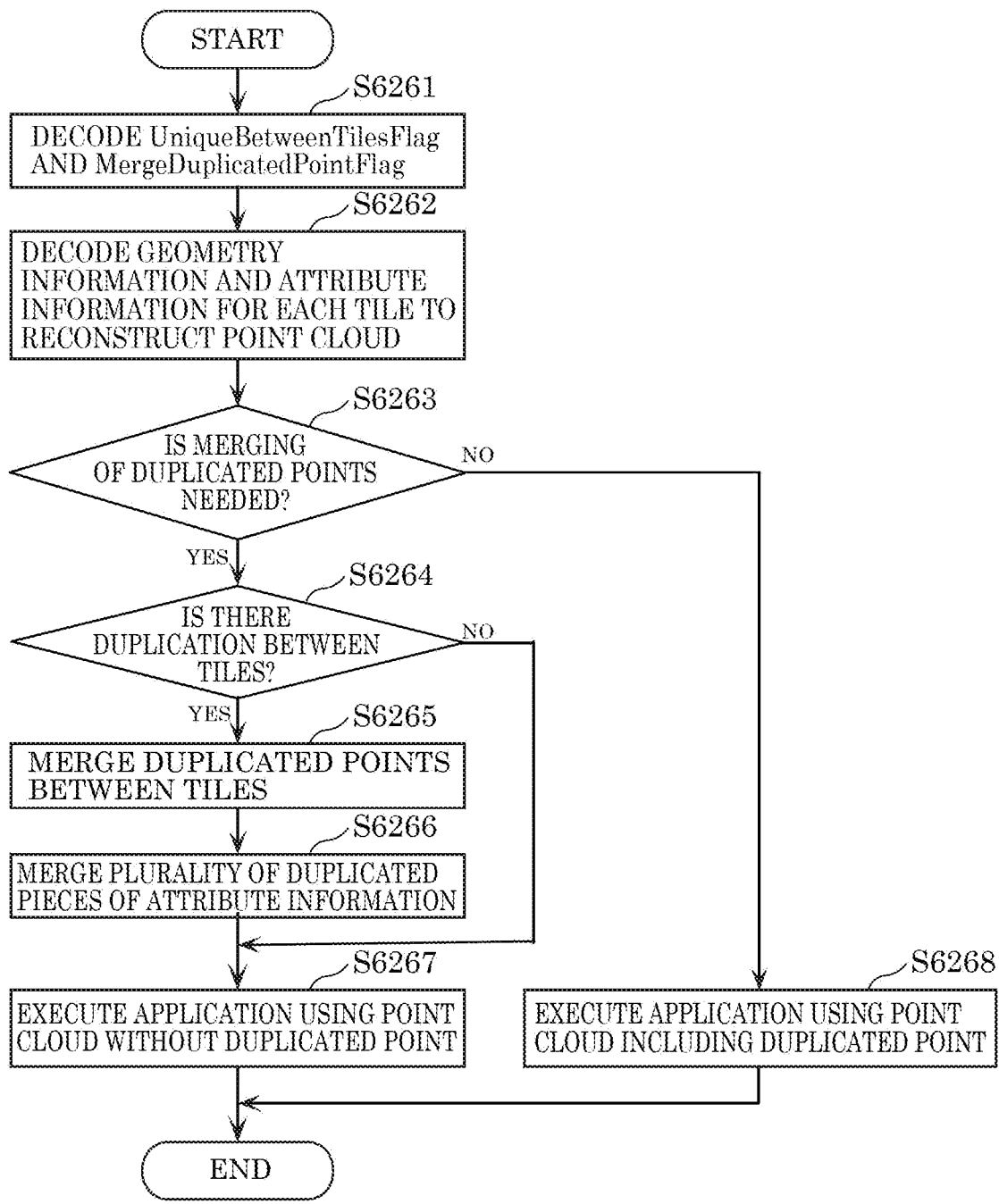
FIG. 101 is a flowchart of a three-dimensional data decoding process according to Embodiment 9.

FIG. 101 is a flowchart of a three-dimensional data decoding process. First, three-dimensional data decoding device decodes UniqueBetweenTilesFlag and MergeDuplicatedPointFlag from the metadata included in the bitstream (S6261). The three-dimensional data decoding device then decodes the attribute information and the geometry information for each tile to reconstruct the point cloud (S6262).

The three-dimensional data decoding device then determines whether the merging of duplicated points is needed or not (S6263). For example, the three-dimensional data decoding device determines whether the merging is needed or not based on whether an application can handle the duplicated points or not or whether the duplicated points should be merged or not. Alternatively, the three-dimensional data decoding device may perform a smoothing or filtering process on the plurality of pieces of attribute information on the duplicated points and determine to merge the duplicated points in order to remove noise or improve the estimation precision.

When the merging of duplicated points is needed (if Yes in S6263), the three-dimensional data decoding device determines whether there is a duplication between tiles (there is a duplicated point between tiles) or not (S6264). For example, the three-dimensional data decoding device may determine whether there is a duplication between tiles or not based on the result of the decoding of UniqueBetweenTilesFlag and MergeDuplicatedPointFlag. This eliminates the need for the three-dimensional data decoding device to search for a duplicated point, and the processing load on the three-dimensional data decoding device can be reduced. Note that the three-dimensional data decoding device may determine whether there is a duplicated point or not by searching for a duplicated point after reconstruction of the tiles.

When there is a duplication between tiles (if Yes in S6264), the three-dimensional data decoding device merges the duplicated points between tiles (S6265). The three-dimensional data decoding device then merges the plurality of duplicated pieces of attribute information (S6266).

After Step S6266, or when there is not a duplication between tiles (if No in S6264), the three-dimensional data decoding device executes an application using the point cloud without a duplicated point (S6267).

On the other hand, when the merging of duplicated points is not needed (if No in S6263), the three-dimensional data decoding device does not merge the duplicated points, and executes an application using the point cloud including duplicated points (S6268).

In the following, an example of an application will be described. First, an example of an application that uses a point cloud without a duplicated point will be described.

Figure 102:
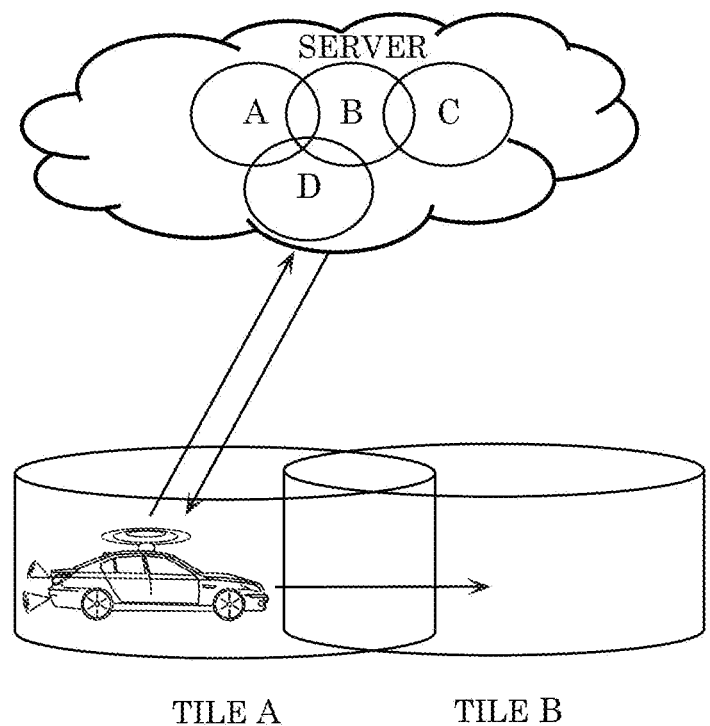
FIG. 102 is a diagram showing an example of an application according to Embodiment 9.

FIG. 102 is a diagram showing an example of an application. The example shown in FIG. 102 shows a use case where a moving body traveling from the area of tile A to the area of tile B downloads a map point cloud from a server in real time. The server stores encoded data of map point clouds of a plurality of overlapping areas. The moving body has already obtained map information on tile A and requests map information on tile B, which is located ahead in the direction of travel, from the server.

In this process, the moving body determines that the data on the part of tile B overlapping with tile A is unnecessary, and transmits to the server a direction to delete the part of tile B overlapping with tile A. The server deletes the overlapping part in tile B, and distributes the map information on tile B with the overlapping part deleted to the moving body. In this way, the amount of the transmission data and the load of the decoding process can be reduced.

Note that the moving body may confirm that there is no duplicated point based on a flag. If the moving body has not obtained the map information on tile A yet, the moving body requests the data on tile B in which the overlapping part is not deleted from the server. When the server does not have a capability of deleting a duplicated point, or when whether there is a duplicated point or not is unknown, the moving body can determine whether or not there are duplicated points by checking the distributed data, and merge duplicated points if there are duplicated points.

Next, an example of an application that uses a point cloud including duplicated points will be described. A moving body uploads map point cloud data obtained by LiDAR to a server in real time. For example, the moving body uploads data obtained for each tile to the server. In this case, although tile A and tile B have an overlapping area, the moving body on the encoding side does not merge the duplicated points between tiles but transmits data along with a flag indicating that there is a duplication between tiles to the server. The server does not merge duplicated data included in the received data and accumulates the received data without change.

When the point cloud data is transmitted or accumulated using a system, such as ISOBMFF, MPEG-DASH/MMT, or MPEG-TS, the device may replace the flag in GPS that indicates whether or not there are duplicated points in a tile or whether or not there are duplicated points between tiles with a describer or metadata in the system layer, and store the describer or metadata in SI, MPD, moov, or moof box, for example. This allows the application to use a function of the system.

Figure 103:
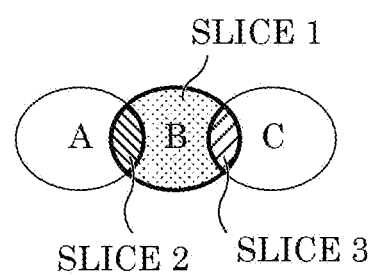
FIG. 103 is a diagram showing an example of tile division and slice division according to Embodiment 9.

As shown in FIG. 103, the three-dimensional data encoding device may divide tile B into a plurality of slices based on the areas overlapping with other tiles, for example. In the example shown in FIG. 103, slice 1 is an area that does not overlap with any other tile, slice 2 is an area that overlaps with tile A, and slice 3 is an area that overlaps with tile C. In this way, desired data can be more easily separated from the encoded data.

The map information may be point cloud data or mesh data. The point cloud data may be divided into tiles corresponding to different areas and saved in the server.

Figure 104:
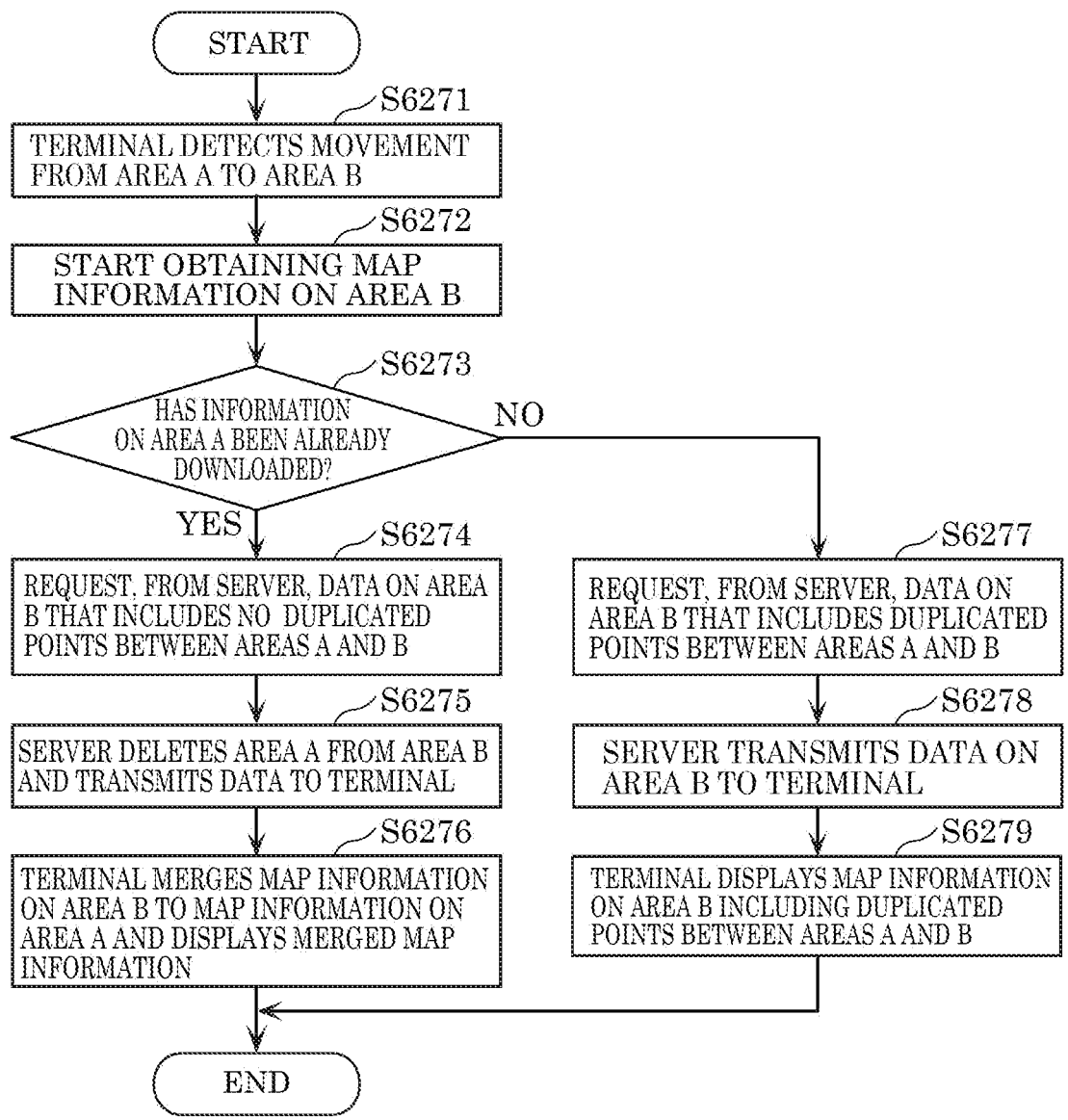
FIG. 104 is a flowchart showing a process performed by a system according to Embodiment 9.

FIG. 104 is a flowchart showing a flow of a process performed by the system described above. First, a terminal (such as a moving body) detects a movement of the terminal from area A to area B (S6271). The terminal then starts obtaining map information on area B (S6272).

If the terminal has already downloaded information on area A (if Yes in S6273), the terminal requests, from the server, data on area B that includes no duplicated points between areas A and B (S6274). The server deletes area A from area B, and transmits data on area B from which area A is deleted to the terminal (S6275). Note that, depending on the direction from the terminal, the server may transmit data on area B by encoding the data so that no duplicated point occurs in real time.

The terminal then merges (combines) the map information on area B to the map information on area A, and displays the merged map information (S6276).

On the other hand, if the terminal has not downloaded the information on area A yet (if No S6273), the terminal requests, from the server, data on area B that includes duplicated points between areas A and B (S6277). The server transmits data on area B to the terminal (S6278). The terminal then displays the map information on area B including duplicated points between areas A and B (S6279).

Figure 105:
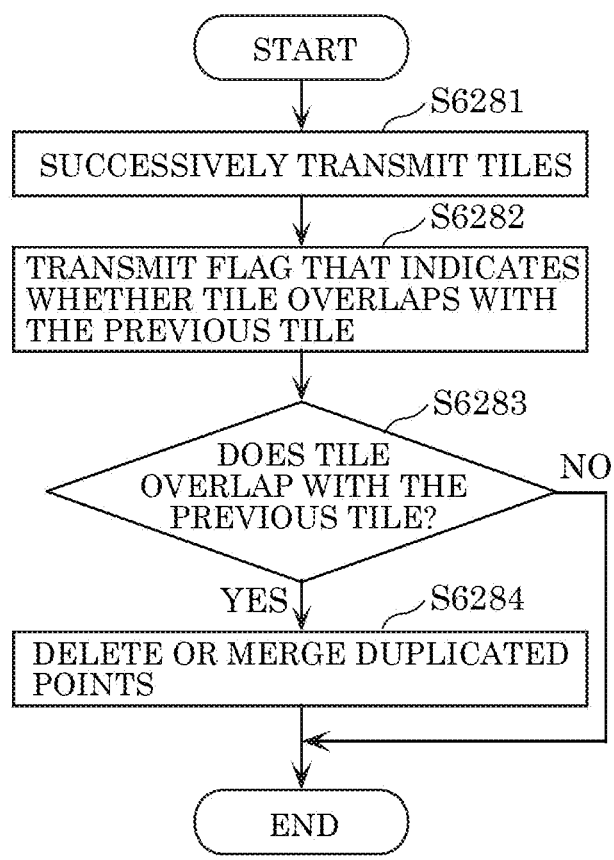
FIG. 105 is a flowchart showing a process performed by the system according to Embodiment 9.

FIG. 105 is a flowchart showing another example of the operation of the system. A transmission device (three-dimensional data encoding device) successively transmits data on tiles (S6281). The transmission device adds, to data on a tile to be transmitted, a flag that indicates whether the tile of the data to be transmitted overlaps with the tile of the previously transmitted data, and then transmits the data (S6282).

A receiving device (three-dimensional data decoding device) determines whether the tile of the received data overlaps with the tile of the previously received data based on the flag added to the data (S6283). If the tile of the received data overlaps with the tile of the previously received data (if Yes in S6283), the receiving device deletes or merges the duplicated points (S6284). On the other hand, if the tile of the received data does not overlap with the tile of the previously received data (if No in S6283), the receiving device does not perform the process of deleting or merging the duplicated points, and ends the process. In this way, the processing load on the receiving device can be reduced, and the precision of the estimation of the attribute information can be improved. Note that the receiving device need not to merge the duplicated points if the merging of the duplicated points is not needed.

Figure 106:
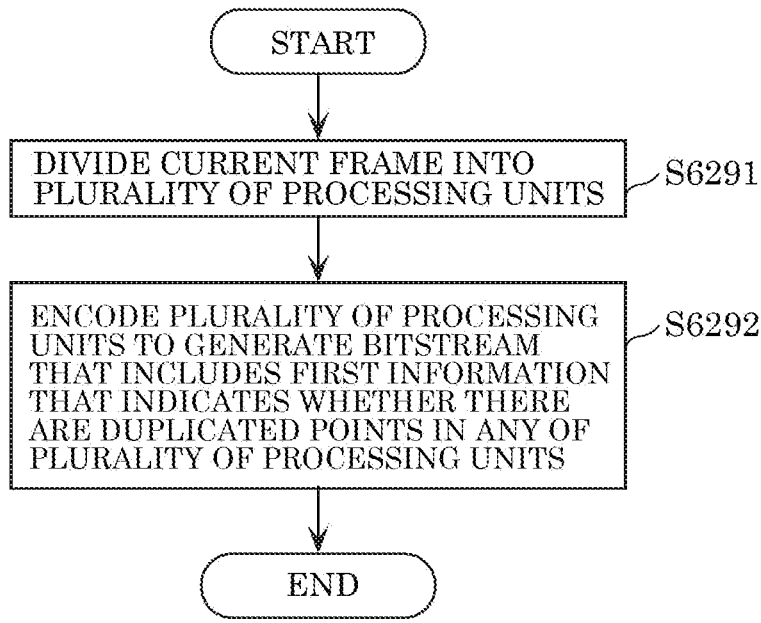
FIG. 106 is a flowchart of an encoding process according to Embodiment 9.

As described above, the three-dimensional data encoding device according to this embodiment performs the process shown in FIG. 106. The three-dimensional data encoding device divides a current frame including a plurality of three-dimensional points into a plurality of processing units (such as tiles or slices) (S6291). The three-dimensional data encoding device encodes the plurality of processing units to generate a bitstream (S6292). Frame-based control information (such as GPS) included in the bitstream includes first information (such as MergeDuplicatedPointFlag) that indicates whether (i) there are duplicated points, which are a plurality of three-dimensional points having the same geometry information, in any of the plurality of processing units included in a current frame or (ii) there is no duplicated point in any of the plurality of processing units.

With this configuration, a notification of the presence or absence of duplicated points can be made on a frame basis, and therefore, the data amount of the bitstream can be reduced.

For example, the encoding of the plurality of processing units includes the quantization process. The frame-based control information (such as GPS) further includes second information (such as independent_quantization_flag) that indicates whether to use the same parameter or different parameters for the plurality of processing units as a quantization parameter used for the quantization process.

With this configuration, a notification of whether to set a quantization parameter or not can be made on a frame basis, and therefore, the data amount of the bitstream can be reduced.

For example, the plurality of processing units include two processing units that spatially overlap with each other. The bitstream includes third information (such as UniqueBetweenTilesFlag) that indicates whether there are a plurality of three-dimensional points that belong to different processing units and have the same geometry information in the overlapping area of the two processing units.

With this configuration, the three-dimensional data decoding device can control the details of the process based on whether there are duplicated points in the overlapping area of the processing units using the third information. Therefore, the processing load on the three-dimensional data decoding device can be reduced.

For example, the three-dimensional data encoding device includes a processor and a memory, and the processor performs the process described above using the memory.

Figure 107:
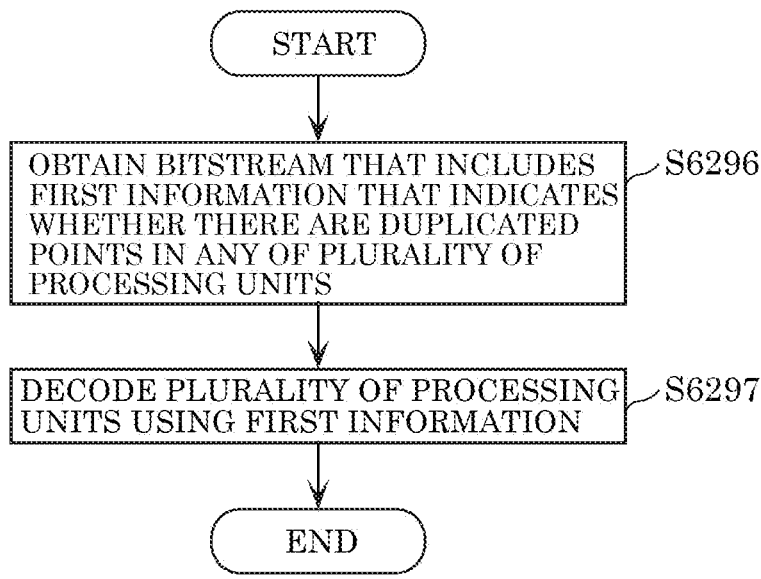
FIG. 107 is a flowchart of a decoding process according to Embodiment 9.

The three-dimensional data decoding device according to this embodiment performs the process shown in FIG. 107. The three-dimensional data decoding device obtains a bitstream generated by encoding a plurality of processing units (such as tiles or slices) obtained by dividing a current frame including a plurality of three-dimensional points (S6296). The three-dimensional data decoding device decodes the plurality of processing units from the bitstream (S6297). Frame-based control information (such as GPS) included in the bitstream includes first information (such as MergeDuplicatedPointFlag) that indicates whether (i) there are duplicated points, which are a plurality of three-dimensional points having the same geometry information, in any of the plurality of processing units included in a current frame or (ii) there is no duplicated point in any of the plurality of processing units. In the decoding of the plurality of processing units (S6297), the three-dimensional data decoding device decodes the plurality of processing units using the first information. For example, if the first information indicates that any of the plurality of processing units included in the current frame includes duplicated points, the three-dimensional data decoding device performs the process of deleting or merging the duplicated points. If the first information indicates that a duplicated point is not included in any of the plurality of processing units included in the current frame, the three-dimensional data decoding device does not perform the process of deleting or merging the duplicated points.

With this configuration, a notification of the presence or absence of duplicated points can be made on a frame basis, and therefore, the data amount of the bitstream can be reduced.

For example, the decoding of the plurality of processing units includes the inverse quantization process. The frame-based control information further includes second information (such as independent_quantization_flag) that indicates whether to use the same parameter or different parameters for the plurality of processing units as a quantization parameter used for the inverse quantization process.

With this configuration, a notification of whether to set a quantization parameter or not can be made on a frame basis, and therefore, the data amount of the bitstream can be reduced.

For example, the plurality of processing units include two processing units that spatially overlap with each other. The bitstream includes third information (such as UniqueBetweenTilesFlag) that indicates whether there are a plurality of three-dimensional points that belong to different processing units and have the same geometry information in the overlapping area of the two processing units.

With this configuration, the three-dimensional data decoding device can control the details of the process based on whether there are duplicated points in the overlapping area of the processing units using the third information. Therefore, the processing load on the three-dimensional data decoding device can be reduced.

For example, the three-dimensional data decoding device includes a processor and a memory, and the processor performs the process described above using the memory.

A three-dimensional data encoding device, a three-dimensional data decoding device, and the like according to the embodiments of the present disclosure have been described above, but the present disclosure is not limited to these embodiments.

Note that each of the processors included in the three-dimensional data encoding device, the three-dimensional data decoding device, and the like according to the above embodiments is typically implemented as a large-scale integrated (LSI) circuit, which is an integrated circuit (IC). These may take the form of individual chips, or may be partially or entirely packaged into a single chip.

Such IC is not limited to an LSI, and thus may be implemented as a dedicated circuit or a general-purpose processor. Alternatively, a field programmable gate array (FPGA) that allows for programming after the manufacture of an LSI, or a reconfigurable processor that allows for reconfiguration of the connection and the setting of circuit cells inside an LSI may be employed.

Moreover, in the above embodiments, the structural components may be implemented as dedicated hardware or may be realized by executing a software program suited to such structural components. Alternatively, the structural components may be implemented by a program executor such as a CPU or a processor reading out and executing the software program recorded in a recording medium such as a hard disk or a semiconductor memory.

The present disclosure may also be implemented as a three-dimensional data encoding method, a three-dimensional data decoding method, or the like executed by the three-dimensional data encoding device, the three-dimensional data decoding device, and the like.

Also, the divisions of the functional blocks shown in the block diagrams are mere examples, and thus a plurality of functional blocks may be implemented as a single functional block, or a single functional block may be divided into a plurality of functional blocks, or one or more functions may be moved to another functional block. Also, the functions of a plurality of functional blocks having similar functions may be processed by single hardware or software in a parallelized or time-divided manner.

Also, the processing order of executing the steps shown in the flowcharts is a mere illustration for specifically describing the present disclosure, and thus may be an order other than the shown order. Also, one or more of the steps may be executed simultaneously (in parallel) with another step.

A three-dimensional data encoding device, a three-dimensional data decoding device, and the like according to one or more aspects have been described above based on the embodiments, but the present disclosure is not limited to these embodiments. The one or more aspects may thus include forms achieved by making various modifications to the above embodiments that can be conceived by those skilled in the art, as well forms achieved by combining structural components in different embodiments, without materially departing from the spirit of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a three-dimensional data encoding device and a three-dimensional data decoding device.

What is claimed is:

1. A three-dimensional data encoding method, comprising:
   dividing each of a plurality of frames into processing units, wherein each frame includes three dimensional points; and
   encoding the processing units to generate a bitstream of the plurality of frames such that the bitstream includes first control information that is common for all of the plurality of frames in the bitstream,
   wherein the first control information includes a parameter set for a sequence and first information indicating whether (i) at least one of the processing units is allowed to include duplicated points that are three-dimensional points having same geometry information or (ii) none of the processing units includes the duplicated points.

2. The three-dimensional data encoding method according to claim 1,
   wherein the encoding includes quantizing, and
   second control information for each frame included in the bitstream includes second information indicating whether a same parameter or separate parameters are to be used as quantization parameters used in the quantizing, for the processing units.

3. The three-dimensional data encoding method according to claim 1,
   wherein the processing units include two processing units spatially overlapping each other, and
   the bitstream includes third information indicating whether three-dimensional points having same geometry information and belonging to different processing units may be located in a region in which the two processing units overlap each other.

4. A three-dimensional data decoding method, comprising:
   obtaining a bitstream generated by encoding processing units into which a current frame including three-dimensional points is divided; and
   decoding the processing units from the bitstream,
   wherein first control information common across frames included in the bitstream includes a parameter set for a sequence and first information indicating whether (i) at least one of the processing units is allowed to include duplicated points that are three-dimensional points having same geometry information or (ii) none of the processing units includes the duplicated points, and
   the decoding of the processing units from the bitstream includes decoding the processing units using the first information.

5. The three-dimensional data decoding method according to claim 4,
   wherein the decoding of the processing units from the bitstream includes inverse quantizing, and
   second control information for each frame included in the bitstream includes second information indicating whether a same parameter or separate parameters are to be used as quantization parameters used in the inverse quantizing, for the processing units.

6. The three-dimensional data decoding method according to claim 4,
   wherein the processing units include two processing units spatially overlapping each other, and
   the bitstream includes third information indicating whether three-dimensional points having same geometry information and belonging to different processing units may be located in a region in which the two processing units overlap each other.

7. A three-dimensional data encoding device, comprising:
   a processor; and
   memory,
   wherein using the memory, the processor:
     divides each of a plurality of frames into processing units, wherein each frame includes three dimensional points; and
     encodes the processing units to generate a bitstream of the plurality of frames such that the bitstream includes first control information that is common for all of the plurality of frames in the bitstream,
   wherein the first control information includes a parameter set for a sequence and first information indicating whether (i) at least one of the processing units included in the current frame is allowed to include duplicated points that are three-dimensional points having same geometry information or (ii) none of the processing units includes the duplicated points.

8. A three-dimensional data decoding device, comprising:
   a processor; and
   memory,
   wherein using the memory, the processor:
     obtains a bitstream generated by encoding processing units into which a current frame including three-dimensional points is divided; and
     decodes the processing units from the bitstream,
   wherein first control information common across frames included in the bitstream includes a parameter set for a sequence and first information indicating whether (i) at least one of the processing units is allowed to include duplicated points that are three-dimensional points having same geometry information or (ii) none of the processing units includes the duplicated points, and
   in the decoding of the processing units from the bitstream, the processing units are decoded using the first information.

9. The three-dimensional data encoding method according to claim 1,
   wherein the bitstream includes information indicating whether three-dimensional points having same geometry information and belonging to different processing units in a same frame may be included.

10. The three-dimensional data decoding method according to claim 4,
  wherein the bitstream includes information indicating whether three-dimensional points having same geometry information and belonging to different processing units in a same frame may be included.

11. The three-dimensional data encoding method according to claim 1,
  wherein each of the frames is a point cloud.

12. The three-dimensional data decoding method according to claim 4,
  wherein each of the frames is a point cloud.

* * * * *